(12) United States Patent
Naoyuki et al.

(10) Patent No.: US 8,673,428 B2
(45) Date of Patent: Mar. 18, 2014

(54) ENGRAVED PLATE AND SUBSTRATE WITH CONDUCTOR LAYER PATTERN USING THE SAME

(75) Inventors: Susumu Naoyuki, Yuuki (JP); Hisashige Kanbara, Oyama (JP); Minoru Tosaka, Yuuki (JP); Kyosuke Suzuki, Tsukuba (JP); Toshirou Okamura, Chikusei (JP); Yoshihito Kikuhara, Oyama (JP); Masami Negishi, Chikusei (JP); Tadayasu Fujieda, Chikusei (JP); Kouichi Tsuyama, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 726 days.

(21) Appl. No.: 12/439,685

(22) PCT Filed: Dec. 27, 2007

(86) PCT No.: PCT/JP2007/075205
§ 371 (c)(1),
(2), (4) Date: Mar. 2, 2009

(87) PCT Pub. No.: WO2008/081904
PCT Pub. Date: Jul. 10, 2008

(65) Prior Publication Data
US 2010/0021695 A1   Jan. 28, 2010

(30) Foreign Application Priority Data

Dec. 27, 2006 (JP) ............... P2006-352549
Apr. 5, 2007 (JP) ............... P2007-099332
Jun. 8, 2007 (JP) ............... P2007-152658
Jun. 15, 2007 (JP) ............... P2007-158735
Jul. 12, 2007 (JP) ............... P2007-183130

(51) Int. Cl.
*B32B 3/00* (2006.01)
*B32B 3/28* (2006.01)
*B32B 3/30* (2006.01)
*B32B 19/00* (2006.01)
*B32B 9/00* (2006.01)

(52) U.S. Cl.
USPC ........... 428/172; 428/167; 428/408; 428/688; 428/689; 428/702

(58) Field of Classification Search
USPC ................. 428/156, 167, 172, 131, 688, 689, 428/693.1, 697, 698, 699, 700, 701, 702, 428/408, 914, 469, 471, 472
See application file for complete search history.

(56) References Cited

U.S. PATENT DOCUMENTS 6,046,758 A * 4/2000 Brown et al. .................. 347/203
6,475,836 B1 * 11/2002 Suzawa et al. ................ 438/149

(Continued)

FOREIGN PATENT DOCUMENTS

CN   1 061 629      6/1992
CN   1457627 A     11/2003

(Continued)

OTHER PUBLICATIONS

English translation of International Preliminary Report on Patentability of PCT/JP2007/075205 dated Jul. 9, 2009.

(Continued)

*Primary Examiner* — Catherine A Simone
(74) *Attorney, Agent, or Firm* — Antonell, Terry, Stout & Kraus, LLP.

(57) ABSTRACT

An engraved plate which includes a substrate and an insulating layer on a surface of the substrate wherein a concave portion which increases in width toward an opening and to which the substrate is exposed is formed at the insulating layer, and an engraved plate, a substrate with conductor layer pattern manufactured by a transferring method using the engraved plate, and a conductor layer pattern are provided.

29 Claims, 17 Drawing Sheets

(56) References Cited

U.S. PATENT DOCUMENTS

| | | | |
|---|---|---|---|
| 7,470,982 B2 * | 12/2008 | Takashima et al. | 257/706 |
| 2002/0119665 A1 | 8/2002 | Chapman | |
| 2004/0081760 A1 * | 4/2004 | Burns et al. | 427/269 |
| 2005/0244995 A1 | 11/2005 | Fukuchi et al. | |
| 2005/0260411 A1 * | 11/2005 | Ravi | 428/408 |
| 2006/0177665 A1 * | 8/2006 | Bast et al. | 428/411.1 |
| 2008/0063840 A1 * | 3/2008 | Morita et al. | 428/156 |

FOREIGN PATENT DOCUMENTS

| | | |
|---|---|---|
| EP | 1 732 128 A1 | 12/2006 |
| JP | 1-226193 | 9/1989 |
| JP | 6-037177 | 2/1994 |
| JP | 09-018119 | 1/1997 |
| JP | 11-026980 | 1/1999 |
| JP | 11-163372 | 6/1999 |
| JP | 11-291438 | 10/1999 |
| JP | 11-309950 | 11/1999 |
| JP | 2000-031413 | 1/2000 |
| JP | 2000-077823 | 3/2000 |
| JP | 2001-071451 | 3/2001 |
| JP | 2001-232747 | 8/2001 |
| JP | 2002-009484 | 1/2002 |
| JP | 2002-038292 | 2/2002 |
| JP | 2002-506484 | 2/2002 |
| JP | 2002038292 A * | 2/2002 |
| JP | 2002-359445 | 12/2002 |
| JP | 2004-518563 | 6/2004 |
| JP | 2004-186416 | 7/2004 |
| JP | 2004-249475 | 9/2004 |
| JP | 2005-052507 | 3/2005 |
| JP | 2005-057159 | 3/2005 |
| JP | 2005-139544 | 6/2005 |
| JP | 2005-294687 | 10/2005 |
| JP | 2005-346043 | 12/2005 |
| JP | 2006-032686 | 2/2006 |
| JP | 2006-215533 | 8/2006 |
| JP | 2006-231668 | 9/2006 |
| JP | 2007-250925 | 9/2007 |
| KR | 2002-0093927 | 12/2002 |
| WO | WO 02/066251 A3 | 8/2002 |
| WO | WO 2005091360 A1 * | 9/2005 |
| WO | WO 2005117123 A1 * | 12/2005 |
| WO | WO 2006/068175 | 6/2006 |

OTHER PUBLICATIONS

Taiwan Office Action of Appln. 096150687 dated Nov. 29, 2010 with partial translation.
Taiwan Office Action of Appln. No. 96150687 dated May 7, 2010 with partial translation.
JP Office Action of Appln. No. 2007-337723 dated Mar. 13, 2012 with partial English translation.
JP Office Action of Appln. No. 2007-337878 dated Mar. 13, 2012 with partial English translation.
Chinese Office Action of Appln. No. 200780045844.6 dated Feb. 13, 2012 with partial English translation.
EP Search Report of Appln. No. 07860426.1 dated Jun. 19, 2012 in English.
CN office action of Appln No. 2007-80045844.6 dated Oct. 22, 2012 with partial English translation.
JP Office Action of Appln. No. 2007-337881 dated Jun. 26, 2012 with English translation.
JP Office Action of Appln. No. 2007-337878 dated Jun. 26, 2012 with English translation.
Chinese office action of Appln. No. 200780045844.6 dated Jul. 23, 2013 with English translation.
KR Office Action of Appln. No. 10-2009-7012064 dated Dec. 2, 2013 with a partial English translation.
CN office action Appln. No. 200780045844.6 dated Nov. 4, 2013 with English translation.

\* cited by examiner

ENGRAVED PLATE AND SUBSTRATE WITH CONDUCTOR LAYER PATTERN USING THE SAME

TECHNICAL FIELD

The present invention relates to an engraved plate and a method of manufacturing the same. The present invention also relates to a substrate with conductor layer pattern manufactured by using an engraved plate (conductive substrate for plating) having a plated portion and a transparent electromagnetic wave shielding member manufactured by the substrate with conductor layer pattern. Furthermore, the present invention relates to a patterned metal foil manufactured by using an engraved plate (conductive substrate for plating) having a plated portion.

BACKGROUND ART

Various engraved plates for forming a fine pattern such as a color filter used in a color liquid crystal display apparatus, for gravure printing, for coating of an adhesive compound, and for transfer coating of a resist material are conventionally used.

Patent Documents 1 and 2 disclose a method of manufacturing an engraved plate. In this method, a metal which is easily etched is plated on a metal roll-like or plate-like substrate, a photosensitive resin is coated to an upper surface of the resultant structure, a direct latent image is formed by exposure, and a resin on an unnecessary portion is removed to form an etching resist pattern. The metal is etched, and the resin is stripped. Furthermore, the documents disclose that nickel electroplating or chromium electroplating is performed on a surface of the engraved plate to improve the plate life.

However, the manufacturing method includes a large number of steps. Since the method has an etching step, depending on cases, further has a chromium electroplating step, an accurate shape cannot be easily given, and a uniform shape of a recessed portion, linearity of a concave portion edge and accuracy of a concave portion thickness cannot be easily obtained.

In recent years, as a substitute of chromium electroplating performed after etching, a silicon oxide layer, a titanium nitride layer, or a diamond-like carbon (to be referred to as DLC hereinafter) layer serving as an inorganic material is used. However, as in a conventional method, an etching step which cannot easily give an accurate shape is required.

Patent Document 3 discloses an electromagnetic wave shielding plate including, as an electromagnetic wave shield layer, a metal mesh formed by using an engraved plate. The electromagnetic wave shielding plate is manufactured such that a metal is electrodeposited with a metal electrolytic solution on an electrodeposition substrate on which a mesh-like metal can be electrodeposited, and the mesh-like metal is bonded to and transferred to a substrate for the electromagnetic wave shielding plate through a bonding agent. In the document, the electrodeposition substrate may be manufactured as follows. The document discloses that an inverted pattern of a mesh pattern is formed on a conductive substrate such as a metal plate by an insulating film which blocks electrodeposition, and an electrodeposition portion on which metal electrodeposition can be performed in the form of a mesh is exposed. The document discloses that the electrodeposition substrate is manufactured by forming a convex conductive mesh layer on an insulating layer support member.

Patent Document 3 discloses that, in manufacturing of the electrodeposition substrate, an insulating layer is formed with a photoresist. When such electrodeposition substrate is used, the electrodeposition substrate can be repeatedly used several times or about several tens of times, however, the electrodeposition substrate cannot be used several hundred times to several thousand times, and the electrodeposition substrate is insufficient to mass-product an electromagnetic wave shielding plate. This is because an insulating layer forming a mesh pattern on the electrodeposition substrate suffers peeling stress by adhesion and transfer, and the insulating layer is peeled from the conductive substrate by several repeated uses.

Patent Document 3 discloses an electrodeposition substrate in which $SiO_2$ is formed on a conductive substrate and photoetched to form an insulating film. However, since the photoetching step is performed, the number of steps in manufacturing the electrodeposition substrate increases. Overetching makes a concave portion narrow toward the opening of the concave portion.

Patent Document 3 discloses a method of forming a necessary concave portion by photolithography or carving on a metal substrate surface, burying and curing a strong insulating resin in the concave portion, and curing the insulating resin to manufacture an electrodeposition substrate having an electrodeposition portion on which a metal can be electrodeposited in the shape of a mesh. However, when the concave portion is formed in the metal substrate by this method, the method does not produce sufficient results in pattern accuracy, a defect-free pattern and required time for pattern manufacturing. When an insulating resin is used in an insulating layer, the endurance (durability) of the insulating layer is not sufficient.

Patent Document 3 discloses that, when a single metal plate consists of tantalum, titanium, or the like or the surface is a metal surface consisting of the material, after a resist is formed on only a corresponding to a portion constituting the electrodeposition portion, anodization is performed to form an insulating oxide layer consisting of titanium oxide, tantalum oxide, or the like, and the resist is removed, and a resultant electrodeposition substrate has an excellent effect. However in cross section of the electrodeposition substrate, the mesh pattern of concave portion (electrodeposition portion) and the insulating oxide layer are substantially flush and do not substantially uneven, since the insulating oxide layer is very thin, and therefore the concave portion can not determine a shape of a electrodeposition layer. More specifically, a line shape to be electrodeposited is not easily controlled. The insulating oxide layer obtained by anodization is deteriorated in endurance, and the insulating oxide layer is not actually suitable for continuous operations. In fact, in electroforming of Ni, anodization is forced to be performed before transfer. Furthermore, since the insulating oxide layer obtained by the anodization has poor insulation performance, the insulating oxide layer is not suitable for high-speed electrolytic plating. However, when the insulating oxide layer is obtained by anodization of aluminum, relatively high insulating performance can be obtained. However, mechanical endurance is deteriorated.

Patent Document 3 discloses a method using a electrodeposition substrate in which a convex conductive mesh layer is formed on an insulating layer support member. According to this method, in fact, a metal is electrodeposited on a side surface of the conductive mesh to form a resistor to adhesion and transfer of the mesh-like electrodeposition metal layer, and the metal layer cannot be peeled. Even though the metal layer can be peeled, the mesh pattern is bent and broken, and electromagnetic wave shielding property is deteriorated.

Patent Document 4 discloses a base sheet for metal layer transfer used to manufacture a circuit pattern of an electronic part and an electrode pattern of a ceramic capacitor. The base sheet for metal layer transfer includes a base metal layer and an electric insulating layer. A convex pattern to form a transfer metal layer by electrolytic plating is formed on the surface of the base metal layer. The electric insulating layer is formed on a portion on which the convex pattern is not formed on the surface of the base metal layer. According to Patent Document 4, a method of manufacturing a base sheet for metal layer transfer is disclosed. In this method, on the surface of the base metal layer, an etching resist is formed by the same pattern as that of the convex pattern by using a dry film resist or the like, and a surface of the base metal layer exposed without being covered with the etching resist is etched to form a concave portion. Thereafter, the etching resist is removed, an electric insulating layer is formed on the entire surface of the etched base metal layer, and the electric insulating layer is polished until the convex pattern is exposed. According to this method, the surface of the electric insulating layer and the surface of the convex pattern of the base metal layer are arranged on the same plane to obtain a flush surface. Patent Document 4 discloses, as another example of the manufacturing method, a method of forming an electric insulating layer consisting of a plating resist on a surface of a base metal layer with an inverted pattern of a convex pattern by using a dry film resist or the like and forming an electrolytic plating metal layer by a convex pattern on the surface of the base metal layer exposed between the electric insulating layers. In this method, the thickness of the electrolytic plating metal layer is made larger than the electric insulating layer. When the surface of the electrolytic plating metal layer is formed at a level higher than that of the surface of the electric insulating layer, in a transfer state of a transfer metal layer formed on the convex pattern by electrolytic plating to an adhesive sheet, the electric insulating layer can be prevented from damaging the adhesive sheet as disclosed in Patent Document 4.

In the Patent Document 4, as a material of the electric insulating layer, an organic insulating resin is disclosed. However, when the transfer metal layer, which is formed on the convex pattern by using the base sheet for metal layer transfer in which the surface of the electric insulating layer and the surface of the convex pattern of the base metal layer are arranged on the same plane to form a flush surface, is transferred to an adhesive sheet, the electric insulating layer on the electrodeposition substrate suffers peeling stress by adhesion and transfer, and the electric insulating layer is peeled from the electrodeposition substrate by several repeated uses.

Patent Document 4 discloses that a transfer metal layer, which formed on a convex pattern by using a base sheet for metal layer transfer in which a surface of the convex pattern constituted by an electrolytic plating metal layer is formed at a level higher than that of a surface of an electric insulating layer, is transferred to an adhesive sheet. However, in this case, the transfer metal layer is plated on a side surface of the convex pattern to form a resistor to adhesion and transfer of the transfer metal layer, and the transfer metal layer cannot be peeled from the convex pattern. Even though the metal layer can be peeled, the mesh pattern is bent and broken, and electromagnetic wave shielding property is deteriorated.

In Patent Document 4, when a method of manufacturing a base sheet for metal layer transfer includes forming of an etching resist on the surface of the base metal layer and etching of the surface of the base metal layer exposed without covered with the etching resist, the number of steps increases, and the productivity is poor.

More specifically, an engraved plate having a uniform-shaped concave portion, a linear edge, high accuracy in depth, and excellent endurance is desired in the past. A method of manufacturing a substrate with conductor layer pattern which is patterned to have electric conductivity and optical transparency by using a transfer method with good productivity is required. Furthermore, an engraved plate for plating which can be easily manufactured is required.

Patent Document 1: JP-A-2006-231668
Patent Document 2: JP-A-2001-232747
Patent Document 3: JP-A-11-26980
Patent document 4: JP-A-2004-186416

DISCLOSURE OF THE INVENTION

The present invention relates to the following aspects.

1. An engraved plate including a substrate and an insulating layer on a surface of the substrate, wherein a concave portion which increases in width toward an opening is formed at the insulating layer.

2. The engraved plate according to item 1, wherein the substrate is insulative or conductive.

3. The engraved plate according to item 1, wherein the concave portion is to hold an object to be transferred.

4. The engraved plate according to item 2, wherein a bottom surface of the concave portion is a layer containing diamond-like carbon or an inorganic material.

5. The engraved plate according to item 1, wherein the concave portion is a portion to form a plating layer.

6. The engraved plate according to item 5, wherein a bottom surface of the concave portion is conductive.

7. The engraved plate according to item 1, wherein the concave portion is formed to draw a geometric figure on an insulating layer or to draw a geometric figure by itself.

8. The engraved plate according to item 1, wherein the insulating layer is a layer containing diamond-like carbon or an inorganic material.

9. The engraved plate according to item 8, wherein a thickness of the insulating layer is 0.1 to 100 μm.

10. The engraved plate according to item 8, wherein the inorganic material is a layer containing $Al_2O_3$ or $SiO_2$.

11. The engraved plate according to item 8 or 9, wherein the insulating layer is a layer containing diamond-like carbon.

12. The engraved plate according to item 11, wherein a hardness of the layer containing diamond-like carbon is 10 to 40 GPa.

13. The engraved plate according to item 11 or 12, including an intermediate layer containing at least one selected from Ti, Cr, W, Si, nitrides thereof, and carbides thereof between the layer containing diamond-like carbon and the substrate.

14. The engraved plate according to any one of items 1 to 13, wherein an angle of a side surface of the concave portion is 30° or more to less than 90°.

15. The engraved plate according to any one of items 1 to 14, wherein the angle of the side surface of the concave portion is 30° or more to 80° or less.

16. The engraved plate according to any one of items 1 to 15, wherein the engraved plate is a roll or winded on a roll.

17. The engraved plate according to any one of items 1 to 15, wherein the engraved plate is roughly a flat plate.

18. The engraved plate according to item 1, wherein a surface of the substrate consists of steel, Ti, conductive diamond-like carbon, or a conductive inorganic material.

19. The engraved plate according to any one of items 1 to 18, wherein the concave portion has a minimum width of 1 to 40 μm, a maximum width of 2 to 60 μm, and an interval of 50 to 1000 μm.

20. The engraved plate according to any one of items 1 to 18, wherein the insulating layer is constituted by a convex shape having a bottom area of 1 to $1\times10^6$ square micrometers, and the convex shapes are distributed at intervals of 1 to 1000 μm.

21. A method of manufacturing an engraved plate, including:
(i) the step of forming a removable convex pattern on a surface of a substrate;
(ii) the step of forming an insulating layer on the surface of the substrate on which the removable convex pattern is formed; and
(iii) the step of removing the convex pattern to which the insulating film adheres.

22. The method of manufacturing an engraved plate according to item 21, wherein the convex pattern draws, as a planar shape, a geometric-graphic shape or a geometric figure.

23. The method of manufacturing an engraved plate according to item 21 or 22, wherein the substrate is conductive.

24. The method of manufacturing an engraved plate according to any one of items 21 to 23, wherein the convex pattern is formed by a photolithography method using a photosensitive resist.

25. The method of manufacturing an engraved plate according to any one of items 21 to 24, wherein insulating layers having different properties or characteristics are formed on the substrate and a side surface of the convex pattern.

26. The method of manufacturing an engraved plate according to item 25, wherein a distance of a boundary surface between the insulating layer formed on the substrate and the insulating layer formed on the side surface of the convex pattern from the side surface (serving as a plane vertical to the substrate) of the convex pattern does not decrease in an upright direction of the convex pattern and increases as a whole.

27. The method of manufacturing an engraved plate according to item 26, wherein an angle of the boundary surface is 30° or more to less than 90° with respect to the substrate.

28. The method of manufacturing an engraved plate according to item 26 or 27, wherein the angle of the boundary surface is 30° or more to 80° or less with respect to the substrate.

29. The method of manufacturing an engraved plate according to any one of items 21 to 28, wherein a pattern shape of the convex portion has a width of 1 to 40 μm, an interval of 50 to 1000 μm, and a height of 1 to 30 μm, thereby drawing a geometric figure.

30. The method of manufacturing an engraved plate according to any one of items 21 to 29, wherein the insulating layer is a layer containing diamond-like carbon or an inorganic material.

31. The method of manufacturing an engraved plate according to item 30, wherein the inorganic material is $Al_2O_3$ or $SiO_2$.

32. The method of manufacturing an engraved plate according to item 30, wherein the insulating layer consists of diamond-like carbon.

33. The method of manufacturing an engraved plate according to item 32, wherein a hardness of a diamond-like carbon layer formed on the substrate is higher than a hardness of a diamond-like carbon layer formed on the side surface of the convex pattern.

34. The method of manufacturing an engraved plate according to item 32 or 33, wherein the hardness of the diamond-like carbon layer formed on the substrate is 10 to 40 GPa, and the hardness of the diamond-like carbon layer formed on the side surface of the convex pattern is 1 to 15 Gpa.

35. The method of manufacturing an engraved plate according to any one of items 32 to 34, wherein the DLC layer is formed by a vacuum deposition method, a sputtering method, an ion-plating method, a cathodic arc deposition method, an ionization deposition method, or a plasma CVD method.

36. The method of manufacturing an engraved plate according to any one of item 35, wherein the DLC layer is formed by a plasma CVD method.

37. The method of manufacturing an engraved plate according to any one of items 21 to 36, wherein before the step of forming an insulating layer on the surface of the substrate on which the convex pattern is formed is performed, the step of forming an intermediate layer on the surface of the substrate on which the convex pattern is formed is performed.

38. The method of manufacturing an engraved plate according to item 37, wherein the intermediate layer contains at least one of Ti, Cr, W, Si, nitrides thereof, and carbides thereof.

39. The method of manufacturing an engraved plate according to any one of items 21 to 38, wherein a thickness of the insulating layer is 0.5 to 20 μm.

40. A method of manufacturing an engraved plate, including:
(i) the step of forming an insulating layer on a surface of a substrate; and
(ii) the step of forming a concave portion which increases in width toward an opening at the insulating layer by a laser.

41. The method of manufacturing an engraved plate according to item 40, wherein the substrate is conductive.

42. The method of manufacturing an engraved plate according to item 40 or 41, wherein the laser is a femtosecond laser.

43. The method of manufacturing a patterned metal foil according to any one of items 5 to 18, wherein a metal is deposited on a concave portion of the engraved plate.

44. The method of manufacturing a patterned metal foil according to item 42, wherein after the metal is deposited, the deposited metal is peeled.

45. A method of manufacturing a patterned metal foil including: and
(i) the step of depositing a metal on a concave portion of the engraved plate according to any one of items 5 to 18 and 20;
(ii) the blacking process step of performing a blacking process to the deposited metal.

46. The method of manufacturing a patterned metal foil according to item 45, wherein the conductive layer forming step and the blacking process step are performed in the same plating solution.

47. The method of manufacturing a patterned metal foil according to item 46, wherein the plating solution is a copper pyrophosphate plating solution or a copper sulfate plating solution containing a brightening agent.

48. A method of manufacturing a patterned metal foil including:
(i) the conductive layer forming step of depositing a metal on a concave portion of the engraved plate according to any one of items 5 to 18 and 20;

(ii) the blacking process step of performing a blacking process to the deposited metal; and (iii) the step of peeling the metal treated by the blacking process.

49. A method of manufacturing a substrate with patterned metal foil including:

(i) the conductive layer forming step of depositing a metal on a concave portion of the engraved plate according to any one of items 5 to 18 and 20 by plating;

(ii) the blacking process step of performing a blacking process to the deposited metal; and (iii) the step of transferring the metal treated by the blacking process to another substrate.

50. The method of manufacturing a substrate with conductor layer pattern including:

(i) the step of depositing a metal on a concave portion of the engraved plate according to any one of items 5 and 6; and (ii) the step of transferring the metal deposited on the concave portion of the conductive substrate to another substrate.

51. The method of manufacturing a substrate with conductor layer pattern according to item 50, wherein a thickness of a metal deposited on the concave portion is not more than twice a depth of the concave portion.

52. The method of manufacturing a substrate with conductor layer pattern according to item 50 or 51, wherein the another substrate has an adhesion layer having a surface having adhesion.

53. The method of manufacturing a substrate with conductor layer pattern according to item 52, wherein the bonding layer contains a photo-curable bonding agent, and the (ii) step includes the step of setting an bonding layer on the substrate and irradiating light on the bonding layer to cure the bonding layer and the step of transferring a metal to another substrate.

54. The method of manufacturing a substrate with conductor layer pattern according to any one of items 50 to 53, wherein the (i) step includes the step of performing a blacking process to the metal after the metal is deposited on the concave portion.

55. The method of manufacturing a substrate with conductor layer pattern according to any one of items 50 to 54, wherein the (ii) step includes the step of performing a blacking process to the metal after the metal is transferred to the another substrate.

56. A substrate with conductor layer pattern manufactured by the method according to any one of items 50 to 55.

57. A transparent electromagnetic wave shielding member wherein a conductor layer pattern of the substrate with conductor layer pattern according to item 56 is covered with a resin.

58. A transparent electromagnetic wave shielding plate obtained by bonding the substrate with conductor layer pattern according to item 56 or the transparent electromagnetic wave shielding member according to item 57 to a transparent substrate.

59. The transparent electromagnetic wave shielding plate according to item 57 or 58, wherein the plate has a pattern different from the conductor layer pattern in a region in which the conductor layer pattern is formed.

The present invention further relates to the following aspects.

1A. A conductive substrate for plating, i.e., an engraved plate wherein an insulating layer is formed on a surface of a conductive substrate, and a concave portion for plating which increases in width toward an opening is formed at the insulating layer.

2A. The engraved plate according to item 1A, wherein the concave portion for plating is formed to draw a geometric figure at the insulating layer or to draw a geometric figure by itself.

3A. The engraved plate according to item 1 or 2, wherein the insulating layer consists of DLC or an inorganic material.

4A. The engraved plate according to any one of items 1A to 3A, wherein the insulating layer is DLC, $Al_2O_3$, or $SiO_2$.

5A. The engraved plate according to any one of items 1 to 4, wherein the insulating layer consists of DLC having a hardness of 10 to 40 GPa.

6A. The engraved plate according to any one of items 1A to 5A, wherein a minimum width of the concave portion is 1 to 40 μm, a maximum width of the concave portion is 2 to 60 μm, and an interval of the concave portion is 50 to 1000 μm.

7A. The engraved plate according to any one of items 1A to 6A, wherein an angle of a side surface of the concave portion is 30° or more to less than 90° on an insulating layer side.

8A. The engraved plate according to any one of items 1A to 7A, wherein an angle of the side surface of the concave portion is 30° or more to 60° or less on the insulating layer side.

9A. The engraved plate according to any one of items 1A to 8A, wherein a thickness of the insulating layer is 0.5 to 20 μm.

10A. The engraved plate according to any one of items 1A to 9A, wherein an intermediate layer including at least one of Ti, Cr, W, Si, nitrides thereof, or carbides thereof is interposed between the substrate and the insulating layer.

11A. The engraved plate according to any one of items 1A to 10A, wherein a surface of the substrate consists of steel or Ti.

12A. The engraved plate according to any one of items 1A to 11A, wherein the engraved plate is a conductive roll (drum) or winded on a roll.

13A. A method of manufacturing an engraved plate including:

(i) the step of forming a removable convex pattern on a surface of a conductive substrate;

(ii) the step of forming an insulating layer consisting of DLC or an inorganic material on the surface of the substrate on which the removable convex pattern is formed; and (iii) the step of removing the convex pattern to which the insulating film adheres.

14A. The method of manufacturing an engraved plate according to item 13A, wherein the removable convex pattern is formed by a photolithography method using a photosensitive resist.

15A. The method of manufacturing an engraved plate according to item 13A or 14A, wherein insulating layers having different properties or different characteristics are formed on the substrate and a side surface of the convex pattern.

16A. The method of manufacturing an engraved plate according to any one of items 13A to 15A, wherein a distance of a boundary surface between the insulating film formed on the substrate and the insulating layer formed on the side surface of the convex pattern from the side surface (serving as a plane vertical to the substrate) of the convex pattern does not decrease in an upright direction of the convex pattern and increases as a whole.

17A. The method of manufacturing an engraved plate according to item 16A, wherein an angle of the boundary surface is 30° or more to less than 90° with respect to the substrate.

18A. The method of manufacturing an engraved plate according to item 16A or 17A, wherein the angle of the boundary surface is not less 30° to 60° or less with respect the substrate.

19A. The method of manufacturing an engraved plate according to items 13A to 18A, wherein a pattern shape of the removal convex portion has a width of 1 to 40 µm, an interval of 50 to 1000 µm, and a height of 1 to 30 µm, thereby drawing a geometric figure.

20A. The method of manufacturing an engraved plate according to any one of items 13A to 19A, wherein the insulating layer is DLC or an inorganic material.

21A. The method of manufacturing an engraved plate according to any one of item 20A, wherein the inorganic material is $Al_2O_3$ or $SiO_2$.

22A. The method of manufacturing an engraved plate according to item 20A, wherein the insulating layer is a film consisting of DLC.

23A. The method of manufacturing an engraved plate according to item 22A, wherein a hardness of a DLC film formed on the substrate is higher than a hardness of a DLC film formed on the side surface of the convex pattern.

24A. The method of manufacturing an engraved plate according to item 23A, wherein the hardness of the DLC film formed on the substrate is 10 to 40 GPa, and the hardness of the DLC film formed on the side surface of the convex pattern is 1 to 15 Gpa.

25A. The method of manufacturing an engraved plate according to any one of items 22A to 24A, wherein the DLC film is formed by a vacuum deposition method, a sputtering method, an ion-plating method, a cathodic arc deposition method, an ionization deposition method, or a plasma CVD method.

26A. The method of manufacturing an engraved plate according to any one of 13A to 25A, wherein before the step of forming an insulating layer on the surface of the substrate on which the removal convex pattern is formed is performed, the step of forming an intermediate layer on the surface of the substrate on which the removal convex pattern is formed is performed.

27A. The method of manufacturing an engraved plate according to item 26A, wherein the intermediate layer includes anyone of Ti, Cr, W, Si, nitrides thereof, and carbides thereof.

28A. The method of manufacturing an engraved plate according to any one of items 13A to 27A, wherein a thickness of the insulating layer is 0.5 to 10 µm.

29A. A method of manufacturing a substrate with conductor layer pattern, includes:
(i) the step of depositing a metal on a concave portion of the engraved plate according to any one of items 1A to 12A by plating; and
(ii) the step of transferring a metal deposited on the concave portion of the substrate to another substrate.

30A. The method of manufacturing a substrate with conductor layer pattern according to item 29A, wherein a thickness of the metal deposited by plating is not more than twice a depth of the concave portion.

31A. The method of manufacturing a substrate with conductor layer pattern according to item 29A or 30A, wherein the other substrate has an adhesion layer having adhesion at least on the surface.

32A. The method of manufacturing a substrate with conductor layer pattern according to any one of items 29A and 31A, including the step of performing a blacking process to the metal deposited on the concave portion of the substrate.

33A. The method of manufacturing a substrate with conductor layer pattern according to any one of items 29A to 32A, further including the step of performing a blacking process to the metal pattern transferred to the other substrate, i.e., the conductor layer pattern.

34A. A substrate with conductor layer pattern manufactured by the method according to any one of items 29A to 33A.

35A. A transparent electromagnetic wave shielding member obtained by covering the conductive pattern of the substrate with conductor layer pattern according to item 34 with a resin.

36A. A transparent electromagnetic wave shielding plate obtained by bonding the substrate with conductor layer pattern according to item 34A or the transparent electromagnetic wave shielding member according to item 35 to a transparent substrate.

According to one aspect of the present invention, in the engraved plate having the concave portion to form a plating layer, since the concave portion on which the metal layer is formed by plating increases in width toward an opening, the conductor layer pattern obtained by plating is easily peeled. Since the insulating layer is consisting of DLC or an inorganic material, the insulating layer is excellent in adhesion to the substrate and has excellent peeling resistance. In the insulating layer, adhesion between the substrate and the insulating layer can be improved by an intermediate layer. For this reason, the life time of the engraved plate can be further elongated.

According to one aspect of the present invention, in the manufacture of the engraved plate having the concave portion which increases in width toward the opening, a convex pattern is formed on the substrate, and, after the insulating layer is formed, the convex pattern to which the insulating film adheres is removed to make it possible to manufacture the concave portion. Therefore, the engraved plate can be easily manufactured and has good productivity.

According to one aspect of the present invention, the number of steps is small, and, in particular, the concave portion which increases in width toward the opening can be easily manufactured. For this reason, the engraved plate can be manufactured at high production efficiency.

According to one aspect of the present invention, since the conductor layer pattern obtained by plating can be easily peeled, a substrate with conductor layer pattern having excellent optical transparency can be easily manufactured and also a substrate with conductor layer pattern having excellent electromagnetic wave shielding property or excellent electric conductivity can be easily manufactured. Furthermore, the substrate with conductor layer pattern can be manufactured at high production efficiency.

According to one aspect of the present invention, an electromagnetic wave shielding member and an electromagnetic wave shielding plate having excellent optical transparency and excellent electromagnetic wave shielding property can be manufactured at high production efficiency by using a specific conductor layer pattern.

The present invention relates to the following aspects.

1B. An engraved plate having DLC or an inorganic material on at least a surface, wherein a concave portion to hold an object to be transferred is formed on the surface, and the concave portion is formed to increase in width toward an opening of the concave portion.

2B. The engraved plate according to item 1B, wherein a bottom surface of the concave portion also consists of DLC or an inorganic material.

3B. The engraved plate according to item 1B or 2B, wherein the DLC or the inorganic material is a film or a layer having a thickness of 0.1 to 100 μm.

4B. The engraved plate according to any one of items 1B to 3B, having DLC on at least a surface.

5B. The engraved plate according to item 4B, wherein a hardness of the DLC is 10 to 40 GPa.

6B. The engraved plate according to any one of claims 4B and 5B, wherein the layer or film of the DLC is formed on a substrate for engraved plate through an intermediate layer containing at least one of Ti, Cr, W, Si, nitrides thereof, and carbides thereof.

7B. The engraved plate according to any one of items 1B to 6B, wherein an angle of a side surface of the concave portion is 30° or more to less than 90°.

8B. The engraved plate according to item 7B, wherein the angle of a side surface of the concave portion is 30° or more to 60° or less.

9B. The engraved plate according to items 1B to 7B, wherein the engraved plate has a roll-like shape.

10B. The engraved plate according to items 1 to 7, wherein the engraved plate is roughly a flat plate.

11B. A method of manufacturing an engraved plate including:

(A) the step of forming a removal convex pattern on a surface of a substrate;

(B) the step of forming a film consisting of DLC or an inorganic material on a surface of the substrate on which the removal convex pattern is formed; and (C) the step of removing the convex pattern.

12B. The method of manufacturing an engraved plate according to item 11B, wherein the substrate has DLC or an inorganic material on the surface of the substrate.

13B. The method of manufacturing an engraved plate according to item 11B or 12B, wherein the removable convex pattern is formed by a photolithography method using a photosensitive resist.

14B. The method of manufacturing an engraved plate according to any one of items 11B to 13B, wherein the films consisting of DLC or an inorganic material is formed on the substrate and a side surface of the convex pattern to have different properties or characteristics.

15B. The method of manufacturing an engraved plate according to any one of items 11B to 14B, wherein a distance of a boundary surface between the film formed on the substrate and the film formed on the side surface of the convex pattern from the side surface (serving as a plane vertical to the substrate) of the convex pattern does not decrease in an upright direction of the convex pattern and increases as a whole.

16B. The method of manufacturing an engraved plate according to any one of items 11B to 15B, wherein the film formed on the substrate is DLC.

17B. The method of manufacturing an engraved plate according to item 16B, wherein a hardness of the DLC film formed on the substrate is higher than a hardness of the DLC film formed on the side surface of the convex pattern.

18B. The method of manufacturing an engraved plate according to item 17B, wherein the hardness of the DLC film formed on the substrate is 10 to 40 GPa, and the hardness of the DLC film formed on the side surface of the convex pattern is 1 to 15 GPa.

19B. The method of manufacturing an engraved plate according to any one of items 11B to 18B, wherein the DLC film is formed by a vacuum deposition method, a sputtering method, an ion-plating method, a cathodic arc deposition method, an ionization deposition method, or a plasma CVD method.

20B. The method of manufacturing an engraved plate according to any one of 10B to 19B, wherein before the step of forming a film on the surface of the substrate on which the removal convex pattern is formed is performed, the step of forming an intermediate layer on the surface of the substrate on which the removal convex pattern is formed is performed.

21B. The method of manufacturing an engraved plate according to item 20B, wherein the intermediate layer includes anyone of Ti, Cr, W, Si, nitrides thereof, and carbides thereof.

22B. The method of manufacturing an engraved plate according to any one of items 11B to 21B, wherein a thickness of the film consisting of DLC or an inorganic material is 0.1 to 100 μm.

According to one aspect of the present invention, the engraved plate can easily achieve a uniform shape of the concave portion, linearity of a concave portion edge, and accuracy in depth of the concave portion. This is because, in manufacturing of the engraved plate, etching of the substrate which is difficult to be performed at high accuracy is made unnecessary, and chromium electroplating which is difficult to be performed at high accuracy is made unnecessary. Therefore, according to an aspect of the present invention, by using the engraved plate, more uniform, more accurate, more precise transfer coating can be performed.

According to one aspect of the present invention, the engraved plate can be easily manufactured with good productivity because the convex pattern is formed on the substrate, and after the film is formed, the convex pattern is removed to make it possible to form the concave portion.

According to one aspect of the present invention, the engraved plate is useful as an engraved plate for gravure printing or an engraved plate for coating of adhesive compound. According to one aspect of the present invention, the engraved plate is further useful as an engraved plate for transfer coating of resist, an engraved plate for transfer coating to a substrate such as a glass substrate of ink for color filter to form a fine pattern of a color filter used in a color liquid crystal display apparatus. These engraved plates can be usefully used in the steps in manufacturing a microscopic structure such as precision electronic part.

Furthermore, according to one aspect of the present invention, an engraved plate surface consists of DLC or an inorganic material is excellent in abrasion resistance. When a film consisting of DLC or an inorganic material is formed on the engraved plate surface, adhesion to the substrate is excellent, and peeling resistance is excellent. Adhesion between the substrate and the film can be improved by the intermediate layer. Therefore, the life time of the engraved plate in repetitive use can be further elongated.

According to one aspect of the present invention, the method of manufacturing an engraved plate has a small number of steps. In particular, since the engraved plate which increases in width toward an opening of the concave portion can be easily manufactured, the engraved plate can be manufactured at high production efficiency.

Furthermore, the present invention relates to the following aspects.

1C. A method of manufacturing a metal foil, i.e., a patterned metal foil including:

(X) the step of depositing a metal by plating on a surface of a conductive substrate for plating, i.e., an engraved plate in which an insulating layer is formed on a surface of a conductive substrate and a concave portion which increases in width toward an opening direction and the substrate is exposing is formed at the insulating layer; and (Y) the step of peeling the metal deposited on the surface of the substrate.

2C. The method of manufacturing a patterned metal foil according to item 1C, wherein the insulating layer is formed to draw a geometric figure or a geometric figure by itself.

3C. The method of manufacturing a patterned metal foil according to item 1C or 2C, wherein the insulating layer consists of DLC or an inorganic material.

4C. The method of manufacturing a patterned metal foil according to any one of items 1C to 3C, wherein the insulating layer consists of DLC, $Al_2O_3$, or $SiO_2$.

5C. The method of manufacturing a patterned metal foil according to any one of items 1C to 4C, wherein the insulating layer consists of DLC having a hardness of 10 to 40 GPa.

6C. The method of manufacturing a patterned metal foil according to any one of items 1C to 5C, wherein the insulating layer has convex shapes having bottom surface areas of 1 to $1 \times 10^6$ square micrometers, and the convex shapes are distributed at intervals of 1 to 1000 μm.

7C. The method of manufacturing a patterned metal foil according to any one of items 1C to 6C, wherein an angle of a side surface of the concave portion is 30° or more to less than 90°.

8C. The method of manufacturing a patterned metal foil according to any one of items 1C to 7C, wherein an angle of the side surface of the concave portion is 30° or more to 60° or less on an insulating layer side.

9C. The method of manufacturing a patterned metal foil according to any one of items 1C to 8C, wherein a thickness of the insulating layer is 0.1 to 100 μm.

10C. The method of manufacturing a patterned metal foil according to any one of items 1C to 9C, wherein an intermediate layer containing at least one of Ti, Cr, W, Si, nitrides thereof, and carbides thereof is interposed between the substrate and the insulating layer.

11C. The method of manufacturing a patterned metal foil according to any one of items 1C to 10C, wherein a surface of the substrate consists of steel or Ti.

12C. The method of manufacturing a patterned metal foil according to any one of items 1C to 11C, wherein the patterned metal foil is a conductive roll (drum) or winded on a roll.

According to one aspect of the present invention, since the concave portion increases in width toward the opening, conversely, since the insulating layer formed on the surface of the substrate has a convex shape widened toward the bottom surface, a patterned metal foil obtained by plating can be easily peeled. Since the insulating layer of the engraved plate consists of DLC or an inorganic material, adhesion to the substrate is excellent, peeling resistance is excellent, and the engraved plate is excellent in repeated use. Therefore, according to one aspect of the present invention, a patterned metal foil can be efficiently manufactured at improved productivity. The adhesion of the insulating layer to the substrate can be improved by the intermediate layer, so that the life time of the engraved plate can be elongated.

Furthermore, the present invention relates to the following aspects.

1D. A method of manufacturing a patterned copper metal layer, i.e., a conductor layer pattern having a surface treated by a blacking process by using a conductive substrate for plating, i.e., an engraved plate, the engraved plate having an insulating film formed on a surface of a conductive substrate and, a pattern of a concave portion formed at the insulating layer to form a plating layer and increasing in width toward an opening, wherein the conductive layer forming step of depositing a copper metal on the concave portion at a first current density to form a copper metal layer and the blacking process step of depositing a copper metal on a surface of the copper metal layer at a second current density higher than the first current density to make the surface black are performed in one copper pyrophosphate plating bath.

2D. The method of manufacturing a conductor layer pattern having a surface treated by a blacking process according to item 1D, wherein the conductive layer forming step is performed in a first electrodeposition region including the first current density, and the blacking process step is performed in a second electrodeposition region including the second current density.

3D. The method of manufacturing a conductor layer pattern having a surface treated by a blacking process according to item 1D or 2D, wherein in the blacking process step, the copper metal is deposited such that a luminance of a light-transmitting portion having a numerical aperture of 50% is 25 to 50 or both chromaticities a* and b* are 5 or less, against a black background having a luminance of 25.

4D. The method of manufacturing a conductor layer pattern having a surface treated by a blacking process according to item 1D or 2D, wherein in the blacking process step, a metal is deposited such that both chromaticities a* and b* of a light-transmitting portion having a numerical aperture of 40% or more are 2.8 or less, against a black background having a luminance of 25.

5D. The method of manufacturing a conductor layer pattern having a surface treated by a blacking process according to item 1D or 2D, wherein in the blacking process step, a numerical aperture is less than 40%, a metal is deposited such that both chromaticities a* and b* of a light-transmitting portion or an opaque portion is 5 or less, against a black background having a luminance of 25.

6D. The method of manufacturing a conductor layer pattern having a surface treated by a blacking process according to any one of items 1D to 5D, wherein the copper pyrophosphate plating bath is an alloy plating bath containing one or more of a VI group element such as molybdenum and a VIII group element such as cobalt or nickel as an additive.

7D. The method of manufacturing a conductor layer pattern having a surface treated by a blacking process according to any one of items 1D to 6D, wherein the first current density is 0.5 to 40 A/dm².

8D. The method of manufacturing a conductor layer pattern having a surface treated by a blacking process according to any one of items 1D to 7D, wherein the concave portion is formed to draw a geometric figure at the insulating layer or to draw a geometric figure by itself.

9D. The method of manufacturing a conductor layer pattern having a surface treated by a blacking process according to any one of items 1D to 8D, wherein the insulating layer consists of DLC or an inorganic material.

10D. The method of manufacturing a conductor layer pattern having a surface treated by a blacking process according to item 9D, wherein the insulating layer is DLC, $Al_2O_3$, or $SiO_2$.

11D. The method of manufacturing a conductor layer pattern having a surface treated by a blacking process according to item 10D, wherein the insulating layer consisting of DLC having a hardness of 10 to 40 GPa.

12D. The method of manufacturing a conductor layer pattern having a surface treated by a blacking process according to any one of items 1D to 11D, wherein an intermediate layer containing at least one of Ti, Cr, W, Si, nitrides thereof, and carbides thereof is interposed between the substrate and the insulating layer.

13D. The method of manufacturing a conductor layer pattern having a surface treated by a blacking process according to any one of items 1D to 12D, wherein a minimum width of the concave portion is 1 to 40 μm, a maximum width of the concave portion is 2 to 60 μm, and an interval of the concave portion is 50 to 1000 μm.

14D. The method of manufacturing a conductor layer pattern having a surface treated by a blacking process according to any one of items 1D to 13D, wherein an angle of a side surface of the concave portion is 30° or more to less than 90° on an insulating layer side.

15D. The method of manufacturing a conductor layer pattern having a surface treated by a blacking process according to any one of items 1D to 14D, wherein an angle of the side surface of the concave portion is 30° or more to 60° or less on the insulating layer side.

16D. The method of manufacturing a conductor layer pattern having a surface treated by a blacking process according to any one of items 1D to 15D, wherein a thickness of the insulating layer is 0.5 to 20 μm.

17D. The method of manufacturing a conductor layer pattern having a surface treated by a blacking process according to any one of items 1D to 16D, wherein a surface of the substrate consists of steel or Ti.

18D. The method of manufacturing a conductor layer pattern having a surface treated by a blacking process according to any one of items 1D to 17D, wherein the engraved plate is a rotator or a flat plate attached to a rotator.

19D. The method of manufacturing a conductor layer pattern having a surface treated by a blacking process according to any one of items 1D to 17D, wherein as the engraved plate, an engraved plate constituted by a rotator or an engraved plate attached to a rotator is used, the engraved plate is partially dipped in a plating solution, and the conductive layer forming step and the transfer step are performed while rotating the rotator.

20D. The method of manufacturing a conductor layer pattern having a surface treated by a blacking process according to any one of items 1D to 19D, wherein in the copper metal layer forming step, the copper metal is deposited such that a thickness of the copper metal is 0.1 to 20 μm.

21D. The method of manufacturing a conductor layer pattern having a surface treated by a blacking process according to any one of items 1D to 20D, wherein a first anode to perform the conductive layer forming step of forming a copper metal layer at the first current density and a second anode to perform the blacking process step of depositing a metal on a surface of the copper metal layer at the second current density to make the surface black are separately dipped in the plating solution, and a shielding member consisting of an insulator is arranged between the anodes.

22D. The method of manufacturing a conductor layer pattern having a surface treated by a blacking process according to any one of items 1D to 19D, wherein a first anode to perform the conductive layer forming step of forming a copper metal layer at the first current density is also used as a second anode to perform the blacking process step of depositing a metal on a surface of the copper metal layer at the second current density to make the surface black, and after formation by the conductive layer by the conductive layer forming step at the first current density, the blacking process step is performed at the second current density.

23D. A method of manufacturing a conductor layer pattern having a surface treated by a blacking process, wherein after the method of manufacturing a copper metal layer having a surface treated by a blacking process according to any one of items 1D to 22D is performed, the copper metal layer having the surface treated by the blacking process is peeled from the engraved plate.

24D. A method of manufacturing a substrate with conductor layer pattern, including: the conductor layer pattern manufacturing step of depositing a copper metal by electrolytic plating on a concave portion of an engraved plate in which an insulating layer is formed on a surface of a conductive substrate and a concave portion increasing in width toward an opening at the insulating layer is formed for plating; and the transfer step of transferring the copper metal deposited on the engraved plate to an adhesive support member, wherein the conductor layer pattern manufacturing step performed such that a conductive layer forming step of forming a copper metal layer at a first current density and the blacking process step of depositing a metal on a surface of the copper metal layer at a second current density higher than the first current density to make the surface black are performed in one copper pyrophosphate plating bath.

25D. The method of manufacturing a substrate with conductor layer pattern according to item 24D, wherein the conductive layer forming step is performed in a second electrodeposition region including the first current density, and the blacking process step is performed in a second electrodeposition region including the second current density.

26D. The method of manufacturing a substrate with conductor layer pattern according to item 24D or 25D, wherein in the blacking process step, the copper metal is deposited such that a luminance of a light-transmitting portion having a numerical aperture of 50% is 25 to 50 or both chromaticities a* and b* are 5 or less, against a black background having a luminance of 25.

27D. The method of manufacturing a substrate with conductor layer pattern according to item 24D or 25D, wherein in the blacking process step, a metal is deposited such that both chromaticities a* and b* of a light-transmitting portion having a numerical aperture of 40% or more are 2.8 or less, against a black background having a luminance of 25.

28D. The method of manufacturing a substrate with conductor layer pattern according to item 24D or 25D, wherein in the blacking process step, a numerical aperture is less than 40%, a metal is deposited such that both chromaticities a* and b* of a light-transmitting portion or an opaque portion are 5 or less, against a black background having a luminance of 25.

29D. The method of manufacturing a substrate with conductor layer pattern according to any one of items 24D to 28D, wherein the copper pyrophosphate plating bath is an alloy plating bath containing one or more of a VI group element such as molybdenum and a VIII group element such as cobalt or nickel as an additive.

30D. The method of manufacturing a substrate with conductor layer pattern according to any one of items 24D to 29D, wherein the first current density is 0.5 to 40 A/dm$^2$.

31D. The method of manufacturing a substrate with conductor layer pattern according to any one of items 24D to 30D, wherein the concave portion to form a plating layer is formed to draw a geometric figure at the insulating layer or to draw a geometric figure by itself.

32D. The method of manufacturing a substrate with conductor layer pattern according to any one of items 24D to 31D, wherein the insulating layer consists of DLC or an inorganic material.

33D. The method of manufacturing a substrate with conductor layer pattern according to item 32D, wherein the insulating layer is DLC, $Al_2O_3$, or $SiO_2$.

34D. The method of manufacturing a substrate with conductor layer pattern according to item 33D, wherein the insulating layer consisting of DLC having a hardness of 10 to 40 GPa.

35D. The method of manufacturing a substrate with conductor layer pattern according to any one of items 24D to 34D, wherein an intermediate layer containing at least one of Ti, Cr, W, Si, nitrides thereof, and carbides thereof is interposed between the substrate and the insulating layer.

36D. The method of manufacturing a substrate with conductor layer pattern according to any one of items 24D to 35D, wherein a minimum width of the concave portion is 1 to 40 μm, a maximum width of the concave portion is 2 to 60 μm, and an interval of the concave portion is 50 to 1000 μm.

37D. The method of manufacturing a substrate with conductor layer pattern according to any one of items 24D to 36D, wherein an angle of a side surface of the concave portion is 30° or more to less than 90° on an insulating layer side.

38D. The method of manufacturing a substrate with conductor layer pattern according to item 37D, wherein an angle of the side surface of the concave portion is 30° or more to 60° or less on the insulating layer side.

39D. The method of manufacturing a substrate with conductor layer pattern according to any one of items 24D to 38D, wherein a thickness of the insulating layer is 0.5 to 20

40D. The method of manufacturing a substrate with conductor layer pattern according to any one of items 24D to 39D, wherein a surface of the substrate consists of steel or Ti.

41D. The method of manufacturing a substrate with conductor layer pattern according to any one of items 24D to 40D, wherein the engraved plate is a rotator or a flat plate attached to a rotator.

42D. The method of manufacturing a substrate with conductor layer pattern according to any one of items 24D to 41D, wherein as the engraved plate, an engraved plate constituted by a rotator or an engraved plate attached to a rotator is used, the engraved plate is partially dipped in a plating solution, and the conductor layer pattern manufacturing step and the transfer step are performed while rotating the rotator.

43D. The method of manufacturing a substrate with conductor layer pattern according to any one of items 24D to 42D, wherein in the conductive layer forming step, the metal is deposited on an upper surface of a convex portion of the engraved plate such that a thickness of the metal is 0.1 to 20 μm.

44D. The method of manufacturing a substrate with conductor layer pattern according to any one of items 24D to 43D, wherein
a first anode to perform the conductive layer forming step of forming a copper metal layer at the first current density and a second anode to perform the blacking process step of depositing a metal on a surface of the copper metal layer at the second current density to make the surface black are separately dipped in the plating solution, and a shielding member consisting of an insulator is arranged between the anodes.

45D. The method of manufacturing a substrate with conductor layer pattern according to any one of items 24D to 43D, wherein a first anode to perform the conductive layer forming step of forming a copper metal layer at the first current density is used as a second anode to perform the blacking process step of depositing a metal on a surface of the copper metal layer at the second current density to make the surface black, and after formation by the conductive layer forming step at the first current density, the blacking process step is performed at the second current density.

46D. A substrate with conductor layer pattern manufactured by the method according to any one of items 24D to 45D.

47D. A transparent electromagnetic wave shielding member obtained by bonding a surface having the conductor layer pattern of the substrate with conductor layer pattern according to item 46D, to a transparent substrate.

48D. A transparent electromagnetic wave shielding member obtained by covering, the conductor layer pattern of the substrate with conductor layer pattern according to item 46D with a resin.

According to one aspect of the present invention, since manufacturing of a patterned copper metal layer and the blacking process of the surface of the copper metal layer can be performed in one plating bath, the copper metal layer or a copper metal which is patterned and having the surface treated by the blacking process can be manufactured at improved productivity. Therefore the substrate with conductor layer pattern can be manufactured at improved productivity.

According to one aspect of the present invention, since the concave portion of the engraved plate increases in width toward an opening, a deposited copper metal can be easily peeled. When an insulating layer on the substrate surface consists of DLC or an inorganic material, especially, DLC, endurance is especially excellent. Therefore, production efficiency of the copper metal layer or the copper metal having the surface treated by the blacking process and the substrate with conductor layer pattern is excellent.

According to one aspect of the present invention, when the engraved plate is electrically coupled to the metal rotator serving as an engraved plate or the metal rotator, continuously, manufacturing of the copper metal layer patterned and having the surface treated by the blacking process or transfer of the metal layer to an adhesive support member can be performed. For this reason, production efficiency of the copper metal layer or the copper metal having the surface treated by the blacking process and the substrate with conductor layer pattern is more improved.

According to one aspect of the present invention, since a plated portion is a concave portion, in a series of steps, the blacking process can be uniformly performed without generating and scattering powder regardless of a thin line portion and a wide line portion. For this reason, the conductor layer pattern manufacturing steps including the conductive layer forming step and the blacking process step can be shortened. When a deposition condition of a black metal in the second electrodeposition region is preferably controlled to deposit, a black metal in the shapes of grains or bumps, so that the blacking process can be preferably performed without generating and scattering powder.

The electromagnetic wave shielding member obtained by using the conductor layer pattern is excellent in optical transparency. For this reason, when the electromagnetic wave shielding member is used as an electromagnetic wave shielding member of a display, a viewer can comfortably view a crisp image under the same conditions as those in a normal state without increasing a luminance and causing an electromagnetic wave to adversely affect her/his body. Since the electromagnetic wave shielding member is excellent in electromagnetic wave shielding property, the electromagnetic wave shielding member is effectively used in an apparatus such as a display which generates an electromagnetic wave, or in a housing, especially, a portion such as an inspection window required to be transparent, of a measurement apparatus, a measurement machine, or a manufacturing apparatus to be protected from an external electromagnetic wave. Furthermore, the electromagnetic wave shielding member according to the present invention, like the substrate with conductor layer pattern, can be manufactured at high production efficiency.

When a transparent substrate is bonded to a surface having a conductor layer pattern of the substrate with conductor layer pattern, or when coating of a transparent resin is performed, the conductor layer pattern can be protected. When a bonding agent layer is formed as a conductor layer transfer surface of another substrate in advance, a foreign object can also be effectively prevented from adhering to the bonding agent layer. At this time, the bonding of the transparent substrate can be performed such that the transparent substrate is pressured and bonded to the bonding agent layer directly or through another bonding agent. Since the conductor layer pattern is buried in the bonding agent layer with an appropriate pressure, transparency or adhesion to the transparent substrate can be improved.

When a transparent substrate with conductor layer pattern is used, an electromagnetic wave shielding member having high optical transparency (in particular, a line width of the conductor layer pattern is small to obtain a high resolution) and good electric conductivity (high electromagnetic wave shielding property) can be easily obtained. For this reason, when the electromagnetic wave shielding member is used as an electromagnetic wave shielding member of a display such as a PDP, a crisp image can be comfortably viewed under the almost same conditions as those in a normal state without increasing the luminance. Since the electromagnetic wave shielding member is excellent in electromagnetic wave shielding property, the electromagnetic wave shielding member is effectively used in an apparatus such as a display which generates an electromagnetic wave, or in a housing or an inspection window to allow an operator to inspect an inside of a measurement apparatus, a measurement machine, or a manufacturing apparatus to be protected from an electromagnetic wave, especially, a portion such as a window or a display surface required to be transparent. Furthermore, according to one aspect of the present invention, as in the manufacturing of the conductor layer pattern, the electromagnetic wave shielding member is excellent in production efficiency.

Furthermore, the present invention relates to the following aspects.

1E. A method of manufacturing a substrate with conductor layer pattern including: the step of depositing a metal on the concave portion, by using an engraved plate in which an insulating layer is formed on a surface of a conductive substrate and a concave portion which increases in width toward an opening and the substrate is exposing is formed in the insulation film; the step of bonding by pressure a resin sheet cured by an active radiation energy to the engraved plate on which the metal is deposited; the step of irradiating the active radiation energy to cure a resin; and the step of peeling the metal from the engraved plate while keeping the metal buried in the resin sheet.

According to one aspect of the present invention, cohesive force to the metal is very strong, and so-called adhesion force between the resin and the transferred metal is strong. After the engraved plate is peeled from the resin, the metal transferred to the resin is free from a drawback such as bending and breaking or loosening, and the metal can be transferred with a very good line shaping property. The active energy is irradiated to make a tacking property of the resin surface inactive, and adhesion between the engraved plate and the resin is considerably deteriorated. In this manner, when the engraved plate is peeled from the resin, the resin does not remain in the engraved plate as a residual.

Furthermore, the present invention relates to the following aspects.

1F. A method of manufacturing an engraved plate including: (A) the step of forming an insulating layer consisting of DLC and an inorganic material on an entire surface of the substrate; and (B) the step of forming a concave portion by a laser at the insulating layer, where the insulating layer is formed on a surface of a conductive substrate, and a concave portion which increases in width toward an opening and which is to form a plating layer is formed at the insulating layer.

2F. The method of manufacturing an engraved plate according to item 1F, wherein a method of processing a concave portion is a femtosecond laser.

3F. The method of manufacturing an engraved plate according to item 1F or 2F, wherein the inorganic material is $Al_2O_3$ or $SiO_2$.

4F. The method of manufacturing an engraved plate according to item 1F or 2F, wherein the insulating layer consists of DLC.

5F. The method of manufacturing an engraved plate according to any one of items 1F to 4F, wherein the insulating layer consists of DLC having a hardness of 10 to 40 GPa.

6F. The method of manufacturing an engraved plate according to any one items 1F to 5F, wherein a minimum width of the concave portion is 1 to 40 μm, a maximum width of the concave portion is 2 to 60 μm, and an interval of the concave portion is 50 to 1000 μm.

7F. The method of manufacturing an engraved plate according to item 5 or 6, wherein the DLC film is formed by a vacuum deposition method, a sputtering method, an ion-plating method, a cathodic arc deposition method, an ionization deposition method, or a plasma CVD method.

8F. The method of manufacturing an engraved plate according to any one of items 1F to 7F, wherein an angle of a side surface of the concave portion formed by a laser is 10° or more to less than 70° on an insulating layer side.

9F. The method of manufacturing an engraved plate according to any one of items 1F to 8F, wherein an angle of a side surface of the concave portion formed by a laser is 10° or more to 40° or less on the insulating layer side.

10F. The method of manufacturing an engraved plate according to any one of items 1 to 9, wherein a thickness of the insulating layer is 0.5 to 20 μm.

11F. The method of manufacturing an engraved plate according to any one of items 1F to 10F, wherein an intermediate layer containing at least one of Ti, Cr, W, Si, nitrides thereof, and carbides thereof is interposed between the substrate and the insulating layer.

12F. The method of manufacturing an engraved plate according to any one of items 1F to 11F, wherein a surface of the substrate consists of steel or Ti.

13F. The method of manufacturing an engraved plate according to any one of items 1F to 12F, wherein the engraved plate is a conductive roll (drum) or winded on a roll.

According to one aspect of the present invention, in the engraved plate, since the concave portion on which the metal layer is formed by plating increases in width toward an opening, the conductor layer pattern obtained by plating is easily peeled. Since the insulating layer consists of DLC or an inorganic material, the insulating layer is excellent in adhesion to the substrate and has excellent peeling resistance. In the insulating layer, adhesion between the substrate and the insulating layer can be improved by an intermediate layer. For this reason, the life time of the engraved plate can be further elongated.

According to one aspect of the present invention, in the engraved plate, a convex pattern is formed on the substrate, and, after the insulating layer is formed, the convex pattern to which the insulating film adheres is removed to make it possible to manufacture the concave portion. Therefore, the conductor layer pattern can be easily manufactured and has good productivity.

For example, when a lift-off method or the like is used, complex process is required. The process includes forming a pattern on the substrate by using a resist or the like once, forming an insulating layer, and removing the resist and the insulating layer formed thereon. For this reason, a substrate surface is intentionally coarsened to obtain adhesion to the resist, and in the step of removing the resist with the insulating layer formed thereon, the resist with the insulating layer is disadvantageously difficult to be uniformly removed in plane with an increase in area. In contrast to this, according to one aspect of the present invention, since the insulating layer formed on the substrate surface in advance is directly processed by a laser, the step of forming and removing a resist is unnecessary, and the number of steps can be considerably reduced.

According to one aspect of the present invention, in the engraved plate, since a resist or the like is not used in formation of a pattern, the surface of the substrate need not be coarsened, and a conductor layer pattern obtained by plating can be easily peeled. Defects of an insulating layer film caused by unevenness of the substrate can be reduced.

According to one aspect of the present invention, since the conductor layer pattern obtained by plating can be easily peeled, a substrate with conductor layer pattern which is excellent in optical transparency can be easily manufactured, and the substrate with conductor layer pattern which is excellent in electromagnetic shielding property or electric conductivity can be easily manufactured. Furthermore, the substrate with conductor layer pattern can be manufactured at high production efficiency.

Furthermore, the present invention relates to the following aspects.

1G. A conductor layer pattern which is a conductor layer having a predetermined pattern, wherein, in a predetermined region (to be referred to as a "specific region" hereinafter) in a region in which the pattern is formed, a pattern different from a peripheral pattern of the specific region is given.

2G. The conductor layer pattern according to item 1, wherein the predetermined pattern is a mesh pattern.

3G. The conductor layer pattern according to item 1G or 2G, wherein the specific region is a region extending in a predetermined direction in a predetermined width.

4G. The conductor layer pattern according to any one of items 1 to 3, wherein a line-like pattern which linearly continues is present in the pattern of the conductor layer in the specific region and the pattern of the peripheral conductor layer.

5G. The conductor layer pattern according to item 4G, wherein, in a line-like pattern which linearly continues in the pattern of the conductor layer in the specific region and the pattern of the peripheral conductor layer, the line width in one region is 90% to 100% of the line width in the other.

6G. The conductor layer pattern according to any one of items 1G to 5G, wherein one of a thickness of the conductor layer in the specific region and a thickness of the peripheral conductor layer is 40% to 100% of the other of the thicknesses.

7G. The conductor layer pattern according to any one of items 1G to 6G, wherein a numerical aperture of the conductor layer pattern region is 50 to 97%.

8G. The conductor layer pattern according to any one of items 1G to 7G, wherein one of numerical apertures of the specific region and the periphery thereof is 40 to 95% of the other of the numerical apertures.

9G. A substrate with conductor layer pattern having the conductor layer pattern according to any one of items 1G to 8G.

10G. A conductive substrate for plating having a predetermined plated portion pattern, wherein, in a predetermined region (to be referred to as a "specific plated portion region" hereinafter) in a region in which the pattern is formed, a pattern different from a peripheral pattern of the predetermined region is given.

11G. The conductor layer pattern according to item 10G, wherein the predetermined pattern is a mesh pattern.

12G. The conductive substrate for plating according to item 10 or 11, wherein the specific plated portion region is a region extending in a predetermined direction in a predetermined width.

13G. The conductive substrate for plating according to any one of items 10G to 12G, wherein a line-like pattern which linearly continues is present in the plated portion pattern of the specific plated portion region and the peripheral plated portion pattern.

14G. The conductive substrate for plating according to any one of items 10G to 13G, wherein, in a line-like pattern which linearly continues in the plated portion pattern in the specific plated portion region and the peripheral plated portion pattern of the specific plated portion pattern region, the line width in one region is 90% to 100% of the line width in the other.

15G. The conductive substrate for plating according to any one of items 10G to 14G, wherein a ratio of an area of the plated portion to an area of a non-plated portion is 6% or more to 100% or less.

16G. The conductive substrate for plating according to any one of items 10G to 15G, wherein one of a ratio of the area of the plated portion to the area of the non-plated portion in the specific plated portion region and a ratio of the area of the plated portion to the area of the non-plated portion in the other region is 40 to 95% of the other of the ratios.

17G. The conductive substrate for plating according to any one of items 10G to 16G, wherein the plated portion is a concave portion which increases in width toward an opening.

18G. The conductive substrate for plating according to any one of items 10G to 17G, wherein a surface of the non-plated portion is covered with an insulating layer.

19G. The conductive substrate plating according to any one of items 10G to 18G, wherein the insulating layer is a diamond-like carbon (DLC) film or an inorganic material film.

20G. A method of manufacturing a conductive substrate for plating including: (A) the step of forming a removal convex pattern having a predetermined pattern on a surface of the conductive substrate, and the pattern being formed to give a pattern different from a peripheral pattern of a predetermined region in a region in which the predetermined pattern is formed; (B) the step of forming an insulating layer consisting of DLC or an inorganic material on a surface of the conductive substrate on which the removal convex pattern is formed; and (C) the step of removing the convex pattern to which the insulating layer is attached.

21G. A method of manufacturing a conductor layer pattern, wherein a metal is deposited by plating on the plated portion of the conductive substrate for plating according to any one of items 10G to 19G.

22G. A method of manufacturing a substrate with conductor layer pattern, including:

(X) the step of depositing a metal by plating on the plated portion of the conductive substrate for plating according to any one of items 10G to 19G; and (Y) the step of transferring the metal deposited on the plated portion of the conductive substrate to another substrate.

23G. An electromagnetic wave shielding member obtained by covering the conductor layer pattern of the substrate with conductor layer pattern according to item 9G with a resin.

24G. An electromagnetic wave shielding plate obtained by using the substrate with conductor layer pattern according to item 9G or the electromagnetic wave shielding member according to item 23G is bonded to a substrate.

The conductor layer pattern and the substrate with conductor layer pattern according to the one of the above embodiments of the present invention can make it easy to perform positioning for further processing or inspection such as coating of a resin on a pattern and bonding of films. In inspection of positioning accuracy, visual check can be made easier.

When a line-like pattern which is linearly continues is present in a pattern of a conductor layer in a specific region and a pattern of a peripheral conductor layer of the specific region, in particular, when line widths of the line-like patterns are specified, a plating layer is rarely bent and broken, and the visibility of the line is improved. When thicknesses of the conductor layer in the specific region and the other region are specified, in-plane uniformity is not considerably deteriorated, and, therefore, production yield and production efficiency are improved.

According to the conductive substrate for plating according to one of the above embodiments of the present invention, the conductor layer pattern and the substrate with conductor layer pattern can be easily manufactured. When the plated portion increases in width toward the opening, the conductor layer pattern can be easily peeled or transferred. When the insulating layer consists of DLC or an inorganic material, in particular, adhesion to the conductive substrate is excellent, and excellent peeling resistance is obtained.

According to the method of manufacturing a substrate with conductor layer pattern according to one of the above embodiments of the present invention, since the conductor layer pattern obtained by plating is easily peeled, the substrate with conductor layer pattern which is excellent in optical transparency can be easily manufactured, and the substrate with conductor layer pattern which is excellent in electromagnetic wave shielding property or electric conductivity can be manufactured. Furthermore, the substrate with conductor layer pattern can be manufactured at high production efficiency. The substrate with conductor layer pattern is useful as an electromagnetic wave shielding member or for another application, in particular, an application which requires optical transparency.

The electromagnetic wave shielding member and the electromagnetic wave shielding plate according to one of the above embodiments of the present invention have excellent optical transparency and excellent electromagnetic wave shielding property and can be manufactured at high production efficiency by using a specific conductor layer pattern.

Furthermore, the present invention relates to the following aspects.

1H. A conductive substrate for plating, i.e., an engraved plate including a substrate and a conductive diamond-like carbon film or a conductive inorganic material film formed on a surface of the substrate.

2H. An engraved plate including: a conductive substrate in which a conductive diamond-like carbon film or a conductive inorganic material film is formed on a surface; and an insulating layer formed on the surface of the conductive diamond-like carbon film or the conductive inorganic material film, wherein a concave portion which increases in width toward an opening to form a plating layer is formed at the insulating layer.

3H. The engraved plate according to item 2H, wherein the concave portion to form the plating layer is formed to draw a geometric figure at the insulating layer or draw a geometric figure by itself.

4H. The engraved plate according to item 2H or 3H, wherein the insulating layer consists of diamond-like carbon or an inorganic material.

5H. The engraved plate according to any one of items 2H to 4H, wherein the insulating layer consists of diamond-like carbon, $Al_2O_3$, or $SiO_2$.

6H. The engraved plate according to any one of items 2H to 5H, wherein the insulating layer consists of diamond-like carbon having a hardness of 10 to 40 GPa.

7H. The engraved plate according to any one of items 2H to 6H, wherein a minimum width of the concave portion is 1 to 40 μm, a maximum width of the concave portion is 2 to 60 μm, and an interval of the concave portion is 50 to 1000 μm.

8H. The engraved plate according to any one of items 2H to 7H, wherein an angle of a side surface of the concave portion is 30° or more to less than 90° on an insulating layer side.

9H. The engraved plate according to any one of items 2H to 7H, wherein an angle of the side surface of the concave portion is 30° or more to 60° or less on the insulating layer side.

10H. The engraved plate according to any one of items 2H to 9H, wherein a thickness of the insulating layer is 0.5 to 20 μm.

11H. The engraved plate according to any one of items 2H to 10H, wherein an intermediate layer containing at least one of Ti, Cr, W, Si, nitrides thereof, and carbides thereof is interposed between the conductive substrate and the insulating layer.

12H. The engraved plate according to any one of items 1H to 11H, wherein the conductive substrate includes a substrate and a conductive diamond-like carbon film or a conductive inorganic material film formed on a surface of the substrate.

13H. The engraved plate according to item 12H, wherein an intermediate layer containing at least one of Ti, Cr, W, Si, nitrides thereof, and carbides thereof is interposed between the substrate and the conductive diamond-like carbon film or the conductive inorganic material film.

14H. The engraved plate according to any one of items 12H and 13H, wherein at least the surface of the substrate consists of a conductive material such as steel or Ti.

15H. The engraved plate according to any one of items 1H to 14H, wherein the engraved plate is a conductive roll (drum) or winded on a roll.

16H. A method of manufacturing an engraved plate including:

(i) the step of forming a removable convex pattern on a surface of a conductive diamond-like carbon film or a conductive inorganic material film of a conductive substrate in which the conductive diamond-like carbon film or the conductive inorganic material film is formed on a surface;

(ii) the step of forming an insulating layer consisting of diamond-like carbon or an inorganic material on the surface of the conductive substrate on which the removable convex pattern is formed; and (iii) the step of removing the convex pattern to which the insulating film adheres.

17H. The method of manufacturing an engraved plate according to item 16H, wherein the removal convex pattern is formed by a photolithography method using a photosensitive resist.

18H. The method of manufacturing an engraved plate according to item 16H or 17H, wherein insulating films having different properties and different characteristics are formed on the conductive substrate and a side surface of the convex pattern.

19H. The method of manufacturing an engraved plate according to any one of items 16H to 18H, wherein a distance of a boundary surface between the insulating layer formed on the conductive substrate and the insulating layer formed on the side surface of the convex pattern from the side surface (serving as a plane vertical to the substrate) of the convex pattern does not decrease in an upright direction of the convex pattern and increases as a whole.

20H. The method of manufacturing an engraved plate according to item 19H, wherein an angle of the boundary surface is 30° or more to less than 90° with respect to the conductive substrate.

21H. The method of manufacturing an engraved plate according to item 19H or 20H, wherein the angle of the boundary surface is 30° or more to 60° or less with respect to the conductive substrate.

22H. The method of manufacturing an engraved plate according to items 16H to 21H, wherein a pattern shape of the removal convex portion has a width of 1 to 40 μm, an interval of 50 to 1000 μm, and a height of 1 to 30 μm, thereby drawing a geometric figure.

23H. The method of manufacturing an engraved plate according to any one of items 13H to 22H, wherein the insulating layer is diamond-like carbon or an inorganic material.

24H. The method of manufacturing an engraved plate according to any one of item 23H, wherein the inorganic material is $Al_2O_3$ or $SiO_2$.

25H. The method of manufacturing an engraved plate according to item 23H, wherein the insulating layer is a diamond-like carbon.

26H. The method of manufacturing an engraved plate according to item 25H, wherein a hardness of a diamond-like carbon film formed on the conductive substrate is higher than a hardness of a DLC film formed on the side surface of the convex pattern.

27H. The method of manufacturing an engraved plate according to item 26H, wherein the hardness of the diamond-like carbon film formed on the conductive substrate is 10 to 40 GPa, and the hardness of the diamond-like carbon film formed on the side surface of the convex pattern is 1 to 15 Gpa.

28H. The method of manufacturing an engraved plate according to any one of items 25H to 27H, wherein the diamond-like carbon film is formed by a vacuum deposition method, a sputtering method, an ion-plating method, a cathodic arc deposition method, an ionization deposition method, or a plasma CVD method.

29H. The method of manufacturing an engraved plate according to any one of items 16H to 28H, wherein before the step of forming an insulating layer on the surface of the conductive substrate on which the removal convex pattern is formed is performed, the step of forming an intermediate layer on the surface of the conductive substrate on which the removal convex pattern is formed is performed.

30H. The method of manufacturing an engraved plate according to item 29H, wherein the intermediate layer includes at least one of Ti, Cr, W, Si, nitrides thereof, and carbides thereof.

31H. The method of manufacturing an engraved plate according to any one of items 16H to 30H, wherein a thickness of the insulating layer is 0.5 to 10 μm.

32H. A method of manufacturing a substrate with conductor layer pattern, includes:
(i) the step of depositing a metal on a concave portion of the engraved plate according to any one of items 2H to 15H by plating; and
(ii) the step of transferring a metal deposited on the concave portion of the conductive substrate to another substrate.

33H. The method of manufacturing a substrate with conductor layer pattern according to item 32H, wherein a thickness of the metal deposited by plating is not more than twice a depth of the concave portion.

34H. The method of manufacturing a substrate with conductor layer pattern according to item 32H or 33H, wherein the another substrate has an adhesion layer having at least a surface of adhesion.

35H. The method of manufacturing a substrate with conductor layer pattern according to any one of items 32H and 34H, including the step of performing a blacking process to the metal deposited on the concave portion of the engraved plate.

36H. The method of manufacturing a substrate with conductor layer pattern according to any one of items 32H to 35H, further including the step of performing a blacking process to the conductor layer pattern transferred to the other substrate.

37H. A substrate with conductor layer pattern manufactured by the method according to any one of items 32H to 36H.

38H. A transparent electromagnetic wave shielding member obtained by covering the conductor layer pattern of the substrate with conductor layer pattern according to item 37H with resin.

39H. A transparent electromagnetic wave shielding plate obtained by bonding the substrate with conductor layer pattern according to item 37H or the transparent electromagnetic wave shielding member according to item 38H to a transparent substrate.

According to one embodiment of the present invention, when the conductive DLC film or the conductive inorganic material film is formed on the substrate surface, microscopic distortion on the substrate can be corrected, scratches, microscopic dents, and the like can be repaired, and the surface can be smoothed. As a result, even though the insulating film is patterned or is not patterned, a uniform metal foil can be manufactured. As a result, when a patterned insulating layer is formed on the conductive substrate surface, adhesion of a resist film used to form the patterned insulating layer can be improved, and high precision and miniaturization of patterning can be achieved.

According to one embodiment of the present invention, when the conductive DLC film or the conductive inorganic material film is formed on the substrate, cleaning or correction of the surface of the engraved plate which is used frequently can be easily performed or omitted. Deterioration of a metal surface caused by plating chemicals when a metal is used as a conductive substrate is reduced or eliminated, a polishing of the conductive substrate surface or a maintenance operation of chemical processing, which must be periodically performed, can be easily performed or made unnecessary. In addition, chemical resistance of the metal serving as a base need not be considered, restriction of the substrate is reduced. As a result, the engraved plate can be provided at low cost.

The conductive DLC film or the conductive inorganic material film is formed on the substrate to make it possible to simplify or omit inspection of the presence/absence of scratches or dents on the conductive substrate surface.

In the engraved plate according to the present invention, when the concave portion on which the metal layer is formed by plating increases in width toward the opening, the conductor layer pattern obtained by plating can be easily peeled. When DLC or an inorganic material is used as a material of the insulating layer, adhesion of the insulating layer to the conductive substrate is excellent, and peeling resistance of the insulating layer is excellent. In the insulating layer, the intermediate layer can improve adhesion between the conductive substrate and the insulating layer. In this manner, the life time of the engraved plate can be further elongated.

In the engraved plate according to the present invention having the concave portion as the plated portion which increases in width toward the opening, the convex pattern is formed on the conductive substrate, and, after the insulating layer is formed, the convex pattern to which the insulating film adheres is removed to make it possible to manufacture the concave portion. Thus, the engraved plate can be easily manufactured and has good productivity.

According to the method of manufacturing an engraved plate related to the present invention, since the concave portion which increases in width toward the opening can be easily manufactured in a small number of steps, the engraved plate can be manufactured at high production efficiency.

According to the method of manufacturing a substrate with conductor layer pattern related to the present invention, since the conductor layer pattern obtained by plating can be easily peeled, the substrate with conductor layer pattern which is excellent in optical transparency can be easily manufactured, and the substrate with conductor layer pattern which is excellent in electromagnetic wave shielding property or electric conductivity can be easily manufacture. Furthermore, the substrate with conductor layer pattern can be manufactured at high production efficiency.

The electromagnetic wave shielding member and the electromagnetic wave shielding plate according to the present invention obtain excellent optical transparency and excellent electromagnetic wave shielding property by using a specific conductor layer pattern, and can be manufactured at high production efficiency.

Furthermore, the present invention relates to the following aspects.

1I. A method of manufacturing a patterned copper metal layer, i.e., a conductor layer pattern, having a surface treated by a blacking process by using an engraved plate, wherein the engraved plate is an engraved plate in which an insulating layer being formed on a surface of a conductive substrate and a pattern of a concave portion which increases in width toward an opening to form a plating layer is formed at the insulating layer, the conductive layer forming step of depositing a copper metal on the concave portion at a first current density to form copper metal layer and the blacking process step of depositing a copper metal on a surface of the copper metal layer at a second current density higher than the first current density to make the surface black or dark brown are performed in one copper sulfate plating bath.

2I. The method of manufacturing a conductor layer pattern having a surface treated by a blacking process according to item 1I, wherein the conductive layer forming step is performed in a first including the first current density, and the blacking process step is performed in a second electrodeposition region including the second current density.

3I. The method of manufacturing a conductor layer pattern having a surface treated by a blacking process according to item 1I or 2I, wherein in the blacking process step, the copper metal is deposited such that a luminance of a light-transmitting portion having a numerical aperture of 50% is 25 to 50 or both chromaticities a* and b* are 5 or less, against a black background having a luminance of 25.

4I. The method of manufacturing a conductor layer pattern having a surface treated by a blacking process according to item 1I or 2I, wherein in the blacking process step, a metal is deposited such that both chromaticities a* and b* of a light-transmitting portion having a numerical aperture of 40% or more are 2.8 or less, against a black background having a luminance of 25.

5I. The method of manufacturing a conductor layer pattern having a surface treated by a blacking process according to item 1I or 2I, wherein in the blacking process step, a numerical aperture is less than 40%, a metal is deposited such that both chromaticities a* and b* of a light-transmitting portion or an opaque portion are 5 or less, against a black background having a luminance of 25.

6I. The method of manufacturing a conductor layer pattern having a surface treated by a blacking process according to any one of items 1I to 5I, wherein the copper sulfate plating bath is a plating bath containing one or more of an organic sulfur compound and a surface active agent as an additive.

7I. The method of manufacturing a conductor layer pattern having a surface treated by a blacking process according to any one of items 1I to 6I, wherein the first current density is 0.5 to 40 A/dm$^2$.

8I. The method of manufacturing a conductor layer pattern having a surface treated by a blacking process according to any one of items 1I to 7I, wherein the concave portion to form a plating layer is formed to draw a geometric figure at the insulating layer or to draw a geometric figure by itself.

9I. The method of manufacturing a conductor layer pattern having a surface treated by a blacking process according to anyone of items 1I to 8I, wherein the insulating film consists of DLC or an inorganic material.

10I. The method of manufacturing a conductor layer pattern having a surface treated by a blacking process according to 9I, wherein the insulating layer is DLC, $Al_2O_3$, or $SiO_2$.

11I. The method of manufacturing a conductor layer pattern having a surface treated by a blacking process according to 10I, wherein the insulating layer consisting of DLC having a hardness of 10 to 40 GPa.

12I. The method of manufacturing a conductor layer pattern having a surface treated by a blacking process according to any one of items 1I to 11I, wherein an intermediate layer containing at least one of Ti, Cr, W, Si, nitrides thereof, and carbides thereof is interposed between the substrate and the insulating layer.

13I. The method of manufacturing a conductor layer pattern having a surface treated by a blacking process according to any one of items 1I to 12I, wherein a minimum width of the concave portion is 1 to 40 μm, a maximum width of the concave portion is 2 to 60 μm, and an interval of the concave portion is 50 to 1000 μm.

14I. The method of manufacturing a conductor layer pattern having a surface treated by a blacking process according to any one of items 1I to 13I, wherein an angle of a side surface of the concave portion is 30° or more to less than 90° on an insulating layer side.

15I. The method of manufacturing a conductor layer pattern having a surface treated by a blacking process according to any one of items 1I to 14I, wherein an angle of the side surface of the concave portion is 30° or more to 80° or less on the insulating layer side.

16I. The method of manufacturing a conductor layer pattern having a surface treated by a blacking process according to any one of items 1I to 15I, wherein a thickness of the insulating layer is 0.5 to 20 μm.

17I. The method of manufacturing a conductor layer pattern having a surface treated by a blacking process according to any one of items 1I to 16I, wherein a surface of the substrate consists of steel or Ti.

18I. The method of manufacturing a conductor layer pattern having a surface treated by a blacking process according to any one of items 1I to 17I, wherein the engraved plate is a rotator or a flat plate attached to a rotator.

19I. The method of manufacturing a conductor layer pattern having a surface treated by a blacking process according to any one of items 1I to 17I, wherein as the engraved plate, an engraved plate constituted by a rotator or an engraved plate attached to a rotator is used, the engraved plate is partially dipped in a plating solution, and the conductor layer pattern manufacturing step and the transfer step are performed while rotating the rotator.

20I. The method of manufacturing a conductor layer pattern having a surface treated by a blacking process according to any one of items 1I to 19I, wherein in the copper metal layer forming step, the copper metal is deposited such that a thickness of the copper metal is 0.1 to 20 μm.

21I. The method of manufacturing a conductor layer pattern having a surface treated by a blacking process according to any one of items 1I to 20I, wherein a first anode to perform the conductive layer forming step of forming a copper metal layer at the first current density and a second anode to perform the blacking process step of depositing a metal on a surface of the copper metal layer at the second current density to make the surface black or dark brown are separately dipped in the plating solution, and a shielding member consisting of an insulator is arranged between the anodes.

22I. The method of manufacturing a conductor layer pattern having a surface treated by a blacking process according to any one of items 1I to 19I, wherein a first anode to perform the conductive layer forming step of forming a copper metal layer at the first current density is also used as a second anode to perform the blacking process step of depositing a metal on a surface of the copper metal layer at the second current density to make the surface black, and after formation of the conductive layer by the conductive layer forming step at the first current density, the blacking process step is performed at the second current density.

23I. A method of manufacturing a conductor layer pattern having a surface treated by a blacking process, wherein after the method of manufacturing a copper metal layer having a surface treated by a blacking process according to any one of items 1I to 22I is performed, the copper metal layer having the surface treated by the blacking process is peeled from the conductive substrate for plating.

24I. The method of manufacturing a substrate with conductor layer pattern, including: the conductor layer pattern manufacturing step of depositing a copper metal by electrolytic plating on a plated portion of an engraved plate in which an insulating layer is formed on a surface of a conductive substrate and a concave portion increasing in width toward an opening at the insulating layer is formed for plating; and the transfer step of transferring the copper metal deposited on the substrate to an adhesive support member, wherein
the conductor layer pattern manufacturing step performed such that a conductive layer forming step of forming a copper metal layer at a first current density and the blacking process step of depositing a metal on a surface of the copper metal layer at a second current density higher than the first current density to make the surface black or dark brown are performed in one copper sulfate plating bath.

25I. The method of manufacturing a substrate with conductor layer pattern according to item 24I, wherein the conductive layer forming step is performed in a second electrodeposition region including the first current density, and the blacking process step is performed in a second electrodeposition region including the second current density.

26I. The method of manufacturing a substrate with conductor layer pattern according to item 24I or 25I, wherein in the blacking process step, the copper metal is deposited such that a luminance of a light-transmitting portion having a numerical aperture of 50% is 25 to 50 or both chromaticities a* and b* are 5 or less, against a black background having a luminance of 25.

27I. The method of manufacturing a substrate with conductor layer pattern according to item 24I or 25I, wherein in the blacking process step, a metal is deposited such that both chromaticities a* and b* of a light-transmitting portion having a numerical aperture of 40% or more are 2.8 or less, against a black background having a luminance of 25.

28I. The method of manufacturing a substrate with conductor layer pattern according to item 24I or 25I, wherein in the blacking process step, a numerical aperture is less than 40%, a metal is deposited such that both chromaticities a* and b* of a light-transmitting portion or an opaque portion are 5 or less, against a black background having a luminance of 25.

29I. The method of manufacturing a substrate with conductor layer pattern according to any one of items 24I to 28I, wherein the copper sulfate plating bath is a plating bath containing one or more of an organic sulfur compound and an surface active agent as an additive.

30I. The method of manufacturing a substrate with conductor layer pattern according to any one of items 24I to 29I, wherein the first current density is 0.5 to 40 $A/dm^2$.

31I. The method of manufacturing a substrate with conductor layer pattern according to any one of items 24I to 30I, wherein the concave portion to form a plating layer is formed to draw a geometric figure at the insulating layer or to draw a geometric figure by itself.

32I. The method of manufacturing a substrate with conductor layer pattern according to any one of items 24I to 31I, wherein the insulating layer consists of DLC or an inorganic material.

33I. The method of manufacturing a substrate with conductor layer pattern according to item 32I, wherein the insulating layer is DLC, $Al_2O_3$, or $SiO_2$.

34I. The method of manufacturing a substrate with conductor layer pattern according to item 33I, wherein the insulating layer consisting of DLC having a hardness of 10 to 40 GPa.

35I. The method of manufacturing a substrate with conductor layer pattern according to any one of items 24I to 34I, wherein an intermediate layer containing at least one of Ti, Cr, W, Si, nitrides thereof, and carbides thereof is interposed between the substrate and the insulating layer.

36I. The method of manufacturing a substrate with conductor layer pattern according to any one of items 24I to 35I, wherein a minimum width of the concave portion is 1 to 40 μm, a maximum width of the concave portion is 2 to 60 μm, and an interval of the concave portion is 50 to 1000 μm.

37I. The method of manufacturing a substrate with conductor layer pattern according to any one of items 24I to 36I, wherein an angle of a side surface of the concave portion is 30° or more to less than 90° on an insulating layer side.

38I. The method of manufacturing a substrate with conductor layer pattern according to item 37I, wherein an angle of the side surface of the concave portion is 30° or more to 80° or less on the insulating layer side.

39I. The method of manufacturing a substrate with conductor layer pattern according to any one of items 24I to 38I, wherein a thickness of the insulating layer is 0.5 to 20 µm.

40I. The method of manufacturing a substrate with conductor layer pattern according to any one of items 24I to 39I, wherein a surface of the substrate consists of steel or Ti.

41I. The method of manufacturing a substrate with conductor layer pattern according to any one of items 24I to 40I, wherein the substrate is a rotator or a flat plate attached to a rotator.

42I. The method of manufacturing a substrate with conductor layer pattern according to any one of items 24I to 41I, wherein as the engraved plate, an engraved plate constituted by a rotator or an engraved plate attached to a rotator is used, the engraved plate is partially dipped in a plating solution, and the conductor layer pattern manufacturing step and the transfer step are performed while rotating the rotator.

43I. The method of manufacturing a substrate with conductor layer pattern according to any one of items 24I to 42I, wherein in the conductive layer forming step, the metal is deposited on an upper surface of a convex portion of the engraved plate such that a thickness of the metal is 0.1 to 20 µm.

44I. The method of manufacturing a substrate with conductor layer pattern according to any one of items 24I to 43I, wherein a first anode to perform the conductive layer forming step of forming a copper metal layer at the first current density and a second anode to perform the blacking process step of depositing a metal on a surface of the copper metal layer at the second current density to make the surface black or dark brown are separately dipped in the plating solution, and a shielding member consisting of an insulator is arranged between the anodes.

45I. The method of manufacturing a substrate with conductor layer pattern according to any one of items 24I to 43I, wherein a first anode to perform the conductive layer forming step of forming a copper metal layer at the first current density is also used as a second anode to perform the blacking process step of depositing a metal on a surface of the copper metal layer at the second current density to make the surface black or dark brown, and after formation of the conductive layer by the conductive layer forming step at the first current density, the blacking process step is performed at the second current density.

46I. A substrate with conductor layer pattern manufactured by the method according to any one of items 24I to 45I.

47I. A transparent electromagnetic wave shielding member obtained by bonding a surface having the conductor layer pattern of the substrate with conductor layer pattern according to item 46I, to a transparent substrate.

48I. A transparent electromagnetic wave shielding member obtained by covering the conductor layer pattern of the substrate with conductor layer pattern according to item 46I with a resin.

According to one aspect of the present invention, since manufacturing of a patterned copper metal layer and the blacking process of the surface of the copper metal layer can be performed in one plating bath, the copper metal layer or a copper metal which is patterned and having the surface treated by the blacking process can be manufactured at improved productivity. Therefore, the substrate with conductor layer pattern can also be manufactured at improved productivity.

According to one aspect of the present invention, since the concave portion which is the plated portion of the engraved plate increases in width toward an opening, a deposited copper metal can be easily peeled. When an insulating layer on the engraved plate surface consists of DLC or an inorganic material, especially, DLC, endurance is especially excellent. Therefore, production efficiency of the copper metal layer or the copper metal having the surface treated by the blacking process and the substrate with conductor layer pattern is excellent.

When the engraved plate is electrically coupled to the metal rotator serving as an engraved plate or the metal rotator, continuously, manufacturing of the copper metal layer patterned and having the surface treated by the blacking process or transfer of the metal layer to an adhesive support member can be performed. For this reason, production efficiency of the copper metal layer or the copper metal having the surface treated by the blacking process and the substrate with conductor layer pattern is more improved.

According to one aspect of the present invention, since a plated portion is a concave portion, in a series of steps, the blacking process can be uniformly performed without generating and scattering powder regardless of a thin line portion and a wide line portion. For this reason, the conductor layer pattern manufacturing steps including the conductive layer forming step and the blacking process step can be shortened. When a deposition condition of a black or dark blown metal in the second electrodeposition region is preferably controlled to deposit a black or dark blown metal in the shapes of grains or bumps, so that the blacking process can be preferably performed without generating and scattering powder.

The electromagnetic wave shielding member obtained by using the conductive layer pattern is excellent in optical transparency. For this reason, when the electromagnetic wave shielding member is used as an electromagnetic wave shielding member of a display, a viewer can comfortably view a crisp image under the almost same conditions as those in a normal state without increasing a luminance and causing an electromagnetic wave to adversely affect her/his body. Since the electromagnetic wave shielding member is excellent in electromagnetic wave shielding property, the electromagnetic wave shielding member is effectively used in an apparatus such as a display which generates an electromagnetic wave, or in a housing, especially, a portion such as an inspection window required to be transparent, of a measurement apparatus, a measurement machine, or a manufacturing apparatus to be protected from an external electromagnetic wave. Furthermore, the electromagnetic wave shielding member according to the present invention, like the substrate with conductor layer pattern, can be manufactured at high production efficiency.

When a transparent substrate is bonded to a surface having a conductor layer pattern of the substrate with conductor layer pattern, or when coating of a transparent resin is performed, the conductor layer pattern can be protected. When an bonding agent layer is formed on a conductor layer transfer surface of another substrate in advance, a foreign object can also be effectively prevented from adhering to the bonding agent layer. At this time, the bonding of the transparent substrate can be performed such that the transparent substrate is pressured and bonded to the bonding agent layer directly or through another adhesive agent. Since the conductor layer pattern is buried in the adhesive agent layer with an appropriate pressure, transparency or adhesion to the transparent substrate can be improved.

When a transparent substrate with conductor layer pattern is used, an electromagnetic wave shielding member having high optical transparency (in particular, a line width of the conductor layer pattern is small to obtain a high resolution) and good electric conductivity (high electromagnetic wave shielding property) can be easily obtained. For this reason, when the electromagnetic wave shielding member is used as an electromagnetic wave shielding member of a display such as a PDP, a crisp image can be comfortably viewed under the almost same conditions as those in a normal state without increasing the luminance. Since the electromagnetic wave shielding member is excellent in electromagnetic wave shielding property, the electromagnetic wave shielding member is effectively used in an apparatus such as a display which generates an electromagnetic wave, or in a housing or an inspection window to allow an operator to inspect an inside of a measurement apparatus, a measurement machine, or a manufacturing apparatus to be protected from an electromagnetic wave, especially, a portion such as a window or a display surface required to be transparent. Furthermore, in the method of manufacturing an electromagnetic wave shielding member according to the present invention, as in the manufacturing of the conductor layer pattern, excellent production efficiency can be obtained.

Furthermore, the present invention relates to the following aspects.

1J. A method of manufacturing a conductor layer pattern which has a surface treated by a blacking process, a metal being deposited on a conductive metal layer with a geometric-figure shape by a pulse electrolytic method to perform the blacking process, wherein the pulse electrolytic method is performed under conditions in which when a high-energization time is given by $T_1$, a low-energization time is given by $T_2$, one cycle is defined by 1 cycle=$T_1+T_2$, a cycle ratio E in pulse electrolyzation is given by $E=100\times(T_1/(T_1+T_2))$, the cycle ratio is kept at 2% or more or 90% or less, and each of the pulse energization times is held at 2 ms or more and 200 ms or less.

2J. A method of manufacturing a conductor layer pattern which has a surface treated by a blacking process, a copper metal being deposited by electrolytic plating on a conductive substrate for plating having a plated portion pattern with a geometric-figure shape, wherein the conductive layer forming step of forming a conductive metal layer at a first current density and the step of performing a blacking process for depositing a metal on a surface of the conductive metal layer at a second current density higher than the first current density by a pulse electrolytic method to make the surface black or dark brown are performed in the same plating bath.

3J. The method of manufacturing a conductor layer pattern according to item 2J, wherein a plated portion pattern is a concave portion pattern which increases in width toward an opening.

4J. The method of manufacturing a conductor layer pattern according to item 2J, wherein the pulse electrolytic method is performed under conditions in which when a high-energization time is given by $T_1$, a low-energization time is given by $T_2$, one cycle is defined by 1 cycle $T_1+T_2$, a cycle ratio E in pulse electrolyzation is given by $E=100\times(T_1/(T_1+T_2))$, the cycle ratio is kept at 2% or more or 90% or less, and each of the pulse energization times is held at 2 ms or more and 200 ms or less.

5J. The method of manufacturing a conductor layer pattern according to any one of items 1J to 4J, wherein, the blacking process is performed to the conductor layer pattern having a surface treated by the blacking process such that a luminance of a light-transmitting portion having an aperture area of about 50% or more is 25 to 50, against a black background having a luminance of 25.

6J. The method of manufacturing a conductor layer pattern according to any one of items 1J to 5J, wherein in the blacking process step, control of each of the pulse electrolytic processes is performed by a voltage.

7J. A method of manufacturing a substrate with conductor layer pattern including: the step of manufacturing a conductor layer pattern which deposits a copper metal on a conductive substrate for plating having a geometric-figure-shaped plated portion pattern by electrolytic plating; and the transfer step of transferring the metal deposited on the conductive substrate for plating to an adhesive support member, wherein the step of manufacturing a conductor layer pattern performs the conductive layer forming step of forming a conductive metal layer at a first current density and the step of performing a blacking process to deposit a metal on the surface of the conductive metal layer at a second current density higher than the first current density to make the surface black or dark brown by a pulse electrolytic method in the same plating bath.

8J. The method of manufacturing a substrate with conductor layer pattern according to item 7J, wherein the plated portion pattern is a concave portion pattern which increases in width toward an opening.

9J. The method of manufacturing a substrate with conductor layer pattern according to item 7J or 8J, wherein the pulse electrolytic method is performed under conditions in which when a high-energization time is given by $T_1$, a low-energization time is given by $T_2$, one cycle is defined by 1 cycle=$T_1+T_2$, a cycle ratio E in pulse electrolyzation is given by $E=100\times(T_1/(T_1+T_2))$, the cycle ratio is kept at 2% or more or 90% or less, and each of the pulse energization times is held at 2 ms or more and 200 ms or less.

10J. The method of manufacturing a substrate with conductor layer pattern according to any one of items 7J to 9J, wherein, the blacking process is performed to the conductor layer pattern having a surface treated by the blacking process such that a luminance of a light-transmitting portion having an aperture area of about 50% or more is 25 to 50, against a black background having a luminance of 25.

11J. The method of manufacturing a conductor layer pattern according to any one of items 7J to 10J, wherein in the blacking process step, control of each of the pulse electrolytic processes is performed by a voltage.

12J. A substrate with conductor layer pattern manufactured by the method according to any one of items 7J to 11J.

13J. A transparent electromagnetic wave shielding member obtained by bonding a surface having a conductor layer pattern of the substrate with conductor layer pattern according to item 12J to a transparent substrate.

14J. A transparent electromagnetic wave shielding member obtained by covering the conductor layer pattern of the substrate with conductor layer pattern according to item 12J with a resin.

According to one aspect of the present invention, since the conductor layer pattern having a surface treated by the blacking process is manufactured by using a pulse electrolytic method under a specific condition, the conductor layer pattern subjected to a blacking process which has a sufficient degree of blacking and which is homogeneous in color tone or shape can be manufactured. (Extra deposition of the metal copper subjected to the blacking process is suppressed, a line is not excessively thickened, and does not generate and scatter powder)

According to one embodiment of the present invention, since the conductive layer forming step and the step of performing the blacking process by the pulse electrolytic method can be performed in the same plating bath, the conductor layer pattern preferably subjected to the blacking process can be manufactured with good productivity.

According to one aspect of the present invention, since the method of manufacturing a substrate with conductor layer includes the method of manufacturing a conductor layer pattern, a substrate having the conductor layer pattern subjected to a blacking process which has a sufficient degree of blacking or which is homogeneous in color tone or shape, therefore, a substrate with conductor layer pattern having preferable characteristics can be manufactured. Furthermore, the substrate with conductor layer pattern can be manufactured with good productivity.

In these methods, when the plated portion pattern is a concave portion pattern which increases in width toward an opening, the conductor layer pattern having the surface treated by the blacking process can be easily peeled or transferred.

The electromagnetic wave shielding member obtained by using the conductor layer pattern can be made excellent in optical transparency. For this reason, the electromagnetic wave shielding member is used as an electromagnetic wave shielding member in a display, a viewer can comfortably view a crisp image under the almost same conditions as those in a normal state without increasing a luminance and causing an electromagnetic wave to adversely affect her/his body. Since the electromagnetic wave shielding member is excellent in electromagnetic wave shielding property, the electromagnetic wave shielding member is effectively used in an apparatus such as a display which generates an electromagnetic wave, or in a housing, especially, a portion such as an inspection window required to be transparent, of a measurement apparatus, a measurement machine, or a manufacturing apparatus to be protected from an external electromagnetic wave. Furthermore, the electromagnetic wave shielding member according to the present invention, like the substrate with conductor layer pattern, can be manufactured at high production efficiency.

When a transparent substrate is bonded to a surface having a conductor layer pattern of the substrate with conductor layer pattern, or when coating of a transparent resin is performed, the conductor layer pattern can be protected. When an bonding agent layer is formed on a conductor layer transfer surface of another substrate in advance, a foreign object can also be effectively prevented from adhering to the bonding agent layer. At this time, the bonding of the transparent substrate can be performed such that the transparent substrate is pressured and bonded to the bonding agent layer directly or through another bonding agent. Since the conductor layer pattern is buried in the bonding agent layer with an appropriate pressure, transparency or adhesion to the transparent substrate can be improved.

When a transparent substrate with conductor layer pattern is used, an electromagnetic wave shielding member having high optical transparency (in particular, a line width of the conductor layer pattern is small to obtain a high resolution) and good electric conductivity (high electromagnetic wave shielding property) can be easily obtained. For this reason, when the electromagnetic wave shielding member is used as an electromagnetic wave shielding member of a display such as a PDP, a crisp image can be comfortably viewed under the almost same conditions as those in a normal state without increasing the luminance. Since the electromagnetic wave shielding member is excellent in electromagnetic wave shielding property, the electromagnetic wave shielding member is effectively used in an apparatus such as a display which generates an electromagnetic wave, or in a housing or an inspection window to allow an operator to inspect an inside of a measurement apparatus, a measurement machine, or a manufacturing apparatus to be protected from an electromagnetic wave, especially, a portion such as a window or a display surface required to be transparent. Furthermore, in the method of manufacturing an electromagnetic wave shielding member according to the present invention, as in the manufacturing of the conductor layer pattern, excellent production efficiency can be obtained.

Furthermore, the present invention relates to the following aspects.

1K. A conductive substrate for plating, wherein an insulating layer is formed on a surface of a conductive substrate, a whole or part of the insulating layer is constituted by at least two layers, and a concave portion, to form a plating layer, which increases in width toward an opening is formed at the insulating layer.

2K. A conductive substrate for plating, wherein insulating layers of at least two types are formed on a surface of a conductive substrate, and a concave portion, to form a plating layer, which increases in width toward an opening is formed at the insulating layers.

3K. The conductive substrate for plating according to item 1K or 2K, wherein the concave portion to form a plating layer is formed to draw a geometric figure at the insulating layer or to draw a geometric figure by itself.

4K. The conductive substrate for plating according to any one of items 1K to 3K, wherein a first insulating layer consists of a diamond-like carbon (DLC) or an inorganic material.

5K. The conductive substrate for plating according to any one of items 1K to 4K wherein the first insulating layer is DLC, $Al_2O_3$, or $SiO_2$.

6K. The conductive substrate for plating according to any one of items 1K to 5K, wherein the first insulating layer consists of DLC having a hardness of 10 to 40 GPa.

7K. The conductive substrate for plating according to any one of items 1K to 6K, wherein a minimum width of the concave portion is 1 to 40 μm, a maximum width of the concave portion is 2 to 60 μm, and an interval of the concave portion is 50 to 1000 μm.

8K. The conductive substrate for plating according to any one of items 1K to 7K, wherein an angle of a side surface of the concave portion is 30° or more to less than 90° on an insulating layer side.

9K. The conductive substrate for plating according to any one of items 1K to 8K, wherein an angle of the side surface of the concave portion is 30° or more to 80° or less on the insulating layer side.

10K. The conductive substrate for plating according to any one of items 1K to 9K, wherein a total thickness of the laminated insulating layer is 0.5 to 20 μm.

11K. The conductive substrate for plating according to any one of items 1K to 10K, wherein an intermediate layer containing at least one of Ti, Cr, W, Si, nitrides thereof, and carbides thereof is interposed between the conductive substrate and the insulating layer.

12K. The conductive substrate for plating according to any one of items 1K to 11K, wherein a surface of the conductive substrate consists of steel or Ti.

13K. The conductive substrate for plating according to any one of items 1K to 12K, wherein a second insulating layer is formed to bury a minute hole of the first insulating layer.

14K. The conductive substrate for plating according to any one of items 1K to 13K, wherein the second insulating layer is obtained by coating an organic material.

15K. The conductive substrate for plating according to any one of items 1K to 14K, wherein the second insulating layer is an electrocoating.

16K. The conductive substrate for plating according to any one of items 1K to 15K, wherein the second insulating layer is obtained by coating an insulating inorganic material.

17K. The conductive substrate for plating according to any one of items 13K to 16K, wherein a third insulating layer is formed on the second insulating layer to cover the first and second insulating layer.

18K. The conductive substrate for plating according to item 17K, wherein the third insulating layer is DLC, $Al_2O_3$, or $SiO_2$.

19K. The conductive substrate for plating according to any one of items 17 and 18, wherein the third insulating layer consists of DLC having a hardness of 10 to 40 GPa.

20K. A method of manufacturing a conductive substrate for plating including: (A) the step of forming a removal convex pattern on a surface of the conductive substrate;
(B) the step of forming at least two insulating layers or insulating layers of at least two types on a surface of the conductive substrate on which the removal convex pattern is formed; and
(C) the step of removing the convex pattern to which the insulating layer is attached.

21K. The method of manufacturing a conductive substrate for plating according to item 20K, wherein the step of forming at least two insulating layers or insulating layers of at least two types on the surface of the conductive substrate on which the removal convex pattern is formed is the step of forming a DLC or inorganic material layer as a first insulating layer, forming an electrocoating layer as a second insulating layer, and forming a DLC or inorganic material layer as a third insulating layer.

22K. The method of manufacturing a conductive substrate for plating according to item 20K or 21K, wherein the removal convex pattern is formed by a photolithography method using a photosensitive resist.

23K. The method of manufacturing a conductive substrate for plating according to any one of items 20K to 22K, wherein a distance of a boundary surface between the first insulating film formed on the conductive substrate and the first insulating layer formed on the side surface of the removal convex pattern from the side surface (serving as a plane vertical to the substrate) of the convex pattern does not decrease in an upright direction of the convex pattern and increases as a whole.

24K. The method of manufacturing a conductive substrate for plating according to any one of items 20K to 23K, wherein a pattern shape of the removal convex portion has a width of 1 to 40 μm, an interval of 50 to 1000 μm, and a height of 1 to 30 μm, thereby drawing a geometric figure.

25K. The method of manufacturing a conductive substrate for plating according to any one of items 20K to 24K, wherein the DLC films serving as the first and third insulating films are formed by a vacuum deposition method, a sputtering method, an ion-plating method, a cathodic arc deposition method, an ionization deposition method, or a plasma CVD method.

26K. A method of manufacturing a conductor layer pattern, wherein (X) a metal is deposited by plating on a concave portion of the conductive substrate for plating according to any one of items 1K to 19K.

27K. A method of manufacturing a conductor layer pattern, including:
(X) the step of depositing a metal by plating on the concave portion of the conductive substrate for plating according to any one of items 1K to 19K, and
(Y) the step of peeling the metal deposited on the concave portion of the conductive substrate.

28K. A method of manufacturing a conductor layer pattern, including:
(X) the step of depositing a metal by plating on the concave portion of the conductive substrate for plating according to any one of items 1K to 19K, and
(Y) the step of transferring the metal deposited on the concave portion of the conductive substrate to another substrate.

29K. The method of manufacturing a substrate with conductor layer pattern according to item 28K, wherein a thickness of the metal deposited by plating is not more than twice a depth of the concave portion.

30K. The method of manufacturing a substrate with conductor layer pattern according to item 28K or 29K, wherein the another substrate has an adhesion layer with adhesion at least on a surface.

31K. The method of manufacturing a substrate with conductor layer pattern according to any one of items 28K to 30K, including the step of performing a blacking process before the step of transferring the metal deposited on the concave portion of the conductive substrate for plating to another substrate.

32K. The method of manufacturing a substrate with conductor layer pattern according to any one of items 28K to 31K, further including the step of performing a blacking process to the conductor layer pattern transferred to the other substrate.

33K. A substrate with conductor layer pattern manufactured by the method according to any one of items 28K to 32K.

34K. A transparent electromagnetic wave shielding member obtained by covering the conductor layer pattern of the substrate with conductor layer pattern according to item 33K with resin.

35K. A transparent electromagnetic wave shielding plate obtained by bonding the substrate with conductor layer pattern according to item 33K or the transparent electromagnetic wave shielding member according to item 34K to a transparent substrate.

In the conductive substrate for plating according to any one of the above embodiments of the present invention, since the concave portion on which the metal layer is formed by plating increases in width toward an opening, the conductor layer pattern obtained by plating can be easily peeled or transferred and smoothly peeled or transferred. Accordingly, the insulating layer is constituted by at least two layers, and a metal can be prevented from being deposited by a defect of the insulating layer. For this reason, a conductor layer pattern which is excellent in characteristic can be manufactured.

When the insulating layer contains DLC or an inorganic material, excellent adhesion to the conductive substrate is obtained, and peeling resistance of the insulating layer, i.e., endurance is excellent. In the insulating layer, adhesion between the conductive substrate and the insulating layer can be improved by the intermediate layer. For this reason, the life time of the conductive substrate for plating can be further elongated.

More specifically, the presence of the second insulating layer formed on the conductive substrate according to one of the embodiments of the present invention can prevent a defective appearance of the substrate with conductor layer pattern caused by deposition of a metal on an unnecessary portion and transfer of the metal because a defect of the insulating layer is repaired such that a pin hole formed in the first insulating layer is buried.

In particular, when DLC or an inorganic material is used as the third insulating layer formed on the conductive substrate according to one of the embodiments of the present invention, the second insulating layer can be protected from a plating chemical solution. For this reason, the endurance of the conductive substrate can be more improved.

In the conductive substrate for plating having a concave portion which increases in width toward an opening according to one of the embodiments of the present invention, a convex pattern is formed on the conductive substrate, and, after an insulating layer is formed, the convex pattern to which the insulating layer adheres is removed to make it possible to manufacture a concave portion. For this reason, the conductive substrate for plating can be easily manufactured at good productivity.

According to the method of manufacturing a conductive substrate for plating according to one of the embodiments of the present invention, a concave portion which especially increases in width toward an opening can be easily manufactured in a small number of steps. For this reason, the conductive substrate for plating can be manufactured at good production efficiency.

According to the method of manufacturing a substrate with conductor layer pattern according to one of the embodiments of the present invention, since the conductor layer pattern obtained by plating can be easily peeled, a substrate with conductor layer pattern having excellent optical transparency can be easily manufactured, and a substrate with conductor layer pattern which is excellent in electromagnetic wave shielding property or electric conductivity can be easily manufactured. Furthermore, the substrate with conductor layer pattern can be manufactured at high production efficiency.

The electromagnetic wave shielding member and the electromagnetic wave shielding plate according to one of the embodiments of the present invention are excellent in optical transparency and electromagnetic wave shielding property by using a specific conductor layer pattern, and can be manufactured at high production efficiency.

The contents disclosed in this specification relate to the subject matters of Japanese Patent Application No. 2006-352549 (filed on Dec. 27, 2006), Japanese Patent Application No. 2007-099332 (filed on Apr. 5, 2007), Japanese Patent Application No. 2007-152658 (filed on Jun. 8, 2007), Japanese Patent Application No. 2007-158735 (filed on Jun. 15, 2007), Japanese Patent Application No. 2007-183130 (filed on Jul. 12, 2007). The entire subject matters are incorporated in the specification of the present invention.

BRIEF DESCRIPTION OF THE DRAWINGS

FIG. 4C-1 is a sectional view showing an example of the steps in manufacturing an engraved plate having an intermediate layer according to the present invention.

FIG. 4D-1 is a sectional view showing an example of the steps in manufacturing an engraved plate having an intermediate layer according to the present invention.

REFERENCE NUMERAL

Figure 1:
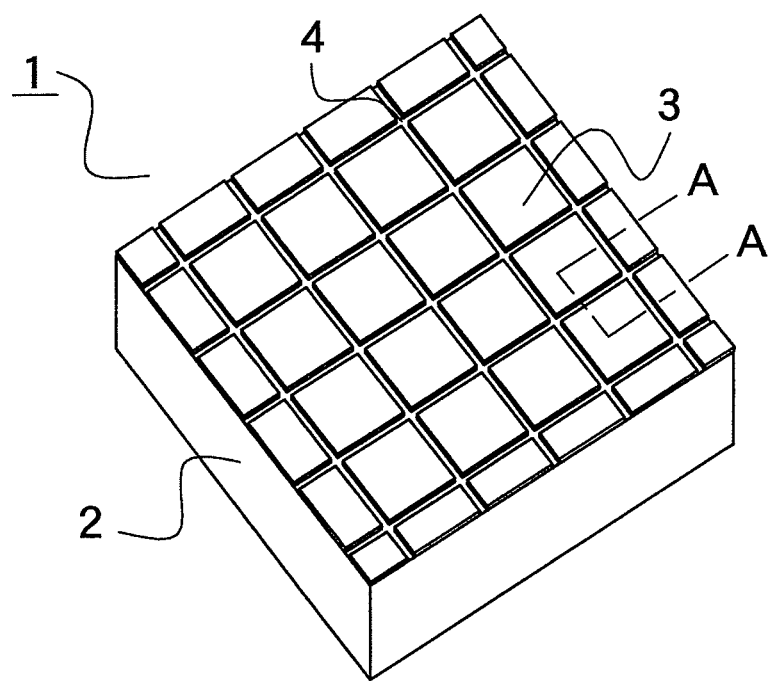
FIG. 1 is a partial perspective view showing an example of an engraved plate according to the present invention.

1 Engraved plate
2 Substrate
3 Insulating layer
4 Concave portion
5 Photosensitive resist layer
6 Projection portion
8 Insulating layer
9 Conductor layer pattern
10 Substrate for transfer
11 First substrate
12 Adhesive compound layer
13 Substrate with conductor layer pattern
13' Second substrate
14 Protecting resin
15 Bonding agent layer
16 Third substrate
17 Transparent resin
20 Hole
21 Step portion
22 Inclined portion
101 Electrolytic bath
102 Plating solution
103 First anode
103a Anode
104 Rotator
105 Pipe
106 Pump
107 Second anode
108 Deposited Metal
109 Adhering support member
110 Bonding roll
111 Adhesion support member with conductor pattern
151 Shielding member
210 engraved plate having plated portion
211 to 228 Conveyance roll
229 Pre-process tank
230 Plating tank
231, 233, 235 Water washing tank
232 Blacking process tank
234 Rust-proofing tank
236 Plastic film substrate
237 Bonding roll
238 Substrate with conductor layer pattern

BEST MODE FOR CARRYING OUT THE INVENTION

An engraved plate according to the present invention includes an insulating layer having a concave portion which increases in width toward an opening on a surface of a substrate. The substrate may be exposed on a bottom surface of the concave portion. The engraved plate according to the present invention can be used for gravure printing, coating of an adhesive compound, transfer coating of a resist material, and formation of a fine pattern such as a color filter used in a color liquid crystal display apparatus. For example, when ink held in the concave portion is transferred onto a sheet, a gravure can be manufactured. When a plating layer deposited on the concave portion is transferred onto a film, a substrate with conductive layer pattern can be manufactured. The substrate can be used as a light-transmitting electromagnetic wave shielding member, a touch panel member, an electrode extractor or a wire for a solar battery, a digitizer member, a skimming barrier card member, a transparent antenna, a transparent electrode, an opaque electrode, an electronic paper member, a substrate for photochromatic film, or the like. Furthermore, when the plating layer deposited on the concave portion is peeled, the plating layer can be used as a conductor layer pattern (patterned metal foil). Of the metal foils, in particular, a perforated metal foil can be used as an electrode for capacitor (collector for capacitor).

The substrate may be insulative. As a material of the insulating substrate, a ceramic, a carbon-fiber reinforced plastic (as a resin component, a thermoplastic resin such as an epoxy resin or an unsaturated polyester, a thermoplastic resin such as a polymethyl methacrylate or a saturated polyester, or the like is known), an inorganic material such as $Al_2O_3$ or $SiO_2$, and DLC are given. Of these materials, the DLC is preferable because the DLC is excellent in endurance and chemical resistance.

The substrate may be conductive. The conductive material used in the conductive substrate has electric conductivity enough to deposit a metal on an exposed surface by electrolytic plating. In particular, the conductive material is preferably a metal. The substrate preferably has low adhesion to the metal layer formed on the substrate surface and peeled easily such that the metal layer formed on the surface of the substrate by the electrolytic plating can be transferred to an adhesive support member. A material of the conductive substrate is not limited to the following materials. However, especially, iron, aluminum, stainless steel, chromeplated cast iron, chromeplated steel, titanium, a material applied with titanium lining, nickel, and the like are preferably used. As the conductive substrate, a substrate on the surface of which a conductive DLC film or a conductive inorganic material film is formed can be used.

When the conductive DLC film is formed on the substrate, minute distortion on the substrate can be corrected, and scratches are repaired to make it possible to smooth the substrate.

A method of forming a conductive DLC film or a conductive inorganic material film on the substrate is basically the same as the following method of forming an insulating DLC film or an inorganic material film. However, a method of giving electric conductivity to the DLC film or the inorganic material film is added.

The method of giving electric conductivity to the DLC film is not limited to the following example. Various methods can be used.

In the method of giving electric conductivity to the DLC film, for example, at least one impurity such as boron, nitrogen, or phosphorous is mixed with carbon and hydrogen to make the DLC film electrically conductive. When the impurity is mixed by a plasma CVD method, a gas containing these impurities is supplied in a chamber to form a DLC film, so that the impurity (boron and nitrogen) is taken as moleculars or atoms in the DLC film. The obtained film exhibits electric conductivity. In a plasma CVD reactive gas used at this time, as a boron source, for example, diborane ($B_2H_2$) and boron oxide ($B_2O_3$) can be used. As a nitrogen source, for example, nitrogen ($N_2$) can be used. Mixing of these elements, as used as an impurity in manufacturing of a semiconductor using a single crystal as a material, makes the DLC film electrically conductive although hard carbon having electric insulation is used.

In addition to the impurities, a material having electric conductivity in itself is taken into the film to make it possible to give electric conductivity to the DLC film. For example, at least one element selected from Ti (titanium), V (vanadium), Cr (chromium), Zr (zirconium), Nb (niobium), Mo (molybdenum), Hf (hafnium), Ta (tantalum), W (tungsten), Au (gold), Pt (platinum), and Ag (silver) is added to the film to make it possible to obtain a conductive film.

At this time, when an amount of added impurity is increased to decrease a resistivity, on the other hand, a characteristic such as abrasion resistance tends to be deteriorated. In consideration of a lower limit of the amount of added impurity, for example, when W is used in a plasma CVD method, a resistivity of $1\times10^6$ Ω·cm or less cannot be obtained unless the amount of added impurity is 0.0001 atom % or more. On the other hand, when Au is added by an ion implantation method, even though an amount of added impurity is 0.000001 atom %, a resistivity is $1\times10^6$ Ω·cm or less. In this manner, depending on elements to be added or adding methods, the lower limit of the resistivity changes. Therefore, the lower limit of the amount of added impurity in the DLC film is preferably set to 0.001 atom % or less in consideration of the added elements. As a method of adding an impurity in formation of the DLC film, the following methods can be applied.

(I) A method in which, during formation of a DLC film by a known method, a gas containing an impurity element is supplied to a reaction system to add the impurity into the film. In particular, this method is effective in a plasma CVD method, a sputtering method, an ion-plating method, a laser ablation method, or the like.

(II) A method in which, during formation of a DLC film by a known method, a solid-substance source containing an impurity element is applied to heating evaporation, sputtering evaporation, or ablation, and the impurity is resultantly added into the film. This method is effective in, especially, a sputtering method, an ion-plating method, an ion-beam sputtering method, a laser ablation method, or the like.

(III) A method in which, during formation of a DLC film by a known method, an ion beam containing an impurity element is irradiated to add the impurity element into the film.

(IV) A method in which, after a DLC film is formed by a known method, ions containing an impurity are implanted to add the impurity.

The above methods may be independently applied to formation of the DLC film added with the impurity, or the plurality of methods may be used in combination. The methods described above and other methods may be used in combination.

When these impurity elements are added into the film, simultaneously with film formation, ion irradiation on a DLC film which is gradually accumulated to increase a density of a carbon amorphous network and to make it possible to finely disperse the additive elements without clustering the additive elements. Furthermore, after film formation, a low-energy electron beam is irradiated on the amorphous carbon film to make it possible to form a local ultrafine graphite cluster at only peripheries of the finely dispersed impurity elements without macroscopically changing a carbon amorphous network structure.

In addition, a DLC film containing a large amount of graphite component and resultantly sp2 at a high content rate, and a DLC film containing a large amount of diamond component and resultantly sp3 at a high content rate are continuously or gradually accumulated sequentially from a substrate toward an upper layer to form a DLC film. By the method, a conductive DLC film can be formed.

As a method except for the above methods, a method of giving electric conductivity while applying a positive pulse by an ion implantation method using a pulse power supply is known. More specifically, a negative high-voltage pulse is applied to a substrate placed in a methane plasma to perform methane ion irradiation from all directions. A high-resistance layer such as an oxide film on a substrate surface is removed, and a conductive coating in which carbon atoms are dispersed is formed on the substrate surface by ion implantation. Hydrocarbon having a large molecular weight such as toluene is introduced into a vacuum tank to generate a plasma of the hydrocarbon by the high-frequency discharge or the glow discharge and to accumulate radicals. At the same time, a negative high-voltage pulse is applied to the substrate and positive ions are accelerated and irradiated on the substrate. At this time, a positive high-voltage pulse is applied to the substrate and electrons in the plasma are irradiated on the substrate to pulsatively activate only a surface layer and to set the surface layer in a high-temperature state, so that hydrocarbon radicals and ions are accumulated. These steps are organically combined to each other, so that a DLC film having high electric conductivity, high corrosion resistance, and high adhesion can be formed. Nitrogen may be mixed in a gas in the DLC film forming step to form a carbonitride film.

The method of making the inorganic material conductive can be performed in accordance with a method of making the DLC conductive. However, when the inorganic material has conductivity in itself, an operation of giving conductivity is unnecessary. As the inorganic material having conductivity in itself, inorganic compounds such as titanium aluminum nitride, chromium nitride, titanium nitride, titanium chromium nitride, titanium carbonitride, and titanium carbide are known. In this film formation, a physical vapor-phase growing method such as a sputtering method or an ion-plating method or a chemical vapor-phase growing method such as plasma CVD can be used.

When these conductive substrates are used, an engraved plate (conductive substrate for plating) having a plated portion can be easily manufactured.

A thickness of an insulating layer corresponds to a depth of a concave portion and is properly determined depending on purposes. The thickness of the insulating layer preferably falls in the range of 0.10 μm or more to 100 μm or less, more preferably, in the range of 0.5 μm or more to 20 μm or less, and particularly preferably, in the range of 1 to 10 μm. When the insulating layer is excessively thin, pin holes easily occur at the insulating layer. For this reason, in plating, a metal is easily deposited on a portion coated with the insulating layer.

A shape of an insulating layer surrounded by the concave portion is properly determined depending on purposes. As the shape, a triangle such as a regular triangle, an isosceles triangle, or a right triangle, a quadrangle such as a square, a rectangle, a lozenge, a parallelogram, or a trapezoid, a (regular) n-sided-polygon (n is an integer which is 3 or more) such as a (regular) hexagon, a (regular) octagon, a (regular) dodecagon, or a (regular) Icosagon, or a geometric figure such as a circle, an ellipse, or a pentagram is given. These shapes may be independently used, or shapes of two or more types may be combined to each other. A proper shape is selected depending on purposes. An engraved plate for gravure printing has a shape suitable for printing and a printed matter.

A conductor layer pattern (metal pattern) is manufactured by using an engraved plate having a plated portion. When this is used in the light-transmitting electromagnetic wave shielding member, and an insulating layer surrounded by the concave portion has a regular-n-sided-polygon and has the same line pitch width, in terms of electromagnetic wave shielding, an insulating layer is preferably triangular. In terms of visible optical transparency required for a light-transmitting electromagnetic wave shielding member, a transparent mesh antenna, or the like, the number n is preferably large such that a numerical aperture of a conductor layer pattern (metal pattern) manufactured by plating increases.

The shape of the engraved plate is not limited to the following examples. However, a sheet-like shape, a plate-like shape, a roll-like shape, and a hoop-like shape are given. When a roll-like engraved plate is used, a sheet-like or plate-like engraved plate may be attached to a rotator (roll). When the hoop-like engraved plate is used, a configuration in which rolls are arranged at two to several positions in the hoop and a hoop-like engraved plate is inserted into the roll may be employed. Since both the roll-like and hoop-like engraved plates can continuously produce a metal foil, production efficiency is higher than that in the sheet-like and plate-like engraved plates. Therefore, the roll-like and hoop-like engraved plates are preferable. When the engraved plate is winded on a roll and used, a conductive roll is preferably used such that the roll and the engraved plate are easily electrically connected to each other.

An example of the engraved plate according to the present invention will be described below with reference to the drawings.

Figure 2A:
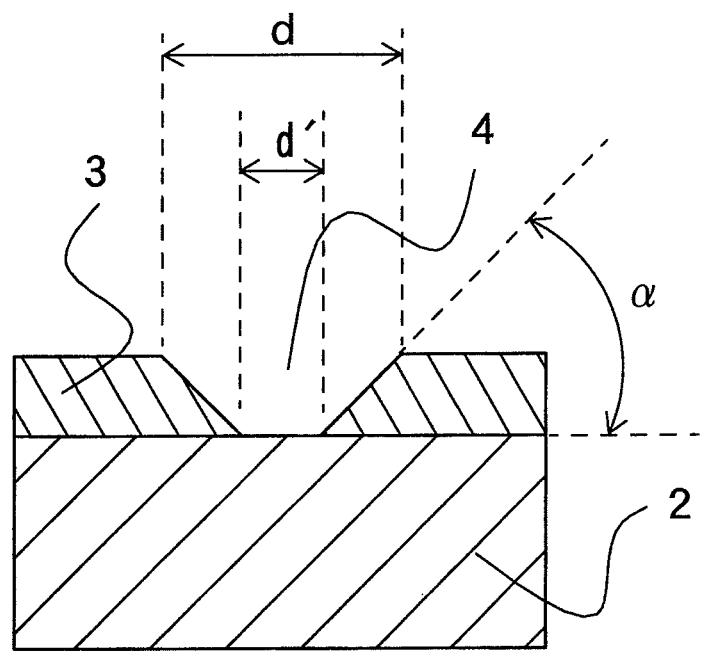
FIG. 2A shows an example of an A-A section of the engraved plate in FIG. 1.
Figure 2B:
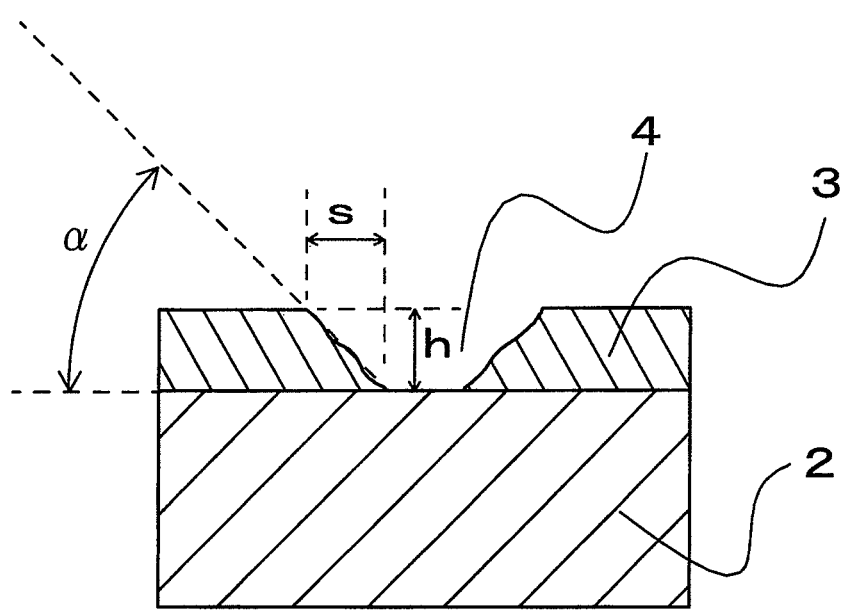
FIG. 2B shows an example of the A-A section of the engraved plate in FIG. 1.

FIG. 1 is a partial perspective view showing an example of the engraved plate according to the present invention. FIG. 2 shows an A-A sectional view in FIG. 1. FIG. 2A shows a case in which a side surface of a concave portion is planar, and FIG. 2B shows a case in which a side surface of the concave portion is moderately uneven.

An engraved plate 1 includes an insulating layer 3 on a substrate 2. A concave portion 4 is formed at the insulating layer 3, and the substrate 2 is exposed on a bottom portion of the concave portion 4. The bottom portion of the concave portion 4 may be a conductor layer which is electrically connected to the substrate. In this example, the insulating layer 3 has a square as a geometric figure, and the concave portion 4 is formed around the square in the form of a groove.

Between the substrate 2 and the insulating layer 3, a conductive or insulating intermediate layer (not shown, will be described later) to improve adhesion properties of the insulating layer 3 may be arranged.

The concave portion 4 increases in width as a whole toward an opening. As shown in the drawings, the concave portion 4 does not always constantly increase at an inclination α.

It is preferable that the concave portion does not decrease in width toward the opening and increases in width as a whole. In particular, one side surface of the concave portion, together with a surface facing the side surface, is preferably formed such that a portion vertical to a bottom surface does not continue for a length of 1 μm or more in a direction of height. When the engraved plate is used in plating deposition, a friction or a resistance between a plating layer and the insulating layer can be decreased when a plating layer is deposited on the concave portion and peeled, and peeling can be more easily performed. In a transfer of a transcript such as ink in gravure printing, the transfer is preferably smoothly performed. When peeling of a conductor layer pattern formed by plating or transfer of a transcript does not pose any problem, the concave portion may partially decrease in width toward the opening. However, it is preferable that such portion is not formed.

The side surface of the concave portion is not always planar. That is, the inclination may not always constant. In this case, as shown in FIG. 2B, the inclination α is determined by

[Numerical Expression 1]

$$\tan \alpha = h/s \qquad \text{(equation 1)}$$

such that a height h of the concave portion, i.e., a thickness of the insulating layer and a width s of a side surface of the concave portion, i.e., a direction in width of the side surface of the concave portion in the horizontal direction are calculated.

α is an angle which is preferably set to 10° or more and less than 90°, more preferably, set to 10° or more and 80° or less, and, particularly preferably, 30° or more and 60° or less. When this angle is small, the engraved plate tends to be difficult to be manufactured. The angle is preferably set to 30° or more. When the angle is large, in peeling of a metal layer (conductor layer pattern) formed on the concave portion by plating or in a transfer to another substrate, a resistance tends to increase. The angle is more preferably set to 80° or less.

In order to manufacture a conductor layer pattern (metal pattern) useful for a light-transmitting electromagnetic wave shielding member by using an engraved plate having a plated portion, as widths of the concave portion 4 as shown in FIG. 2, a width d of the opening is preferably set to 2 to 60 μm, a width of a bottom portion d' is preferably set to 1 to 40 μm. The width d of the opening of the concave portion 4 is more particularly preferably set to 4 to 15 μm, and the width d' of the bottom portion is particularly preferably set to 3 to 10 μm. A central interval (line pitch) of the concave portion 4 is preferably set to 50 to 1000 μm, and more specifically set to 100 to 400 μm. The width of the groove and an interval between the grooves are determined in consideration of the fact that the numerical aperture of the conductor layer pattern is preferably set to 50% or more, and more preferably set to 80% or more.

In the present invention, when the central interval (line pitch) of the concave portion cannot be easily determined because the graphic pattern of the insulating layer formed by the concave portion is a complex figure or a combination of a plurality of figures, with reference to a repetitive unit of the pattern, the area of the unit is converted into a square area, the length of one side of the square is defined as the central interval.

In particular, when the electromagnetic wave shielding member is used for a display, in terms of visible optical transparency, the numerical aperture of the conductor layer pattern in the electromagnetic wave shielding member must be 50% or more, and preferably 80% or more. The numerical aperture of the conductor layer pattern is a percentage of a ratio of, to an effective area of the electromagnetic wave shielding member, an area obtained by subtracting an area covered with a conductive layer from the effective area. The effective area of the electromagnetic wave shielding member is, for example, an area of a range in which the geometric figure is drawn, i.e., an area of a range which effectively functions for the electromagnetic wave shielding. This is also applied to not only the electromagnetic wave shielding member but also a transparent antenna or the like which is required to be transparent.

In order to manufacture a patterned metal foil by using an engraved plate having a plated portion, the area of the bottom surface (contact surface between the insulating layer and the conductive substrate) of the insulating layer 3 surrounded by the concave portion is preferably 1 to $1\times10^6$ square micrometers, and more preferably $1\times10^2$ to $1\times10^4$ square micrometers. The interval (minimum distance between convex portions) of the insulating layer is preferably 1 to 1000 μm, and more preferably 10 to 100 μm. The area of the bottom surface of the insulating layer and the interval of the insulating layers are determined in consideration of the fact that the numerical aperture of the conductor layer pattern (metal pattern) is preferably 10% or more, and particularly preferably 30% or more.

The method of manufacturing an engraved plate includes the step of forming an insulating layer having the appropriate plane figure as described above on a surface of a substrate.

This step includes (A) the step of forming a removal convex pattern on the surface of the substrate, (B) the step of forming an insulating layer on a surface of the substrate on which the removal convex pattern is formed, and (C) the step of removing the convex pattern to which the insulating layer adheres.

A method of manufacturing an engraved plate according to the present invention will be described below. FIG. 3 shows an example of a step showing the method of manufacturing an engraved plate by a sectional view.

Figure 3A:
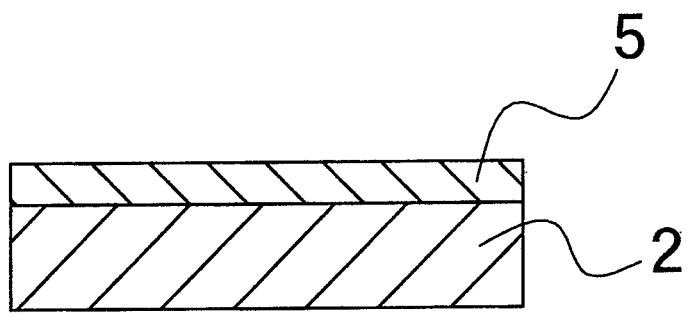
FIG. 3A is a sectional view showing an example of the steps in manufacturing an engraved plate according to the present invention.

As shown in FIG. 3A, a photosensitive resist layer (photosensitive resin layer) 5 is formed on the substrate 2. As the photosensitive resist, a negative resist (a portion on which light is irradiated is cured) or a positive resist (a portion on which light is irradiated is dissolved) can be used. When the resist is a dry film resist, the resist is laminated on the substrate 2. When the resist is a liquid resist, the resist is coated. The liquid resist can be coated by a sprayer, a dispenser, dipping, a roll, spin coating, or the like.

Figure 3B:
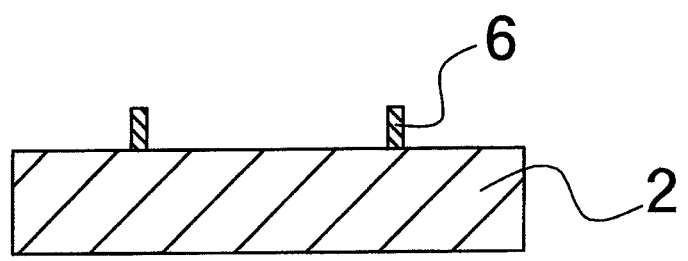
FIG. 3B is a sectional view showing an example of the steps in manufacturing an engraved plate according to the present invention.

As shown in FIG. 3B, a photolithography method is applied to the photosensitive resist layer 5 to pattern the photosensitive resist layer 5, so that a projection portion 6 may be formed. More specifically, after a patterned photomask is placed on the photosensitive resist layer 5, exposed, and then developed, an unnecessary portion of the photosensitive resist layer 5 is removed to leave the projection portion 6. The shape of the projection portion 6 and a plurality of projection portions are considered to correspond to the concave portions 4 on the substrate 2. A negative mask or a positive mask is used as the photomask. The negative mask and the positive mask are selected depending on the types of resists.

In place of formation of the projection portion 6 from the photosensitive resist layer 5 by using a mask, a resist pattern (convex pattern) may be formed by a printing method, and the resist may be cured by light irradiation or heat to form the projection portion 6. In this case, as the printing method of the resist pattern, various methods can be used. For example, screen printing, anastatic printing, anastatic offset printing, anastatic inversion offset printing, intaglio printing, intaglio offset printing, an ink-jet printing, a flexographic printing, or the like can be used. As the resist, a photo-curable resin or a thermosetting resin can be used.

A method of directly exposing the photosensitive resist layer 5 with a laser beam without using a mask can also be employed. When an active radiation energy is irradiated on the photo-curable resin through a mask or without a mask to make it possible to perform patterning, any configuration can be used.

When the substrate has a large size, a method using a dry film resist is preferable in terms of productivity. When the substrate is a plating drum or the like, a method of laminating a dry film resist or coating a liquid resist and directly exposing the resist with a laser beam or the like without a mask is preferably used.

With respect to a sectional shape of the projection portion 6, the side surface of the sectional shape is preferably vertical to the substrate, or the projection portion 6 is preferably located at a position where at least a part of an upper portion of the side surface of the projection portion 6 overhangs an end portion at which the projection portion 6 is in contact with the substrate 2. A maximum value $d_1$ of the width of the projection portion 6 is preferably set to be equal to or larger than a width $d_0$ of the projection portion 6 which is in contact with the substrate 2. This is because the width of a concave portion of an insulating layer, to be formed, having good adhesion is determined by $d_1$. In the sectional shape of the projection portion 6, as a method of making the maximum value $d_1$ of the width of the projection portion 6 equal to or larger than the width $d_0$ in which the projection portion 6 is in contact with the substrate 2, over-developing is performed in development of the projection portion 6, or a resist having an undercut shape as a characteristic feature may be used. The maximum value $d_1$ is preferably realized on the upper side of the convex portion.

The shape of the projection portion 6 is associated with the shape of the concave portion. Due to the facility of manufacturing, a maximum width is preferably 1 μm or more, an interval is preferably 1 μm or more, and a height is preferably 1 to 50 μm. When an engraved plate is used to manufacture a conductor layer pattern for a light-transmitting electromagnetic wave shielding member, the maximum width of the projection portion 6 is preferably 1 to 40 μm, and more preferably 3 to 10 μm. The interval is preferably 50 to 1000 μm, and more preferably 100 to 400 μm. The height is preferably 1 to 30 μm. When the engraved plate is used to manufacture a perforated metal foil, projection portions each having a circle or a rectangle having a proper size as a planar shape are arranged at proper intervals to form above described insulating layer 3.

Figure 3C:
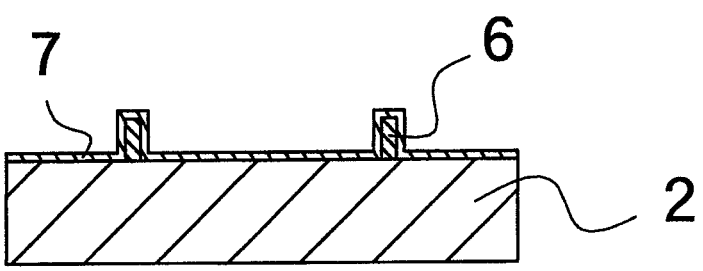
FIG. 3C is a sectional view showing an example of the steps in manufacturing an engraved plate according to the present invention.

As shown in FIG. 3C, an insulating layer 7 is formed on a surface of the substrate 2 having the projection portion 6. Although the insulating layer is not limited to the following examples, the insulating film may be formed with an inorganic material such as an inorganic compound, for example, DLC, $Al_2O_3$, or $SiO_2$.

When a DLC thin film is formed as an insulating layer, a dry coating method such as a physical vapor-phase growing method such as a vacuum deposition method, a sputtering method, an ion-plating method, an a cathodic arc deposition method, an ionization deposition method, or a chemical vapor-phase growing method such as plasma CVD method can be used. Of these methods, the plasma CVD method which uses a high-frequency wave or pulse discharge which can control a film forming temperature from a room temperature or higher is particularly preferable.

In order to form the DLC thin film by the plasma CVD method, a gas containing a carbon source as a raw material is used. As the gas containing the carbon source, hydrocarbon, carbon monoxide, or carbon dioxide is given. Of these gases, a hydrocarbon-based gas is preferably used. As the hydrocarbon gas, for example, alkane-based gases such as methane, ethane, propane, butane, pentane, and hexane, alkene-based gases such as ethylene, propylene, butane, and pentene, alkadiene-based gases such as pentadiene and butadiene, alkyne-based gases such as acetylene and methyl acetylene, aromatic-hydrocarbon-based gases such as benzene, toluene, xylene, indene, naphthalene, and phenanthrene, cycloalkane-based gases such as cyclopropane and cyclohexane, cycloalkene-based gases such as cyclopentene and cyclohexene, alcohol-based gases such as methanol and ethanol, ketone-based gases such as acetone and methyl ethyl ketone,
aldehyde-based gases such as methanal and ethanal, and the like are given. The gases may be independently used, or two or more gases may be used in combination. In addition to the gas containing a carbon source, oxygen, steam, or a noble gas may be contained. The noble gas is a gas consisting of 0(zero)-group element of the periodic table. As the gas, for example, helium, argon, neon, xenon, or the like is given. These noble gases may be independently used, or two or more noble gases may be used in combination.

When the insulating layer is formed with an inorganic material such as an inorganic compound such as $Al_2O_3$ or $SiO_2$, a physical vapor-phase growing method such as a sputtering method or an ion-plating method or a chemical vapor-phase growing method such as a plasma CVD can be used. For example, when the insulating layer is formed by the sputtering method, an oxide or nitride film such as an $SiO_2$ or $Si_3N_4$ film can be formed by introducing oxygen, nitrogen, or the like as a reactive gas and by using Si or Al as a target. When the ion-plating method is used, a film can be formed on the substrate by using Si or Al as a raw material, by irradiating of an electron beam to Si or Al and evaporating Si or Al. At this time, a reactive gas such as oxygen, nitrogen, or acetylene is introduced to make it possible to form an oxide, nitride, or carbide film. When the film is formed by a CVD method, a compound gas such as a metal chloride, a metal hydride, an organic metal compound, or the like is used as a raw material, and the film is formed by using a chemical reaction of the raw material. CVD of the silicon oxide is performed by plasma CVD using, for example, TEOS or ozone. CVD of the silicon nitride can be performed by plasma CVD using, for example, ammonia and silane.

Figure 3D:
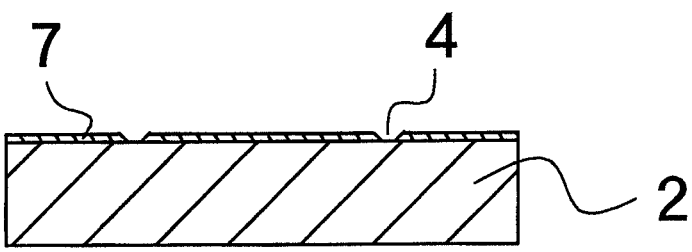
FIG. 3D is a sectional view showing an example of the steps in manufacturing an engraved plate according to the present invention.

As shown in FIG. 3D, the convex pattern constituted by the projection portion 6 is removed, so that the engraved plate 1 can be manufactured.

In removal of the projection portion 6 to which the insulating layer adheres, a commercial resist stripping solution, an inorganic or organic alkali, an organic solvent, or the like can be used. When there is a dedicated stripping solution corresponding to a resist used in formation of a pattern, the stripping solution can be used.

As a stripping method, for example, the insulating film is dipped in a chemical liquid to make it possible to swell, break, or dissolve the resist and then remove the resist. In order to sufficiently impregnate the stripping solution in the resist, a method such as a ultrasonic vibration, heating, and stirring may be simultaneously used. The stripping solution can be applied to the resist by shower, jet flow, or the like to enhance stripping. The resist can also be rubbed with a soft cloth, a cotton swab, or the like.

When the heat resistance of the insulating layer is sufficiently high, the resist can be removed by calcining and carbonize the resist at a high temperature, and a method of irradiating a laser to bake and evaporate the resist can also be used.

As a stripping solution, for example, a 3% NaOH solution is used. Shower or dipping can be applied as a stripping method.

The insulating layer formed on the substrate 2 and the insulating layer formed on a side surface of the projection portion 6 are made to have different property or characteristic, each other. For example, the hardness of the former is made higher than that of the latter. When the DLC film is formed by a plasma CVD method, the above configuration is established. In general, when the moving speed of an insulating material changes at an angle of, for example, 90°, in formation of an insulating film, the films formed as described above are different from each other in property or characteristic.

It is preferable that a distance of a boundary surface between the insulating film formed on the conductive substrate and the insulating layer formed on the side surface of the convex pattern from the side surface (serving as a plane vertical to the substrate) of the convex pattern does not decrease in an upright direction of the convex pattern and increases as a whole.

The side surface (serving as a plane vertical to the conductive substrate) is a vertical surface when the side surface of the convex pattern is a plane vertical to the substrate. However, when the side surface of the convex pattern overhangs the substrate side, the side surface of the convex pattern is a vertical plane vertically raised from a point where the side surface of the convex pattern ends at the conductive substrate.

When the projection portion 6 is removed, the insulating layer is separated by the boundary. As a result, the side surface of the concave portion has an angle of inclination $\alpha$. The angle of inclination $\alpha$ is preferably 10° or more and less than 90°, more preferably 10° or more and 80° or less, further preferably 30° or more and 60° or less, and particularly preferably 40° or more and 60° or less. When the DLC film is manufactured by plasma CVD, the angle can be easily controlled to about 40 to 60°. More specifically, the concave portion 4 is formed to increase in width toward the opening. As a method of controlling the angle of inclination $\alpha$, a method of adjusting the height of the projection portion 6 is preferably used. When the height of the projection portion 6 increases, the angle of inclination $\alpha$ can be easily increased and controlled.

In the formation of the insulating layer, since the substrate is not shadowed by the resist, the property of the insulating layer on the substrate is uniform. In contrast to this, in formation of the insulating layer on the side surface of the convex pattern, since the side surface of the convex pattern is at an angle with a direction of film thickness on the substrate, the insulating layer (in particular, a DLC film) to be formed cannot have the same characteristic (for example, the same hardness) as that of the insulating layer on the substrate. On a contact surface of the insulating layers which are different in quality, a boundary surface between the insulating layers is formed in accordance with growth of the insulating layers. Furthermore, since the boundary surface is a growing surface of the insulating layer, the boundary surface is smooth. For this reason, when the convex pattern consisting of the projection portion is removed, the insulating layer (in particular, the DLC film) is easily separated at the boundary surface. Furthermore, the angle of inclination α of the boundary surface, i.e., the side surface of the concave portion is consequently controlled as described above because the growth of the insulating layer is delayed on the side surface of the projection portion in a direction of film thickness on the substrate.

The hardness of the insulating layer formed on the substrate is preferably 10 to 40 GPa. The insulating layer having a hardness of less than 10 GPa is soft and in this case, when the engraved plate is used as a plate for plating, endurance in repetitive use tends to decrease. When the hardness exceeds 40 GPa, the insulating layer cannot follow the transformation of the substrate when the substrate is subjected to processing such as bending, and chaps or cracks easily occur at the insulating layer. The hardness of the insulating layer formed on the substrate is more preferably 12 to 30 Gpa.

In contrast to this, the hardness of the insulating layer formed on the side surface of the projection portion is preferably 1 to 15 GPa. The insulating layer formed on the side surface of the projection portion is preferably formed to have a hardness lower than that of the insulating layer formed on the substrate. In this manner, a boundary surface is formed between both the insulating layers, and then the step of stripping the convex pattern constituted by the projection portion to which the insulating layer adheres is performed, and resultantly a concave portion increasing in width toward an opening is formed. The hardness of the insulating layer formed on the side surface of the projection portion is more preferably 1 to 10 GPa.

The hardness of the insulating layer can be measured by using a nano indentation method. The nano indentation method is a method of pressing a regular-triangular-pyramid (Berkovich type) indentor having a diamond chip as a distal end shape into a thin film or a surface of a material and calculating a hardness on the basis of a load on the indentor at this time and a projection area under the indentor. As a measurement by the nano indentation method, an apparatus called a nano indentor is commercially available. The hardness of the film formed on the substrate can be measured by directly pressing an indentor from the upper side of the conductor substrate. In order to measure the hardness of the film formed on the side surface of the projection portion, a part of the substrate is cut and cast-molded with a resin, and the indentor is pressed from the section into an insulating layer formed on the side surface of the projection portion to make it possible to measure the hardness. In a normal nano indentation method, a hardness is measured by applying a small load of 1 to 100 mN to the indentor to perform hardness measurement. However, the present invention describes a value measured by applying a load of 3 mN to the indentor for 10 seconds as a value of hardness.

In place of manufacturing an engraved plate by the method using the photosensitive resist, an engraved plate as shown in FIG. 3D may be made by a method of forming an insulating layer on the substrate 2 and removing an unnecessary portion of the insulating layer by irradiation of a laser beam.

When a laser beam is irradiated on an insulating layer, a concave portion which increases in width toward an opening of the insulating layer can be formed by thermal diffusion. As the laser, although the laser is not especially limited, a $CO_2$ laser, a UV-YAG laser, and a femtosecond laser are given. When a laser such as the $CO_2$ laser or the UV-YAG laser having a large pulse width is used, even though the laser beam is narrowed down, thermal diffusion considerably affects the periphery of a portion having a processing width. For this reason, a groove which increases in width toward the opening can be formed. In contrast to this, when the femtosecond laser is used, a thermal diffusion area is small because a pulse width is small, and the groove having a small width can be formed.

In order to prevent the substrate or the periphery of the processed concave portion from being damaged, the femtosecond laser is preferably used.

The femtosecond laser is an ultrashort pulse laser in which an ON time (pulse width) is set to $10^{-12}$ seconds (1 picosecond) shorter than a thermal relaxation time. Note that the pulse width of a normal YAG laser (reference wave YAG laser) is about $10^{-3}$ seconds, and the pulse width of a high-frequency YAG laser is about $10^{-6}$.

In recent years, it has been proposed that a femtosecond laser having a pulse width of 1 picosecond or less is used in processing in which high depth accuracy is required for an organic compound. According to the femtosecond laser, nonthermal processing can be performed because multiphoton absorption or a phenomenon for a time shorter than a thermal relaxation time is performed. Furthermore, since nonlinear response is performed, a processing resolution is an optical diffraction limit or less, and processing can be performed at high accuracy. Since the nonthermal processing can be performed, a processing material does not melted. For this reason, a molten material is not scattered around the processed portion. Furthermore, the substrate is not deteriorated. A residual to a processed bottom portion or thermal damage around the processed portion is suppressed.

In processing, an assist gas or the like can also be used to remove a minute sticking material generated in the processing. As the assist gas, for example, dry air, nitrogen, oxygen, argon, or the like can be used.

In order to form the concave portion with a desired shape, a shape or size of the aperture is decreased to elongate a focal distance of a lens or an optical path from the aperture to the lens, so that a laser beam may be narrowed down.

As the surface of the substrate, a surface polished by polishing or the like is preferably used because a defect does not easily occur at the insulating layer. When an unevenness is present on the substrate, the insulating layer cannot completely bury the unevenness, and the portion may remain as a defect having a thin coating. Stress of the insulating layer is concentrated on the uneven portion, and the insulating layer is easily peeled. When a smooth unevenness remains on the surface of the substrate by electrolytic polishing, chemical polishing, or the like, the defect is not adversely affected. However, when a sharp unevenness formed by physical polishing or the like is present, this defect is easily conspicuous. Even in the step of laser processing, when the unevenness on the surface is large, the laser beam is not easily focused on the surface. For this reason, the surface of the substrate is preferably smooth.

FIG. 4 shows a sectional view of an example of a method of manufacturing an engraved plate having an intermediate layer according to the present invention.

Figures 1, 4C:
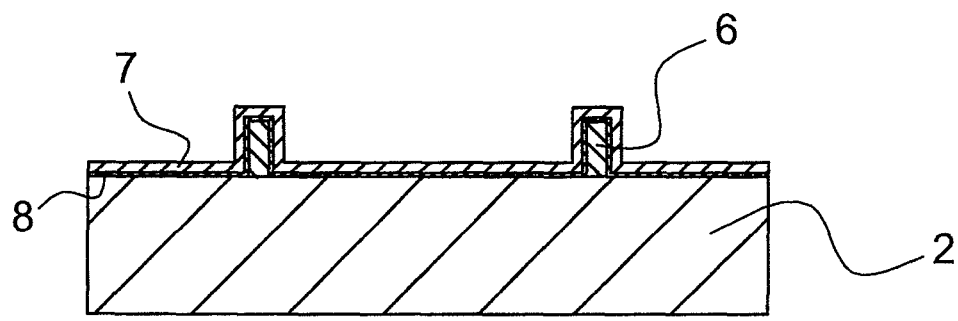

As shown in FIG. 4C-1, an intermediate layer 8 may be formed on the substrate 2 having the projection portion 6, and the insulating layer 7 may be formed.

By using the intermediate layer, adhesion of the insulating layer to the substrate is improved, so that endurance of the insulating layer can be further improved.

As the intermediate layer, an intermediate layer consisting of at least one component selected from Ti, Cr, W, Si, nitrides thereof, and carbides thereof may be used. Of these layers, a thin film consisting of Si or SiC is preferable because the thin film is excellent in adhesion to, for example, a metal such as stainless steel and forms SiC on a boundary face between the thin film and the insulating layer laminated thereon to improve adhesion of the insulating layer. These layers can be formed by the dry coating method. The intermediate layer preferably has the thickness of 1 μm or less. In consideration of productivity, the thickness is more preferably 0.5 μm or less. A coating having a thickness of larger than 1 μm is not suitable, because a coating time for the coating becomes long, and an internal stress of the coating film increases.

Figures 1, 4D:
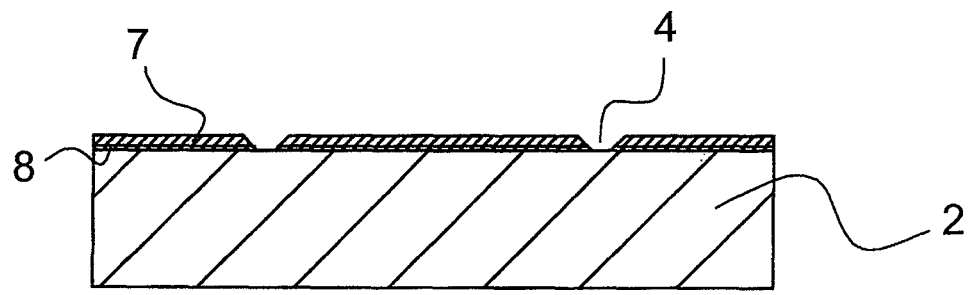

As shown in FIG. 4D-1, the concave portion 4 is formed to obtain an engraved plate. The concave portion 4 is formed as in FIG. 3D. On the bottom surface of the concave portion 4 of the obtained engraved plate, the substrate 2 is exposed, and the insulating layer 7 is formed on the intermediate layer 8.

The intermediate layer may be formed on the surface of the substrate 2 before the projection portion 6 is formed. Thereafter, on the surface, the step of forming an insulating layer to draw a geometric figure by the concave portion on which the substrate is exposed may be performed. When the concave portion is formed as a plated portion, and when an intermediate layer having electric conductivity which is enough to perform electrolytic plating is used, the bottom portion of the concave portion may still be the intermediate layer. However, when the intermediate layer has insufficient conductivity, a conductive substrate is used as the substrate 2, and the intermediate layer of the bottom portion of the concave portion is removed by a method such as a dry etching method to expose the substrate 2.

After the projection portion 6 is formed (FIG. 3 and FIG. 4C-1), one or more insulating layer may be formed (not shown). A second insulating layer buries a hole defect such as a minute hole (pin hole) to compensate for the defect of the first insulating layer. The second insulating layer need not completely cover the first insulating layer. The second insulating layer may be formed to compensate for at least the defect. When the second insulating layer is manufactured by using a electrocoating, the hole defect such as the pin hole can be efficiently buried. At this time, the coating may be performed to overflow the coating from the hold defect. Even though the pin hole is not completely buried, the coating may be formed to bury the hole defect to the extent that the conductive substrate of the corresponding portion is not expose. Although a third insulating layer is preferably formed to cover the second insulating layer, when selective coating is difficult, the coating may be performed to cover the entire insulating layer thereunder.

The second insulating layer is protected from a plating chemical liquid to be used by the third insulating layer, so that the endurance of the conductive substrate can be further improved. At this time, a DLC or an inorganic material is preferably used as the third insulating layer.

Two or more insulating layers or insulating layers of two or more types can be formed by performing the step of forming an insulating layer twice or more. With respect to a material, the DLC, the inorganic material, the electrocoating, an organic material such as the thermosetting resin, or the like can be used. The same material or different materials may be used. When two or more layers are used, a defect occurring when only one layer is used is compensated.

In particular, DLC or the inorganic material is used in the first insulating layer (initial insulating layer formed on a conductive substrate), a second insulating layer (insulating layer secondly formed on the conductive substrate) consists of an organic or inorganic material, and the third insulating layer (insulating layer thirdly formed on the conductive substrate) preferably consists of DLC or an inorganic material. As an insulating material used to form the second insulating layer, a material having high adhesion to the conductive substrate (for example, metal) and being excellent in heat resistance is preferably used. An inorganic material used in the second insulating layer is preferably in paste form. A method of forming a film consisting of DLC or an inorganic material is the same as the method described above.

As the organic material, a material which does not change in composition or physicality even at 10° C. or more is preferable when the DLC or the inorganic material is formed by the above method. A material which does not change in composition or physicality even at 150° C. or more is more preferable.

When the thermosetting resin is used as the material which does not change in composition or physicality, the composition and the physicality denote those obtained after the resin cured. As the thermosetting resin, an aniline formaldehyde resin, a urea-formaldehyde resin, a phenolformaldehyde resin, a lignin resin, a xylene formaldehyde resin, a xylene formaldehyde resin, a melamine formaldehyde resin, an epoxy resin, an urea resin, an aniline resin, a melamine resin, a phenol resin, a formalin resin, a metal oxide, a metal chloride, oxime, an alkylphenol resin, or the like is used. These resins are self-curing resin (curing catalyst may be used).

As the thermosetting resin, a resin using a curing agent can be used. As the materials, combinations between resins having functional groups such as a carboxyl group, a hydroxyl group, an epoxy group, an amino group, and unsaturated hydrocarbon group and curing agents having functional groups such as an epoxy group, hydroxyl group, an amino group, an amide group, a carboxyl group, and a thiol group or a curing agent such as a metal chloride, an isocyanate compound, an acid anhydride, a metal oxide, and a peroxide are used. In order to increase a curing reaction rate, an additive agent such as a general-purpose catalyst can also be used. More specifically, a curable acrylate resin composition, an unsaturated polyester resin composition, a diallyl phthalate resin, an epoxy resin composition, a polyurethane resin composition, and the like are exemplified. As a method of forming an insulating layer, a method of dipping a first conductive substrate in the resin which is diluted and drying the first conductive substrate can also be used. Since pin holes are selectively buried, a method of selectively applying a resin on pin hole portions by a dispenser or the like is more preferable.

As an insulating material used to form the second insulating layer, a material having high adhesion to a conductive material and being in excellent in heat resistance such as a metal is preferably used. As such a material, an electrocoating may be used. Since the electrocoating is deposited on an electrified position, when electrocoating is performed from the upper side of the DLC film, an electrocoating film is generated in only a hole defect such as a pin hole, and formation of the coating film can be minimized. As a manner of burying the hole defect such as a pin hole with an electrocoating, a manner of selectively burying a pin hole position is preferable. However, the coating may have a shape which is overflowed and largely spreads as long as the pin hole portion is buried. Even though the hole is not completely buried, any burying method may be used, as long as the conductive substrate 2 is not exposed.

Any one of a known cationic electrocoating and a known anion electrocoating can be used. An example of usable electrocoating is described here.

The cationic electrocoating includes a cathodic deposition type thermosetting electrocoating obtained by preparing a paste of a resin having a basic amino group and neutralizing with an acid and solving (dispersing) the resin with water. The cationic electrocoating is coated by using the conductive substrate (object to be coated) as a cathode.

As the resin having a basic amino group, a resin obtained by adding an amine compound to an epoxy group (oxirane ring) of an epoxy-group-containing resin such as a bisphenol epoxy resin, an epoxy-group (or glycidyl-group)-containing acrylic resin, glycidyl ether of alkylene glycol, epoxidized polybutadiene and epoxidized novolac phenol resin, a resin obtained by polymerizing an unsaturated compound having a basic amino group (for example, dimethylaminoethyl methacrylate, N-vinylpyrazole, N-diethylaminoethylacrylate, and the like), a reactant obtained by reacting a polyisocyanate component with a glycol component containing tertiary amino-group-containing glycol (for example, N-methyldiethanolamine) as one component of glycol and a polyisocyanate compound, and a compound obtained by generating iminoamine by a reaction between a acid anhydride and a diamine compound to introduce an amino group into a resin are known. As the amine compound described above, an amine compound, which is a basic amine compound, such as aliphatic, alicyclic, or aromatic-aliphatic primary or secondary amine, alkanolamine, tertiary amine, or quaternary ammonium salt is given.

A cross-linking agent may be mixed in the cationic electrocoating. As the cross-linking agent, a blocked polyisocyanate compound is well known. When a coating film is heated (about 140° or more), a block agent is dissociated, an isocyanate group is reproduced, and a crosslinking reaction between the group reactive with an isocyanate group such as a hydroxyl group in the catione resin described above and an isocyanate group occurs to cure the coating film.

Furthermore, in a cationic electrocoating, a pigment (A color pigment, an extender pigment, an anticorrosive pigment, or the like. A blending quantity of the pigment is preferably 40 parts by weight or less per 100 parts by weight of a solid resin content), a hydrophilic solvent, water, an additive, or the like can be mixed as needed.

The cationic electrocoating is preferably diluted with deionized water such that a solid content concentration is about 5 to 40% by weight, and pH of the coating is preferably adjusted within the range of 5.5 to 8.0. Cationic electrocoating prepared in this manner can be generally performed at a bath temperature of 15 to 35° C. and a load voltage of 100 to 400 V by using an object to be coated as a cathode. A bake temperature to cure the coating film generally preferably ranges from 100 to 200° C.

As the anion electrocoating, an anode-deposition type electrocoating obtained by using a resin having a carboxyl group as a main structure, neutralizing the resin with a basic compound, and solving (dispersing) the resin with water is preferably used. Coating is performed by using the conductive substrate (object to be coated) as an anode.

As the resin having a carboxyl group, an maleic oil resin obtained by making maleic anhydride addition-reaction to drying oil (linseed oil, dehydrated castor oil, wood oil, or the like), a maleic polybutadiene obtained by making maleic anhydride addition-reaction to polybutadiene (1,2-, 1,4-, or the like), a resin obtained by making maleic anhydride addition-reaction to unsaturated fatty ester of an epoxy resin, a resin obtained by making polybasic acid (trimellitic anhydride, maleic fatty acid, maleic oil, or the like) addition-reaction to a high-molecular-weight polyalcohol (having molecular-weight of about 1000 or more and including partial ester of an epoxy resin, stylene-allylalcohol copolymer and the like), a carboxyl-group-containing polyester resin (including a resin containing fatty acid denaturalized), a carboxyl-group-containing acrylate resin, and a resin obtained by making maleic anhydride or the like addition-reaction to a polymer or copolymer synthesized with a reaction product between a polymerizable unsaturated monomer containing a glycidyl group or a hydroxyl group and an unsaturated fatty acid are given. A resin having a carboxyl group content falling within the range of about 30 to 200 as an acid value is suitable.

A cross-linking agent can be mixed in the anion electrocoating. As the cross-linking agent, a low-molecular-weight melamine resin such as a hexakis methoxymethyl melamine, a butoxy methyl melamine, or an ethoxymethyl melamine can be used as needed. Furthermore, in the anion electrocoating, a pigment (A color pigment, an extender pigment, an anticorrosive pigment, or the like. A blending quantity of the pigment is preferably 40 parts by weight or less per 100 parts by weight of a solid resin content), a hydrophilic solvent, water, an additive, or the like can be mixed as needed.

The anion electrocoating is preferably adjusted with deionized water or the like to have a solid content concentration of about 5 to 40% by weight and preferably applied to anion electrocoating while keeping pH7 to pH9. The anion electrocoating can be performed according to a common procedure. For example, the anion electrocoating can be performed at a bath temperature of 15 to 35° C. and a load voltage of 100 to 350 V by using an object to be coated as an anode. The anion electrocoating film is heated to be cured in principle in a temperature range of 100 to 200° C., preferably, 140 to 200° C. When a resin denaturated by air-drying unsaturated fatty acid is used, the coating film can be dried at room temperature.

The second insulating layer can be formed by being coated or electrocoated on the first insulating layer in the wet process. In order to improve adhesion between the second insulating layer and the DLC film, a hydrophilic functional group may be introduced onto a surface of the DLC film by corona treatment, ITRO treatment, plasma treatment, frame treatment, or the like, and, thereafter, the second insulating layer described above may be coated. A primer, silane coupling agent, or the like is coated on one layer to make it possible to improve adhesion between the DLC film and the second insulating layer.

The second insulating layer consisting of an organic material coated or electrocoated in the wet process is frequently weak against strong acid or strong alkali. When the second insulating layer is used while being exposed, a pin hole may reappear. The third insulating layer is preferably formed to compensate for the pin hole. As the third insulating layer, a material such as DLC, $Al_2O_3$, and $SiO_2$ which is excellent in chemical resistance is preferably used. In particular, the DLC is more preferable because the DLC is excellent in chemical resistance.

When an insulating layer is partially removed with a laser beam to form a concave portion, these operations are preferably performed after all the insulating layers are formed.

By using the engraved plate having a plated portion, a conductor layer pattern (metal pattern) can be manufactured by depositing metal on the plated portion by plating.

As a plating method, a known method can be employed. An electrolytic plating method, an electroless plating method, another plating method can be applied.

As a metal appearing or deposited by plating, a conductive metal such as silver, copper, gold, aluminum, tungsten, nickel, iron, or chromium is used. However, the metals desirably include at least one metal having a volume resistivity (specific resistance) of 20 μΩ·cm or less at 20° C. When a structure obtained by the present invention is used as an electromagnetic wave shielding sheet, an excellent electromagnetic wave shielding property is obtained when a metal constituting the sheet has high conductivity because the electromagnetic wave shielding sheet is grounded by using an electromagnetic wave as a current. As these metals, silver (1.62 μΩ·cm), copper (1.72 μΩ·cm), gold (2.4 μΩ·cm), aluminum (2.75 μΩ·cm), tungsten (5.5 μΩ·cm), nickel (7.24 μΩ·cm), iron (9.0 μΩ·cm), chromium (17 μΩ·cm, all the values at 20° C.), or the like is used. However, the material is not limited to these metals. If possible, a volume resistivity is preferably 10 μΩ·Cm, and more preferably 5 μΩ·cm. In consideration of prices or ready availabilities of the metals, copper is most preferably used. These metals may be independently used, an alloy of the metal and another metal may be used to give functionality, and a metal oxide of the metal may be used. In terms of conductivity, the electromagnetic wave shielding sheet which maximally includes a metal having a volume resistivity of 20 μΩ·cm as a component is preferably used.

As an electroless plating method, copper plating, nickel plating, or the like is typically used. Furthermore, tin plating, gold plating, silver plating, cobalt plating, iron plating, or the like is used. In an electroless plating process which is industrially used, a reductant is added to a plating solution, and electrons generated by the oxidative reaction is used in a metal deposition reaction. The plating solution contains a metallic salt, a complexing agent, a reductant, a pH adjuster, a pH buffering agent, a stabilizer, and the like. In electroless copper plating, copper sulfate is preferably used as a metallic salt, formalin is preferably used as a reductant, and Rochelle salt or ethylenediaminetetraacetic acid (EDTA) is preferably used as a complexing agent. The pH is mainly adjusted with sodium hydroxide and potassium hydroxide, lithium hydroxide, or the like can also be used. As a buffering agent, carbonate or phosphate is used. As a stabilizer, a cyanide, thiourea, bipyridyl, o-phenanthroline, neocuproine, or the like which is preferentially complexed with univalent copper is used. In electroless nickel plating, nickel sulfate is used as a metallic salt, and sodium hypophosphite, hydrazine, a borohydride compound, or the like is preferably used as a reductant. When sodium hypophosphite is used, a plating film contains phosphorous and is excellent in corrosion resistance or abrasion resistance. As a buffering agent, monocarboxylic acid or alkali metal salt thereof is frequently used. As a complexing agent, a complexing agent which forms a soluble and stable complex with a nickel ion in a plating solution is used. Acetic acid, lactic acid, tartaric acid, malic acid, citric acid, glycine, alanine, EDTA, or the like is used. As a stabilizer, a sulfur compound or a lead ion is added. With respect to the electroless plating method, pp. 505 to 545 of the Non-patent Document 1 can be referred to.

Furthermore, in order to obtain a reducing function of the reductant, catalytic activation of a metal surface may be required. When a body consists of a metal such as iron, steel, nickel, or the like, these metals have catalytic activity. For this reason, the metals are deposited by only dipping the substrate in the electroless plating solution. When copper, silver, an alloy thereof, or stainless steel is a body, a method of dipping an object to be plated in an hydrochloric acid solution of palladium chloride and depositing palladium on the surface by ion substitution is used to give catalytic activity.

The electroless plating is a method of causing a palladium catalyst to be attached on a concave portion of an engraved plate as needed, dipping the engraved plate in an electroless copper plating solution at a temperature of about 60 to 90° C., and performing copper plating.

In the electroless plating, the substrate need not always be conductive. However, when an anodic oxidizing process is performed to the substrate, the substrate must be conductive.

In particular, when the material of the conductive substrate is Ni, to perform electroless plating, a method of anodic-oxidizing the engraved plate, dipping the engraved plate in an electroless copper plating solution, and depositing copper is used.

In electrolytic copper plating, copper sulfate bath, copper fluoroborate solution bath, copper pyrophosphate bath, or copper cyanide bath, or the like can be used as an electrolytic bath for plating. At this time, it is known that a stress relaxation agent (also having the effect of a brightening agent) comprising an organic material or the like is added to plating bath to make it possible to decrease scattering in electrodeposition stress. In electrolytic nickel plating, Watts bath, sulfamate bath, or the like can be used. Additives such as saccharin, para toluenesulphonamide, sodium benzensulfonate, and sodium naphthalene trisulforate and, as a blending stock, a commercially available additive may be added to these plating bath as needed to adjust flexibility of nickel foil. Furthermore, in electrolytic gold plating, alloy plating using potassium gold cyanide, pure gold plating using ammonium citrate bath, potassium citrate bath, or the like is used. In alloy plating, a binary alloy of gold and copper, gold and silver, and gold and cobalt or a ternary alloy of gold, copper, and silver are used. With respect to another metal, similarly, a known method can be used. As the electrolytic plating method, for example, pp. 87 to 504 in "Practical Plating for Field Engineer" (edited by Japan Plating Association, issued by Maki Shoten, 1986) can be referred to.

In plating to form a conductor layer pattern, at a specific current density applied across an engraved plate (cathode) having a plated portion and an anode, electrolytic plating is performed to the engraved plate (i.e., a metal is deposited on the plated portion of the engraved plate), and a conductive metal layer is formed. A volume resistivity of the conductive metal layer is preferably 10 μΩ·cm or less, and more preferably 5 μΩ·cm or less. The range of the specific current density described above is a range of a maximum current density or less representing an upper limit of a current density at which a normal coating film is generated, and a range of a critical current density or more which is a lower limit at which the normal coating film is generated. More specifically, the plating is influenced by a composition of an electrolytic solution, a type of an additive, a concentration, a circulating method, a temperature, a stirring method, and the like, and the plating is influenced by whether the plated portion pattern is a convex portion pattern or a concave portion pattern. For this reason, although the current density is not generally defined, preferably, the current density is properly determined in the range of 0.5 A/dm$^2$ or more to 60 A/dm$^2$ or less. This is because, when the current density is lower than the critical current density, a normal coating film cannot be obtained. When the current density is lower than 0.5 A/dm$^2$, a long period of time is required to deposit a metal layer having a target thickness. As a result, production efficiency is deteriorated, and production cost does not decrease. Furthermore, when the current density exceeds 60 A/cm$^2$, deposited copper does not form a normal coating film to hinder the transferring or peeling step (will be performed later). In terms of this point of view, the current density is preferably 40 A/cm$^2$ or less.

A blacking process may be applied to the conductor layer pattern formed on the engraved plate having the plated portion.

As plating bath used in the blacking process in the present invention, various plating solutions can be used. As an example, copper plating bath such as copper pyrophosphate bath or copper sulfate bath can be used. The copper pyrophosphate bath is an electrolytic solution containing copper pyrophosphate and pyrophosphate salts. As a concrete example, a plating bath having the following mixture is known. This plating bath can be used to manufacture the conductor layer pattern.

An aqueous solution which contains:
copper pyrophosphate 63 to 105 g/L (23 to 38 g/L as a copper content); and
potassium pyrophosphate 200 to 470 g/L,
and in which, as needed, ammonia water, potassium nitrate, a brightening agent, and the like are dissolved and mixed is used. As the ammonia water, for example, ammonia water having a specific gravity of 0.88 is used. 1 to 6 mL/L of ammonia water are preferably used, 8 to 16 g/L of potassium nitrate are preferably used, and a proper quantity of brightening agent (mercaptothiazol, mercaptothiazol-based additive, or the like) is preferably used.

In addition, sodium pyrophosphate or a commercially available additive for copper pyrophosphate plating can also be used. Furthermore, when one or more components of an VI group element such as molybdenum and a VIII group element such as cobalt or nickel is added to the plating bath, a blacking process can be more stably performed.

Copper sulfate bath is an electrolytic solution containing copper sulfate and sulfuric acid. As a concrete example, a plating bath having the following mixture is known. An aqueous solution which contains:
copper sulfate (pentahydrate) 50 to 400 g/L (12 to 100 g/L as a copper content); and
sulfuric acid 50 to 200 g/L,
and in which, as needed, chloride ions, an surface active agent, a brightening agent are dissolved and mixed is used. As a chloride ion source, hydrochloric acid, sodium chloride, or the like is known. 20 to 100 mg/L of the chloride ion source are preferably used. 1 to 20 mL/L of surface active agent and 0.1 to 10 mL/L of brightening agent can be preferably used. As a chemical agent which can be replaced with the surface active agent, polymer polysaccharide or low-molecular-weight glue can also cope with the copper sulfate bath. The plating bath can also be used to manufacture the conductor layer pattern. For the blacking process, the surface active agent is preferably used as an essential component. Furthermore, the copper sulfate bath preferably contains the brightening agent.

As the surface active agent, anion, cation, nonion, or ampholytic surface active agent can be used. In particular, the nonionic surface active agent is preferably used.

The nonionic surface active agent conceptually includes a polymeric surface active agent. For example, the nonionic surface active agent includes polymeric surface active agents such as polyethylene glycol, polypropylene glycol, polyvinyl alcohol, carboxymethylcellulose, and polyacrylamide. As the polymeric surface active agent, a polymeric surface active agent obtained by performing 2 to 300-mol addition condensation of any one or both of ethylene oxide and propylene oxide to alkanol, phenol, naphthol, or a bisphenol compound having a carbon number of 1 to 20, alkylphenol and arylalkylphenol having alkyl having a carbon number of 1 to 25, alkylnaphthol having alkyl having a carbon number of 1 to 25, alkoxyl phosphate having alkyl having a carbon number of 1 to 25, sorbitan ester, styrenated phenol, or polyalkylene glycol, aliphatic amine having a carbon number of 1 to 22, aliphatic amid having a carbon number of 1 to 22, or the like.

As an example of the cation surface active agent, lauryl trimethylammonium salt, stearyl trimethylammonium salt, lauryl dimethylethylammonium salt, octadecyldimethylethylammonium salt, dimethylbenzyl lauryl ammonium salt, cetyl dimethylbenzylammonium salt, octadecyldimethylbenzylammonium salt, trimethylbenzylammonium salt, triethylbenzylammonium salt, hexadecylpyridinium salt, lauryl pyridinium salt, dodecylpyridinium salt, stearyl amine acetate, lauryl amine acetate, octadecylamine acetate, or the like is given.

As the anion surface active agent, alkylsulfate, polyoxyethylene alkyl ether sulfate, polyoxyethylene alkyl phenyl ether sulfate, alkylbenzenesulfonate, (mono-, di-, or tri-) alkylnaphthalenesulfonate, or the like is given. As the alkyl sulfate, sodium lauryl sulfate, sodium oleyl sulfate, or the like is given. As the polyoxyethylene alkyl ether sulfate, sodium polyoxyethylene nonyl ether sulfate, sodium polyoxyethylene dodecyl ether sulfate, or the like is given. As the polyoxyethylene alkyl phenyl ether sulfate, polyoxyethylene nonyl phenylether sulfate or the like is given. As the alkylbenzenesulfonate, sodium dodecylbenzenesulfonate or the like is given. As the (mono-, di-, or tri-) alkylnaphthalenesulfonate, sodium dibutylnaphthalenesulfonate or the like is given.

As the ampholytic surface active agent, carboxy betaine, imidazoline betaine, sulfone betaine, aminocarboxylic acid, or the like is given. A sulfation adduct or sulfonation adduct of a condensation product between ethylene oxide and/or propylene oxide and alkyl amine or diamine can also used.

As the brightening agent, an organic sulfur compound or the like is known. As the sulfur compound, bis(3-sulfopropyl)disulfide, bis(2-sulfopropyl)disulfide, bis(3-sulfo-2-hydroxypropyl)disulfide, bis(4-sulfobutyl)disulfide, bis(p-sulfophenyl)disulfide, di-n-propyl-thioether-di-3-sulfonic aid, 3-(benzotiariazol-2-thio)propylsulfonic acid, N,N-dimethyl-dithiocarbamic acid-(3-sulfopropyl) ester, o-ethyl-diethyl-carbonate-s-(3-sulfopropyl)ester, thiourea and a derivative thereof, S-(2-ethylamide)-thiopropanesulfonic acid, S-(3-propylamide)-thiopropanesulfonic acid, S-(4-butylamide)-thiopropanesulfonic acid, S-(3-butylamide)-thiopropanesulfonic acid, S-(3-propylamide)-thiopropyl-2-hydroxy-3-sulfonic acid, S-(3-propylamide)-thiophenylsulfonic acid, S—(N,N-dimethyl-3-propylamide)-thiopropanesulfonic acid, S—(N-phenyl-3-propylamide)-thiopropanesulfonic acid, or the like and salts such as sodium salts or potassium salts thereof.

As a blacking process, furthermore, a plating process of another element such as black nickel plating or cobalt plating can be performed.

The black nickel plating is a plating method of forming a black alloy containing nickel sulfide as a main component on a surface of a body to be plated by electrodeposition. Any one of iron and cobalt which are VIII group elements can be used because sulfides of both the elements get black. Among sulfides of the VIII group elements, the nickel sulfide gets black which is a target color, and has preferable adhesion to an underlying metal. As a sulfide of an element except for the VIII group element, a sulfide of silver, mercury, copper, lead, or the like can be used. Even though alloy plating of tin and nickel or tin and cobalt or black chromium plating is used, a blacking process layer (black layer) which does not generate and scatter powder and has good adhesion to only a metal layer can be formed.

In formation of the black nickel plating layer, a plating solution containing 60 to 100 g/L of nickel sulfate, 30 to 50 g/L of ammonium nickel sulfate, 20 to 40 g/L of zinc sulfate, and 10 to 20 g/L of sodium thiocyanate can be used. This plating bath is used, pH: 4 to 7, a temperature: 45 to 55° C., and a current density (current density in a high energization state in a pulse electrolytic method): 0.5 to 3.0 A/dm² are set as conditions, a stainless anode or a nickel anode is used, and a circulating pump and air stirring are used in stirring, so that a black nickel plating layer suitable for a plasma display panel can be formed. As a pre-process for the black nickel plating, alkaline degreasing and acid washing which are appropriate to improvement of adhesion to an underlying metal layer are preferably performed. When plating is performed with a plating solution which contains each component in the concentration except the concentration range of the component, the plating solution can be easily decomposed, and preferable black cannot be easily obtained. When the plating is performed at a temperature of more than 55° C., the plating solution is easily decomposed. In contrast to this, when plating is performed at 1.0 A/dm² or more and a temperature of less than 45° C., a product has a rough surface and easily generate and scatter powder, and the life time of the plating solution becomes short. The plating can be performed at less than 45° C. and a current density of 1.0 A/dm² or less. However, in this case, long-term plating must be performed to obtain desired blackness, so that the productivity is deteriorated. For these reasons, a temperature range used when short-term black nickel plating is performed by using a plating solution having the above concentration composition is optimally 45 to 55° C. With respect to a current density (current density in a high energization state in pulse electrolytic method), the plating can be performed at less than 0.5 A/dm² within the temperature range. However, in this case, a long-term plating must be performed to obtain desired blackness. When plating is performed at more than 3.0 a/dm², the plating solution is easily decomposed, and a black film which easily contains and scatters powder is formed. In the black nickel plating using the stainless anode, the life time of the plating solution becomes short. For these reasons, in general, a nickel anode is desirably used.

In electrolytic plating, especially, in copper plating, when the conductor layer pattern is manufactured, a current density is relatively decreased. In a blacking process, a current density is relatively increased. Thus, manufacturing of a conductor layer formed as a continuous film and a blacking process which deposits granular or needle-like metal can be controlled.

Figure 5E:
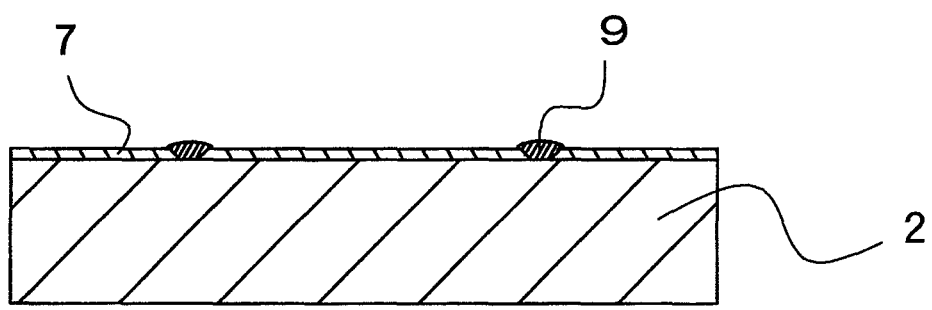
FIG. 5E shows a sectional view showing manufacture example of a substrate with conductor layer pattern according to the present invention.

As an example of a method of manufacturing a conductor layer pattern 9 in FIG. 5E, electrolytic plating is performed at a first current density applied across the conductive substrate 2 (cathode) and an anode (i.e., copper is deposited on the concave portion), and a conductive copper layer is formed to obtain the conductor layer pattern 9. A volume resistivity of the conductor layer pattern is preferably, 10 μΩ·cm or less, and more preferably 5 μΩ·cm or less. A range of the first current density is a range which is a maximum current density or less, that is, an upper limit or less of the current density to generate a normal film and which is a critical current density or more. The first current density, more specifically, is influenced by a composition of an electrolytic solution, a type of an additive, a concentration, a circulating method, a temperature, a stirring method, and the like and also influenced by a pattern of a convex portion or a concave portion. For this reason, the first current density cannot be automatically defined. However, the first current density is appropriately determined preferably in the range of 0.5 A/dm² or more to 60 A/dm² or less, more preferably in the range of 0.5 A/dm² or more to 40 A/dm² or less, or in the range of furthermore preferably 20 A/dm² or less. This is because, when the current density is out of the critical current density, a normal film cannot be obtained. When the current density is lower than 0.5 A/dm², a long period of time is required to deposit a metal layer having a target thickness. As a result, production efficiency is deteriorated, and production cost does not decrease. Furthermore, when the current density exceeds 60 A/cm², deposited copper does not form a normal film to hinder the transferring or peeling step (will be performed later). A conductor layer pattern consisting of a metal except for copper can also be manufactured as the conductor layer pattern 9 as a matter of course. The current density and the like are the same as described above.

After the conductor layer pattern 9 is formed, the blacking process may be subsequently performed. The blacking process can be performed in a tank different from that of a plating bath for forming a conductor layer pattern or the same tank of the plating bath.

The blacking process is performed to a surface of the conductive layer pattern at a second current density applied across the conductive substrate 2 (cathode) and the anode. The range of the second current density is preferably a range which is a maximum current density or more, that is, an upper limit or more of a current density to form a normal film and which is a limiting current density or less, that is, a maximum value or less of a current density at which ion supply by diffusion reaches the limit and at which the current density does not increase even though the voltage increases. Since an appropriate value of the second current density changes depending on a mesh shape or another plating condition, although the second current density is not generally determined, the second current density is appropriately determined in consideration of a degree of blackness. Depending on cases, even though the second current density is 10 A/dm², the blacking process can be performed. Depending on cases, when the second current density is not much higher, the blacking process may not be able to be performed. In general, when the pattern is very fine, a higher current density tends to be required. In a blacking process using copper plating bath, the other conditions do not change, in general, the second current density is appropriately selected from a range larger than the range of the first current density. When the second current density is excessively high, copper is deposited in a needle-like form, and drawbacks such as defective transfer or generating and scattering of powder tend to occur. The upper limit of the second current density is preferably 100 A/dm² in a DC system. When a plating bath except for the copper plating bath is used, the second current density may be the same as the first current density.

The second current density is not limited to one current density. The second current density is gradually changes in two or more steps, so that sizes of particles deposited as a black film may be controlled.

When the blacking process is performed by a pulse electrolytic method, the pulse electrolytic method is a plating method in which high energization and low energization are alternately performed. It is assumed that a high-energization time is defined as $T_1$, a low-energization time is defined as $T_2$, 1 cycle is given by:

$$1\ \text{cycle}=T_1+T_2,$$

and a cycle ratio E is given by:

$$E=100\times(T_1/(T_1+T_2)).$$

In this case, when the high-energization time $T_1$ and the low-energization time $T_2$ are too short or too long, the effect is insufficient, a preferable blacking process cannot be determined, or the metal is excessively deposited. When a pulse effect is insufficient, the film does not become sufficiently black. In contrast to this, under the condition in which the pulse effect is excessive, a drawback such as blackening and thickening or generating and scattering of powder occurs. As a cycle ratio, an appropriate cycle is determined in consideration of a current density. As desired energization times, the high-energization time $T_1$ is set to 2 ms or more and 20 ms or less, and the low-energization time $T_2$ is set to 5 ms or more and 200 ms or less. More preferably, the high-energization time $T_1$ is 5 to 10 ms, and the low-energization time $T_2$ is 50 to 100 ms. A preferable cycle ratio is 2% or more and 75% or less. The cycle ratio is more preferably 5% to 50%.

A current density in the high energization state is set to be higher than a current density in the low energization state, and the current density in the low-energization state is desirably a current density ($0 A/dm^2$) at which no current is impressed, or a current density which is higher than $0 A/dm^2$ and which is equal to or lower than the maximum current density in plating to manufacture the conductive metal layer. A preferable value of the current density in the high-energization state changes depending on the cycle ratio and an energization time of each cycle. As a tendency, a high current density is required when the cycle ratio is low or when the energization time is short. In contrast to this, when the cycle ratio is high or when the energization time is long, a value close to a current density in the DC condition can be selected.

An upper limit of the current density in the high-energization state is preferably set to $500 A/dm^2$. The current density in the high-energization state is preferably to be higher than the current density in the low-energization state by $5 A/dm^2$ or more, and more preferably by $10 A/dm^2$ or more.

Although a preferable current density changes depending on the shape and area of the pattern, various conditions such as a plating solution temperature and solution stirring, and the conditions of $T_1$ and $T_2$, preferable processing times are determined for the current densities.

In the blacking process step, a fine-grain metal (in particular, typically, a metal copper) is deposited on a surface of a conductive metal layer (in particular, typically, a metal copper layer) by electroplating to make the surface black or dark brown. The surface seems black or dark brown as a result of deposition of the fine-grain metal on the conductive metal layer thereunder. It can be said that the fine grains are arranged on the conductive metal layer, depending on cases, stacked to form a black metal layer.

In order to cover the upper surface of the conductive metal layer with a black or dark brown metal layer, the blacking process generally makes a current density constant to deposit a film having a predetermined film thickness in formation by plating of the conductive metal layer. That is, control is generally performed by a constant current. However, when the constant current control is applied to the blacking process, a current density suitable for the blacking process changes as the area to be plated is changed. As a result, an amount of energization easily becomes short or excessive. Furthermore, since an appropriate condition of the blacking process also changes depending on a shape of an object to be plated, a plating solution composition, solution circulation, and a temperature condition, management of the current density of the blacking process generally requires detailed management and control. In particular, when conductive metal layers are continuously produced with the engraved plate having a roll shape or a hoop shape, an area to be plated periodically changes depending on shapes of a conductive substrate and an insulating layer. Therefore, as a method of making the preferable current density constant, the blacking process state is preferably performed under the control by a constant voltage or an almost constant voltage. A current value mainly changes depending on the area to be plated under the control by the constant voltage or the almost constant voltage. As a result, the control of the blacking process can be performed by an almost constant current density. A voltage in a low-energization state preferably falls within the range of 0 V to 3 V, and a voltage in a high-energization state preferably falls within the range which is higher than the voltage in the low-energization state and which is 10 V or less.

A color is required to be expressed numerically to quantatively evaluate the color. Some methods of expressing colors numerically are standardized by International Commission on Illumination (CIE). As a typical method of these methods, an L*a*b* color system is known. In this system, L* denotes a luminance, a* denotes hue and chromaticness of red-green, and b* denotes hue and chromaticness of yellow-blue. Perfect black (light is totally absorbed) is expressed by L*: 0. In contrast to this, perfect white (light is totally reflected) is expressed by L*: 100.

A substrate with conductor layer pattern which shields a display surface of a display from an electromagnetic wave is required to have good optical transparency. For this reason, a coverage obtained by the conductor layer pattern for electromagnetic wave shielding is preferably decreased as much as possible. In order to prevent external light from being reflected, to increase the brightness of transmitted light, and to improve image quality, the conductor layer pattern itself is desirably black. However, since the substrate with conductor layer pattern itself has high optical transparency for the above reasons, a chromaticity (luminance) of the substrate with conductor layer pattern itself having a microscopic shape cannot be easily directly measured. Therefore, against a black background having a luminance of 25, the luminance of the conductor layer pattern portion is measured. More specifically, the black surface of the conductor layer pattern faces upward, black paper having a luminance of 25 is laid under the substrate with conductor layer pattern, and the luminance is measured. When the conductor layer pattern is preferably black, the luminance L* has a value of 25 to 50, and the chromaticities a* and b* have values of 5 or less. On the other hand, when the degree of blackness is insufficient to leave the original color of copper, the luminance L* has a large value of 60 or more, and the chromaticities a* and b* have values larger than 5 representing red or yellow.

The chromaticity can be measured such that a spectrophotometer CM-508d (Konica Minolta Holdings, Inc.) is used and set in a reflection mode. A color-measurement target portion for measuring luminance and the chromaticity is a circle having a diameter of 8 mm, and an average color of the opening can be calculated.

When generation of a conductive metal layer and a blacking process are continuously performed in, especially, the same plating bath, a water washing process and surface finishing of the conductive metal layer need not be performed between the conductive layer forming step and the blacking process step. For this reason, manufacturing time can be shortened, and costs can be reduced, and an environmental load can also be reduced. Such step are especially useful when metal is copper.

The conductor layer pattern deposited on the concave portion 4 of the engraved plate by plating preferably has a thickness of 0.1 µm or more and more preferably has a thickness of 0.5 µm or more to exhibit sufficient conductivity (for example, to sufficiently develop an electromagnetic wave shielding property). In order to reduce the possibility of forming a pin hole in the conductor layer pattern (at this time, the electromagnetic wave shielding property is deteriorated), the thickness is further preferably 3 µm or more. When the thickness of the conductor layer pattern is excessively large, the conductor layer pattern increases in width. For this reason, a line width increases when the pattern is transferred, a numerical aperture of the substrate with conductor layer pattern decreases, and transparency and invisibility are deteriorated. Therefore, in order to secure the transparency and invisibility, the thickness of the conductor layer pattern is preferably 20 µm or less. Furthermore, in order to shorten deposition time of plating and increase production efficiency, the thickness of the conductor layer pattern is further preferable 10 µm or less.

In order to preferably peel the conductor layer pattern by a transfer substrate through a bonding agent or an adhesive compound without disconnection or defective peeling, the conductor layer pattern is preferably deposited to be higher than the insulating layer by about 1 µm or more.

On the other hand, when the depth of the concave portion is relatively larger than the thickness of the deposited conductor layer pattern, the conductor layer pattern can be regulated in shape. For this reason, the thickness of the conductor layer pattern formed by plating is preferably twice or less the height of the insulating layer, particularly preferably 1.5 times or less the height, and further particularly preferably 1.2 times or less the height. However, the thickness is not limited to these values.

Even though plating is performed enough to cause a conductor layer pattern to be present in the concave portion, an anchor effect when the conductor layer pattern is peeled can be extremely reduced, since the concave portion shape increases in width toward the opening, and the surface of the concave portion side surface formed by the insulating layer can be smoothed. A ratio of the height of the conductor layer pattern to be deposited to the width of the conductor layer pattern can be made high, and a transmissivity can be more improved.

A substrate with conductor layer pattern according to the present invention will be described below. The substrate with conductor layer pattern can be applied to, an electromagnetic wave shield film, a mesh antenna or a transparent antenna, a touch panel member, an electrode extractor or a wire for a solar battery, a digitizer member, a skimming barrier card member, a transparent antenna, a transparent electrode, an opaque electrode, an electronic paper member, a photochromatic film, or the like. The substrate with conductor layer pattern is manufactured by a method including (i) the step of depositing a metal on a concave portion of the engraved plate, and (ii) the step of transferring the metal deposited on the concave portion to another substrate. The details will be described with reference to the drawings. FIG. 5 is a sectional view showing a first half of a manufacture example of a substrate with conductor layer pattern. FIG. 6 is a sectional view showing the second half of the manufacture example.

As shown in FIG. 5E, the concave portion of the engraved plate is plated to form the conductor layer pattern 9. The conductor layer pattern may be treated by a blacking process.

Figure 5F:
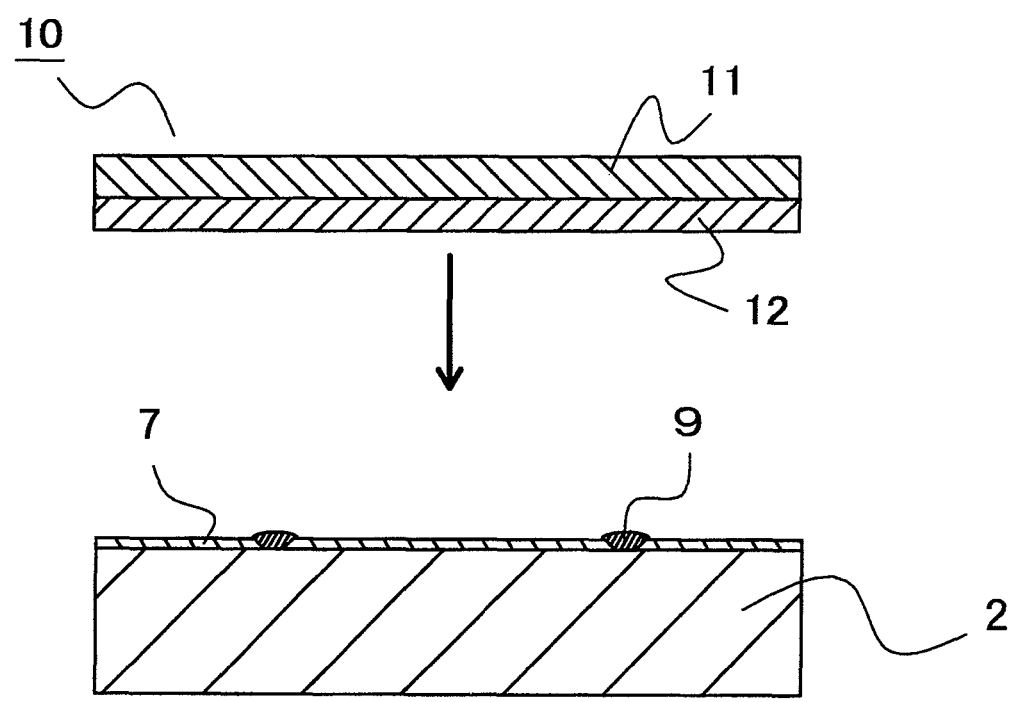
FIG. 5F shows a sectional view showing manufacture example of a substrate with conductor layer pattern according to the present invention.

As shown in FIG. 5F, the conductor layer pattern 9 is transferred to a transfer substrate 10. The transfer substrate 10 includes a first substrate 11 and an adhesive compound layer 12. The engraved plate 1 on which the conductor layer pattern 9 is formed is prepared to bond by pressure the adhesive compound layer 12 side of the transfer substrate 10. In place of the adhesive compound layer 12 of the transfer substrate 10, the substrate itself may have necessary adherence.

Although the first substrate 11 is not limited to the following examples, a plate consisting of glass, plastic, or the like, a plastic film, a plastic sheet, or the like is used. Although the glass is not limited to the following examples, glass such as soda glass, non-alkali glass, or tempered glass is used.

Although the plastic is not limited to the following examples, a thermoplastic resin or a thermosetting resin such as a polystyrene resin, an acrylic resin, a polymethyl methacrylate resin, a polycarbonate resin, a polyvinyl chloride resin, a polyvinylidene chloride resin, a polyethylene resin, a polypropylene resin, a polyamide resin, a polyamideimide resin, a polyetherimide resin, a polyetherether ketone resin, a polyalylate resin, a polyacetal resin, a thermoplastic polyester resin such as a polybutylene terephthalate resin or a polyethylene terephthalate resin, a cellulose acetate resin, a fluorine resin, a polysulfone resin, a polyethersulfone resin, a polymethylpentene resin, a polyurethane resin, or a diallyl phthalate resin is used. Of the plastics, a polystyrene resin, an acrylic resin, a polymethyl methacrylate resin, a polycarbonate resin, or a polyvinyl chloride resin which are excellent in transparency is preferably used.

Of these materials, as the first substrate, a plastic film is preferably used. As the plastic film, a film consisting of a polyester such as polyethylene telephthalate (PET) or polyethylene naphthalate, a polyolefin such as polyethylene, polypropylene, polystyrene, or EVA, a vinyl resin such as polyvinyl chloride or polyvinylidene chloride, or a plastic such as polysulfone, polyethersulfone, polycarbonate, polyamide, polyimide, or an acrylic resin and having an all-visible-light transmittance of 70% or more is preferable. These layers can be independently used, and can be used as a multi-layer film obtained by combining two or more layers. Of these plastic films, a polyethylene telephthalate film or a polycarbonate film are especially preferable because of transparency, heat resistance, easy handling, and a price.

The thickness of the first substrate is not limited to a specific thickness. However, the thickness is preferably 1 mm or less. When the first substrate is excessively thick, a visible-light transmittance tends to decrease. When the first substrate is excessively thin, handling properties are deteriorated. In consideration of this, the thickness of the plastic film is preferably 5 to 500 µm, and more preferably 50 to 200 µm.

In order to use the first substrate as a substrate of an electromagnetic wave shield film to prevent an electromagnetic wave from leaking from a front surface of a display, the first substrate is desirably transparent.

The adhesive compound layer 12 which exhibits adherence in a transfer state or exhibits adherence in a heating state or under pressure is preferably used. As a resin having adherence, a resin having a glass-transition temperature of 20° C. or less is preferably used, a resin having a glass-transition temperature of 0° C. or less is most preferably used. As a material used in the adhesive compound layer, a thermoplastic resin, a resin which is cured by irradiation of an active radiation energy, a thermosetting resin, or the like can be used. When the resin exhibits adherence in a heating state, if the temperature is excessively high, deformation such as gurgitation, sag or curl may occur in the transparent substrate. For this reason, the glass-transition temperature of the thermoplastic resin, the thermosetting resin, or a resin which is cured by irradiation of an active radiation energy is preferably 80° C. or less. The weight-average molecular weight of the thermoplastic resin, the thermosetting resin, or a resin which is cured by irradiation of an active radiation energy is preferably 500 or more. When the molecular weight is smaller than 500, the cohesive force of the resin is excessively low. For this reason, adhesion to a metal may be deteriorated.

As typical thermoplastic resin, the following resins are given. For example, natural rubber, a (di)ene such as polyisoprene, poly-1,2-dibutadiene, polyisobutene, polybutene, poly-2-heptyl-1,3-butadiene, poly-2-t-butyl-1,3-butadiene, poly-1,3-butadiene, a polyether such as polyoxyethylene, polyoxypropylene, polyvinylethylether, polyvinylhexylether, or polyvinylbutylether, a polyester such as polyvinyl acetate or polyvinyl propionate, polyurethane, ethyl cellulose, polyvinyl chloride, polyacrylonitrile, polymethacrylonitrile, polysulfone, polysulfide, a phenoxy resin, or a poly(metha) acrylic ester such as polyethylacrylate, polybutylacrylate, poly-2-ethylhexylacrylate, poly-t-butylacrylate, poly-3-ethoxypropylacrylate, polyoxycarbonyltetramethacrylate, polymethylacrylate, polyisopropylmethacrylate, polydodecylmethacrylate, polytetradecylmethacrylate, poly-n-propylmethacrylate, poly-3,3,5-trimethylcyclohexylmethacrylate, polyethylmethacrylate, poly-2-nitro-2-methylpropylmethacrylate, poly-1,1-diethylpropylmethacrylate, or polymethylmethacrylate can be used. Monomers constituting these polymers may be used as a copolymer which obtained by copolymerization of two or more of the monomers as needed. Two or more of the polymers or the copolymers can also be blended and used.

As a resin cured by an active radiation energy, a material which uses an acrylate resin, an epoxy resin, a polyester resin, an urethane resin, or the like as base polymers and gives a radical polymerizability or cation polymerizability functional group to each of the base polymers can be exemplified. As the radical polymerizability functional group, a group having a carbon-carbon double bond such as an acrylic group (acryloyl group), a methacryl group (nethacryloyl group), a vinyl group, an allyl group, or the like is known, and the acrylic group (acryloyl group) having good reactivity is preferably used. As the cation polymerizability functional group, an epoxy group (glycidyl ether group or glycidyl amine group) is typically known, and a high-reactivity alicyclic epoxy group is preferably used. As a concrete material, acrylic urethane, epoxy(metha) acrylate, epoxy modifying polybutadiene, epoxy modifying polyester, polybutadiene (metha) acrylate, acrylic modifying polyester, or the like is known. As the active radiation energy, an ultraviolet ray, an electron beam, or the like is used.

When the active radiation energy is an ultraviolet ray, as a photosensitizer or a photoinitiator to be added in ultraviolet curing, a known material such as benzophenones, anthraquinones, benzoins, sulfonium salts, diazonium salts, onium salts, or halonium salts can be used. A general purpose thermoplastic resin may be blended in the above material.

Before active energy is irradiated on a resin which is cured by an active radiation energy to cross-link the resin, the resin may be cross-linked by using a curing agent or the like. As the curing agent for curing a resin having a functional group such as a carboxyl group, a hydroxyl group, an epoxy group, an amino group, or an unsaturated hydrocarbon group, a curing agent having a functional group such as an epoxy group, a hydroxyl group, an amino group, an amide group, a carboxyl group, or a thiol group or a curing agent such as a metal chloride, an isocyanate, a acid anhydride, a metal oxide, or a peroxide is exemplified. In order to increase a curing reaction speed, an additive such as a general-purpose catalyst can be used. More specifically, a curable acrylic resin composition, an unsaturated polyester resin composition, a diallylphthalate resin, an epoxy resin composition, or a polyurethane resin composition is exemplified.

When the resin which is cured with an active radiation energy is used, the resin can be cured while burying the conductor layer pattern 9 in the resin. For this reason, cohesive force on the conductor layer pattern 9 is very high, and adhesion between the resin and the transferred metal is very high. After the conductor layer pattern is peeled from the resin, the metal transferred to the resin is free from a drawback such as bending and breaking or loosening, and the metal can be transferred with a very good line shaping property. The active energy is irradiated to make a tacking property of the resin surface inactive. In this manner, adhesion generated between the conductor layer pattern and the resin when the conductor layer pattern is peeled is extremely deteriorated. Therefore, when the conductor layer pattern is peeled from the resin, the residue of the resin on the conductor layer pattern is preferable. With respect to the degree of hardness of the resin when the conductor layer pattern deposited on the concave portion is arranged on the first substrate and the active radiation energy is irradiated, a cross-linking reaction is desirably performed by 10% to 100% regardless of radical polymerization or cationic polymerization. In a so-called incomplete curing state in which the cross-linking reaction is 10% or more to less than 100%, the same result as described above is obtained.

As the thermosetting resin, a combination between a resin such as natural rubber, isoprene rubber, chloroprene rubber, polyisobutylene, butyl rubber, halogenated butyl, acrylonitrile-butadiene rubber, styrene-butadiene rubber, polyisobutene, carboxy rubber, neoprene, or polybutadiene, and a cross-linking agent such as sulfur, an aniline formaldehyde resin, a urea-formaldehyde resin, a phenolformaldehyde resin, a lignin resin, a xylene formaldehyde resin, a xylene formaldehyde resin, a melamine formaldehyde resin, an epoxy resin, an urea resin, an aniline resin, a melamine resin, a phenol resin, a formalin resin, a metal oxide, a metal chloride, oxime, an alkylphenol resin, or the like may be used. In these thermosetting resins, in order to increase a cross-linking reaction speed, an additive such as a general-purpose vulcanization accelerator can also be used.

The thermosetting resin may be cured by using a curing agent. As the thermosetting resin, a resin having a functional group such as a carboxyl group, a hydroxyl group, an epoxy group, an amino group, or an unsaturated hydrocarbon group is given. As the curing agent, a compound having a functional group such as an epoxy group, a hydroxyl group, an amino group, an amide group, a carboxyl group, or a thiol group, a metal chloride, an isocyanate, an acid anhydride, a metal oxide, or a peroxide is given. In order to increase a curing reaction speed, an additive such as a general-purpose catalyst can also be used. As the thermosetting resin, a curable acrylic resin composition, an unsaturated polyester resin composition, a diallylphthalate resin, an epoxy resin composition, a polyurethane resin composition, or the like is exemplified.

As the thermosetting resin or the resin cured by an active radiation energy, an adduct of an acrylic acid or a methacrylic acid is preferably used.

As the adduct of an acrylic acid or a methacrylic acid, epoxy acrylate (n=1.48 to 1.60), urethane acrylate (n=1.5 to 1.6), polyether acrylate (n=1.48 to 1.49), or polyester acrylate (n=1.48 to 1.54) can also be used. In particular, with respect to an adhesive property, urethane acrylate, epoxy acrylate, and polyether acrylate are excellent. As the epoxy acrylate, a (meth) acrylic acid adduct of 1,6-hexanediol diglycidyl ether, neopentylglycol diglycidyl ether, allyl alcohol diglycidyl ether, resorcinol diglycidyl ether, adipate diglycidyl ester, phthalate diglycidyl ester, polyethylene glycol diglycidyl ether, trimethylolpropane triglycidyl ether, glycerine triglycidyl ether, pentaerythritol tetraglycidyl ether, sorbitol tetraglycidyl ether or the like is given. A polymer such as epoxyacrylate having a hydroxyl group in a molecular is effective to improve an adhesive property. Two or more of these copolymer resins can be used at once as needed.

In a adhesive compound layer, as needed, an additive such as a cross-linking agent, a curing agent, a diluent, a plasticizing agent, an antioxidant, a filler, a coloring agent, an ultraviolet absorber, or a tackifier may be mixed.

Since the adhesive compound layer does not have sufficient strength when the thickness of the adhesive compound layer is excessively small, the conductor layer pattern 9 does not adhere to the adhesive compound layer 12 when the conductor layer pattern 9 is transferred, and defective transfer may occur. Therefore, the thickness of the adhesive compound layer is preferably 1 μm or more, and further preferably 3 μm or more to secure transfer reliability in mass production. When the adhesive layer is thick, the manufacturing cost of the adhesive compound layer increases. When the adhesive compound layer is laminated, a deformation volume of the adhesive layer increases. For this reason, the thickness of the adhesive compound layer is preferably 30 μm or less and more preferably 15 μm or less.

Figure 6G:
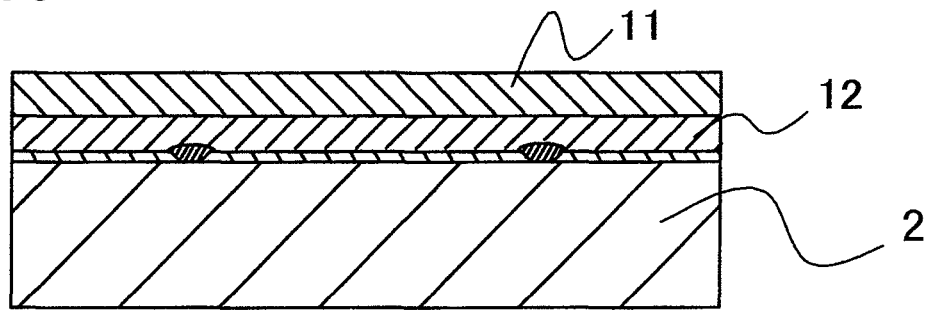
FIG. 6G shows a sectional view showing manufacture example of a substrate with conductor layer pattern according to the present invention.

As shown in FIG. 6G, the adhesive compound layer 12 side of the transfer substrate 10 is press-bonded on the engraved plate 1 on which the conductor layer pattern 9 is formed. At this time, the adhesive compound layer 12 may be in contact with the insulating layer 7. After the transfer substrate 10 is bonded to a surface on which a metal layer is formed, depending on the characteristics of the adhesive compound layer 12, heating and irradiation of an active radiation energy are performed as needed.

Figure 6H:
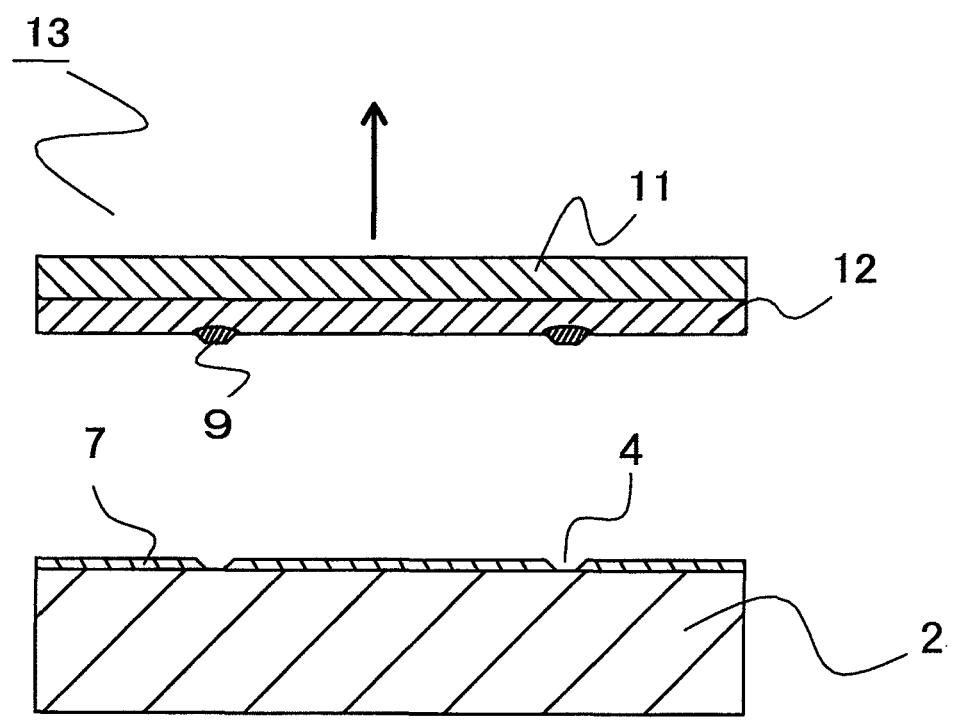
FIG. 6H shows a sectional view showing manufacture example of a substrate with conductor layer pattern according to the present invention.

As shown in FIG. 6H, the transfer substrate 10 is peeled, the conductor layer pattern 9 adheres to the adhesive compound layer 12 and is peeled from the concave portion 4 of the engraved plate 1. As a result, a substrate with conductor layer pattern 13 is obtained.

A line width of a conductor layer pattern (means a conductor layer pattern treated by a blacking process when a blacking process is performed to a metal pattern) of the finally obtained substrate with conductor layer pattern is preferably 40 μm or less, and a line interval therebetween is preferably 50 μm or more. In terms of invisibility of the conductor layer pattern (geometric figure), the line width is more preferably 25 μm or less. In terms of visible-light transmission, a line interval is more preferable 120 μm or more. When the line width becomes excessively small, a surface resistance becomes excessively high, and a shielding effect is deteriorated. For this reason, the line width is preferably 1 μm or more. When the line interval is large, a numerical aperture is improved, and the visible-light transmission is improved. When the conductor layer pattern obtained by the present invention is used as a display front surface, the numerical aperture (aperture rate) is required to be 50% or more, and is further preferably 60% or more. When the line interval is excessively large, an electromagnetic wave shielding property is deteriorated. For this reason, the line interval is preferably set to 1000 μm (1 mm) or less. When the conductor layer pattern has a complex figure obtained by a combination of geometric figures or the like, with reference to a repetitive unit, an area of the repetitive unit is converted into a square area, and the length of one side of the square is defined as the line interval.

When the substrate with conductor layer pattern obtained by the present invention is applied to a display front surface, in terms of a visible-light transmission, a numerical aperture of a portion having an electromagnetic wave shield function is required to be 50% or more. However, the numerical aperture is preferably 60% or more, and, in particular, preferably 80% or more. Since the line width becomes excessively small when the numerical aperture is excessively large, the numerical aperture is preferably 97% or less. In terms of the line interval, the line interval is preferably 1000 μm (1 mm) or less. When the line interval is excessively large, the electromagnetic wave shielding property tends to be deteriorated. When the conductor layer pattern has a complex figure obtained by a combination of geometric figures or the like, with reference to a repetitive unit, an area of the repetitive unit is converted into a square area, and the length of one side of the square is defined as the line interval. In terms of a visible-light transmission, a line interval is preferably 50 μm or more, more preferably 100 μm or more, and particularly preferably 120 μm or more. When the line interval is large, the numerical aperture is improved, and the visible-light transmission is improved.

The thickness of the conductor layer pattern is preferably 100 μm or less. When the conductor layer pattern is applied as a conductor layer pattern of an electromagnetic wave shielding sheet of the display front surface, a field angle of the display is widened as the thickness get smaller. This matter is desirable as an electromagnetic wave shielding material, and therefore time required to form a metal layer by plating can be shortened. For this reason, the conductor layer pattern is preferably 40 μm or less, and more preferably 18 μm or less. When the thickness is excessively small, a surface resistance becomes excessively high, an electromagnetic wave shielding effect is deteriorated. Since in this case, the conductor layer pattern is poor in strength and the conductor layer pattern is difficult to be peeled from the conductive substrate in the transfer operation, the thickness is preferably 0.5 μm or more, and more preferably 1 μm or more.

When the depth of the concave portion is relatively larger than the thickness of a metal layer to be deposited, the metal layer to be deposited can be regulated in shape. In terms of this point, the thickness of a metal foil formed by plating is preferably twice or less the height of the insulating layer, in particular, preferably 1.5 times or less, and further preferably 1.2 times or less. However, the thickness is not limited to the above values.

Plating can be performed so that the metal layer to be deposited is present within the concave portion. In this case, since the shape of the concave portion increases in width toward the opening, further the concave portion side surface formed at the insulating layer can be smoothed, an anchor effect in peeling of the metal foil pattern can be reduced. A ratio of a height of the metal layer to be deposited to a width of the metal layer can be made high, and a transmittance can be more improved. This will be described below with reference to the drawings.

Figure 7:
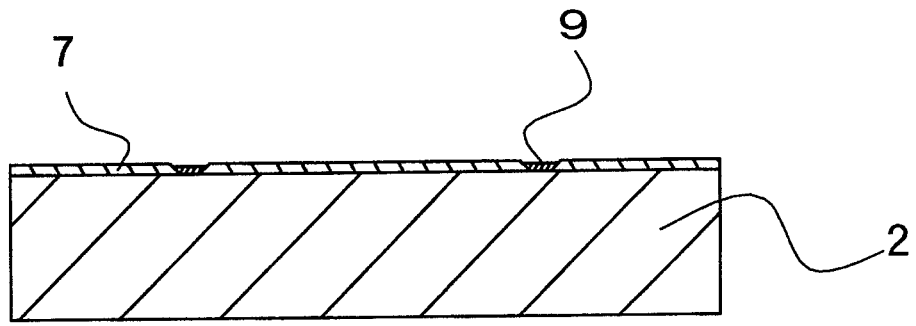
FIG. 7 shows a sectional view showing an example of an engraved plate which conductor layer pattern according to the present invention is formed.
Figure 8:
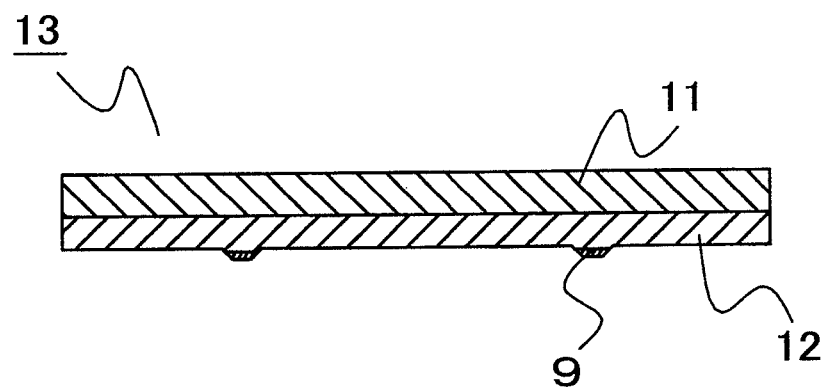
FIG. 8 is a sectional view showing an example of a substrate with conductor layer pattern according to the present invention.

FIG. 7 shows a sectional view showing a state in which a conductor layer pattern is formed in a concave portion of an engraved plate by plating. FIG. 8 shows a sectional view of a substrate with conductor layer pattern obtained by transferring the conductor layer pattern in the concave portion.

When the engraved plate is plated, a plating layer isotropically grows. When deposition of plating started from an exposed portion of the substrate advances, the deposited metal layer projects to overhang the insulating layer such that the metal layer overflows from concave portion. In terms of bonding to the transfer substrate, the plating is preferably deposited to project. However, at this time, as shown in FIG. 7, the deposition may be performed such that the deposited plating layer is fitted into the concave portion 4. In this case, as shown in FIG. 8, the transfer substrate is press-bonded, so that the conductor layer pattern 9 is transferred to and bonded on the adhesive compound layer 12. The conductor layer pattern 9 is peeled from the engraved plate 1, and the substrate with conductor layer pattern 13 can be manufactured.

When a blacking process (FIG. 5E) is not performed before the conductor layer pattern 9 is transferred to the transfer substrate 10, after a pattern with conductor layer is formed (FIGS. 6H and 8), the blacking process step may be performed to the conductor layer pattern. Even though the blacking process is performed before the conductor layer pattern 9 is transferred to the transfer substrate 10, the blacking process may be performed again.

The method of the blacking process is a method of forming a black layer on the conductor layer pattern. For this purpose, various methods such as plating, an oxidizing process, and printing can be used for the metal layer.

When the blacking process performed after the conductor layer pattern is transferred to the substrate, black plating such as black nickel plating is preferably performed.

The black nickel plating is a plating method of forming a black alloy containing nickel sulfide as main component on a surface of a body to be plated by electrodeposition. Since both sulfides of iron and cobalt which are VIII group elements are black, the elements can be used. Among sulfides of the VIII group elements, nickel sulfide has a suitable black color, and has preferable adhesion to an underlying metal. As a sulfide of an element except for the VIII group elements, sulfides of silver, mercury, copper, lead, or the like can be used. Even though alloy plating of tin and nickel or tin and cobalt, or black chromium plating is used, a blacking-process layer (black layer) which does not contain and scatter powder and has good adhesion to only the metal layer can be formed.

When the black nickel plating layer is formed, a plating solution containing 60 to 100 g/L of nickel sulfate, 30 to 50 g/L of ammonium nickel sulfate, 20 to 40 g/L of zinc sulfate, and 10 to 20 g/L of sodium thiocyanate can be used. This plating bath is used, pH: 4 to 7, a temperature: 45 to 55° C., and a current density: 0.5 to 3.0 A/dm$^2$ are set as conditions, a stainless anode or a nickel anode is used, and a circulating pump and air stirring are used in stirring, so that a black nickel plating layer suitable for a plasma display panel can be formed. As a pre-process for the black nickel plating, alkaline degreasing and acid washing which are appropriate to improve adhesion to an underlying metal layer are preferably performed. When plating is performed with a plating solution which contains each component in the concentration except the concentration ranges of the components, the plating solution can be easily decomposed, and preferable black cannot be easily obtained. When the plating is performed at a temperature of more than 55° C., the plating solution is easily decomposed. In contrast to this, when plating is performed at 1.0 A/dm$^2$ or more and a temperature of lower than 45° C., a product has a rough surface and easily generates and scatters powder, and the life time of the plating solution becomes short. The plating can be performed at less than 45° C. and a current density of 1.0 A/dm$^2$ or less. However, in this case, long-term plating must be performed to obtain desired blackness, so that the productivity is deteriorated. For these reasons, a temperature range used when short-term black nickel plating is performed by using a plating solution having the above concentration composition is optimally 45 to 55° C. With respect to a current density, the plating can be performed at less than 0.5 A/dm$^2$ within the temperature range. However, in this case, a long-term plating must be performed to obtain desired blackness. When plating is performed at 3.0 A/dm$^2$ or more, the plating solution is easily decomposed, and a black film which easily contains and scatters powder is formed. In the black nickel plating using the stainless anode, the life time of the plating solution becomes short. For these reasons, in general, a nickel anode is desirably used.

When a substrate with conductor layer pattern is used as an electromagnetic wave shielding member on the front surface of a display or the like, for security of visibility including antireflection, the conductor layer pattern having a surface treated by a blacking process is preferably used. It is preferable that the front surface of the electromagnetic wave shielding member is black because demands such as realization of high contrast and a black screen set in a power-off state are fulfilled. When the substrate with conductor layer pattern having a conductor layer pattern treated by a blacking process is used as an electromagnetic wave shielding member on the front surface of the display, in general, a surface on which a black layer is formed faces a viewer side.

Furthermore, a rust-proofing process may be performed to the conductor layer pattern having a surface applied with a blacking process. As the rust-proofing process, a chromate treatment or benzotriazole treatment serving as a known means can be used. A commercially available rust-proofing agent can also be used. When a blacking process is performed again by the same method after a conductor layer having a surface treated by a blacking process is transferred to another substrate, the rust-proofing process is similarly desirably performed.

When the substrate with conductor layer pattern according to the present invention is used as an electromagnetic wave shielding member, the substrate can be bonded to a display screen through a proper bonding agent or without using an bonding agent and can be used. However, the substrate may be bonded to another substrate and then applied to the display. The other substrate must be transparent when the substrate is used to shield an electromagnetic wave from the front surface of the display.

Figure 9:
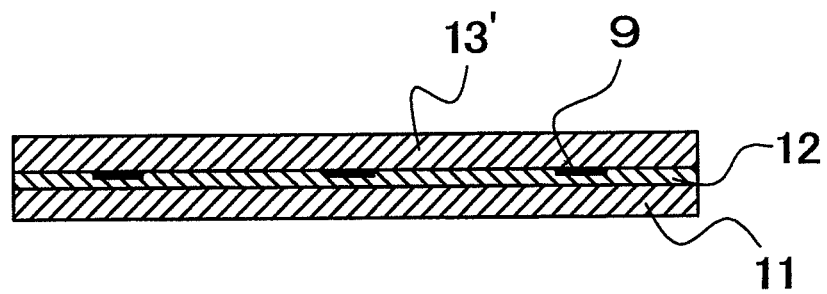
FIG. 9 shows an example of a section of an electromagnetic wave shielding member according to the present invention.

FIG. 9 shows a sectional view of an electromagnetic wave shielding member obtained by bonding a substrate with conductor layer pattern to another substrate. In FIG. 9, on the adhesive compound layer 12 laminated on the first substrate 11, the conductor layer pattern 9 is bonded. On the conductor layer pattern 9, a second substrate 13' is laminated. The conductor layer pattern 9 is buried in the adhesive compound layer 12. This configuration can be manufactured such that the substrate with conductor layer pattern on the conductor layer pattern 9 side is pressured on the second substrate 13' while being heated or unheated. In this case, when the adhesive compound layer 12 has sufficient fluidity or as long as the adhesive compound layer 12 has sufficient fluidity, the conductor layer pattern 9 is buried in the adhesive compound layer 12 by applying a proper pressure to the adhesive compound layer 12. As the first substrate 11 and the second substrate 13', substrates having transparency and having excellent smooth surfaces are used, so that an electromagnetic wave shielding member having high transparency can be obtained.

Figure 10:
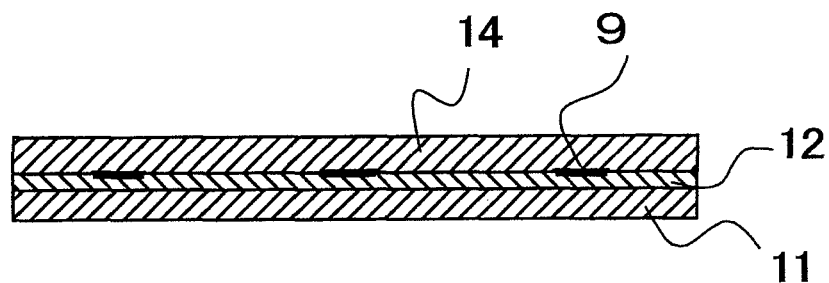
FIG. 10 shows an example of a section of an electromagnetic wave shielding member according to the present invention.

FIG. 10 shows a sectional view of an electromagnetic wave shielding member in which a substrate with conductor layer pattern is covered with a protecting resin. On the adhesive compound layer 12 laminated on the first substrate 11, the conductor layer pattern 9 is bonded. These layers are covered with a transparent protecting resin 14.

Figure 11:
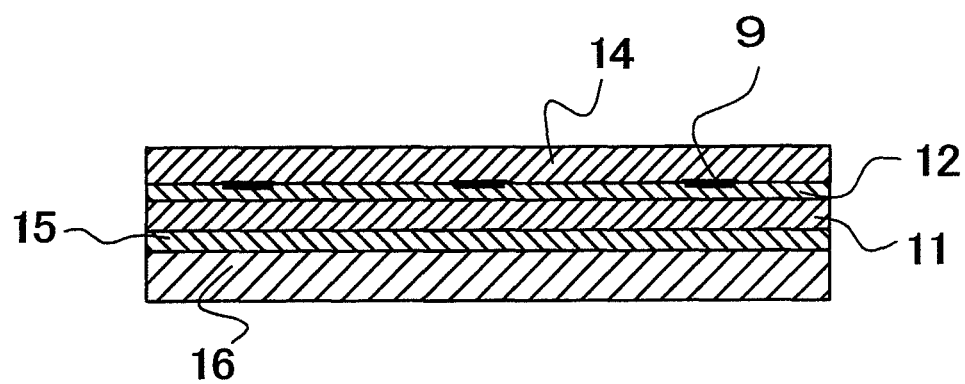
FIG. 11 shows an example of a section of an electromagnetic wave shielding plate according to the present invention.

FIG. 11 shows a sectional view of an electromagnetic wave shielding member according to another aspect. The electromagnetic wave shielding member is obtained by bonding a third substrate 16 to the first substrate 11 side of the electromagnetic wave shielding member in FIG. 10 through an bonding agent layer 15. The third substrate 16 may consist of glass or the like.

Figure 12:
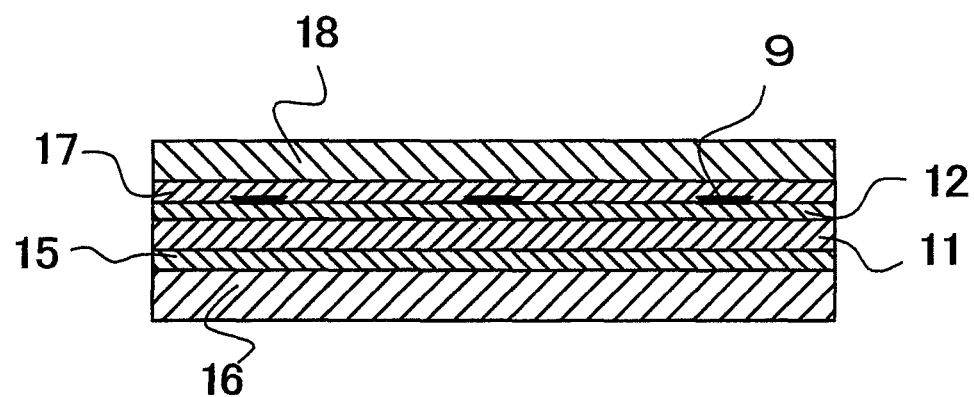
FIG. 12 shows an example of a section of an electromagnetic wave shielding plate according to the present invention.

FIG. 12 shows a sectional view of an electromagnetic wave shielding member according to still another aspect. In place of the protecting resin 14 of the electromagnetic wave shielding member shown in FIG. 11, on the conductor layer pattern 9, a protecting film 18 is laminated through a transparent resin 17. As the transparent resin 17, an bonding agent or an adhesive compound containing a thermoplastic resin, a thermosetting resin, or a resin cured by an active radiation energy as a main component is given. When the resin cured by the active radiation energy is used, the resin is cured instantaneously or at short times. For this reason, the resin is preferably used because high productivity can be achieved. A patterned metal foil (conductor layer pattern) according to the present invention is expressed below. The patterned metal foil can be manufactured by using the engraved plate described above. The patterned metal foil includes a perforated metal foil for a collector for a capacitor.

Figure 13:
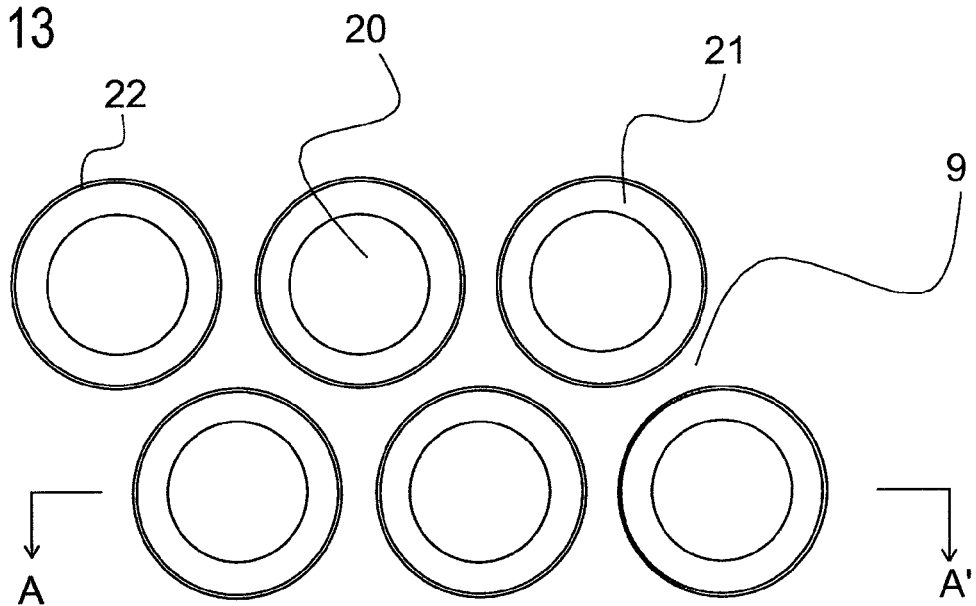
FIG. 13 is a bottom view showing a perforated metal foil according to the present invention, i.e., a part of a patterned metal foil.
Figure 14:
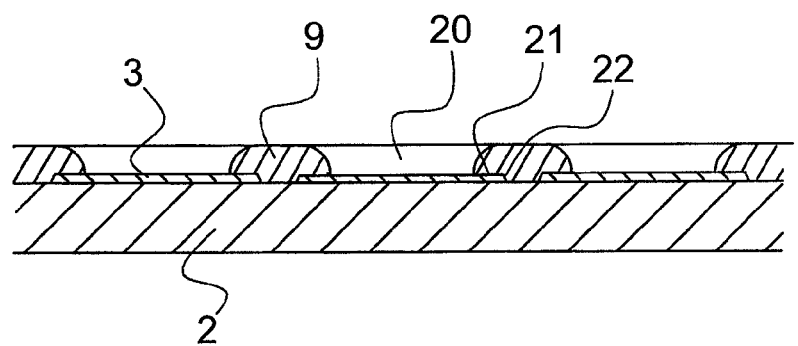
FIG. 14 shows an A-A sectional view of the patterned metal foil in FIG. 13.

FIG. 13 is a bottom view showing a part of a perforated metal foil serving as an example of the conductor layer pattern. In FIG. 13, 6 combinations each constituted by 3 coaxial circles are drawn. It is assumed that the combinations are repeated a predetermined number of times in horizontal and vertical directions in a staggered configuration. FIG. 13 shows a state the conductor layer pattern is formed on an engraved plate. The Figure corresponding to an A'-A' sectional view in FIG. 14 is shown in FIG. 14.

A hole 20 penetrates through the conductor layer pattern 9. A step portion 21 and a small-width inclined portion 22 connected to the step portion 21 are present around the hole 20. The step portion 21 and the inclined portion 22 correspond to the insulating layer 3 on the conductive substrate 2 and a concave portion formed by the insulating layer 3 on the conductive substrate 2. The inclined portion 22 is formed to correspond to a inclined portion of the insulating layer 3 widened toward the end. More specifically, in FIG. 13, on the inclined portion 22, an inner circumference (minimum diameter) and an outer circumference (maximum diameter) are expressed, and the inclined portion 22 is inclined from the small-diameter inner circumference (end of the step portion 21) to the large-diameter outer circumference. The step portion 21 corresponds to a portion formed to cause a plating layer to overhang the insulating layer 3 from the concave portion of the engraved plate. Therefore, since the step portion 21 is a portion overhanging the insulating layer 3, the thickness of the conductor layer pattern 9 on the step portion 11 decreases toward a hole 30, and the bottom surface of the hole is higher than the bottom surface of the conductor layer pattern corresponding to the concave portion serving as a plated portion by the thickness of the insulating layer 3.

Figure 15:
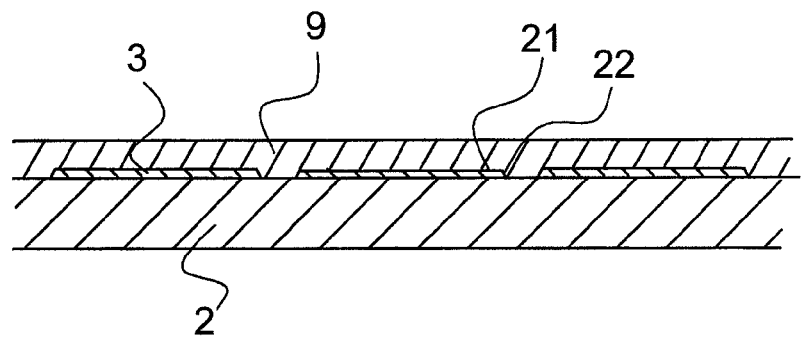
FIG. 15 shows an example of a sectional view of a conductor layer pattern according to the present invention.

FIG. 15 is a sectional view showing another example of the conductor layer pattern, and shows a state in which the conductor layer pattern is present on the engraved plate as shown in FIG. 13. A plating layer deposited on the concave portion on the conductive substrate 2 grows to run upon the insulating layer 3 without forming a through hole. However, the plating layer serves as the conductor layer pattern 9 having a concave portion corresponding to the insulating layer 3. The insulating layer 3 is extended in a depth direction of paper and is decreased in width, so that a fine groove can be formed in the conductor layer pattern. When the groove is blocked with an appropriate material not to bury the groove, a fine fluid or gas flow path can be easily formed. Therefore, the flow path can be applied as a heat sink or a supply path for a small amount of chemical. As the appropriate material, a flat metal foil free from a groove or a concave portion, the conductor layer pattern itself (the conductor layers are laminated to each other such that grooves facing with each other or the surface having grooves are facing with each other but grooves do not overlap), or the like is used. The plurality of conductor layer patterns may be laminated in the same direction, and a surface including a finally exposed groove can be covered with an appropriate material.

A case in which the engraved plate according to the present invention is used as a rotator (roll) will be described below.

The rotator (roll) preferably consists of a metal. Furthermore, as the rotator, a drum electrode used in a drum electrolytic deposition method is preferably used. As a material which forms a surface of the drum electrode, as described above, stainless steel, chromium-plated cast iron, chromium-plated steel, titanium, or a titanium-lined material which has relatively low adhesion to a plating layer can be preferably used. Substrates with conductor layer pattern can be continuously manufactured as a roll. For this reason, in this case, the productivity is considerably improved.

A structure can be obtained as a roll while continuously peeling a pattern formed by electrolytic plating using a rotator. More specifically, in FIG. 16, an electrolytic solution (plating solution) 102 in an electrolytic vessel 101 is supplied into a space between a first anode 103 and a rotator 104 such as a drum electrode by a pipe 105 and a pump 106. A first voltage is applied across the first anode 103 and the rotator 104. When the rotator 104 is rotated at a constant speed, a conductor layer is electrolytically deposited on the surface of the rotator 104. Furthermore, when a voltage higher than the first voltage is applied across a second anode 107 and the rotator 104, a black film can be deposited on the deposited conductor layer pattern. More specifically, a blacking process can be performed. Besides the second anode 107, a plurality of anodes may be used to change a voltage in steps, so that sizes of particles deposited on a black film may be controlled.

Figure 16:
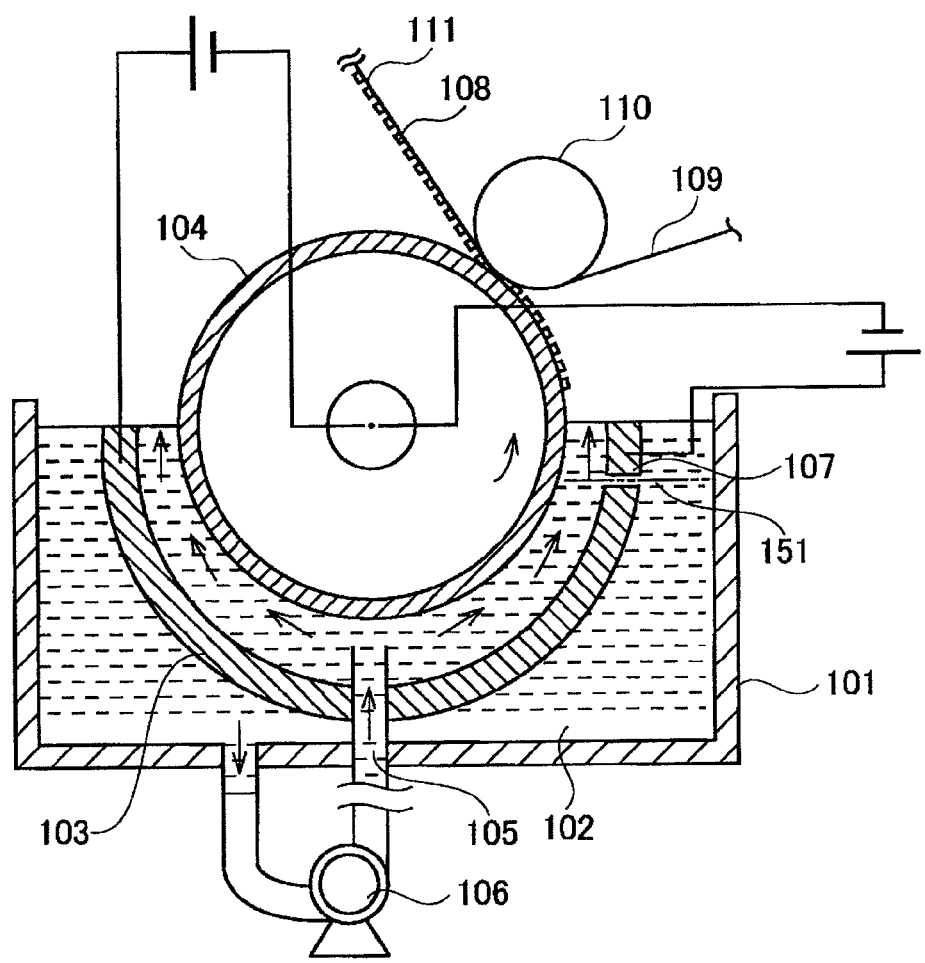
FIG. 16 shows a sectional view of a rotator according to the present invention.

In the state shown in FIG. 16, the first anode 103 and the second anode 107 are dipped in a plating solution while being separated from each other. A shielding member 151 consisting of an insulator may be arranged between the anodes (electrode) 103 and 107. When the shielding member 151 is arranged, a first current density and a second current density can be easily maintained.

A proximal end side of the shielding member 151 is integrally fixed to an inner wall of the electrolytic vessel 101, and a distal end side of the shielding member 151 may be arranged near the conductive substrate (rotator 104). Therefore, the plating solution flows between the conductive substrate 104 and the distal end of the shielding member 151.

As materials of the anodes 103 and 107, insoluble anodes or the like each of which is obtained by forming a thin film consisting of a platinum-group metal or an oxide thereof on a surface of a base substance consisting of titanium metal is preferably used. The shapes of the anodes are not limited to specific shapes. Planar, rod-like, porous, mesh-like anodes and the like are used.

Figure 17:
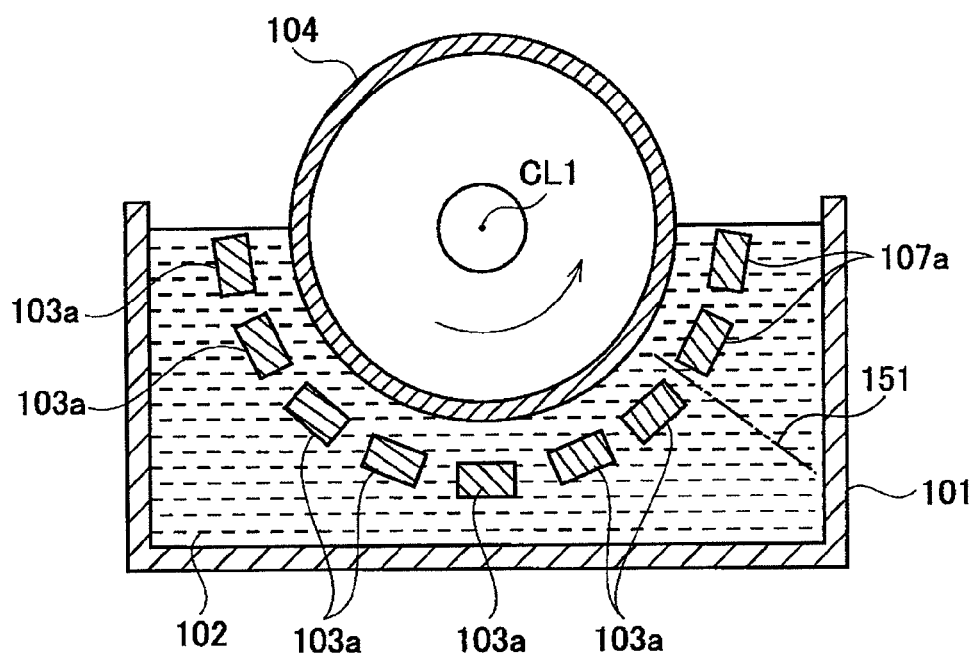
FIG. 17 shows a sectional view of a rotator according to the present invention.

More specifically, for example, as shown in FIG. 17, a plurality of anodes 103a (anodes corresponding to the first anode 103) each having a rectangular section vertical to a longitudinal direction and one or more of anodes 107b (anodes corresponding to the second anode 107) each having a rectangular section vertical to the longitudinal direction may be arranged on a circumference of a rotation central axis CL1 of the rotator 104.

The conductor layer pattern treated by the blacking process is transferred to the adhesive support member 109 while being continuously peeled from the rotator 104 such that the adhesive support member 109 is bonded by pressure with a bonding roll 110 to the conductor layer pattern outside a electrolytic solution 102, and the conductor layer patterns can be winded on the roll as a adhesive support member with conductor layer pattern 111. After the conductor layer pattern is peeled, before the rotator is dipped in the electrolytic solution again, the surface of the rotator may be cleaned with a brush roll. A dehydrated roll may be arranged on an upper end of the anode to prevent the rapidly circulated electrolytic solution from spouting upward. The electrolytic solution intercepted by the dehydrated roll returns from the outside of the anode to the lower electrolytic solution vessel, and is circulated by a pump. The step of adding, as needed, a metal ion source, an additive, or the like by consumed amounts thereof and the step of analyzing components are desirably added during the circulation. The conductor layer pattern may be peeled from the rotator and collected without using the adhesive support member 109.

The first anode may be also used as the second anode, and, a conductor layer pattern may be formed at a first current density, and then the blacking process step may be performed at a second current density.

A case in which the engraved plate according to the present invention has a hoop like shape will be described below. The hoop-like engraved plate can be manufactured such that after an insulating layer and a concave portion are formed on a surface of a belt-like engraved plate, both the ends of the engraved plate are connected to each other. As a material constituting the surface of the engraved plate, a material such as a stainless steel, chromium-plated cast iron, chromium-plated steel, titanium, or a titanium-lined material which has relatively low adhesion to a plating plate can be preferably used as described above. When the hoop-like conductive substrate is used, productivity of a substrate with conductor layer pattern is high because the steps of the blacking process, the rust-proofing process, the transfer process, and the like can be performed by one continuous step. Substrates with conductor layer pattern can be continuously manufactured and produced as a roll. The thickness of the hoop-like conductive substrate may be appropriately determined. However, the thickness is preferably 100 to 1000 μm.

Figure 18:
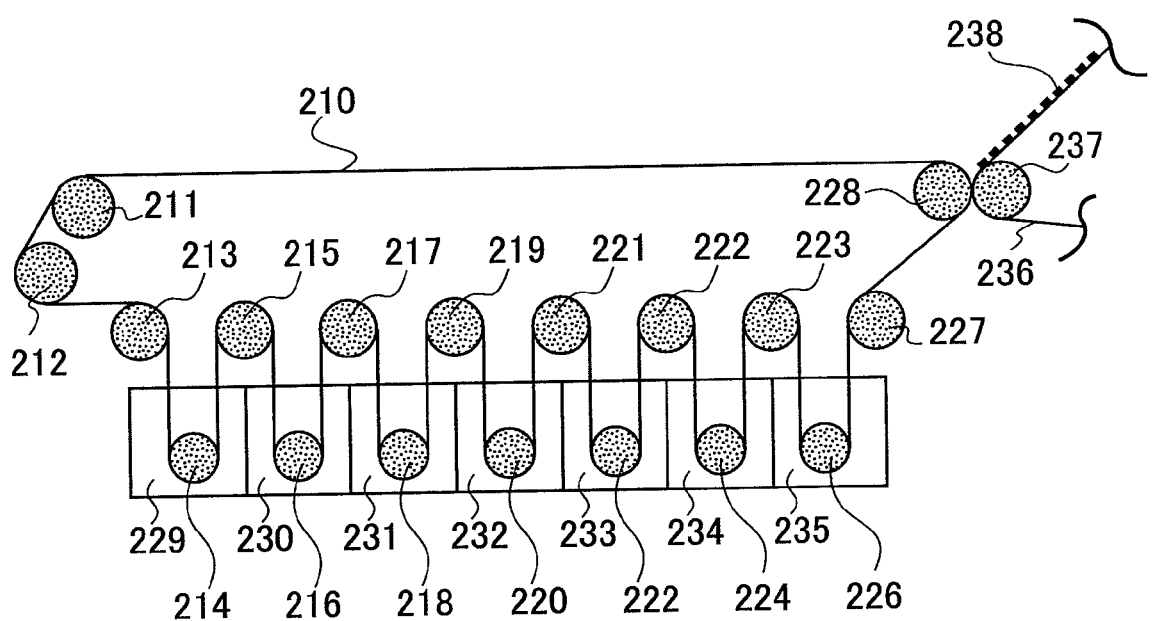
FIG. 18 shows a sectional view of a hoop-like engraved plate according to the present invention.

The step of obtaining a structure as a roll while continuously peeling the conductor layer pattern formed by electrolytic plating by using the hoop-like conductive substrate will be described below with reference to FIG. 18. FIG. 18 is a conceptual diagram of an apparatus which peels conductor layer patterns while depositing the conductor layer patterns by electrolytic plating when a hoop-like conductive substrate is used a conductive substrate.

By using conveyance rolls 211 to 228, a hoop-like engraved plate 210 is caused to go round through a pre-process tank 229, a plating tank 230, a water washing tank 231, a blacking process tank 232, a water washing tank 233, a rust-proofing tank 234, and a water washing tank 235 in the order named. In the pre-process tank 229, pre-processes such as a degreasing process or an oxidizing process are performed to the engraved plate 210. Thereafter, a metal is deposited on the engraved plate 210 in the plating tank 230. Thereafter, a surface of the metal deposited on the engraved plate 210 is blackened and rust-proofing processed sequentially through the water washing tank 231, the blacking process tank 232, the water washing tank 233, the rust-proofing tank 234, and the water washing tank 235. Only one water washing tank after each of the process steps is shown. However, as needed, a plurality of water washing tanks may be used, another pre-process tank or the like may be arranged before each of the process step. A plastic film substrate 236 on which an adhesive layer is laminated is caused to path between the engraved plate 210 and the bonding roll 237 on the conveyance rolls 228 to transfer a plating pattern deposited on the conductive concave portion of the engraved plate 210, the metal is transferred to the plastic film substrate 236, so that a substrate with conductor layer pattern 238 can be continuously manufactured. The obtained substrate with conductor layer pattern 238 can be winded in the form of a roll. As necessary, the bonding roll 237 can be can be heated. The plastic film substrate 236 may be preliminarily heated through a pre-heat tank before the plastic film substrate 236 passes through the bonding roll. In winding of the transferred film, as needed, demolding PET or the like may be inserted. After the metal is transferred, the steps are repeatedly performed to the hoop-like conductive substrate. In this manner, substrates with conductor layer pattern can be manufactured continuously with high productivity.

When the substrate with conductor layer pattern obtained as described above is used as a electromagnetic wave shielding member, an anti-reflecting layer, a near-infrared ray shielding layer, or the like may be further laminated. A substrate itself to which the metal deposited on the conductive substrate is transferred may also serve as a functional layer such as an anti-reflecting layer or a near-infrared ray shielding layer. Furthermore, a cover film (for example, protecting film 18 in FIG. 12) used when a protecting layer is formed on a conductor layer pattern may also serve as an anti-reflecting layer, a near-infrared ray shielding layer, or the like.

The conductor layer pattern may be peeled from the rotator and collected without using the plastic film substrate 236.

The substrate with conductor layer pattern according to the present invention can also be manufactured by not only the continuous plating method using the rotating roll or the hoop but also sheet-fed processing. When the substrate with conductor layer pattern is manufactured by the sheet-fed processing, an engraved plate can be easily handled. Even though an insulating layer is stripped at one position after the same engraved plate is repeatedly used, in sheet-fed processing, only a defective engraved plate can be easily extracted or exchanged. Contrary only a specific portion cannot be easily extracted or exchanged, when a drum-like or hoop-like substrate is used. When a substrate is manufactured by the sheet-fed processing as described above, a measure for a defective occurring in an engraved plate can be performed easily. A thickness of a single-sheet conductive substrate may be appropriately determined. However, in consideration of a thickness being enough to be strong to stirring or the like of a solution in the plating tank, the thickness of the substrate is preferably 20 μm or more. When the thickness is excessively large, the substrate increases in weight and cannot be easily handled. For this reason, the thickness is preferably 10 μm or less.

The conductor layer pattern obtained by the present invention may have a grounding portion.

The conductor layer pattern can include a region A manufactured by the engraved plate and a region B corresponding to a grounding portion around the region A. When the conductor layer pattern serves as an electromagnetic wave shielding member, the substrate preferably has a grounding portion. The region A and the region B may have same conductor layer pattern. An area ratio of an insulating layer to the region A (ratio of an area of a portion except for the area of the concave portion to the entire area in a plan view) may be larger than an area ratio of the insulating layer to the region B, and may be preferably larger than the area ratio by 10% or more. The area ratio of the insulating layer to the region B may be 0 and in this case, a plain metal film is formed by plating on a peripheral region of the engraved plate. Since the plain metal film is easily broken in the transfer operation, the area ratio of the insulating layer to the region B is preferably 40% or more, or preferably less than 97%.

As geometric figures drawn by a pattern of the concave portion, (1) a mesh-like geometric design, (2) square geometric designs regularly arranged at predetermined intervals, (3) parallelogram designs regularly arranged at predetermined intervals, (4) a circular design or an elliptical design, (5) a triangular design, (6) a polygonal design the number of sides of which is five or more, (7) a pentangle, and the like are known.

Formation of a concave portion in the region B, formation of an insulating layer, and the like can be performed by the same method as that of the region A. Furthermore, the depth of the concave portion and the increase in width of the concave portion toward the opening are preferably set as in the region A.

A thickness of a line of the conductor layer pattern at a portion having a grounding function is preferably 0.5 μm or more to assure a sufficient electric resistance as described above, and more preferably 1 μm or more. Furthermore, when the conductor layer pattern serves as an electromagnetic wave shielding member, if a difference between the thickness of the line of the conductor layer pattern of the portion having an electromagnetic wave shielding function and the thickness of the line of another portion is large, the difference makes a step in the transfer operation. For this reason, a boundary portion is not transferred or is easily bent and broken. The difference between the thickness of the line of the conductor layer pattern of the portion having the electromagnetic wave shielding function is preferably 10 μm or less, and more preferably 5 μm or less.

The conductor layer pattern obtained by the present invention may have a plating foil portion.

Figure 19A:
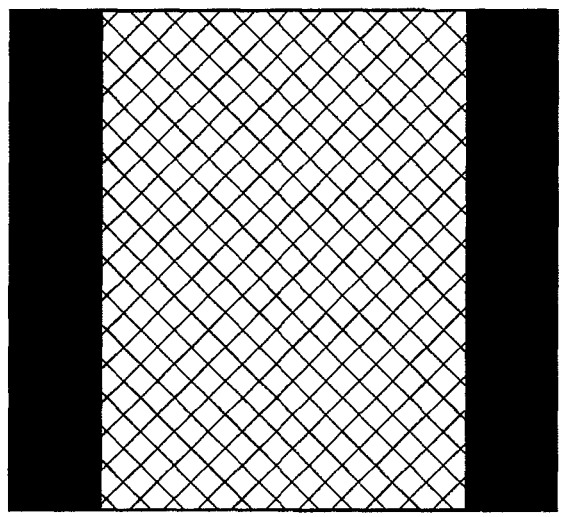
FIG. 19A shows an example of an electromagnetic wave shielding member having a plating foil portion according to the present invention.
Figure 19B:
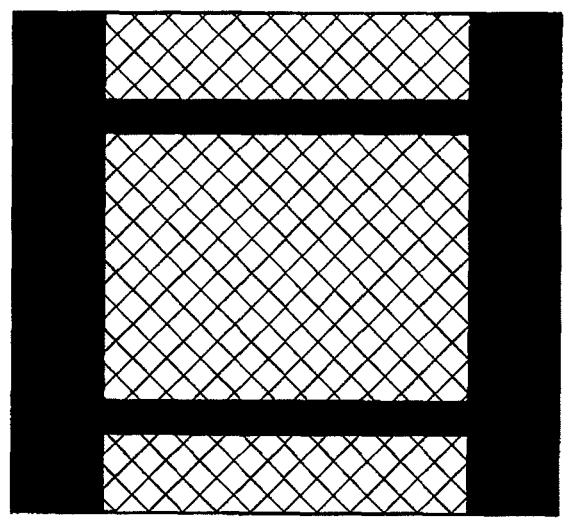
FIG. 19B shows an example of an electromagnetic wave shielding member having a plating foil portion according to the present invention.
Figure 20:
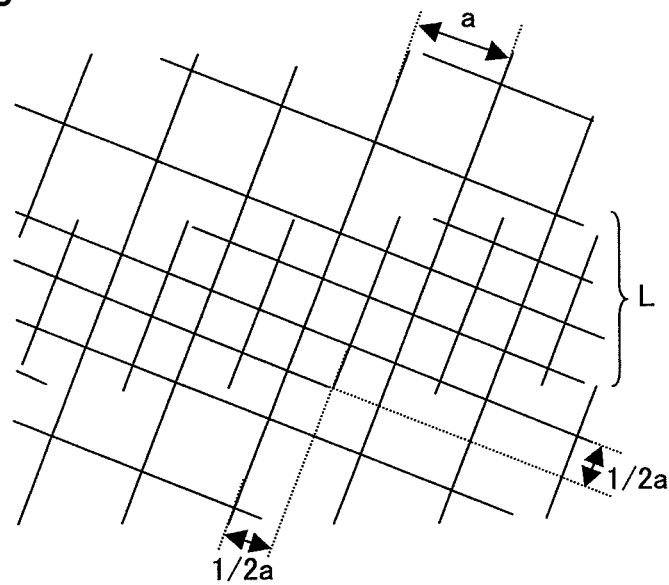
FIG. 20 shows an example of a partial enlarged view of the electromagnetic wave shielding member according to the present invention.
Figure 21:
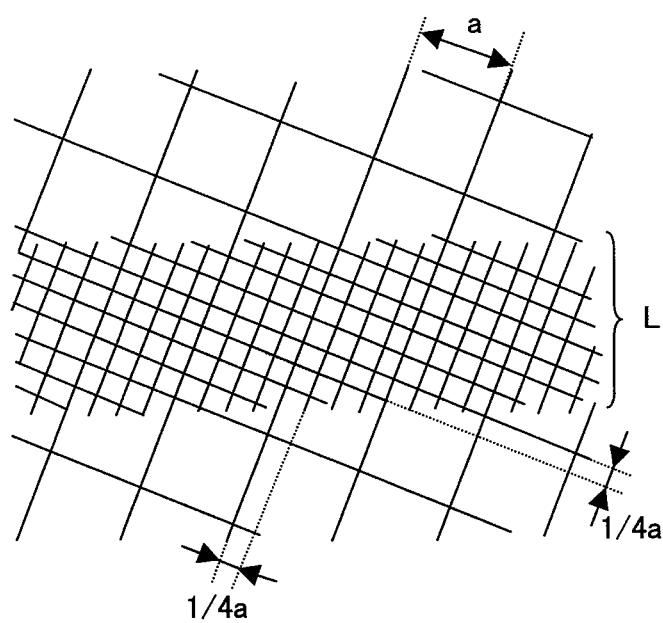
FIG. 21 shows an example of a partial enlarged view of an electromagnetic wave shielding member according to the present invention.
Figure 22:
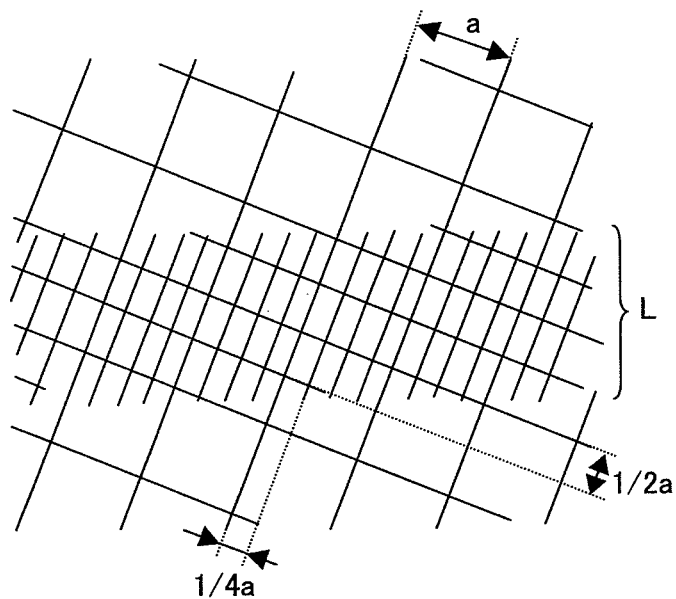
FIG. 22 shows an example of a partial enlarged view of the electromagnetic wave shielding member according to the present invention.
Figure 23:
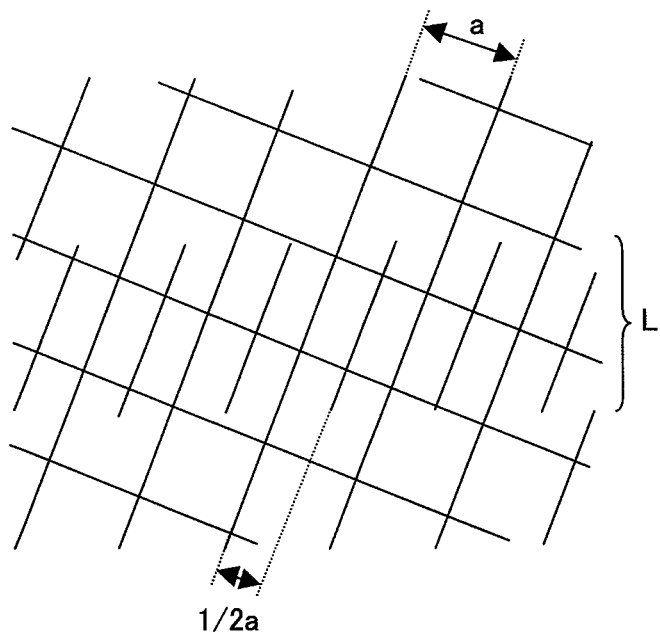
FIG. 23 shows an example of a partial enlarged view of the electromagnetic wave shielding member according to the present invention.
Figure 24:
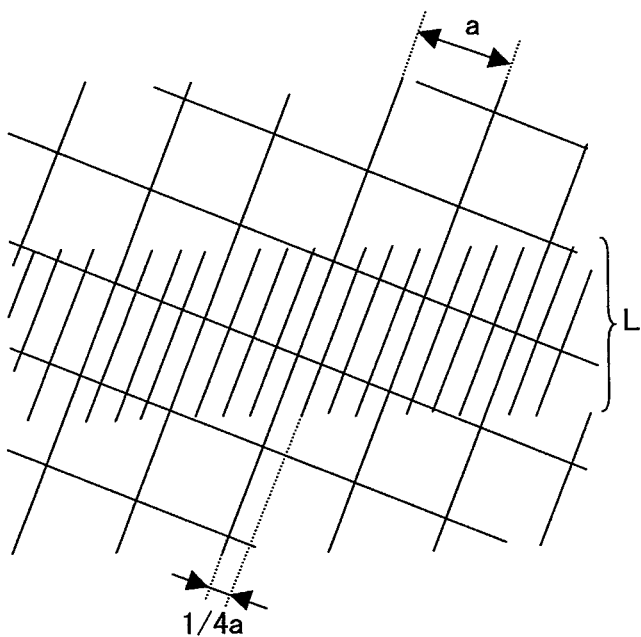
FIG. 24 shows an example of a partial enlarged view of the electromagnetic wave shielding member according to the present invention.
Figure 25:
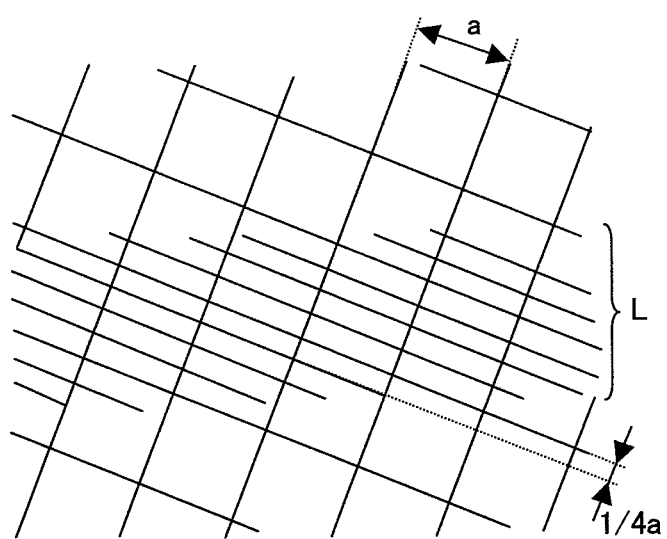
FIG. 25 shows an example of a partial enlarged view of the electromagnetic wave shielding member according to the present invention.
Figure 26A:
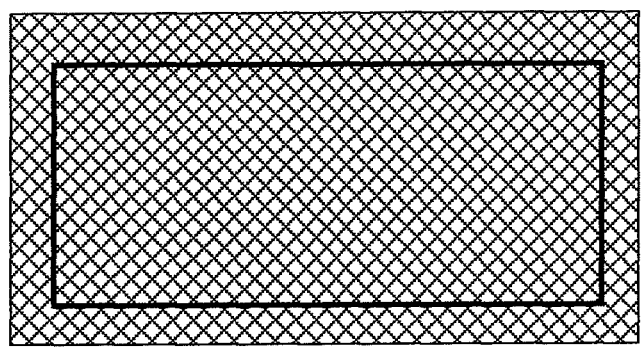
FIG. 26A shows an example of an overall view of an electromagnetic wave shielding member according to the present invention.
Figure 26B:
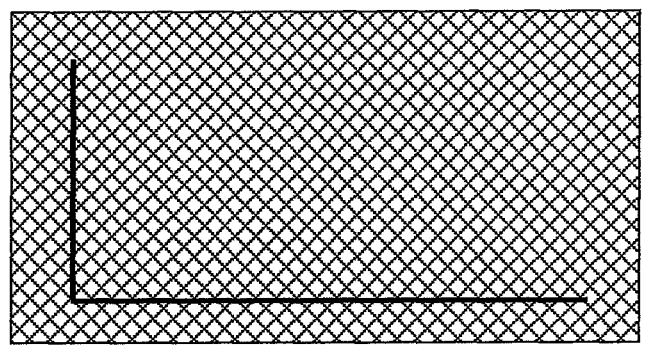
FIG. 26B shows an example of an overall view of the electromagnetic wave shielding plate according to the present invention.
Figure 26C:
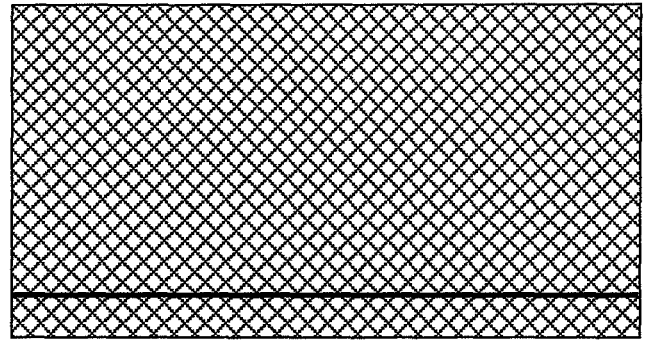
FIG. 26C shows an example of an overall view of the electromagnetic wave shielding member according to the present invention.
Figure 26D:
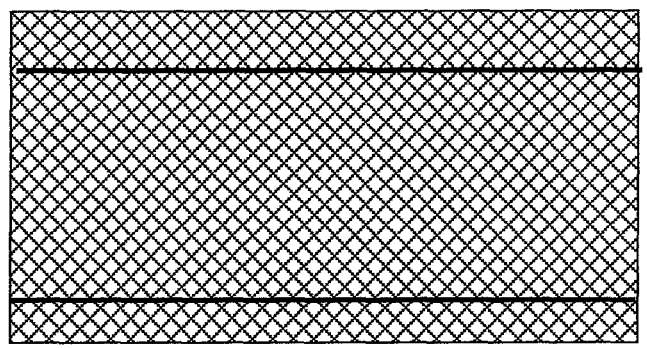
FIG. 26D shows an example of an overall view of the electromagnetic wave shielding member according to the present invention.
Figure 26E:
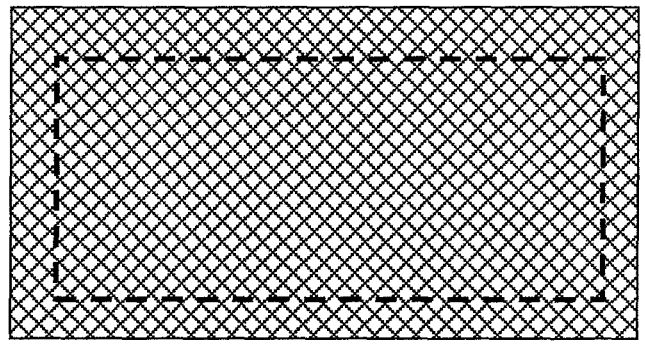
FIG. 26E shows an example of an overall view of the electromagnetic wave shielding member according to the present invention.
Figure 26F:
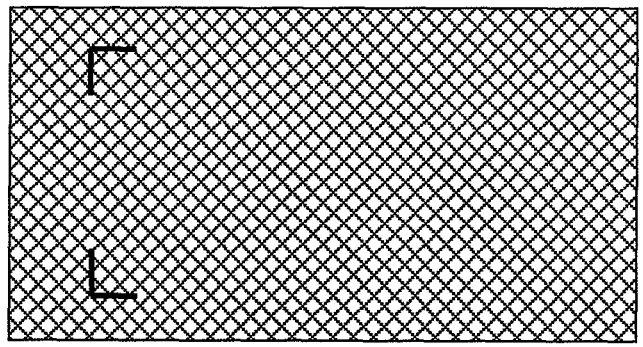
FIG. 26F shows an example of an overall view of the electromagnetic wave shielding member according to the present invention.

When a portion corresponding to a conductor layer pattern of at least light-transmitting electromagnetic shielding portion of the engraved plate has a rectangular body or a rotator, outside the portion, a portion (there is not insulating layer) having a level equal to that of the upper surface of the convex portion can be formed in the form of a continuous belt to surround the portion corresponding to the conductor layer patterns of the light-transmitting electromagnetic wave shielding portion or along two facing sides. In this manner, after a plating layer is formed on the engraved plate, a conductor layer pattern metal layer having a continuous-belt-like plating foil can be formed to a portion of the conductor layer pattern. For example, a plan view of the pattern is shown in FIG. 19. In FIG. 19A, a black portion denotes a plating foil, and a meshed portion denotes a conductor pattern formed by plating. Due to the presence of the foil portion, the foil itself serves as a support member to make it easy to peel the conductor layer pattern from the engraved plate. Since the obtained conductor layer pattern can be sufficiently supported at both end portions in the subsequent steps, the conductor layer pattern can be easily handled. Depending on cases, the conductor layer pattern can be peeled without using a substrate having an adhesive compound layer. An unnecessary part of the foil portion can be cut off later, and the foil portion is left with a predetermined width and can also be used as a grounding portion. Another example of the pattern is shown in FIG. 19B. FIG. 19B is a plan view of a part of a conductor layer pattern metal layer manufactured when a rotator is used as a conductive substrate or when a conductive support member is attached to the rotator. In this manner, grounding portions can be formed on the four sides of the light-transmitting electromagnetic wave shielding portion.

As the conductor layer pattern obtained by the present invention, a pattern in which a belt-like conductor layer (frame portion) continues in a conductible state around a mesh-like conductor layer pattern to ground a shielded electromagnetic wave as a current when the electromagnetic shielding wave shielding member is manufactured is preferably used.

The conductive layer pattern obtained by the present invention may have a specific region.

The specific region of the conductor layer pattern according to the present invention is formed at an arbitrary position of the conductor layer pattern.

In particular, for the purposes of positioning, recognition of a pattern serving as a boundary to partitioning a region to be formed in the conductor layer pattern, recognition of a position to apply a conductive material or a protecting resin material, and other position recognition, the specific region is formed at a necessary position.

The specific region is, as a whole, a polygonal (lengths of all the sides are equal to each other and all interior angles are equal to each other or some of them are different from each other, lengths of some sides are different from each other, or lengths of all sides are different from each other) such as a triangular region, a square region, or a hexagonal region, a circular region, an elliptical region, or a region having another shape. In this region, a specific conductor layer pattern is formed. This conductor layer pattern may be a mesh-like pattern or another pattern. The specific region preferably has a shape extending in a predetermined direction in a predetermined width when the region indicates a boundary, and is preferably formed in the form of a belt (to make it possible to be recognized in the form of a line). The belt-like specific region may be continuous as a specific region or may be scattered at predetermined intervals as indicated by a broken line. This belt-like (macroscopically linear) region is optimum as a pattern serving as a boundary formed in the conductor layer pattern.

When the specific region recognized as a belt-like region is formed at a predetermined position inside of an end of the conductor layer pattern to surround the position in a predetermined width, so that the specific region can be used as a recognition position to cause an outer portion of the region surrounded by the specific region to be used as a grounding portion. As this grounding portion, the pattern on the periphery of the specific region may be directly used. Furthermore, a gap of the pattern may be buried with a conductive paste or the like and used as a grounding portion.

The planar shape of the conductor layer pattern is, as a whole, constituted by repeating a triangle such as a regular triangle, an isosceles triangle, or a right triangle, a quadrangle such as a square, a rectangle, a lozenge, a parallelogram, or a trapezoid, a (regular) n-sided polygon (n is an integer which is 3 or more) such as a (regular) hexagon, a (regular) octagon, a (regular) dodecagon, or a (regular) Icosagon, or a geometric figure such as a circle, an ellipse, or a pentagram. The conductor layer pattern may be a design obtained by appropriately combining these figures. One of these units can be independently repeated, or two or more of these units can be combined to each other and repeated. The conductor layer pattern may be preferably a mesh pattern having such a design. The conductor layer pattern need not be a mesh-like pattern. The conductor layer pattern is preferably electrically conductive as a whole.

The specific region is a part of the conductor layer pattern. Even though the entire conductor layer pattern is a mesh pattern, the conductor layer pattern in the specific region may be a mesh pattern or may be not. When the conductor layer pattern of the specific region is a mesh pattern, the mesh pattern can be selected from patterns which can be mesh-like patterns on the periphery of the specific region. However, as the pattern, a pattern which can be recognized as a pattern different from the peripheral conductor layer pattern is selected. When these patterns can be recognized as different patterns, these patterns include similar mesh-shaped patterns which are different in line pitches or bias angles of a mesh.

When different patterns can be recognized, a numerical aperture of the specific region may not be different from a numerical aperture of the peripheral region of the specific region. However, in terms of visibility, one of the numerical apertures of the specific region and the peripheral region of the specific region is preferably 95% or less of the other numerical aperture, and more preferably 90% or less of the other numerical aperture. When the numerical aperture decreases, a plating area becomes relatively large, and a current density relatively decreases. For this reason, a plating thickness decreases to a portion having a large numerical aperture. As a result, a plating layer tends to be bent and broken when the plating layer is transferred and peeled. Therefore, one of the numerical apertures of the specific region and the peripheral region thereof is preferably 40% or more of the other, and more preferably 70% or more of the other. In consideration of plating thickness uniformity and visibility of a pattern, one of the numerical apertures is preferably 40 to 95% of the other, and more preferably 70% to 90% of the other.

One of the thickness of the specific region and the peripheral region thereof is preferably 40 to 100% of the other. In this case, bending and breaking of the plating layer is effectively prevented.

When the specific region is a belt-like region, the width of the specific region preferably falls within the range of 0.1 to 5 mm. When the width is large, the plating thickness is uneven due to the difference between the numerical apertures of the specific region and the peripheral region thereof. For this reason, the plating layer tends to be bent and broken. When the numerical aperture of the specific region is smaller than that of the peripheral region of the specific region, and when the width is large, quantity of plating increases, and the cost increases. Therefore, in consideration of these conditions, the width is preferably 0.1 to 1 mm.

When the substrate with conductor layer pattern according to the present invention is manufactured by a transferring method, and when the specific region and the peripheral pattern thereof have linear patterns which linearly continues, a frequency of bending and breaking of the plating layer in the specific region preferably decreases in the plating transfer. At this time, in the linear pattern, one of the line widths in the specific region and the peripheral region thereof is preferably 90 to 100% of the other.

In this case, the line pitch of the specific region is preferably 1/integer of the line pitch of the peripheral region. When the 1/integer is set, a line which is linearly continues is easily formed on the conductor layer pattern in the peripheral region and the conductor layer pattern in the specific region. When the specific region is a belt-like region, in terms of visibility of the conductor layer pattern in the specific region and a bending and breaking of plating metal, a line pitch in the specific region is more preferably ½ to ⅕ of a line pitch in the peripheral region of the specific region.

The specific region may have shapes as shown in FIGS. 17 to 23. FIGS. 20 to 25 are plan views showing examples of partial conductor layer patterns in the specific region and the peripheral region thereof. Although a line pitch of a pattern having an electromagnetic wave shield function is represented by a, a line pitch in a specific region L is ½a in FIG. 20, ¼a in FIG. 21, ¼a and ½a in FIG. 22, ½a and a in FIG. 23, and ¼a and a in FIGS. 24 and 25. FIG. 26 is a plan view showing examples of the position of a specific region in an entire conductor layer pattern. As six examples, positions (heavy line) of specific regions in the entire conductor layer pattern.

The above conductor layer pattern may have a surface treated by a blacking process as described above. The conductor layer pattern may be laminated on an appropriate substrate (another substrate to be described later) directly or through an bonding agent layer.

An engraved plate having a plated portion to manufacture the conductor layer pattern by plating, and an engraved plate having a plated portion of a pattern corresponding to the conductor layer pattern.

The plated portion is a portion where a metal is deposited by plating. In deposition of a plating layer, depending on plating conditions, in consideration of the plating conditions, a plated portion (width and pitch of the plated portion, depth or height of the plated portion, and the like) is designed in accordance with design of the conductor layer pattern.

The pattern of the plated portion corresponds to the conductor layer pattern. Similarly, a plated portion region (specific plated portion region) corresponding to the specific region in the conductor layer pattern is included in the entire plated portion pattern.

The planar shape of the plated portion pattern of the engraved plate having the plated portion is, as a whole, constituted by repeating a triangle such as a regular triangle, an isosceles triangle, or a right triangle, a quadrangle such as a square, a rectangle, a lozenge, a parallelogram, or a trapezoid, a (regular) n-sided polygon (n is an integer which is 3 or more) such as a (regular) hexagon, a (regular) octagon, a (regular) dodecagon, or a (regular) lcosagon, or a geometric figure such as a circle, an ellipse, or a pentagram. The conductor layer pattern may be a design obtained by appropriately combining these figures. One of these units can be independently repeated, or two or more of these units can be combined to each other and repeated. The plated portion pattern may be preferably a mesh pattern having such a design.

The pattern in the specific plated portion region is a part of the plated portion pattern, and the pattern is selected from the above geometric figures. However, as the pattern, a pattern which can be recognized as a pattern different from the plated portion pattern therearound is selected. These patterns, for example, if these patterns can be recognized as different patterns, include patterns, although the patterns have the same shape, which are different in line pitches or bias angles.

The plated portion pattern is preferably designed to make it possible to design an entirely continuous conductor layer.

The pattern of the specific plated portion region is, as a whole, a polygonal (lengths of all the sides are equal to each other and all interior angles are equal to each other or some of them are different from each other, lengths of some sides are different from each other, or lengths of all sides are different from each other) such as a triangular region, a square region, or a hexagonal region, a circular region, an elliptical region, or a region having another shape. In this region, a plated portion of a specific pattern is formed. When the specific plated portion pattern indicates a boundary in the whole of the plated portion pattern, the plated portion pattern preferably has a shape extending in a predetermined direction in a predetermined width, and is preferably formed in the form of a belt (to make it possible to be macroscopically linearly recognized). The specific region constituted by a belt-like (macroscopically linear) specific region may be continuously connected to each other as the specific region or scattered at predetermined intervals as indicated by a broken line. This belt-like (macroscopically linear) region is optimum as a pattern serving as a boundary formed in the plated portion pattern.

In the pattern in the specific plated portion region and the plated portion pattern in another region, the plated portions are preferably designed such that one of the thicknesses of the conductor layers formed by plating is 40 to 100% of the other (in particular, the depth or the height is adjusted).

The plated portion pattern is preferably designed such that an area of a plated portion is 60% or more and 100% or less of an area of a non-plated portion. One of a ratio of the area of the plated portion to the area of the non-plated portion in the specific plated portion region and a ratio of the area of the plated portion to the area of the non-plated portion in the other region is 40 to 95% of the other. These ratios correspond to numerical apertures of the conductor layer pattern.

When the substrate with conductor layer pattern according to the present invention is used as a shielding member, an anti-reflection layer, an near-infrared shielding layer, and the like may be further laminated. A substrate itself to which a metal deposited on an engraved plate is transferred may also serve as a functional layer such as an anti-reflecting layer or a near-infrared shielding layer. Furthermore, a cover film used when a resin is coated on the conductor layer pattern layer may serve as a functional layer such as an anti-reflecting layer or a near-infrared shielding layer.

EXAMPLES

An invention of this present application will be described below with reference to Examples 1A to 4A and Comparative Example 1A.

Example 1A

Formation of Convex Pattern

Resist films (PhoTec RY 3315, thickness: 10 µm (manufactured by Hitachi Chemical Co., Ltd.)) were laminated to both surfaces of a 150 mm square stainless steel plate (SUS316L, mirror finish, thickness: 300 µm, manufactured by NISSHIN STEEL CO., LTD.) (corresponding to FIG. 3A). As laminating conditions, a roll temperature was set to 105° C., a pressure was set to 0.5 MPa, and a line speed was set to 1 m/min. A negative film on which a lattice-shaped pattern of light-transmitting portion was formed at a line width of 15 µm and a line pitch of 300 µm in a 120 mm square area and at a bias angle of 45° (in the square area, lines are arranged at angle of 45° to the sides of the square area) was placed on one surface of the stainless steel plate at rest. By using an ultraviolet irradiation apparatus, under a degree of vacuum of 600 mmHg or less, ultraviolet rays were irradiated at 120 mJ/cm$^2$ on the negative film for the upper and lower surfaces of the stainless steel plate on which the negative film was placed. Furthermore, the resist film was developed with a 1% sodium carbonate aqueous solution, so that a lattice-shaped pattern constituted by a projection portion resist film (projection portion; height: 10 µm) having a line width of 16 to 19 µm, a line pitch of 300 µm, and a bias angle of 45° was formed on the SUS plate. Since a surface opposing the surface on which the pattern is formed is entirely exposed by UV-ray, the resist film is not developed, and the resist film is formed on the entire surface (corresponding to FIG. 3B). The line width is a maximum width ($d_1$) of the projection portion and a width of an upper portion of the projection portion. A width ($d_0$) of a contact portion between the projection portion and the conductive substrate was smaller than the maximum width by 0 to about 0.8 µm. A minimum width of the projection portion is smaller than the maximum width ($d_1$) by 0 to about 1.5 µm and a width of a portion of the projection portion slightly higher than the contact portion between the projection portion and the conductive substrate. These were actually measured by observing a section with a scanning electron microscope (SEM) at a magnification of 3000. As measuring points, 5 or more points were set.

(Formation of Insulating Layer)

A DLC film was formed by PBII/D apparatus (Type III, manufactured by Kurita Seisakusyo Co., Ltd.) as hereinafter. A stainless steel substrate with a resist film was put into a chamber, and a vacuum state was set in the chamber. Thereafter, a substrate surface was cleaned with an argon gas. Hexamethyldisiloxane was introduced into the chamber, and an intermediate layer was formed to have a film thickness of 0.1 µm. Then, toluene, methane, and an acetylene gas were introduced, and a DLC layer was formed on the intermediate layer to have a film thickness of 5 to 6 µm (corresponding to FIG. 3C). The thicknesses of the DLC films formed on both the sides of a convex portion formed by the resist film were 4 to 6 µm. An angle of a boundary surface was 45 to 51°. The thickness of the insulating layer and the angle of the boundary surface were actually measured such that a part of the conductive substrate was cut out and casted with a resin and SEM observation of a section was performed at a magnification of 3000. Measuring portions were 5 portions, and both the sides of the resist film were measured. For this reason, the maximum values and the minimum values of the values at a total of 10 points were employed.

(Formation of Concave Portion; Removal of Convex Pattern to which Insulating Layer Adheres)

A stainless steel substrate to which an insulating layer adheres was dipped in a sodium hydroxide aqueous solution (10%, 50° C.) and left in the solution for 8 hours while being oscillated occasionally. A resist film which formed a convex pattern and a DLC film which adheres to the resist film were stripped. Since some portion could not be easily stripped, these films were entirely stripped by lightly rubbing the films with a cloth to obtain an engraved plate (corresponding to FIG. 3D).

A shape of the concave portion increased in width toward an opening, and an inclination angle of a side surface of the concave portion was equal to an angle of the boundary surface. The depth of the concave portion was 5 to 6 µm. The width of the concave portion at a bottom portion was 16 to 19 µm, and a width (maximum width) at the opening was 26 to 31 µm. A pitch of the concave portions was 300 µm.

(Copper Plating)

Furthermore, an adhesive film (HITALEX K-3940B, manufactured by Hitachi Chemical Co., Ltd.) was bonded to a surface (rear surface) of the obtained engraved plate on which the pattern was not formed. The engraved plate to which the adhesive film was bonded and phosphorous-containing copper were used as a cathode and an anode, respectively, and they were dipped in an electrolytic bath (250 g/L of copper sulfate (pentahydrate), 70 g/L of sulfuric acid, and 4 ml/L of an aqueous solution of CU-BRITE AR (manufactured by EBARA-UDYLITE CO., LTD., additive), 30° C.) for electrolytic copper plating, a voltage was applied across both the electrodes to obtain a current density of 10 A/dm$^2$, and plating was performed until the thickness of a metal deposited on the concave portion of the engraved plate was about 7 µm. A plating layer was formed in the concave portion of the engraved plate such that the plating layer overflowed from the concave portion.

(Manufacturing of Adhesive Film for Transfer)

On a surface of a 100-μm-thickness polyethylene terephthalate (PET) film (A-4100, manufactured by TOYOBO CO., LTD.), a primer (HP-1, manufactured by Hitachi Chemical Co., Ltd.) having a thickness of 1 μm and an acrylic polymer (HTR-280, manufactured by Nagase ChemteX Corporation) having a thickness of 10 μm were sequentially coated to manufacture an adhesive film for transfer.

(Transfer)

A surface of the adhesive layer of the adhesive film for transfer and the copper-plated surface of the engraved plate were bonded to each other by using a roll laminator. As laminate conditions, a roll temperature was set to 25° C., a pressure was set to 0.1 MPa, and a line speed was set to 1 m/min. When the adhesive film bonded to the plate for transfer of the plated metal was peeled, copper deposited on the engraved plate was transferred onto the adhesive film. In this manner, a substrate with conductor layer pattern was obtained, the pattern constituted by a lattice-shaped conductor layer pattern having a line width of 20 to 25 μm, a line pitch of 300±2 μm, and a conductor layer thickness (maximum) of 7 to 8 μm. The shape of the conductor layer, reflecting the shape of the concave portion, increased in width from the lower portion to the upper portion (adhesive layer) as shown in FIG. 5E, and a portion overflowed from the concave portion spread like an umbrella.

When the surface of the engraved plate was observed after the transfer operation, the insulating layer was not stripped at any portion. The line width and the thickness of the conductor layer were actually measured such that the obtained substrate with conductor layer pattern was partially cut and casted with a resin, and a section was SEM-observed at a magnification of 3000. Measuring portions were 5 portions, and both the sides of the concave portion were measured. For this reason, the maximum values and the minimum values of the values at a total of 10 points were employed (the same way will be applied to the following description). The line pitch was measured at a magnification of 200 by using a microscope (digital microscope VHX-500, manufactured by KEYENCE CORPORATION). The measurement was performed at 5 arbitrary points (the same way will be applied to the following description).

(Formation of Protecting Film)

The surface of the obtained substrate with conductor layer pattern on which the conductor layer pattern was present was coated with UV-curable resin Hitaloid 7983AA3 (manufactured by Hitachi Chemical Co., Ltd.) and laminated by a polycarbonate film (macrohole DE, manufactured by Bayer Corporation, 75 μm). After the conductor layer pattern was buried in a UV-curable resin, an ultraviolet ray having 1 J/cm$^2$ was irradiated on the UV-curable resin by using an ultraviolet lamp to cure the UV-curable resin, so that a substrate with conductor layer pattern having a protecting film was obtained.

(Repetitive Use)

By using the engraved plate, the copper plating step to the transfer step were repeated 500 times by the same manner as described above. As a result, transference performance of the copper plating was not changed, and stripped portions of the insulating layer were also not observed.

Example 2A

Formation of Convex Pattern

A liquid resist (ZPN-2000, manufactured by ZEON CORPORATION) was applied to both the surfaces of a titanium plate of 150 mm square (pure titanium, mirror finish, a thickness of 400 μm, manufactured by Nippon Kinzoku co., Ltd.) The resist was coated three times to obtain a resist film having a thickness of 6 μm. After the resultant resist film was prebaked at 110° C. for 1 minute, a negative chromium mask on which a lattice-shaped pattern of light-transmitting portion was formed at a line width of 5 μm and a line pitch of 300 μm in a 110 mm square area and at a bias angle of 45° (in the square area, lines are arranged at angle of 45° to the sides of the square area) was placed on one surface of the titanium plate at rest. By using an ultraviolet irradiation apparatus, under a degree of vacuum of 600 mmHg or less, ultraviolet ray was irradiated at 200 mJ/cm$^2$ for the upper surface of the titanium plate (as an adsorbed substrate) on which the chromium mask was placed. The ultraviolet ray was irradiated on the rear surface on which no mask was placed at 200 mJ/cm$^2$. The resultant structure was heated at 115° C. for 1 minute and then the resist film was developed with a 2.38% tetramethylammonium hydroxide (TMAH), so that a lattice-shaped pattern constituted by a resist film having a line width of 5 to 7 μm, a line pitch of 300 μm, and a bias angle of 45° was formed on the titanium plate. The line width is a maximum width ($d_1$) of the projection portion and a width of an upper portion of the projection portion. A width ($d_0$) of a contact portion between the projection portion and the conductive substrate was smaller than the maximum width by 0 to about 0.5 μm. A minimum width of the projection portion is smaller than the maximum width ($d_1$) by 0 to about 1 μm and a width of a portion of the projection portion slightly higher than the contact portion between the projection portion and the conductive substrate. These were actually measured by observing a section with a scanning electron microscope (SEM) at a magnification of 3000. As measuring points, 5 or more points were set.

(Formation of Insulating Layer)

The processes in Example 1A were repeated up to a coating process of an intermediate layer. Thereafter, DLC was coated to have a film thickness of 2 to 2.5 μm. At this time, the thicknesses of the DLC films on both sides of the convex portion formed by the resist film were 1.8 to 2.5 μm. An angle of a boundary surface was 45 to 48°. The thickness of the insulating layer and the angle of the boundary surface were measured by the same method as described in Example 1A.

(Formation of Concave Portion; Removal of Convex Pattern to which Insulating Layer Adheres)

A titanium substrate to which an insulating layer adheres was dipped in a sodium hydroxide aqueous solution (10%, 50° C.) and left in the solution for 2 hours while being applied with supersonic waves at 50 kHz. A resist film which formed a convex pattern and a DLC film which adheres to the resist film were stripped. Since some portion could not be easily stripped, these films were entirely stripped by lightly rubbing the films with a cloth to obtain an engraved plate.

A shape of the concave portion increased in width toward an opening, and an inclination angle of a side surface of the concave portion was equal to an angle of the boundary surface. The depth of the concave portion was 2 to 2.5 μm. The width of the concave portion at a bottom portion was 5 to 7 μm, and a width (maximum width) at the opening was 9 to 12 μm. A pitch of the concave portions was 300 μm.

(Copper Plating)

Furthermore, an adhesive film (HITALEX K-3940B, manufactured by Hitachi Chemical Co., Ltd.) was bonded to a surface (rear surface) of the obtained engraved plate on which the pattern was not formed. The engraved plate to which the adhesive film was bonded and a copper plate were used as a cathode and an anode, respectively, and the both of a cathode and an anode were dipped in an electrolytic bath (copper pyrophosphate: 100 g/L, potassium pyrophosphate: 250 g/L, ammonia water (30%): 2 mL/L, pH: 8 to 9, and bath temperature: 30° C.) for electrolytic copper plating, a voltage was applied across both the electrodes to obtain a cathode current density of 5 A/dm$^2$, and plating was performed until the thickness of a metal deposited on the concave portion of the engraved plate was about 3.5 μm. A plating layer was formed in the concave portion of the engraved plate such that the plating layer overflowed from the concave portion.

(Transfer)

The copper pattern formed on the engraved plate was transferred onto an adhesive film as in Example 1A. A substrate with conductor layer pattern was obtained, the pattern constituted by a lattice-shaped conductor layer pattern having a line width of 11 to 14 μm, a line pitch of 300±2 μm, and a conductor layer thickness of 3 to 4 μm. The shape of the conductor layer, reflecting the shape of the concave portion, increased in width from the lower portion to the upper portion (adhesive layer) as shown in FIG. 6H, and a portion overflowed from the concave portion spread like an umbrella.

When the surface of the engraved plate was observed after the transfer operation, the insulating layer was not stripped at any portion.

Furthermore, a protecting film was formed as in Example 1A to obtain a substrate with conductor layer pattern having the protecting film was obtained.

(Repetitive Use)

By using the engraved plate, the copper plating step to the transfer step were repeated 700 times by the same manner as described above. As a result, transference performance of the copper plating was not changed, and stripped portions of the insulating layer were also not observed.

Example 3A

A liquid resist (KMPR-1050, manufactured by NIPPON KAYAKU CO., LTD.) was applied to both the surfaces of a stainless steel substrate (SUS304, 314×150 mm, manufactured by NISSHIN STEEL CO., LTD.) to have a thickness of 15 μm. After the resultant resist film was prebaked at 90° C. for 10 minutes, two negative chromium masks on each of which a lattice-shaped pattern of light-transmitting portion was formed at a line width of 5 μm and a line pitch of 300 μm in a 110 mm square area and at a bias angle of 45° (in the square area, lines are arranged at angle of 45° to the sides of the square area) were placed on one surface of the stainless steel plate in parallel to each other at rest. By using an ultraviolet irradiation apparatus, under a degree of vacuum of 600 mmHg or less, an ultraviolet ray was irradiated at 200 mJ/cm$^2$ for the upper surface of the stainless steel plate (as an adsorbed substrate) on which the chromium mask was placed. The ultraviolet ray was irradiated on the rear surface on which no mask was placed at 200 mJ/cm$^2$. The resultant structure was heated at 95° C. for 7 minutes and then the resist film was developed with a 2.38% tetramethylammonium hydroxide (TMAH), so that a pattern constituted by a resist film having a line width of 5 to 7 μm, a line pitch of 300 μm, and a bias angle of 45° was formed on the stainless steel plate. The line width is a maximum width ($d_1$) of the projection portion and a width of an upper portion of the projection portion. A width ($d_0$) of a contact portion between the projection portion and the conductive substrate was smaller than the maximum width by 0 to about 1 μm. A minimum width of the projection portion is smaller than the maximum width ($d_1$) by 0 to about 2 μm and a width of a portion of the projection portion slightly higher than the contact portion between the projection portion and the conductive substrate. These were actually measured by observing a section with a scanning electron microscope (SEM) at a magnification of 3000. As measuring points, 5 or more points were set.

(Formation of Insulating Layer)

As in Example 2A, DLC was coated to have a film thickness of 3 to 4 μm. At this time, the thicknesses of the DLC films on both sides of the convex portion formed by the resist film were 3 to 4 μm. An angle of a boundary surface was 45 to 47°.

(Formation of Concave Portion; Removal of Convex Pattern to which Insulating Layer Adheres)

A stainless steel substrate to which an insulating layer adheres was dipped in a resist stripping solution (RemoverPG, manufactured by NIPPON KAYAKU CO., LTD., 70° C.) and left in the solution for 8 hours while being oscillated occasionally. A resist film which formed a convex pattern and a DLC film which adheres to the resist film were stripped. Since some portion could not be easily stripped, these films were entirely stripped by lightly rubbing the films with a cloth to obtain an engraved plate.

A shape of the concave portion increased in width toward an opening, and an inclination angle of a side surface of the concave portion was equal to an angle of the boundary surface. The depth of the concave portion was 3 to 4 μm. The width of the concave portion at a bottom portion was 5 to 7 μm, and a width (maximum width) at the opening was 11 to 15 μm. A pitch of the concave portions was 300 μm.

(Copper Plating)

The engraved plate manufactured as described above was winded on a stainless steel roll having a diameter of φ100 mm and a width of 200 mm such that a back surface of the engraved plate was in contact with the roll, and joint lines were bonded to each other with an insulating tape. Furthermore, in order to prevent a plating solution from penetrating through the side portions, the insulating tapes were adhered to the roll and the conductive substrate along the circumferences of both side so as to cover the region of 5 mm width containing the ends of the conductive substrate. Consequently one rotator was formed.

By an apparatus configuration as shown in FIG. 16, electrolytic copper plating was performed to a rotator 104. As an anode 103, a titanium insoluble electrode coated with platinum was used. For a cathode, the stainless steel roll was used as a drum electrode. In an electrolytic bath 101 for electrolytic copper plating, an aqueous solution containing copper pyrophosphate: 100 g/L, potassium pyrophosphate: 250 g/L, and ammonia water (30%): 2 mL/L and set at pH: 8 to 9 was accommodated as an electrolytic solution 102. The electrolytic solution 102 was supplied to a gap between the anode 103 and the rotator 104 by a pump 106 through a pipe 105 to fulfill the gap. An approximately half part of the rotator was dipped in the electrolytic solution. A voltage was applied across both the electrodes to obtain a current density of 15 A/dm$^2$, and plating was performed until the thickness of a metal deposited on the conductive substrate was about 5 μm. At this time, the stainless steel roll was rotated at a speed of 0.1 m/minute. A plating layer was formed in the concave portion of the engraved plate such that the plating layer overflowed from the concave portion.

(Transfer)

The adhesive film manufactured in Example 1A was temporarily winded in the form of a roll to obtain a rolled adhesive film. The adhesive film was winded off from the rolled adhesive film, and an adhesive compound layer surface of the adhesive film was continuously bonded to a metal (copper) deposited on the rotator (stainless steel roll) by a bonding roll under the same laminate conditions as in Example 1A and peeled to transfer the metal to the adhesive compound layer of the adhesive film, so that a substrate with conductor layer pattern was continuously manufactured. The substrate with conductor layer pattern was winded in the form of a roll. At this time, the substrate with conductor layer pattern was winded while laminating a release liner PET (S-32, manufactured by Teijin DuPont Films Japan Limited) on a surface of the adhesive film on which the conductor layer pattern was transferred to prevent blocking in a winding state. The conductor layer pattern had a line width of 14 to 18 μm, a line pitch of 300±2 μm, and a conductor layer thickness of 4.5 to 6.5 μm. After a 50 m of adhesive film to which the copper plating layer was transferred was winded, the copper plating layer on the stainless steel roll and transference performance of the copper plating were not changed, and stripped portions of the insulating layer were also not observed. The shape of the conductor layer, reflecting the shape of the concave portion, increased in width from the lower portion to the upper portion (adhesive layer) as shown in FIG. 5($h$), and a portion overflowed from the concave portion spread like an umbrella.

(Formation of Protecting Film)

A part of the obtained substrate with conductor layer pattern was cut off, and, on a surface on which the conductor layer pattern was formed, a UV-curable resin (ARONIX UV-3701, manufactured by TOAGOSEI CO., LTD) was coated by using an applicator (Yoshimitsu Seiki Corporation, YBA type) to have a thickness of 15 μm, and a PET film (Miller D, manufactured by Teijin DuPont Films Japan Limited, 75 μm) was gently laminated by using a hand roll while preventing air bubbles from being made. Thereafter, an ultraviolet ray of 1 J/cm$^2$ was irradiated by using an ultraviolet lamp to form a protecting film.

(Repetitive Use)

By using the obtained conductive substrate for plating transfer, the copper plating step to the transfer step were repeated 5000 times (rotator was rotated 5000 times) by the same manner as described above. As a result, transference performance of the copper plating was not changed, and stripped portions of the insulating layer were also not observed.

Example 4A (Formation of Convex Pattern) to (Removal of Convex Pattern to which Insulating Layer Adheres)

As in Example 1A, a convex pattern was formed as in Example 1A, an insulating layer was formed to have a thickness of 5 to 6 μm, and the convex pattern to which the insulating layer adheres was removed. Consequently, an engraved plate was manufactured.

(Copper Plating)

An adhesive film (HITALEX K-3940B, manufactured by Hitachi Chemical Co., Ltd.) was bonded to a surface (rear surface) of the obtained engraved plate on which the pattern was not formed. The engraved plate to which the adhesive film was bonded and phosphorous-containing copper were used as a cathode and an anode, respectively, and they were dipped in an electrolytic bath (255 g/L of copper sulfate (pentahydrate), 55 g/L of sulfuric acid, and 4 ml/L of an aqueous solution of CU-BRITE #1A (manufactured by EBARA-UDYLITE CO., LTD., additive), 20° C.) for electrolytic copper plating, a voltage was applied across both the electrodes to obtain a cathode current density of 7 A/dm$^2$, and plating was performed until the thickness of a metal deposited on the concave portion of the engraved plate was about 4 μm.

The copper plating did not reach a line opening, and a plated state was a state shown in FIG. 6.

(Transfer)

An adhesive layer surface of the adhesive film for transfer manufactured in Example 1A was bonded to the copper-plated surface of the engraved plate by using a roll laminator. As laminate conditions, a roll temperature of 25° C., a pressure of 0.1 MPa, and a line speed of 1 m/min were set. When the adhesive film bonded to a plate for plating transfer was peeled, a copper deposited on the concave portion of the engraved plate was transferred to the adhesive film. In this manner, a substrate with conductor layer pattern was obtained, the pattern constituted by a lattice-shaped conductor layer pattern having a line width of 22 to 27 μm, a line pitch of 300±2 μm, and a conductor layer thickness of 3 to 4 μm. The shape of the conductor layer, reflecting the shape of the concave portion, increased in width from the lower portion to the upper portion (adhesive layer) as shown in FIG. 7.

(Repetitive Use)

By using the engraved plate, the copper plating step to the transfer step were repeated 700 times by the same manner as described above. As a result, transference performance of the copper plating was not changed, and stripped portions of the insulating layer were also not observed.

Comparative Example 1A

Formation of Convex Pattern

A convex pattern was formed as in Example 1A to obtain a convex pattern having a thickness of 10 μm, a line width of to 19 μm, and a line pitch of 300 μm. At this time, one end of a surface of a conductive substrate was not irradiated UV-rays, so that an underlying metal was exposed after a developing operation.

(Formation of Insulating Layer)

The conductive substrate on which the convex pattern was formed was used as a cathode, the portion where the underlying metal was exposed was connected to an electrode by a clip, and a stainless steel (SUS304) plate was used as an anode. In this state, in a cationic electrocoating (Insuleed3020, manufactured by NIPPON PAINT Co., Ltd.), electrocoating was performed to the conductive substrate under conditions of 15 V and 10 seconds. After the resultant substrate was cleaned with water and dried at 110° C. for 10 minutes, the coating was baked under conditions of 230° C. and 40 minutes in a nitrogen flow to form an insulating layer. An oxygen concentration in the furnace was 0.1%. The thickness of the insulating layer formed on a planar portion was about 2.5 μm. Since the electrocoating was not formed at a portion which was not originally electrified, the coating film was not formed around the concave portion. However, since the electrocoating adhering to the resist film was not completely cleaned, the electrocoating film adhered to both the sides of the concave portion formed by the resist film. The thickness of the electrocoating film was 0.2 to 0.7 μm. In the electrocoating, a boundary surface between the side portion of the convex pattern and the film formed on the planar portion was not formed.

(Removal of Convex Pattern to which Insulating Film Adheres)

The stainless steel substrate to which the electrocoating was applied was dipped in a sodium hydroxide aqueous solution (10%, 50° C.) and left in the solution for 15 minutes while being oscillated occasionally. A resist film which formed a convex pattern and an electrocoating which adheres to the resist film were stripped. Although side portions of the line had various shapes, a large number of portions where concave portions increasing in width toward openings were not formed were observed, and a large number of portions where boundary surfaces of the insulating layer were not smoothed and were fracture surfaces were observed. Some uneven line was also observed. The depth of the concave portion was 2.5 µm. The width of the concave portion at a bottom portion was 16 to 25 µm, and a width (maximum width) at the opening was 17 to 30 µm. A pitch of the concave portions was 300 µm.

(Copper Plating)

An adhesive film (HITALEX K-3940B, manufactured by Hitachi Chemical Co., Ltd.) was bonded to a surface (rear surface) of the obtained engraved plate on which the uneven pattern was not formed. The engraved plate to which the adhesive film was bonded and phosphorous-containing copper were used as a cathode and an anode, respectively, and the engraved plate was dipped in an electrolytic bath (70 g/L of copper sulfate (pentahydrate), 180 g/L of sulfuric acid, Copper acid HL (manufactured by Atotech Japan, surface active agent), 20° C.) for electrolytic copper plating, a voltage was applied across both the electrodes to obtain a current density of 8 A/dm$^2$, and plating was performed until the thickness of a metal deposited on the concave portion of the engraved plate was about 5 µm.

(Transfer)

The copper pattern formed on the engraved plate was transferred to an adhesive film as in Example 1A. A substrate with conductor layer pattern was obtained, the pattern constituted by a lattice-shaped conductor layer pattern having a line width of 20 to 33 µm, a line pitch of 300±2 µm, and a conductor layer thickness of 4.7 to 6 µm. On the line obtained after the transfer operation, reflecting the shape of the uneven line of the conductive substrate, an uneven portion was observed. When a surface of the engraved plate observed after the transfer operation, the insulating layer were not stripped at any portion.

A protecting film was formed as in Example 1A to form a substrate with conductor layer pattern having the protecting film was obtained.

(Repetitive Use)

By using the engraved plate, the copper plating step to the transfer step were repeated by the same manner as described above. As a result, transference performance of the copper plating was gradually deteriorated, and a stripped portion of the insulating layer was visually recognized when the copper plating step to the transfer step were repeated five times.

Characteristic values, plating conditions, characteristics of a conductor layer pattern, and the like of the engraved plates obtained in Examples 1A to 4A and Comparative Example 1A are shown in Table 1.

TABLE 1

|  |  | Example 1A | Example 2A | Example 3A | Example 4A | Comparative Example 1A |
|---|---|---|---|---|---|---|
| Conductive Substrate | Material | SUS316L | Titanium | SUS304 | SUS316L | SUS316L |
|  | Shape | Sheet-fed processing | Sheet-fed processing | Roll | Sheet-fed processing | Sheet-fed processing |
| Convex Pattern | Forming Method | Photolithography | Photolithography | Photolithography | Photolithography | Photolithography |
|  | Resist Thickness (µm) | 10 | 6 | 15 | 10 | 10 |
|  | Mask Line Width | 15 | 5 | 5 | 15 | 15 |
|  | Line Pitch | 300 | 300 | 300 | 300 | 300 |
|  | Line Width (µm) | 16 to 19 | 5 to 7 | 5 to 7 | 16 to 19 | 16 to 19 |
| Insulating Layer Coating | Material | DLC | DLC | DLC | DLC | electrocoating |
|  | Intermediate Layer Coating Thickness (µm) | 0.1 | 0.1 | 0.1 | 0.1 | — |
|  | Coating Thickness (µm) | 5 to 6 | 2 to 2.5 | 3 to 4 | 5 to 6 | 2.5 |
|  | Coating Thickness of Both Sides of Convex Portion (µm) | 4 to 6 | 1.8 to 2.5 | 3 to 4 | 4 to 6 | 0.2 to 0.7 |
|  | Boundary Surface Angle (°) | 45 to 51 | 45 to 48 | 45 to 47 | 45 to 51 | — |
| Convex Pattern Strpping | Method | Alkali Dipping | Alkali Dipping + Supersonic Wave | Alkali Dipping | Alkali Dipping | Alkali Dipping |
|  | Groove Width (bottom portion) (µm) | 16 to 19 | 5 to 7 | 5 to 7 | 16 to 19 | 16 to 25 |
|  | Groove Width (opening) (µm) | 26 to 31 | 9 to 12 | 11 to 15 | 26 to 31 | 17 to 30 |
|  | Groove Depth (µm) | 5~6 | 2~2.5 | 3~4 | 5~6 | 2.5 |
|  | Groove Pitch (µm) | 300 | 300 | 300 | 300 | 300 |
| Plating Condition | Composition | Copper Sulfate 250 g/L Sulfuric Acid 70 g/L | Copper Pyrophosphate 100 g/L Potassium Pyrophosphate 250 g/L Ammonia Solution 2 ml/L | Copper Pyrophosphate 100 g/L Potassium Pyrophosphate 250 g/L Ammonia Solution 2 ml/L | Copper Sulfate 255 g/L Sulfuric Acid 55 ml/L | Copper Sulfate 70 g/L Sulfuric Acid 180 g/L |
|  | Cathode Current Density (A/dm$^2$) | 10 | 5 | 15 | 7 | 8 |
| Conductor Layer Pattern | Line Width (µm) | 20 to 25 | 11 to 14 | 14 to 18 | 22 to 27 | 20 to 33 |
|  | Line Thickness (µm) | 7 to 8 | 3 to 4 | 4.5 to 6.5 | 3 to 4 | 4.7 to 6.0 |
|  | Line Linearity | OK | OK | OK | OK | Uneven |
|  | Abnormal Pattern | None | None | None | None | None |
| Repetitive Endurance of Conductive Substrate |  | 500 times OK | 700 times OK | 5000 times OK | 700 times OK | 7 times NG |

Furthermore, the invention of this application will be described below with reference to Examples 1B to 5B Example 1B Formation of Convex Pattern Resist films (PhoTec RY 3315, thickness: 10 μm (manufactured by Hitachi Chemical Co., Ltd.)) were laminated to both surfaces of a stainless steel plate (SUS316L, mirror finish, a thickness of 300 μm, manufactured by NISSHIN STEEL CO., LTD.) (corresponding to FIG. 3(a)). As laminating conditions, a roll temperature was set to 105° C., a pressure was set to 0.5 MPa, and a line speed was set to 1 m/min. A negative film on which a pattern of rectangular light-transmitting portion having an one-side length of 140 μm was formed at a rectangular pitch of 200 μm in a 120 mm square area and at a bias angle of 60° (in the square area, rectangles was arranged at 60° to either side of the square area) was placed on one surface of the stainless steel plate at rest. By using an ultraviolet irradiation apparatus, under a degree of vacuum of 600 mmHg or less, an ultraviolet ray was irradiated at 120 mJ/cm² on the negative film for the upper and lower surfaces of the stainless steel plate on which the negative film was placed. Furthermore, the resist film was developed with a 1% sodium carbonate aqueous solution, so that a pattern (print pattern) constituted by a resist film having a length of one side of 140 to 145 μm, a rectangular pitch of 200 μm, and a bias angle of 60° was formed on the SUS plate. Since a surface opposing the surface on which the pattern is formed is entirely exposed by UV-rays, the surface is not developed, and the resist film is formed on the entire surface (corresponding to FIG. 3B).

(Formation of Film)

A DLC film was formed by PBII/D apparatus (Type III, manufactured by Kurita Seisakusyo Co., Ltd.) as hereinafter. A stainless steel substrate with a resist film was put into a chamber, and a vacuum state was set in the chamber. Thereafter, a substrate surface was cleaned with an argon gas, hexamethyldisiloxane was introduced into the chamber, and an intermediate layer was formed to have a film thickness of 0.1 μm. Toluene, methane, and an acetylene gas were introduced, and a DLC layer was formed on the intermediate layer to have a film thickness of 20 μm (corresponding to FIG. 3C). The thicknesses of the DLC films formed on both the sides of a convex portion formed by the resist film were 15 to 17 μm. An angle of a boundary surface was 45 to 50°. The thickness of the DLC film and the angle of the boundary surface were actually measured such that a part of the conductive substrate was cut out and casted with a resin and SEM observation of a section was performed at a magnification of 3000. Measuring portions were 5 portions, and both the sides of the resist film were measured. For this reason, the maximum values and the minimum values of the values at a total of 10 points were employed.

(Formation of Concave Portion; Removal of Convex Pattern to which Film Adheres)

The stainless steel substrate to which the film adheres was dipped in a sodium hydroxide aqueous solution (10%, 50° C.) and left in the solution for 8 hours while being oscillated occasionally. The resist film which forms the convex pattern and the DLC film which adheres to the resist film were stripped. Since some portion could not be easily stripped, these films were entirely stripped by lightly rubbing the films with a cloth to obtain an engraved plate (corresponding to FIG. 3D).

The shape of the concave portion increased in width toward the opening, and an inclination angle of a side surface of the concave portion was equal to an angle of the boundary surface. The depth of the concave portion was 19 to 20 μm. The width of the concave portion at a bottom portion was 140 to 143 μm, and a width (maximum width) at the opening was 180 to 185 μm. A pitch of the concave portions was 200 μm. An engraved plate having a uniform-shaped concave portion, a linear concave portion edge, and a uniform-depth concave portion could be obtained.

By using the engraved plate, gravure printing can be repeated 1000 times or more without stripping the DLC film.

Example 2B

Formation of Convex Pattern

A liquid resist (ZPN-2000, manufactured by ZEON CORPORATION) was applied to both the surfaces of a 150 mm square titanium plate (pure titanium, mirror finish, a thickness of 400 μm, manufactured by Nippon Kinzoku co., Ltd.). The resist was applied three times to obtain a resist film having a thickness of 6 μm. The resultant resist film was prebaked at 110° C. for 1 minute, a negative chromium mask on which a pattern of rectangular light-transmitting portion having an one-side width of 120 μm was formed at a rectangular pitch of 150 μm in a 110 mm square area and at a bias angle of 60° (in the square area, rectangles was arranged at 60° to either side of the square area) was placed on one surface of the titanium plate at rest. By using an ultraviolet irradiation apparatus, under a degree of vacuum of 600 mmHg or less, ultraviolet ray was irradiated at 200 mJ/cm² for the upper surface of the titanium plate (as an adsorbed substrate) on which the chromium mask was placed. The ultraviolet ray was irradiated on the rear surface on which no mask was placed at 200 mJ/cm². The resultant structure was heated at 115° C. for 1 minute and then the resist film was developed with a 2.38% tetramethylammonium hydroxide (TMAH), so that a pattern constituted by a resist film having an one-side width of 120 to 122 μm, a rectangular pitch of 150 μm, and a bias angle of 60° was formed on the titanium plate.

(Formation of Film)

The processes of Example 1B were repeated up to a coating process of an intermediate layer. Thereafter, DLC was coated to have a film thickness of 10 μm. At this time, the thicknesses of the DLC films on both the surfaces of the convex portion formed by the resist film were 7 to 8 μm. An angle of a boundary surface was 45 to 51°. The film thickness and the angle of the boundary surface were measured by the same method as described in Example 1B.

(Formation of Concave Portion; Removal of Convex Pattern to which Film Adheres)

A titanium substrate to which a film adheres was dipped in a sodium hydroxide aqueous solution (10%, 50° C.) and left in the solution for 2 hours while being applied with supersonic waves at 50 kHz. A resist film which formed a convex pattern and a DLC film which adheres to the resist film were stripped. Since some portion could not be easily stripped, these films were entirely stripped by lightly rubbing the films with a cloth to obtain an engraved plate.

A shape of the concave portion increased in width toward an opening, and an inclination angle of a side surface of the concave portion was equal to an angle of the boundary surface. The depth of the concave portion was 9 to 10 μm. The width of the concave portion at a bottom portion was 120 to 122 μm, and a width (maximum width) at the opening was 140 to 142 μm. A pitch of the concave portions was 150 μm.

An engraved plate having a uniform-shaped concave portion, a linear concave portion edge, and a uniform-depth concave portion could be obtained.

By using the engraved plate, gravure printing can be repeated 1000 times or more without stripping the DLC film.

Example 3B

A liquid resist (KMPR-1050, manufactured by NIPPON KAYAKU CO. LTD.) was applied to both the surfaces of a stainless steel substrate (SUS304, 314×150 mm, manufactured by NISSHIN STEEL CO., LTD.) to have a thickness of 15 µm. The resultant resist film was prebaked at 90° C. for 10 minutes. Thereafter, two negative chromium masks on each of which a pattern of light-transmitting portion having an one-side width of 120 µm was formed at a rectangular pitch of 150 µm in a 110 mm square area and at a bias angle of 60° (in the square area, rectangles was arranged at 60° to either side of the square area) were placed on one surface of the stainless steel plate in parallel to each other at rest. By using an ultraviolet irradiation apparatus, under a degree of vacuum of 600 mmHg or less, an ultraviolet ray was irradiated at 200 mJ/cm$^2$ for the upper surface of the stainless steel plate (as an adsorbed substrate) on which the chromium mask was placed. The ultraviolet ray was irradiated on the rear surface on which no mask was placed at 200 mJ/cm$^2$. The resultant structure was heated at 95° C. for 7 minutes and then the resist film was developed with a 2.38% tetramethylammonium hydroxide (TMAH), so that a pattern constituted by a resist film having an one-side length of 120 to 125 µm, a rectangular pitch of 150 µm, and a bias angle of 60° was formed on the stainless steel plate.

(Formation of Film)

As in Example 2B, DLC was coated to have a film thickness of 10 µm. At this time, the thicknesses of the DLC films on both the surfaces of the convex portion formed by the resist film were 6 to 7 µm. An angle of a boundary surface was 45 to 48°.

(Formation of Concave Portion; Removal of Convex Pattern to which Film Adheres)

A stainless steel substrate to which a film adheres was dipped in a resist stripping solution (RemoverPG, manufactured by NIPPON KAYAKU CO., LTD., 70° C.) and left in the solution for 8 hours while being oscillated occasionally. A resist film which formed a convex pattern and a DLC film which adheres to the resist film were stripped. Since some portion could not be easily stripped, these films were entirely stripped by lightly rubbing the films with a cloth to obtain an engraved plate.

A shape of the concave portion increased in width toward an opening, and an inclination angle of a side surface of the concave portion was equal to an angle of the boundary surface. A shape of the concave portion increased in width toward an opening, and an inclination angle of a side surface of the concave portion was equal to an angle of the boundary surface. The depth of the concave portion was 9 to 10 µm. The width of the concave portion at a bottom portion was 120 to 123 µm, and a width (maximum width) at the opening was 140 to 143 µm. A pitch of the concave portions was 150 µm. An engraved plate having a uniform-shaped concave portion, a linear concave portion edge, and a uniform-depth concave portion could be obtained.

By using the engraved plate, gravure printing can be repeated 1000 times or more without stripping the DLC film.

Example 4B (Formation of Concave Portion) to (Removal of Convex Pattern to which Film Adheres)

As in Example 2B, a liquid resist was applied, a convex pattern was formed by laser exposure, a DLC film was formed to have a thickness of 10 µm, a convex pattern to which a film adheres was removed, and a gravure printing roll was manufactured. As a result, an engraved plate having a uniform-shaped concave portion, a linear concave portion edge, and a uniform-depth concave portion could be obtained.

(Repetitive Use)

By using the engraved plate, gravure printing was performed. As a result, the gravure printing could be repeated 1000 times or more without stripping the DLC film.

Example 5B

Manufacturing of Substrate for Engraved Plate

A φ200-mm roll having a length of 300 mm (SUS304, mirror finish, manufactured by NISSHIN STEEL CO., LTD.) was prepared, and a DLC film (thickness of 1 µm) was formed on an entire cylindrical surface by the same manner as in Example 1B by using a PBII/D apparatus (TypeIII, manufactured by Kurita Seisakusyo Co., Ltd.). The resultant roll was freshly used as a substrate for engraved plate.

(Formation of Convex Portion) to (Removal of Convex Pattern to which Film Adheres)

The substrate for engraved plate was used in place of the 150 mm square titanium plate in Example 2B, and as in Example 2B, application of a liquid resist (circumferential surface), formation of a convex pattern, formation of a DLC film (including formation of an intermediate layer), and removal of a convex pattern to which a film adheres were performed to manufacture a gravure printing roll. As a result, an engraved plate having a uniform-shaped concave portion, a linear concave portion edge, and a uniform-depth concave portion could be obtained. This gravure printing roll has a concave portion having a bottom portion covered with a DLC film, and is especially excellent in chemical resistance.

By using the engraved plate (gravure printing roll), gravure printing can be repeated 1000 times or more without stripping the DLC film.

Furthermore, the present invention will be concretely described below with reference to Examples 1C to 4C and Comparative Example 1C.

Example 1C

Formation of Convex Pattern

Resist films (PhoTec RY 3315, thickness: 15 µm (manufactured by Hitachi Chemical Co., Ltd.)) were laminated to both surfaces of a 150 mm square stainless steel plate (SUS316L, mirror finish, thickness: 300 µm, manufactured by NISSHIN STEEL CO., LTD.) (corresponding to FIG. 3A). As laminating conditions, a roll temperature was set to 105° C., a pressure was set to 0.5 MPa, and a line speed was set to 1 m/min. A negative film on which circular patterns serving as opaque portions each having a diameter of φ100 µm were formed at a pitch of 150 µm in a zigzag form (each tandem of circular patterns is arranged in a zigzag form) was placed on one surface of the stainless steel plate at rest. By using an ultraviolet irradiation apparatus, under a degree of vacuum of 600 mmHg or less, ultraviolet rays were irradiated at 120 mJ/cm$^2$ on the negative film for the upper and lower surfaces of the stainless steel plate on which the negative film was placed. Furthermore, the resist film was developed with a 1% sodium carbonate aqueous solution, so that a convex pattern of the resist film obtained by arranging projection portions (thickness: 15 μm) having a diameter of φ98 to 99 μm at a pitch of 150 μm in a zigzag form was formed on the SUS plate. These numerical values were calculated by observing at least 5 points or more with an optical microscope. The diameter is a maximum diameter ($d_1$) of the projection portion and a diameter of an upper portion of the projection portion. A diameter of a contact portion between the projection portion and the conductive substrate was smaller than the maximum diameter by 0 to about 1 μm. A minimum diameter of the projection portion is smaller than the maximum diameter by 0 to about 2 μm and a diameter of a portion of the projection portion slightly higher than the contact portion between the projection portion and the conductive substrate. These were actually measured by observing a section with a scanning electron microscope (SEM) at a magnification of 3000. As measuring points, 5 or more points were set. Since a surface opposing the surface on which the pattern is formed is entirely exposed by UV-rays, the resist film of the surface is not developed, and the resist film is formed on the entire surface (corresponding to FIG. 3B).

(Formation of Insulating Layer)

A DLC film was formed by PBII/D apparatus (Type III, manufactured by Kurita Seisakusyo Co., Ltd.) as hereinafter. A stainless steel substrate with a resist film was put into a chamber, and a vacuum state was set in the chamber. Thereafter, a substrate surface was cleaned with an argon gas, hexamethyldisiloxane was introduced into the chamber, and an intermediate layer was formed to have a film thickness of 0.1 μm. Then, toluene, methane, and an acetylene gas were introduced, and a DLC layer was formed on the intermediate layer to have a film thickness of 5 to 6 μm (corresponding to FIG. 3C). The thicknesses of the DLC films formed on both the sides of a resist pattern formed by the resist film were 4 to 6 μm. An angle of a boundary surface was 45 to 51°. The thickness of the insulating layer and the angle of the boundary surface were actually measured such that a part of the conductive substrate was cut out and casted with a resin and SEM observation of a section was performed at a magnification of 3000. Measuring portions were 5 portions, and both the sides of the resist film were measured. For this reason, the maximum values and the minimum values of the values at a total of 10 points were employed.

(Removal of Resist Pattern to which Insulating Layer Adheres and Formation of Insulating Layer Pattern)

The stainless steel substrate to which the film adheres was dipped in a sodium hydroxide aqueous solution (10%, 50° C.) and left in the solution for 8 hours while being oscillated occasionally. The resist film and the DLC film which adheres to the resist film were stripped. Since some portion could not be easily stripped, these films were entirely stripped by lightly rubbing the films with a cloth to obtain an engraved plate (corresponding to FIG. 3D).

When observation was performed by the same manner as in the above-mentioned SEM observation, the shape of the insulating layer of the engraved plate was convex which increased toward a bottom portion, and an inclination angle of a side surface of the convex portion was equal to an angle of the boundary surface. A height of the insulating layer was 5 to 6 μm. A diameter of the bottom portion of the insulating layer was φ98 to 99 μm, and a diameter (minimum diameter) of an upper portion of the insulating layer was φ86 to 91 μm. A pitch of the insulating layer was 150 μm. These numerical values were calculated by observing at least 5 points or more with an optical microscope.

(Copper Plating)

Furthermore, an adhesive film (HITALEX K-3940B, manufactured by Hitachi Chemical Co., Ltd.) was bonded to a surface (rear surface) of the obtained engraved plate on which the pattern was not formed. The engraved plate to which the adhesive film was bonded and phosphorous-containing copper were used as a cathode and an anode, respectively, and they were dipped in an electrolytic bath (250 g/L of copper sulfate (pentahydrate), 70 g/L of sulfuric acid, and 4 ml/L of an aqueous solution of CU-BRITE AR (manufactured by EBARA-UDYLITE CO., LTD., additive), 30° C.) for electrolytic copper plating, a voltage was applied across both the electrodes to obtain a current density of 10 A/dm$^2$, and plating was performed until the thickness of a metal deposited on the surface of the engraved plate was 20 μm. As a result, a copper foil was formed to cover an exposed surface of the conductive substrate and the ends of the insulating layer. See FIG. 14.

(Peeling)

The copper foil formed on the engraved plate was peeled. A copper foil patterned to have a pattern in which holes each having a diameter of φ57 to 60 μm were arranged at a pitch of 150 μm in a zigzag form was obtained. These numerical values were calculated by observing at least 5 points or more with an optical microscope. The shape of the patterned copper foil, reflecting the shape of the insulating layer as shown in FIG. 14, had a step portion 11 around each hole, an inclined portion 12 connected to the step portion 11 was inclined from a large-diameter outer circumference to a small-diameter inner circumference in a bottom view.

When the surface of the engraved plate was observed after the peeling, the insulating layer did not have a stripped portion.

(Repetitive Use)

By using the engraved plate, the copper plating step to the copper foil peeling step were repeated 500 times by the same manner as described above. As a result, transference performance of the copper plating did not change, and stripped portions of the insulating layer were not observed.

Example 2C

Formation of Convex Pattern

A liquid resist (ZPN-2000, manufactured by ZEON CORPORATION) was coated to both the surfaces of a 150 mm square titanium plate (pure titanium, mirror finish, a thickness of 400 μm, manufactured by Nippon Kinzoku co., Ltd.). The resist was coated three times to obtain a resist film having a thickness of 6 μm. The resultant resist film was prebaked at 110° C. for 1 minute. Thereafter, a 110 mm square size of negative mask on which circular patterns serving as opaque portions each having a diameter of φ50 μm were formed at an interval of 70 μm in a zigzag form (each tandem of circular patterns is arranged in a zigzag form) was placed on one surface of the titanium plate at rest. By using an ultraviolet irradiation apparatus, under a degree of vacuum of 600 mmHg or less, an ultraviolet ray was irradiated at 200 mJ/cm$^2$ on the negative mask for the upper surface of the titanium plate (as an adsorbed substrate) on which the negative mask was placed. The ultraviolet ray was irradiated on the rear surface on which no mask was placed at 200 mJ/cm$^2$. The resultant structure was heated at 115° C. for 1 minute and then the resist film was developed with a 2.38% tetramethylammonium hydroxide (TMAH), so that a convex pattern of the resist film obtained by arranging projection portions (thickness: 6 μm) having a diameter of ϕ49 to 50 μm at a pitch of 70 μm in a zigzag form was formed on the titanium plate. The diameter and the pitch were calculated by the same manner as in Example 1C. The diameter is a maximum diameter ($d_1$) of the projection portion and a diameter of an upper portion of the projection portion. When a diameter of a contact portion between the projection portion and the conductive substrate was measured by the same manner as in Example 1C, the diameter was smaller than the maximum diameter by 0 to about 0.5 μm. A minimum diameter of the projection portion is smaller than the maximum diameter by 0 to about 1 μm and a diameter of a portion of the projection portion slightly higher than the contact portion between the projection portion and the conductive substrate.

(Formation of Insulating Layer)

The processes of Example 1C were repeated up to a coating process of an intermediate layer. Thereafter, DLC was coated to have a film thickness of 2 to 2.5 μm. At this time, the thicknesses of the DLC films on both the surfaces of the pattern formed by the resist film were 1.8 to 2.5 μm. An angle of a boundary surface was 45 to 47°. The thickness of the insulating layer and the angle of the boundary surface were measured by the same method as described in Example 1C.

(Removal of Resist Pattern to which Insulating Layer Adheres and Formation of Insulating Layer Pattern)

A titanium substrate to which an insulating layer adheres was dipped in a sodium hydroxide aqueous solution (10%, 50° C.) and left in the solution for 2 hours while being applied with supersonic waves at 50 kHz. A resist film and a DLC film which adheres to the resist film were stripped. Since some portion could not be easily stripped, these films were entirely stripped by lightly rubbing the films with a cloth to obtain an engraved plate.

When SEM observation was performed as in Example 1C, the shape of the insulating layer of the engraved plate increased toward a bottom portion, and an inclination angle of a side surface of the convex portion was equal to an angle of the boundary surface. A height of the insulating layer was 2 to 2.5 μm. When measurement was performed as in Example 1C, a diameter of the bottom portion of the insulating layer was ϕ49 to 50 μm, and a diameter (minimum diameter) of an upper portion of the insulating layer was ϕ44 to 46 μm. A pitch of the insulating layer was 70 μm.

(Copper Plating)

Furthermore, an adhesive film (HITALEX K-3940B, manufactured by Hitachi Chemical Co., Ltd.) was bonded to a surface (rear surface) of the obtained engraved plate on which the pattern was not formed. The engraved plate to which the adhesive film was bonded and a copper plate were used as a cathode and an anode, respectively, and they were dipped in an electrolytic bath (copper pyrophosphate: 100 g/L, potassium pyrophosphate: 250 g/L, an ammonia water (30%): 2 ml/L, pH: 8 to 9, and a bath temperature: 30° C.) for electrolytic copper plating, a voltage was applied across both the electrodes to obtain a cathode current density of 5 A/dm², and plating was performed until the thickness of a metal deposited on the concave portion of the engraved plate was 20 μm. As a result, a copper foil was formed to cover a surface of the conductive substrate and the ends of the insulating layer (see FIG. 14).

(Peeling)

The patterned copper foil formed on the engraved plate was peeled. Measurement was performed as in Example 1C, a copper foil patterned to have a pattern in which holes each having a diameter of ϕ8 to 11 μm were arranged at a pitch of 70 μm in a zigzag form was obtained. The shape of the patterned copper foil, reflecting the shape of the insulating layer as shown in FIG. 6, had a step portion 11 around each hole, an inclined portion 12 connected to the step portion 11 was inclined from a large-diameter outer circumference to a small-diameter inner circumference in a bottom view.

When the surface of the engraved plate was observed after the peeling, the insulating layer did not have a stripped portion.

(Repetitive Use)

By using the engraved plate, the copper plating step to the peeling step were repeated 700 times by the same manner as described above. As a result, transference performance of the copper plating did not change, and stripped portions of the insulating layer were not observed.

Example 3C

Formation of Convex Pattern

A liquid resist (KMPR-1050, manufactured by NIPPON KAYAKU CO., LTD.) was applied to a stainless steel substrate (SUS304, 4×150 mm, manufactured by NISSHIN STEEL CO., LTD.) to have a thickness of 10 μm. The resultant resist film was prebaked at 90° C. for 10 minutes. Thereafter, two negative masks on each of which circular patterns serving as opaque portions each having a diameter of ϕ60 μm were formed at a pitch of 80 μm in a zigzag form (each tandem of circular patterns is arranged in a zigzag form) in a 110 mm square area was placed on one surface of the stainless steel plate at rest. By using an ultraviolet irradiation apparatus, under a degree of vacuum of 600 mmHg or less, an ultraviolet ray was irradiated at 200 mJ/cm² on the negative mask for the upper surface of the stainless steel plate (as an adsorbed substrate) on which the negative mask was placed. The ultraviolet ray was irradiated on the rear surface on which no mask was placed at 200 mJ/cm². The resultant structure was heated at 95° C. for 7 minutes and then the resist film was developed with a 2.38% tetramethylammonium hydroxide (TMAH), so that a convex pattern of the resist film obtained by arranging projection portions having a diameter of ϕ59 to 60 μm at a pitch of 80 μm in a zigzag form was formed on the stainless steel plate. The diameter and the pitch were calculated by the same manner as in Example 1C. The diameter is a maximum diameter ($d_1$) of the projection portion and a diameter of an upper portion of the projection portion. When a diameter of a contact portion between the projection portion and the conductive substrate was measured by the same manner as in Example 1C, the diameter was smaller than the maximum diameter by 0 to about 0.8 μm. A minimum diameter of the projection portion is smaller than the maximum diameter by 0 to about 1.5 μm and a diameter of a portion of the projection portion slightly higher than the contact portion between the projection portion and the conductive substrate.

(Formation of Insulating Layer)

As in Example 2C, DLC was coated to have a film thickness of 3 to 4 μm. At this time, the thicknesses of the DLC films on both the surfaces of the resist pattern formed by the resist film were 2.7 to 4 μm. An angle of a boundary surface was 45 to 48°.

(Removal of Resist Pattern to which Insulating Layer Adhered and Formation of Insulating Layer Pattern)

A stainless steel substrate to which an insulating layer adheres was dipped in a resist stripping solution (RemoverPG, manufactured by NIPPON KAYAKU CO., LTD., 70° C.) and left in the solution for 8 hours while being oscillated occasionally. A resist film and a DLC film which adheres to the resist film were stripped. Since some portion could not be easily stripped, these films were entirely stripped by lightly rubbing the films with a cloth to obtain an engraved plate.

When SEM observation was performed as in Example 1C, a shape of the insulating layer increased in width toward a distal end, and an inclination angle of a side surface of the insulating layer was equal to an angle of the boundary surface. A height of the insulating layer was 3 to 4 µm. When measurement was performed as in Example 1C, a diameter of the bottom portion of the insulating layer was φ59 to 60 µm, and a diameter of the upper portion of the insulating layer was (minimum diameter) φ51 to 54 µm. A pitch of the insulating layer was 80 µm.

(Copper Plating)

The engraved plate was winded on a stainless steel roll having a diameter of φ100 mm and a width of 200 mm such that a rear surface of the engraved plate was in contact with the roll, and joint lines were bonded to each other with an insulating tape. Furthermore, in order to prevent a plating solution from penetrating through the side portions, the insulating tapes were adhered to the roll and the conductive substrate along the circumferences of both side so as to cover the region of 5 mm width containing the ends of the conductive substrate. Consequently one rotator was formed.

With the apparatus configuration as shown in FIG. 16, electrolytic copper plating was performed to a rotator 104. As an anode 103, a titanium insoluble electrode coated with platinum was used. For a cathode, the stainless steel roll was used as a drum electrode. In an electrolytic bath 101 for electrolytic copper plating, an aqueous solution containing copper pyrophosphate: 100 g/L, potassium pyrophosphate: 250 g/L, and ammonia water (30%): 2 mL/L and set at pH: 8 to 9 was accommodated as an electrolytic solution 102 at 40° C. The electrolytic solution 102 was supplied to a portion between the anode 103 and the rotator 104 by a pump 106 through a pipe 105 to fulfill the portion. An approximately half part of the rotator 104 was dipped in the electrolytic solution. A voltage was applied across both the electrodes to obtain a current density of 15 A/dm$^2$, and plating was performed until the thickness of a metal deposited on the conductive substrate was about 20 µm. At this time, the stainless steel roll was rotated at a speed of 0.1 m/minute. As a result, a plating layer was formed to cover the surface of the conductive substrate and the ends of the insulating layers.

(Peeling)

The copper pattern formed on the engraved plate was peeled. A copper foil patterned to have holes each having a diameter of 18 to 21 µm and arranged at a pitch of 80 µm was obtained. The shape of the patterned copper foil, reflecting the shape of the insulating layer as shown in FIG. 14, had a step portion 21 around each hole, an inclined portion 22 connected to the step portion 21 was inclined from a large-diameter outer circumference to a small-diameter inner circumference in a bottom view.

When the surface of the engraved plate was observed after the peeling, the insulating layer did not have a stripped portion.

(Repetitive Use)

By using the obtained conductive substrate for plating transfer, the copper plating step to the peeling step were repeated 5000 times (rotator was rotated 5000 times) by the same manner as described above. As a result, a peeling property of the copper plating was not changed, and stripped portions of the insulating layer were also not observed.

Example 4C (Formation of Convex Pattern) to (Removal of Resist Pattern to which Insulating Layer Adheres and Formation of Insulating Layer Pattern)

As in Example 1C, a convex pattern was formed on stainless steel plate, and formation of an insulating layer, removal of a resist pattern to which the insulating layer adheres, and formation of an insulating layer pattern were performed. Consequently, an engraved plate was manufactured.

(Copper Plating)

An adhesive film (HITALEX K-3940B, manufactured by Hitachi Chemical Co., Ltd.) was bonded to a surface (rear surface) of the obtained engraved plate on which the convex pattern was not formed. The engraved plate to which the adhesive film was bonded and phosphorous-containing copper were used as a cathode and an anode, respectively, and they were dipped in an electrolytic bath (255 g/L of copper sulfate (pentahydrate), 55 g/L of sulfuric acid, and 4 ml/L of an aqueous solution of CU-BRITE #1A (manufactured by EBARA-UDYLITE CO., LTD., additive), 20° C.) for electrolytic copper plating, a voltage was applied across both the electrodes to obtain a cathode current density of 7 A/dm$^2$, and plating was performed until the thickness of a metal deposited on the surface of the engraved plate was about 70 µm. The copper plating covered the insulating layer, and the plated state was a state as shown in FIG. 7.

(Peeling)

The patterned copper foil formed on the engraved plate was peeled. The pattern applied to the copper foil was formed as a circular concave portion on the copper foil. However, a diameter of an opening of the concave portion was φ98 to 99 µm, a diameter of a bottom surface of the concave portion was φ86 to 91 µm, and a circular concave portion pitch was 150 µm. As shown in FIG. 7, reflecting the shape of the insulating layer, the concave portion decreases in width from the opening of the concave portion to the bottom surface. The diameters and the pitch were measured at 5 or more points with an optical microscope.

When the surface of the engraved plate was observed after the peeling, the insulating layer were not stripped at any portion.

(Repetitive Use)

By using the engraved plate, the copper plating step to the transfer step were repeated 700 times by the same manner as described above. As a result, transference performance of the copper plating was not changed, and stripped portions of the insulating layer were not observed.

Comparative Example 1C

Formation of Hole Pattern

A convex pattern was formed as in Example 1C to obtain a hole pattern having a diameter of φ98 to 99 µm and a pitch of 150 µm. At this time, one end of a surface of a conductive substrate is not irradiated UV-rays, and an underlying metal is exposed after developing.

(Formation of Insulating Layer)

The conductive substrate on which the resist pattern was formed was used as a cathode, the portion where the underlying metal was exposed was connected to an electrode by a clip, and a stainless steel (SUS304) plate was used as an anode. In this state, in a cationic electrocoating (Insuleed3020, manufactured by NIPPON PAINT Co., Ltd.), electrocoating was performed to the conductive substrate under conditions of 15 V and 10 seconds. After the resultant substrate was washed with water and dried at 110° C. for 10 minutes, the coating was baked under conditions of 230° C. and 40 minutes in a nitrogen flow to form an insulating layer. An oxygen concentration in the furnace was 0.1%. The height of the insulating layer formed on a planar portion (on the conductive substrate) was about 2 to 3 μm. Since the electrocoating was not formed at a portion which was not originally electrified, the coating film was not formed on the upper portion of the resist pattern. However, since the electrocoating adhering to the resist film was not completely cleaned, the electrocoating film adhered to both the sides of the resist pattern formed by the resist film. The thickness of the electrocoating film was 0.2 to 0.7 μm. In the electrocoating, a boundary surface between the side portion of the resist pattern and the film formed on the planar portion (on the conductive substrate) was not formed.

(Removal of Resist Pattern to which Insulating Film Adheres)

The stainless steel substrate to which the electrocoating was applied was dipped in a sodium hydroxide aqueous solution (10%, 50° C.) and left in the solution for 15 minutes while being oscillated occasionally. A resist film which formed a convex pattern and an electrocoating which adheres to the resist film were stripped. Although side surface portions of the insulating layer had various shapes, a large number of portions where the insulating layer did not increase in width toward the end were observed, and a large number of portions where boundary surfaces of the insulating layer were not smoothed and were fracture surfaces were observed. Some uneven shape of the insulating layer was also observed.

(Copper Plating)

An adhesive film (HITALEX K-3940B, manufactured by Hitachi Chemical Co., Ltd.) was bonded to a surface (rear surface) of the obtained engraved plate on which the convex portion was not formed. The engraved plate to which the adhesive film was bonded and phosphorous-containing copper were used as a cathode and an anode, respectively, and they were dipped in an electrolytic bath (70 g/L of copper sulfate (pentahydrate), 180 g/L of sulfuric acid, Copperacid HL (manufactured by Atotech Japan, surface active agent), 20° C.) for electrolytic copper plating, a voltage was applied across both the electrodes to obtain a current density of 8 A/dm$^2$, and plating was performed until the thickness of a metal deposited on the surface of the engraved plate was about 20 μm.

(Peeling)

The copper pattern formed on the engraved plate was peeled. Tolerably a copper foil patterned to have holes each having a diameter of 57 to 60 μm and arranged at a pitch of 150 μm was obtained. The pattern shapes of the holes were uneven, and a good pattern could not be obtained.

(Repetitive Use)

By using the engraved plate, the copper plating step to the peeling step were repeated by the same manner as described above. As a result, a stripped portion of the insulating layer was visually recognized when the copper plating step to the peeling step were repeated seven times.

Characteristic values, plating conditions, characteristics of the conductor layer patterns, and the like of the engraved plates obtained in Examples 1C to 4C and Comparative Example 1C are shown in Table 2.

TABLE 2

| | Item | Example 1C | Example 2C | Example 3C | Example 4C | Comparative Example 1C |
|---|---|---|---|---|---|---|
| Conductive Substrate | Material | SUS316L | Titanium | SUS304 | SUS316L | SUS316L |
| | Shape | Sheet-fed processing | Sheet-fed processing | Roll | Sheet-fed processing | Sheet-fed processing |
| Convex Pattern | Resist (μm) | Resist film | Liquid resist | Liquid resist | Resist film | Resist film |
| | Resist Thickness (μm) | 15 | 6 | 10 | 15 | 15 |
| | Mask Circle Diameter (μm) | 100 | 50 | 60 | 100 | 100 |
| | Projection Portion Pitch (μm) | 150 | 70 | 80 | 150 | 150 |
| | Projection portion Diameter (μm) | 98 to 99 | 49 to 50 | 59 to 60 | 98 to 99 | 98 to 99 |
| Insulating Layer Coating | Material | DLC | DLC | DLC | DLC | electrocoating |
| | Intermediate Layer Coating Thickness (μm) | 0.1 | 0.1 | 0.1 | 0.1 | — |
| | Coating Thickness (μm) | 5 to 6 | 2 to 2.5 | 3 to 4 | 5 to 6 | 2 to 3 |
| | Resist Side surface Coating Thickness (μm) | 4 to 6 | 1.8 to 2.5 | 2.7 to 4 | 4 to 6 | 0.2 to 0.7 |
| | Boundary Surface Angle (°) | 45 to 51 | 45 to 47 | 45 to 48 | 45 to 51 | — |
| Insulating Layer Pattern | Resist stripping Method | Alkali Dipping | Alkali Dipping + Supersonic Waves | Alkali Dipping | Alkali Dipping | Alkali Dipping |
| | Insulating Layer Bottom Surface Diameter (μm) | 98 to 99 | 49 to 50 | 59 to 60 | 98 to 99 | 98 to 99 |
| | Insulating Layer Upper Surface Diameter (μm) | 86 to 91 | 44 to 46 | 51 to 54 | 86 to 91 | 96 to 98 |
| | Insulating Layer Height (μm) | 5 to 6 | 2 to 2.5 | 3 to 4 | 5 to 6 | 2 to 3 |
| | Insulating Layer Pitch (μm) | 150 | 70 | 80 | 150 | 150 |

TABLE 2-continued

| Item | | Example 1C | Example 2C | Example 3C | Example 4C | Comparative Example 1C |
|---|---|---|---|---|---|---|
| Plating Condition | Composition | Copper Sulfate 250 g/L Sulfuric Acid 70 g/L | Copper Pyrophosphate 100 g/L Potassium Pyrophosphate 250 g/L Ammonia Water 2 ml/L | Copper Pyrophosphate 100 g/L Potassium Pyrophosphate 250 g/L Ammonia Water 2 ml/L | Copper Sulfate 255 g/L Sulfuric Acid 55 g/L | Copper Sulfate 70 g/L Sulfuric Acid 180 g/L |
| Metal Foil Hole Pattern | Hole Diameter ($\mu$m) | 57 to 60 | 8 to 11 | 18 to 21 | (Concave Portion Opening Diameter) 98 to 99 | 57 to 60 |
| | Hole Pitch ($\mu$m) | 150 | 70 | 80 | 150 | 150 |
| | Metal Foil Thickness ($\mu$m) | 20 | 20 | 20 | 70 | 20 |
| | Pattern Shape | Preferable | Preferable | Preferable | Preferable | Uneven |
| Repetitive endurance of conductive substrate | | 500 Times OK | 700 Times OK | 5000 Times OK | 700 Times OK | 7 Times NG |

Furthermore, the present invention will be concretely described with reference to Examples 1D to 4D.

Example 1D

Formation of Convex Pattern

Resist films (PhoTec RY 3315, thickness: 15 $\mu$m (manufactured by Hitachi Chemical Co., Ltd.)) were laminated to both surfaces of a stainless steel plate (SUS316L, mirror finish, a thickness of 300 $\mu$m, manufactured by NISSHIN STEEL CO., LTD.) (corresponding to FIG. 3A). As laminating conditions, a roll temperature was set to 105° C., a pressure was set to 0.5 MPa, and a line speed was set to 1 m/min. A negative film on which a lattice-shaped pattern of light-transmitting portion was formed at a line width of 15 $\mu$m and a line pitch of 300 $\mu$m in a 120 mm square area and at a bias angle of 45° (in the square area, lines are arranged at 45° to the sides of the square area) was placed on one surface of the stainless steel plate at rest. By using an ultraviolet irradiation apparatus, under a degree of vacuum of 600 mmHg or less, an ultraviolet ray was irradiated at 120 mJ/cm$^2$ on the negative film for the upper and lower surfaces of the stainless steel plate on which the negative film was placed. Furthermore, the resist film was developed with a 1% sodium carbonate aqueous solution, so that a lattice-shaped pattern constituted by a resist film having a line width of 16 to 19 $\mu$m, a line pitch of 300 $\mu$m, and a bias angle of 45° was formed on the SUS plate. A width ($d_0$) of a contact portion between the projection portion and the conductive substrate was smaller than the maximum width by 0 to about 1 $\mu$m. A minimum width of the projection portion is smaller than the maximum width ($d_1$) by 0 to about 2 $\mu$m and a width of a portion of the projection portion slightly higher than the contact portion between the projection portion and the conductive substrate. These were actually measured by observing a section with a scanning electron microscope (SEM) at a magnification of 3000. As measuring points, 5 or more points were set.

Since a surface opposing the surface on which the convex pattern is formed is entirely exposed by UV-ray, the surface is not developed, and a resist film is formed on the entire surface (corresponding to FIG. 3B).

(Formation of Insulating Layer)

A DLC film was formed by PBII/D apparatus (Type III, manufactured by Kurita Seisakusyo Co., Ltd.) as hereinafter. A stainless steel substrate with a resist film was put into a chamber, and a vacuum state was set in the chamber. Thereafter, a substrate surface was cleaned with an argon gas, hexamethyldisiloxane was introduced into the chamber, and an intermediate layer was formed to have a film thickness of 0.1 $\mu$m. Toluene, methane, and an acetylene gas were introduced, and a DLC layer was formed on the intermediate layer to have a film thickness of 2 $\mu$m (corresponding to FIG. 3C). The thicknesses of the DLC films formed on both the sides of a convex portion formed by the resist film were 2 $\mu$m. An angle of a boundary surface was 45 to 51°. The thickness of the insulating layer and the angle of the boundary surface were actually measured such that a part of the conductive substrate was cut out and casted with a resin and SEM observation of a section was performed at a magnification of 3000. Measuring portions were 5 portions, and both the sides of the resist film were measured. For this reason, the maximum values and the minimum values of the values at a total of 10 points were employed.

(Formation of Concave Portion; Removal of Convex Pattern to which Film Adheres)

The stainless steel substrate to which the insulating layer adheres was dipped in a sodium hydroxide aqueous solution (10%, 50° C.) and left in the solution for 8 hours while being oscillated occasionally. The resist film which forms the convex pattern and the DLC film which adheres to the resist film were stripped. Since some portion could not be easily stripped, these films were entirely stripped by lightly rubbing the films with a cloth to obtain an engraved plate (corresponding to FIG. 3D).

The shape of the concave portion increased in width toward the opening, and an inclination angle of a side surface of the concave portion was equal to an angle of the boundary surface. The depth of the concave portion was 2 $\mu$m. The width of the concave portion at a bottom portion was 16 to 19 $\mu$m, and a width (maximum width) at the opening was 21 to 27 $\mu$m. A pitch of the concave portions was 300 $\mu$m.

(Copper Plating)

Furthermore, an adhesive film (HITALEX K-3940B, manufactured by Hitachi Chemical Co., Ltd.) was bonded to a surface of the obtained engraved plate on which the pattern was not formed. The engraved plate to which the adhesive film adheres was used as a cathode, the engraved plate was fixed to a rotational drum electrode by using a Teflon (trademark) tape, and electrolytic copper plating was performed. A bath composition of an electrolytic copper plating bath and electrolytic conditions are as follows:

Concentration of copper pyrophosphate: 100 g/L
Concentration of potassium pyrophosphate: 250 g/L
Amount of used ammonia water (30%): 2 mL/L pH: 8 to 9
Bath temperature: 30° C.
Anode: Copper plate As stirring of the plating bath, only moderate liquid circulation was used. Plating was performed at a current density of 10 A/dm$^2$ until a thickness of a metal deposited on a metal surface of the concave portion of the conductive substrate was 5 μm. The metal deposited at this stage was red, and an electric conductivity was 0.1 Ω/square (ohm per square) in surface resistivity. Thereafter, the current density was changed into 50 A/dm$^2$, and plating was continuously performed for 5 seconds to make the surface black. The conductive substrate to which the conductor pattern having a surface treated by a blacking process was adhered was extracted from the plating bath, washed with water, and dried.

(Manufacturing of Adhesive Film for Transfer)

On a surface of a 100-μm-thickness polyethylene terephthalate (PET) film (A-4100, manufactured by TOYOBO CO., LTD.), a primer (HP-1, manufactured by Hitachi Chemical Co., Ltd.) was firstly coated at a thickness of 1 μm and an acrylic polymer (HTR-280, manufactured by Nagase ChemteX Corporation) was next coated at a thickness of 10 μm and consequently an adhesive film for transfer was manufactured.

(Transfer)

A surface of the adhesive layer of the adhesive film for transfer and the copper-plated surface of the engraved plate were bonded to each other by using a roll laminator. As laminate conditions, a roll temperature was set to 25° C., a pressure was set to 0.1 MPa, and a line speed was set to 1 m/min. When the adhesive film bonded to the plate for transfer of the plated metal was peeled, copper deposited on the engraved plate was transferred onto the adhesive film. In this manner, a substrate with conductor layer pattern was obtained, the pattern constituted by a lattice-shaped conductor layer pattern having a line width of 20 to 25 μm, a line pitch of 300±2 μm, and a conductor layer thickness of 5 μm on an average. The shape of the conductor layer, reflecting the shape of the concave portion, increased in width from the lower portion to the upper portion (adhesive layer) as shown in FIG. 6H, and a portion overflowed from the concave portion spread like an umbrella.

When the surface of the engraved plate was observed after the transfer operation, the insulating layer was not stripped at any portion. The line width and the thickness of the conductor layer were actually measured such that the obtained substrate with conductor layer pattern was partially cut and casted with a resin, and a section was SEM-observed at a magnification of 3000. Measuring portions were 5 portions, and both the sides of the concave portion were measured. For this reason, the maximum values and the minimum values of the values at a total of 10 points were employed (the same way will be applied to the following description). The line pitch was measured at a magnification of 200 by using a microscope (digital microscope VHX-500, manufactured by KEYENCE CORPORATION). The measurement was performed at 5 arbitrary points (the same way will be applied to the following description).

(Formation of Protecting Film)

The surface of the obtained substrate with conductor layer pattern on which the conductor layer pattern was present was coated with UV-curable resin Hitaloid 7983AA3 (manufactured by Hitachi Chemical Co., Ltd.) and laminated by a polycarbonate film (macrohole DE, manufactured by Bayer Corporation, 75 μm). Consequently, the conductor layer pattern was buried in a UV-curable resin. Thereafter, an ultraviolet ray having 1 J/cm$^2$ was irradiated on the UV-curable resin by using an ultraviolet lamp to cure the UV-curable resin, so that a substrate with conductor layer pattern having a protecting film was obtained.

(Repetitive Use)

By using the engraved plate, the copper plating transfer step was repeated 500 times by the same manner as described above. As a result, transference performance of the copper plating was not changed, and stripped portions of the insulating layer were also not observed.

(Measurement of Luminance and Chromaticity)

A luminance and a chromaticity of the obtained substrate with conductor layer pattern were measured by using a spectrophotometer CM-508d (manufactured by Konica Minolta Holdings, Inc.). Measurement was performed in a reflecting mode such that Black paper having a luminance L* of 25 was laid under the substrate.

As an object to be measured, a conductor layer pattern having a surface treated by a blacking process was used and an opening area of about 85% was measured. When the luminance was measured, a luminance L* was 40 which fell within a preferable value range. The chromaticities a* and b* were 2.22 and 1.74, respectively. Each value signifies low hue.

Example 2D

A substrate with conductor layer pattern was manufactured by the same manner as in Example 1D except that Photec RY 3415 (thickness of 15 μm, and manufactured by Hitachi Chemical Co., Ltd.) was used as a resist film used in formation of the convex pattern in Example 1D and JFE443CT (mirror finish, thickness of 0.8 mm, and manufactured by JFE Steel Corporation) was used as a conductive substrate in place of SUS316L. Red electrolytic plating was performed to the obtained substrate with conductor layer pattern and black electrolytic plating was subsequently performed to the substrate as in Example 1D. Transference to an adhesive film for transfer was performed as in Example 1D. Thereafter, a protecting film was formed.

The copper plating-transfer step was repeated by using the engraved plate 1000 times. As a result, transference performance of the copper plating was not changed, and stripped portions of the insulating layer were also not observed.

A luminance and a chromaticity of the obtained conductor layer pattern were measured as in Example 1D. As an object to be measured, a conductor layer pattern having a surface treated by a blacking process was used and an opening area of about 85% was measured. When the luminance was measured, a luminance L* was 47 which fell within a preferable value range. The chromaticities a* and b* were 0.75 and 2.54, respectively. Each value signifies low hue.

Example 3D

A substrate with conductor layer pattern was manufactured by the same manner as in Example 1D except that Photec RY 3525 (thickness of 25 μm, and manufactured by Hitachi Chemical Co., Ltd.) was used as a resist film used in formation of the convex pattern in Example 1D and a titanium plate (mirror finish, thickness of 0.5 mm, and manufactured by NIPPON STAINLESS STEEL KOZAI CO, LTD.) was used as a conductive substrate in place of SUS316L. Red electrolytic plating was performed to the obtained substrate with conductor layer pattern and black electrolytic plating was subsequently performed to the substrate as in Example 1D.

Transference to an adhesive film for transfer was performed as in Example 1D. Consequently, a protecting film was formed.

The copper plating-transfer step was repeated by using the engraved plate 1000 times. As a result, transference performance of the copper plating was not changed, and stripped portions of the insulating layer were also not observed.

A luminance and a chromaticity of the obtained conductor layer pattern were measured as in Example 1D. As an object to be measured, a conductor layer pattern having a surface treated by a blacking process and an opening area of about 80% was measured. When the luminance was measured, a luminance L* was 39 which fell within a preferable value range. The chromaticities a* and b* were 1.72 and 1.82, respectively. Each value signifies low hue.

Example 4D

Red plating and then black plating was performed to the substrate with conductor layer pattern manufactured as in Example 1D to obtain a metal thickness of 5 μm. Thereafter, as in Example 1D, the plating layer was transferred to a UV-curable adhesive film for transfer (brand name: KH-1510X, and manufactured by Hitachi Chemical Co., Ltd.), a cover film was laminated, and an ultraviolet ray was irradiated at 0.5 J/cm$^2$. Thereafter, as in Example 1D, a protecting film was formed.

The copper plating-transfer step was repeated by using the engraved plate 1000 times. As a result, transference performance of the copper plating was not changed, and stripped portions of the insulating layer were also not observed.

A luminance and a chromaticity of the obtained conductor layer pattern were measured as in Example 1D. As an object to be measured, a conductor layer pattern having a surface treated by a blacking process and an opening area of about 85% was measured. When the luminance was measured, a luminance L* was 46 which fell within a preferable value range. The chromaticities a* and b* were 0.92 and 1.1, respectively. Each value signifies low hue.

Furthermore, the present invention will be described below with reference to Examples 1E to 2E.

Example 1E

Formation of Convex Pattern

Resist films (PhoTec RY 3315, thickness: 15 μm (manufactured by Hitachi Chemical Co., Ltd.)) were laminated to both surfaces of a 150 mm square stainless steel plate (SUS304, mirror finish, thickness: 300 μm, manufactured by NISSHIN STEEL CO., LTD.) (corresponding to FIG. 3A). As laminating conditions, a roll temperature was set to 105° C., a pressure was set to 0.5 MPa, and a line speed was set to 1 m/min. A negative film on which a lattice-shaped pattern of light-transmitting portion was formed at a line width of 5 μm and a line pitch of 300 μm in a 120 mm square area and at a bias angle of 45° (in the square area, lines are arranged at 45° to the sides of the square area) was placed on one surface of the stainless steel plate at rest. By using an ultraviolet irradiation apparatus, under a degree of vacuum of 600 mmHg or less, ultraviolet rays were irradiated at 120 mJ/cm$^2$ on the negative film for the upper and lower surfaces of the stainless steel plate on which the negative film was placed. Furthermore, the resist film was developed with a 1% sodium carbonate aqueous solution, so that a lattice-shaped pattern constituted by a resist film having a line width of 5 to 7 μm, a line pitch of 300 μm, and a bias angle of 45° was formed on the SUS plate. Since a surface opposing the surface on which the pattern is formed is entirely exposed by UV-rays, the surface is not developed, and the resist film is formed on the entire surface (corresponding to FIG. 3B). The line width is a maximum width ($d_1$) of the projection portion and a width of an upper portion of the projection portion. A width ($d_0$) of a contact portion between the projection portion and the conductive substrate was smaller than the maximum width by 0 to about 1 μm. A minimum width of the projection portion is smaller than the maximum width ($d_1$) by 0 to about 2 μm and a width of a portion of the projection portion slightly higher than the contact portion between the projection portion and the conductive substrate. These were actually measured by observing a section with a scanning electron microscope (SEM) at a magnification of 3000. As measuring points, 5 or more points were set.

(Formation of Insulating Layer)

A DLC film was formed by PBII/D apparatus (Type III, manufactured by Kurita Seisakusyo Co., Ltd.) as hereinafter. A stainless steel substrate with a resist film was put into a chamber, and a vacuum state was set in the chamber. Thereafter, a substrate surface was cleaned with an argon gas, hexamethyldisiloxane was introduced into the chamber, and an intermediate layer was formed to have a film thickness of 0.1 μm. Toluene, methane, and an acetylene gas were introduced, and a DLC layer was formed on the intermediate layer to have a film thickness of 3 to 4 μm (corresponding to FIG. 3C). The thicknesses of the DLC films formed on both the sides of the projection portion formed by the resist film were 3 to 4 μm. An angle of a boundary surface was 45 to 51°. The thickness of the insulating layer and the angle of the boundary surface were actually measured such that a part of the conductive substrate was cut out and casted with a resin and SEM observation of a section was performed at a magnification of 3000. Measuring portions were 5 portions, and both the sides of the resist film were measured. For this reason, the maximum values and the minimum values of the values at a total of 10 points were employed.

(Formation of Concave Portion; Removal of Convex Pattern to which Insulating Layer Adheres)

A stainless steel substrate to which an insulating layer adheres was dipped in a sodium hydroxide aqueous solution (10%, 50° C.) and left in the solution for 8 hours while being oscillated occasionally. A resist film which formed a convex pattern and a DLC film which adheres to the resist film could be stripped. Since some portion could not be easily stripped, these films were entirely stripped by lightly rubbing the films with a cloth to obtain an engraved plate (corresponding to FIG. 3D).

A shape of the concave portion increased in width toward an opening, and an inclination angle of a side surface of the concave portion was equal to an angle of the boundary surface. The depth of the concave portion was 5 to 6 μm. The width of the concave portion at a bottom portion was 5 to 7 μm, and a width (maximum width) at the opening was 11 to 15 μm. A pitch of the concave portions was 300 μm.

The engraved plate was manufactured as described above.

(Copper Plating)

Furthermore, an adhesive film (HITALEX K-3940B, manufactured by Hitachi Chemical Co., Ltd.) was bonded to a surface (rear surface) of the obtained engraved plate on which the pattern was not formed. The engraved plate to which the adhesive film was bonded and a copper plate were used as a cathode and an anode, respectively, and they were dipped in an electrolytic bath (copper pyrophosphate: 100 g/L, potassium pyrophosphate: 250 g/L, an ammonia water (30%): 2 ml/L, pH: 8 to 9, and a bath temperature: 30° C.) for electrolytic copper plating, a voltage was applied across both the electrodes to obtain a cathode current density of 5 A/dm$^2$, and plating was performed until the thickness of a metal deposited on the concave portion of the engraved plate was almost 3.5 µm. A plating layer was formed in the concave portion of the engraved plate such that the plating layer overflowed from the concave portion.

(Manufacturing of Adhesive Film for Transfer)

On an adhesive processing surface of a 125-µm-thickness polyethylene terephthalate (PET) film (A-4100, manufactured by TOYOBO CO., LTD.), a transferring resin composition 1 having a thickness of 15 µm was sequentially applied and dried as an adhesive compound layer to manufacture an adhesive film for transfer.

<Transferring Resin Composition 1>

80 parts by weigh of urethane acrylic acrylate polymer (Tg=−10 to 20° C., Mw=20000, brand name: Hitaloid 4872-H6, manufactured by Hitachi Chemical Co., Ltd.), 20 parts by weight of urethane acrylic acrylate oligomer (Tg=50° C., Mw=2200, brand name: Hitaloid 7903-3, manufactured by Hitachi Chemical Co., Ltd.), 3 parts by weight of a photoinitiator (α-1-hydroxyphenyl ketone, brand name: Irg184, manufactured by Chiba Specialty Chemicals Corporation), and 3 parts by weight of toluene and 3 parts by weight of methyl ethyl ketone as dilute solutions.

(Transfer)

A surface of the adhesive layer of the adhesive film for transfer and the copper-plated surface of the engraved plate were bonded to each other by using a roll laminator. As laminate conditions, a roll temperature was set to 25° C., a pressure was set to 0.1 MPa, and a line speed was set to 1 m/min. In the state in which the conductive substrate is bonded, by using a UV irradiation apparatus (manufactured by EYE GRAPHICS CO., LTD., type: SUV-F1 manufactured by EYE GRAPHICS CO., LTD.), an ultraviolet ray was irradiated at 1000 mJ/cm$^2$ from a substrate PET surface side of the adhesive film for transfer to cure the adhesive film for transfer.

When the adhesive film for transfer bonded to the engraved plate was peeled, copper deposited on the engraved plate was exactly transferred to the adhesive film. A transferred lattice-shaped conductor layer pattern was free from a drawback such as bending and breaking, twisting, or loosening and also had a good line shaping property. Furthermore, even though the adhesive film for transfer was peeled from the conductive substrate, transition of the adhesive film for transfer to the surface of the conductive substrate was not observed.

In this manner, a substrate with conductor layer pattern was obtained, the pattern constituted by a lattice-shaped conductor layer pattern having a line width of 14 to 18 µm, a line pitch of 300±2 µm, and a conductor layer thickness (maximum) 4.5 to 6.5 µm. The shape of the conductor layer, reflecting the shape of the concave portion, as shown in FIG. 6H, increased in width from the lower portion to the upper portion (adhesive layer), and a portion overflowed from the concave portion spread like an umbrella.

(Formation of Protecting Film)

The surface of the obtained substrate with conductor layer pattern on which the conductor layer pattern was present was coated with UV-curable resin Hitaloid 7983AA3 (manufactured by Hitachi Chemical Co., Ltd.) and laminated by a polycarbonate film (macrohole DE, manufactured by Bayer Corporation, 75 µm). Consequently, the conductor layer pattern was buried in a UV-curable resin. Thereafter, an ultraviolet ray having 1000 mJ/cm$^2$ was irradiated on the UV-curable resin by using an ultraviolet lamp to cure the UV-curable resin, so that a substrate with conductor layer pattern having a protecting film was obtained.

Example 2E

Copper Plating

Plating was performed to a surface (rear surface), on which a pattern was not formed, of the same engraved plate as that obtained in Example 1E, as in Example 1E. The thickness of a metal deposited on the concave portion of the engraved plate was almost 3.5 µm, and a plating layer was formed in the concave portion of the engraved plate such that the plating layer overflowed from the concave portion.

(Manufacturing of Adhesive Film for Transfer)

On an adhesive processing surface of a 125-µm-thickness polyethylene terephothalate (PET) film (A-4100, manufactured by TOYOBO CO., LTD.), a transferring resin composition 2 was sequentially applied and dried to have a thickness of 15 µm as an adhesive compound layer to manufacture an adhesive film for transfer.

<Transferring Resin Composition 2>

100 parts by weigh of acrylic acrylate polymer (Tg=−36° C., Mw=500000 to 800000, brand name: SK-Dyne SK2094, manufactured by Soken Chemical & Engineering Co., Ltd.), 0.054 parts by weight of a curing agent (brand name: E-AX for SK-Dyne, manufactured by Soken Chemical & Engineering Co., Ltd.), and 3 parts by weight of a photoinitiator (α-1-hydroxyphenyl ketone, brand name: Irg184, manufactured by Chiba Specialty Chemicals Corporation).

(Transfer)

A surface of the adhesive layer of the adhesive film for transfer and the copper-plated surface of the engraved plate were bonded to each other by using a roll laminator. As laminate conditions, a roll temperature was set to 25° C., a pressure was set to 0.1 MPa, and a line speed was set to 1 m/min. In the state in which the conductive substrate is bonded, by using a UV irradiation apparatus (manufactured by EYE GRAPHICS CO., LTD., type: SUV-F1 manufactured by EYE GRAPHICS CO., LTD.), ultraviolet rays were irradiated on the transferring resin composition 2 at 2100 mJ/cm$^2$ (curing rate of the transferring resin composition 2 (to be referred to as a curing rate hereinafter) 51%), 500 mJ/cm$^2$ (curing rate: 76%), 1000 mJ/cm$^2$ (curing rate: 94%), and 2000 mJ/cm$^2$ (curing rate: 100%) to cure the transferring resin composition 2 which forms an adhesive layer of the adhesive film for transfer.

When the adhesive film for transfer bonded to the engraved plate was peeled, copper deposited on the engraved plate was exactly transferred to the adhesive film. A transferred lattice-shaped conductor layer pattern was free from a drawback such as bending and breaking, twisting, or loosening and also had a good line shaping property. Furthermore, even though the adhesive film for transfer was peeled from the conductive substrate, transition of the adhesive film for transfer to the surface of the conductive substrate was not observed.

As described above, in any case, a substrate with conductor layer pattern was obtained, the pattern constituted by a lattice-shaped conductor layer pattern having a line width of 15 to 17 µm, a line pitch of 300±2 µm, and a conductor layer thickness (maximum) 4.5 to 6.0 µm. The shape of the conductor layer, reflecting the shape of the concave portion, as shown in FIG. 6H, increased in width from the lower portion to the upper portion (adhesive layer), and a portion overflowed from the concave portion spread like an umbrella.

As also in each of Examples 1E to 2E, when transference of the conductor layer pattern (whether a plating layer deposited on the engraved plate was completely transferred to the adhesive film for transfer), the presence/absence of a residue of the resin on the engraved plate were examined, any problem was not posed (whether an adhesive film resin did not remain on the engraved plate at all, when a plating layer deposited on the engraved plate was transferred to the adhesive film for transfer).

[About Curing Rate of Transferring Resin Composition]

In curing rate measurement of a transferring resin composition which forms an adhesive layer of the adhesive film for transfer, Photo DSC (photochemical reaction calorimeter, for example, type PDC121U, manufactured by Seiko Instruments, Inc.) was used. As a measurement principle, by using an apparatus which irradiates an ultraviolet ray or the like to cause a sample material to photochemically react (photo polymerization reaction or the like) to directly measure heat generated in the reaction, reaction behaviors such as photo polymerization and photocuring can be easily and accurately measured.

(Evaluation Method)

In this measuring apparatus, two reaction heat detection units are present. A perfectly cured product was charged as a reference sample into one of the two reaction heat detection units, and a sample was charged into the other. As the reference sample, a vacant aluminum pan was not used, and the reason why the perfectly cured product of the sample material was charged is the reason why radiant heat generated from the aluminum pan is reset.

0.5 g of a transferring resin composition were charged into the aluminum pan, reaction heat generated when an ultraviolet ray was irradiated at 5 mW/cm$^2$ and 25° C. for 10 min was chart-output, and an area surrounded by a heat generation curve and a base line is calculated with reference to the base line. The area is used as a heat value. These operations are fully automatically performed. When the apparatus is used, the operations can be easily performed.

As the sample material, an uncured product and a product on which an active radiation energy is irradiated is used. Reaction heat generated when the sample materials are perfectly cured is measured first.

A curing rate is determined such that a curing rate C(%) is calculated by the following equation 2 using the generated reaction heat as fully curing reaction heat $H_0$ and reaction heat generated from the product on which the active radiation energy is irradiated as a residual curing reaction heat H.

[Equation 2]

$$C = (1 - (\text{Residual curing reaction heat } H / \text{fully curing reaction heat } H_0)) \times 100 \quad \text{(Equation 2)}$$

By using a photochemical reaction calorimeter, for example, type PDC121U, manufactured by Seiko Instruments, Inc.), with respect to the transferring resin composition 2, an uncured product, a product on which an ultraviolet ray was irradiated at 100 mJ/cm$^2$, a product on which an ultraviolet ray was irradiated at 500 mJ/cm$^2$, a product on which an ultraviolet ray was irradiated at 1000 mJ/cm$^2$, and a product on which an ultraviolet ray was irradiated at 2000 mJ/cm$^2$ were measured as sample materials. Reaction heats are as shown in Table 3.

TABLE 3

| Example 2E | Reaction Heat mJ/cm$^2$ | Remarkable |
| --- | --- | --- |
| Uncured product | 59.62 | Fully curing reaction heat |
| Product on which ultraviolet ray was irradiated at 100 mJ/cm$^2$ | 29.34 | Residual curing reaction heat |
| Product on which ultraviolet ray was irradiated at 500 mJ/cm$^2$ | 14.38 | |
| Product on which ultraviolet ray was irradiated at 1000 mJ/cm$^2$ | 3.63 | |
| Product on which ultraviolet ray was irradiated at 2000 mJ/cm$^2$ | 0.02 | |

Furthermore, the present invention will be concretely described below with reference to Examples 1F to 3F.

Example 1F

Formation of Insulating Layer

A DLC film was formed by PBII/D apparatus (Type III, manufactured by Kurita Seisakusyo Co., Ltd.) as hereinafter. A mirror polished stainless steel substrate (SUS316L, 100 mm×150 mm×0.3 mmt) was put into a chamber. After the chamber was set in a vacuum state, and a substrate surface was cleaned with an argon gas. Then, hexamethyldisiloxane was introduced into the chamber, and an intermediate layer was formed to have a film thickness of 0.1 μm. Toluene, methane, and an acetylene gas were introduced, and a DLC layer was formed on the intermediate layer to have a film thickness of 2 to 3 μm (corresponding to FIG. 4(b)). The thickness of the insulating layer was actually measured such that a part of the conductive substrate was cut out and casted with a resin and SEM observation of a section was performed at a magnification of 3000. Measuring points were 5 points, and the maximum value and the minimum value were employed.

(Formation of Concave Portion)

By using a femtosecond laser processing apparatus (SurfbeatR, manufactured by Canon Machinery Inc.), processing was performed. A laser pulse having a peak wavelength of 800 nm and a pulse width of about 150 fs was controlled to be linearly polarized, and irradiated on a surface of an insulating layer formed on the conductive substrate in the atmosphere. An area of 50 mm square was processed to form a lattice-shaped pattern having a line width of 12 to 14 μm on the bottom portion and a line pitch of 350 μm. An angle of the concave portion was 17° to 20°, and a line width of the opening was 19 to 24 μm. The angle of the concave portion was actually measured such that a part of the conductive substrate was cut out and casted with a resin and SEM observation of a section was performed at a magnification of 3000. Measuring points were 5 points, and the maximum value and the minimum value were employed.

(Copper Plating)

Furthermore, an adhesive film (HITALEX K-3940B, manufactured by Hitachi Chemical Co., Ltd.) was bonded to a surface (rear surface) of the obtained engraved plate on which the pattern was not formed. The engraved plate to which the adhesive film was bonded and phosphorous-containing copper were used as a cathode and an anode, respectively, and they were dipped in an electrolytic bath (250 g/L of copper sulfate (pentahydrate), 70 g/L of sulfuric acid, and 4 ml/L of an aqueous solution of CU-BRITE AR (manufactured by EBARA-UDYLITE CO., LTD., additive), 30° C.) for electrolytic copper plating, a voltage was applied across both the electrodes to obtain a current density of 10 A/dm$^2$, and plating was performed until the thickness of a metal deposited on the concave portion of the engraved plate was 8 µm. A plating layer was formed in the concave portion of the engraved plate such that the plating layer overflowed from the concave portion.

(Manufacturing of Adhesive Film for Transfer)

On a surface of a 100-µm-thickness polyethylene terephthalate (PET) film (A-4100, manufactured by TOYOBO CO., LTD.), a primer (HP-1, manufactured by Hitachi Chemical Co., Ltd.) was firstly coated at a thickness of 1 µm and an acrylic polymer (HTR-280, manufactured by Nagase ChemteX Corporation) was next coated at a thickness of 10 µm and consequently an adhesive film for transfer was manufactured.

(Transfer)

A surface of the adhesive layer of the adhesive film for transfer and the copper-plated surface of the engraved plate were bonded to each other by using a roll laminator. As laminate conditions, a roll temperature was set to 40° C., a pressure was set to 0.1 MPa, and a line speed was set to 1 m/min. When the adhesive film bonded to the plate for transfer of the plated metal was peeled, copper deposited on the engraved plate was transferred onto the adhesive film. In this manner, a substrate with conductor layer pattern was obtained, the pattern constituted by a lattice-shaped conductor layer pattern having a line width of 28 to 31 µm, a line pitch of 350±2 µm, and a conductor layer thickness (maximum) of 8 µm. The shape of the conductor layer, reflecting the shape of the concave portion, increased in width from the lower portion to the upper portion (adhesive layer) as shown in FIG. 6E, and a portion overflowed from the concave portion spread like an umbrella.

When the surface of the engraved plate was observed after the transfer operation, the insulating layer was not stripped at any portion. The line width and the thickness of the conductor layer were actually measured such that the obtained substrate with conductor layer pattern was partially cut and casted with a resin, and a section was SEM-observed at a magnification of 3000. Measuring portions were 5 portions, and both the sides of the concave portion were measured. For this reason, the maximum values and the minimum values of the values at a total of 10 points were employed (the same way will be applied to the following description). The line pitch was measured at a magnification of 200 by using a microscope (digital microscope VHX-500, manufactured by KEYENCE CORPORATION). The measurement was performed at 5 arbitrary points (the same way will be applied to the following description).

(Formation of Protecting Film)

The surface of the obtained substrate with conductor layer pattern on which the conductor layer pattern was present was coated with UV-curable resin Hitaloid 7983AA3 (manufactured by Hitachi Chemical Co., Ltd.) and laminated by a polycarbonate film (macrohole DE, manufactured by Bayer Corporation, 75 µm). Consequently, the conductor layer pattern was buried in a UV-curable resin. Thereafter, an ultraviolet ray having 1 J/cm$^2$ was irradiated on the UV-curable resin by using an ultraviolet lamp to cure the UV-curable resin, so that a substrate with conductor layer pattern having a protecting film was obtained.

(Repetitive Use)

By using the engraved plate, the copper plating step to the transfer step were repeated 300 times by the same manner as described above. As a result, transference performance of the copper plating was not changed, and stripped portions of the insulating layer were also not observed.

Example 2F

Formation of Insulating Layer

By using a titanium TP270C plate (100 mm×100 mm×0.5 mmt, manufactured by KOBE STEEL., TLT.) polished at #600 as a conductive substrate, the processes of Example 1F were repeated up to a coating process of an intermediate layer. Thereafter, a DLC layer was coated to have a thickness of 5 to 6 µm.

(Formation of Concave Portion)

By using a femtosecond laser processing apparatus (SurfbeatR, manufactured by Canon Machinery Inc.), processing was performed. A laser pulse having a peak wavelength of 800 nm and a pulse width of about 150 fs was controlled to be linearly polarized, and irradiated on a surface of an insulating layer formed on the conductive substrate in the atmosphere. The processing was performed while spraying compressed air as an assist gas. An area of 50 mm square was processed to form a lattice-shaped pattern having a line width of 8 to 11 µm on the bottom portion and a line pitch of 275 µm. An angle of the concave portion was 21° to 24°, and a line width of the opening was 34 to 37 µm. The angle of the concave portion was actually measured such that a part of the conductive substrate was cut out and casted with a resin and SEM observation of a section was performed at a magnification of 3000. Measuring points were 5 points, and the maximum value and the minimum value were employed.

(Copper Plating)

Furthermore, an adhesive film (HITALEX K-3940B, manufactured by Hitachi Chemical Co., Ltd.) was bonded to a surface (rear surface) of the obtained engraved plate on which the pattern was not formed. The engraved plate to which the adhesive film was bonded and a copper plate were used as a cathode and an anode, respectively, and they were dipped in an electrolytic bath (copper pyrophosphate: 100 g/L, potassium pyrophosphate: 250 g/L, an ammonia water (30%): 2 ml/L, pH: 8 to 9, and a bath temperature: 30° C.) for electrolytic copper plating, a voltage was applied across both the electrodes to obtain a cathode current density of 6 A/dm$^2$, and plating was performed until the thickness of a metal deposited on the concave portion of the engraved plate was almost 10 µm. A plating layer was formed in the concave portion of the engraved plate. Since the width of the opening was large, the concave portion was not completely buried in the width direction.

(Transfer)

A copper pattern formed on the engraved plate was transferred to the adhesive film as in Example 1F. A substrate with conductive layer pattern was obtained, the pattern constituted by a lattice-shaped conductive layer pattern having a line width of 28 to 31 µm, a line pitch of 275±2 µm, and a conductor layer thickness of 10 µm. The shape of the conductor layer, reflecting the shape of the concave portion, increased in width from the lower portion to the upper portion (adhesive layer). However, the concave portion was not completely buried in the width direction.

When the surface of the engraved plate was observed after the transfer operation, the insulating layer did not have a stripped portion.

Furthermore, a protecting film was formed as in Example 1F to obtain a substrate with conductor layer pattern having a protecting film was obtained.

(Repetitive Use)

By using the engraved plate, the copper plating step to the transfer step were repeated 700 times by the same manner as described above. As a result, transference performance of the copper plating did not change, and stripped portions of the insulating layer were not observed.

Example 3F

Formation of Insulating Layer

By using a SUS304 stainless foil (314 mm×100 mm×0.15 mmt, manufactured by NISSHIN STEEL CO., LTD.) mirror-polished as a substrate, a DLC was coated to have a film thickness of 0.1 µm as in Example 2F. At this time, the thicknesses of the DLC films on both the sides of a convex portion formed by a resist film were 1 to 2 µm.

(Formation of Concave Portion)

By using a femtosecond laser processing apparatus (SurfbeatR, manufactured by Canon Machinery Inc.), processing was performed. A laser pulse having a peak wavelength of 800 nm and a pulse width of about 200 fs was controlled to be linearly polarized, and irradiated on a surface of an insulating layer formed on the conductive substrate in the atmosphere. The processing was performed while spraying compressed air as an assist gas. Two areas of 50 mm square on one plane were processed to form a lattice-shaped pattern having a line width of 25 to 26 µm on the bottom portion and a line pitch of 300 µm. An angle of the concave portion was 18° to 20°, and a line width of the opening was 30 to 37 µm. The angle of the concave portion was actually measured such that a part of the conductive substrate was cut out and casted with a resin and SEM observation of a section was performed at a magnification of 3000. Measuring points were 5 points, and the maximum value and the minimum value were employed.

(Copper Plating)

The engraved plate manufactured as described above was winded on a stainless steel roll having a diameter of φ100 mm and a width of 200 mm such that a back surface of the engraved plate was in contact with the roll, and joint lines were bonded to each other with an insulating tape. Furthermore, in order to prevent a plating solution from penetrating through the side portions, the insulating tapes were adhered to the roll and the conductive substrate along the circumferences of both sides so as to cover the region of 5 mm width containing the ends of the conductive substrate. Consequently one rotator was formed.

By an apparatus configuration as shown in FIG. 16, electrolytic copper plating was performed to a rotator 104. As an anode 103, a titanium insoluble electrode coated with platinum was used. For a cathode, the stainless steel roll was used as a drum electrode. In an electrolytic bath 101 for electrolytic copper plating, an aqueous solution containing copper sulfate (pentahydrate): 255 g/L, sulfuric acid: 55 g/L, and CU-BRITE #1A (manufactured by EBARA-UDYLITE CO., LTD., additive): 4 mL/L, at 20° C. was accommodated as an electrolytic solution 102. The electrolytic solution 102 was supplied to a portion between the anode 103 and the rotator 104 by a pump 106 through a pipe 105 to fulfill the portion. An approximately half part of the rotator 104 was dipped in the electrolytic solution. A voltage was applied across both the electrodes to obtain a current density of 15 A/dm$^2$, and plating was performed until the thickness of a metal deposited on the conductive substrate was about 5 µm. At this time, the stainless steel roll was rotated at a speed of 0.1 m/minute. A plating layer was formed in the concave portion of the engraved plate such that the plating layer overflowed from the concave portion.

(Transfer)

The adhesive film manufactured in Example 1F was temporarily winded in the form of a roll to obtain a rolled adhesive film. The adhesive film was winded off from the rolled adhesive film, and an adhesive compound layer surface of the adhesive film was continuously bonded to a metal (copper) deposited on the rotator (stainless steel roll) by a bonding roll 110 under the same laminate conditions as in Example 1F and peeled to transfer the metal to the adhesive compound layer of the adhesive film, so that a substrate with conductor layer pattern was continuously manufactured. The substrate with conductor layer pattern was winded in the form of a roll (not shown). At this time, the substrate with conductor layer pattern was winded while laminating a release liner PET (S-32, manufactured by Teijin DuPont Films Japan Limited) on a surface of the adhesive film on which the conductor layer pattern was transferred to prevent blocking in a winding state. The conductor layer pattern had a line width of 35 to 38 µm, a line pitch of 300±2 µm, and a conductor layer thickness of 5 µm. After a 50 m of adhesive film to which the copper plating layer was transferred was winded, the plating of copper on the stainless steel roll and transference performance of the copper plating were not changed, and stripped portions of the insulating layer were also not observed. The shape of the conductor layer, reflecting the shape of the concave portion, increased in width from the lower portion to the upper portion (adhesive layer) as shown in FIG. 8(h), and a portion overflowed from the concave portion spread like an umbrella.

(Formation of Protecting Film)

A part of the obtained substrate with conductor layer pattern was cut off, and, on a surface on which the conductor layer pattern was formed, a UV-curable resin (ARONIX UV-3701, manufactured by TOAGOSEI CO., LTD) was coated by using an applicator (Yoshimitsu Seiki Corporation, YBA type) to have a thickness of 15 µm, and a PET film (Miller D, manufactured by Teijin DuPont Films Japan Limited, 75 µm) by using a hand roll while preventing air bubbles from being made. Thereafter, an ultraviolet ray of 1 J/cm$^2$ was irradiated by using an ultraviolet lamp to form a protecting film.

(Repetitive Use)

By using the obtained conductive substrate for plating transfer, the copper plating step to the transfer step were repeated 650 times (rotator was rotated 650 times) by the same manner as described above. As a result, transference performance of the copper plating was not changed, and stripped portions of the insulating layer were also not observed.

Specifications and examination results in the Examples described above are shown in Table 4.

TABLE 4

|  |  | Example 1F | Example 2F | Example 3F |
| --- | --- | --- | --- | --- |
| Conductive Substrate | Material | SUS316L | Titanium TP270C | SUS304 |
|  | Shape | Single-fed processing | Single-fed processing | Single-fed processing →Roll |
|  | Surface | Mirror polishing | #600 polishing | Mirror polishing |

TABLE 4-continued

|  |  | Example 1F | Example 2F | Example 3F |
|---|---|---|---|---|
| Insulating layer coating | Material | DLC | DLC | DLC |
|  | Intermediate layer Coating thickness (μm) | 0.1 | 0.1 | 0.1 |
|  | Coating thickness (μm) | 2 to 3 | 5 to 6 | 1 to 2 |
| Concave portion formation | Method | Femtosecond laser | Femtosecond laser | Femtosecond laser |
|  | Polarization | Linear | Circular | Linear |
|  | Groove width (bottom portion) (μm) | 12 to 14 | 8 to 11 | 25 to 26 |
|  | Groove width (opening) (μm) | 22 to 28 | 34 to 38 | 30 to 37 |
|  | Groove pitch (μm) | 350 | 275 | 300 |
| Plating condition | Composition | Copper sulfate 250 g/L Sulfuric acid 70 g/L | Copper pyrophosphate 100 g/L Potassium pyrophosphate 250 g/L Ammonia water 2 ml/L | Copper sulfate 255 g/L Sulfuric acid 55 g/L |
|  | Cathode current density | 10 | 6 | 15 |
| Conductor layer pattern | Line width (μm) | 28 to 31 | 28 to 31 | 35 to 38 |
|  | Line thickness (μm) | 8 | 10 | 5 |
|  | Line linearity | OK | OK | OK |
|  | Pattern abnormality | None | None | None |
| Repetitive endurance of conductive substrate |  | OK until 300 times | OK until 700 times | OK until 650 times |

Furthermore, the present invention will be concretely described below with reference to Examples 1G to 4G.

Example 1G

A negative film for pattern formation was performed by the following specifications.
(Pattern Specification 1)
A lattice-shaped pattern of light-transmitting portion was formed at a line width of 12 μm and a line pitch of 300 μm in a 120 mm square area and a bias angle of 45° (in the square area, lines are arranged at 45° to the sides of the square area). In a 0.5-mm-width specific region 50-mm inside from an edge of the pattern, a lattice-shaped pattern was formed at a line width of 12 μm, a line pitch of 150 μm, and a bias angle of 45°. In the above specification, the specific regions were arranged at the four sides (see FIG. 20).
(Formation of Convex Pattern)
Resist films (PhoTec RY 3315, thickness: 10 μm (manufactured by Hitachi Chemical Co., Ltd.)) were laminated to both surfaces of a 150 mm square stainless steel plate (SUS316L, #400 polishing finish, thickness of 500 μm, manufactured by NISSHIN STEEL CO., LTD.) (corresponding to FIG. 3A). As laminating conditions, a roll temperature was set to 105° C., a pressure was set to 0.5 MPa, and a line speed was set to 1 m/min. A negative film formed according to pattern 1 was placed on one surface of the stainless steel plate at rest. By using an ultraviolet irradiation apparatus, under a degree of vacuum of 600 mmHg or less, ultraviolet rays were irradiated at 250 mJ/cm² on the negative film for the upper and lower surfaces of the stainless steel plate on which the negative film was placed. Furthermore, the resist film was developed with a 1% sodium carbonate aqueous solution, so that a projection portion resist film (projection portion; height: 10 μm) having a line width of 15 to 17 μm, a line pitch of 300 μm, and a bias angle of 45° was formed on the SUS plate. A projection portion resist film (projection portion; height: 10 μm) having a region width of 0.5 mm and constituted by a lattice-shaped pattern having a line width of 15 to 17 μm, a line pitch of 150 μm, and a bias angle of 45° was formed on each of four sides 50-mm inside from the edges of the pattern. Since a surface opposing the surface on which the pattern is formed is entirely exposed by UV-rays, the surface is not developed, and the resist film is formed on the entire surface (corresponding to FIG. 3B).

(Formation of Insulating Layer)
A DLC film was formed by PBII/D apparatus (Type III, manufactured by Kurita Seisakusyo Co., Ltd.) as hereinafter. A stainless steel substrate with a resist film was put into a chamber, and a vacuum state was set in the chamber. Thereafter, a substrate surface was cleaned with an argon gas, hexamethyldisiloxane was introduced into the chamber, and an intermediate layer was formed to have a film thickness of 0.1 μm. Toluene, methane, and an acetylene gas were introduced, and a DLC layer was formed on the intermediate layer to have a film thickness of 2 to 3 μm (corresponding to FIG. 3C).
(Formation of Concave Portion; Removal of Convex Pattern to which Insulating Layer Adheres)
A stainless steel substrate to which an insulating layer adheres was dipped in a sodium hydroxide aqueous solution (10%, 50° C.) and left in the solution for 8 hours while being oscillated occasionally. A resist film which formed a convex pattern and a DLC film which adheres to the resist film were stripped. Since some portion could not be easily stripped, these films were entirely stripped by lightly rubbing the films with a cloth to obtain an engraved plate (corresponding to FIG. 3D).
A shape of the concave portion increased in width toward an opening, and an inclination angle of a side surface of the concave portion was equal to an angle of the boundary surface. The depth of the concave portion was 2 to 3 μm. The width of the concave portion at a bottom portion was 15 to 17 μm, and a width (maximum width) at the opening was 19 to 23 μm. A pitch of the concave portions was 300 μm.
(Copper Plating)
Furthermore, an adhesive film (HITALEX K-3940B, manufactured by Hitachi Chemical Co., Ltd.) was bonded to a surface (rear surface) of the obtained engraved plate on which the pattern was not formed. The engraved plate to which the adhesive film was bonded and phosphorous-containing copper were used as a cathode and an anode, respectively, and they were dipped in an electrolytic bath (250 g/L of copper sulfate (pentahydrate), 70 g/L of sulfuric acid, and 4 ml/L of an aqueous solution of CU-BRITE AR (manufactured by EBARA-UDYLITE CO., LTD., additive), 30° C.) for electrolytic copper plating, a voltage was applied across both the electrodes to obtain a current density of 10 A/dm², and plating was performed until the thickness of a metal deposited on the concave portion of the engraved plate was 4

μm. A plating layer was formed in the concave portion of the engraved plate such that the plating layer overflowed from the concave portion.

(Manufacturing of Adhesive Film for Transfer)

On a surface of a 100-μm-thickness polyethylene terephthalate (PET) film (A-4100, manufactured by TOYOBO CO., LTD.), a primer (HP-1, manufactured by Hitachi Chemical Co., Ltd.) was firstly coated at a thickness of 1 μm and an acrylic polymer (HTR-280, manufactured by Nagase ChemteX Corporation) was next coated at a thickness of 10 μm as an adhesive layer, and consequently an adhesive film for transfer was manufactured.

(Transfer)

A surface of the adhesive layer of the adhesive film for transfer and the copper-plated surface of the engraved plate were bonded to each other by using a roll laminator. As laminate conditions, a roll temperature was set to 25° C., a pressure was set to 0.1 MPa, and a line speed was set to 1 m/min. When the adhesive film bonded to the plate for transfer of the plated metal was peeled, copper deposited on the engraved plate was transferred onto the adhesive film. In this manner, a substrate with conductor layer pattern was obtained, the pattern constituted by a lattice-shaped conductor layer pattern which was formed at a line width of 23 to 25 μm, a line pitch of 300 μm and a conductor layer thickness (maximum) of 4 to 5 μm as a whole, and a lattice-shaped conductor layer pattern which was formed at a line width of 22 to 24 μm, a line pitch of 150 μm, a bias angle of 45° and a conductor layer thickness (maximum) of 3.5 to 4.5 μm, in the region having a width of 0.5 mm, on the 50-mm inside from an edge of the pattern.

The shape of the conductor layer, reflecting the shape of the concave portion, as shown in FIG. 6H, increased in width from the lower portion to the upper portion (adhesive layer), and a portion overflowed from the concave portion spread like an umbrella. Visibility of the pattern which could be visually recognized in the form of a line was preferable. A numerical aperture (T1) of a portion having a line pitch of 300 μm was 84.0%, and a numerical aperture (T2) of a portion having a line pitch of 150 μm was 70.6%. A ratio (T2/T1) of these values was 82.6%. Bending and breaking of the plating layer did not occur in the peeling and transfer states.

(Formation of Protecting Film)

The surface of the obtained substrate with conductor layer pattern on which the conductor layer pattern was present was coated with a UV-curable resin Hitaloid 7983AA3 (manufactured by Hitachi Chemical Co., Ltd.) and laminated by a polycarbonate film (macrohole DE, manufactured by Bayer Corporation, 75 μm). Consequently the conductor layer pattern was buried in a UV-curable resin. Thereafter, an ultraviolet ray having 1 J/cm² was irradiated on the UV-curable resin by using an ultraviolet lamp to cure the UV-curable resin, so that a substrate with conductor layer pattern having a protecting film was obtained. A shape of the conductor layer pattern was a shape shown in FIG. 20.

Example 2G

A negative film for pattern formation was manufactured by the following specification.

(Pattern Specification 2)

A lattice-shaped pattern of light-transmitting portion was formed at a line width of 15 μm and a line pitch of 300 μm in a 120 mm square area and a bias angle of 45° (in the square area, lines are arranged at 45° to the sides of the square area). As a specific region, a lattice-shaped pattern was formed at a line width of 15 μm, a line pitch of 75 μm, and a bias angle of 45°, and in a region width of 1 mm, on one side 50-mm inside from an edge of the above lattice-shaped pattern (see FIG. 21).

A convex pattern shown in Table 5 was obtained and a substrate with conductor layer pattern was manufactured by the same manner as that in Example 1G except that pattern specification 2 was used in place of pattern specification 1. In this manner, a substrate with conductor layer pattern was obtained, the pattern constituted by a lattice-shaped conductor layer pattern which was formed at a line width of 23 to 25 μm, a line pitch of 300 μm and a conductor layer thickness (maximum) of 4 to 5 μm, and a lattice-shaped conductor layer pattern which was formed at a line width of 21 to 23 μm, a line pitch of 75 m, a bias angle of 45° and a conductor layer thickness (maximum) of 3.0 to 4.0 μm, in a region width of 1 mm, on one side 50-mm inside the edge of the former pattern.

The shape of the conductor layer, reflecting the shape of the concave portion, as shown in FIG. 6H, increased in width from the lower portion to the upper portion (adhesive layer), and a portion overflowed from the concave portion spread like an umbrella. Visibility of the pattern which could be visually recognized in the form of a line was preferable. A numerical aperture (T1) of a portion having a line pitch of 300 μm was 84.0%, and a numerical aperture (T2) of a portion having a line pitch of 75 μm was 48.1%. A ratio T2/T1 of these values was 57.3%. Bending and breaking of the plating layer did not occur in the peeling and transfer states.

Example 3G

A negative film for pattern formation was manufactured by the following specification.

(Pattern Specification 3)

A lattice-shaped pattern of light-transmitting portion was formed at a line width of 15 μm and a line pitch of 300 μm in a 120 mm square area and a bias angle of 45° (in the square area, lines are arranged at 45° to the sides of the square area). Furthermore, as specific regions, hatched pattern was formed at a line width of 15 μm, a length of 2.83 mm, and a bias angle of 45', and in a region width of 2 mm, on four sides 50 mm inside from an edge of the above lattice-shaped pattern (see FIG. 22).

A convex pattern shown in Table 5 was obtained and a substrate with conductor layer pattern was manufactured by the same manner as that in Example 1G except that pattern specification 3 was used in place of pattern specification 1. In this manner, a substrate with conductor layer pattern was obtained, the pattern constituted by a lattice-shaped conductor layer pattern which was formed at a line width of 23 to 25 μm, a line pitch of 300 μm and a conductor layer thickness (maximum) of 4 to 5 μm, and a lattice-shaped conductor layer pattern having hatched pattern which was formed at a line width of 22 to 24 μm, a line pitch of 150 μm, a bias angle of 45° and a conductor layer thickness (maximum) of 3.0 to 4.0 μm, in a region width of 2 mm, on one side 50-mm inside the edge of the former pattern.

The shape of the conductor layer, reflecting the shape of the concave portion, as shown in FIG. 5(h), increased in width from the lower portion to the upper portion (adhesive layer), and a portion overflowed from the concave portion spread like an umbrella. Visibility of the pattern which could be visually recognized in the form of a line was preferable. A numerical aperture (T1) of a portion having a line pitch of 300 μm was 84%, and a numerical aperture (T2) of a portion having a line pitch of 150 μm was 77.3%. A ratio T2/T1 of these values was 92.0%. Bending and breaking of the plating layer did not occur in the peeling and transfer states. The shape of the conductor layer was the shape shown in FIG. 22.

Example 4G

Pattern Specification 4

A negative film for pattern formation was manufactured by the following specification. A lattice-shaped pattern of light-transmitting portion was formed at a line width of 15 μm and a line pitch of 300 μm in a 120 mm square area and a bias angle of 45° (in the square area, lines are arranged at 45° to the sides of the square area). Furthermore, as specific regions, hatched lines each having a line width of 15 μm, a length of 2.83 mm, and a bias angle of 45° were formed in a region width of 2 mm, on four sides 50-mm inside from an edge of the above lattice-shaped pattern, at an intermediate portion of the lattice-shaped pattern (see FIG. 23).

A convex pattern shown in Table 5 was obtained and a substrate with conductor layer pattern was manufactured by the same manner as that in Example 1G except that pattern specification 4 was used in place of pattern specification 1. In this manner, a substrate with conductor layer pattern was obtained, the pattern constituted by a lattice-shaped conductor layer pattern which was formed at a line width of 23 to 25 μm, a line pitch of 300 μm and a conductor layer thickness (maximum) of 4 to 5 μm, and a lattice-shaped conductor layer pattern which was formed at a line width of 22 to 24 μm, a line pitch of 75 μm, a bias angle of 45° and a conductor layer thickness (maximum) of 3.0 to 4.0 μm, in a region width of 2 mm on one side 50-mm inside the edge of the former pattern.

The shape of the conductor layer, reflecting the shape of the concave portion, increased in width from the lower portion to the upper portion (adhesive layer) as shown in FIG. 5(h), and a portion overflowed from the concave portion spread like an umbrella. Visibility of the pattern which could be visually recognized in the form of a line was preferable. A numerical aperture (T1) of a portion having a line pitch of 300 μm was 84%, and a numerical aperture (T2) of a portion having a line pitch of 75 μm was 62.6%. A ratio T2/T1 of these values was 74.5%. Bending and breaking of the plating layer did not occur in the peeling and transfer states. The shape of the conductor layer pattern was the shape shown in FIG. 23.

Characteristic values and specifications of the engraved plates obtained in Examples 1G to 4G are shown in Table 5.

TABLE 5

| | | Item | Example 1G | Example 2G | Example 3G | Example 4G |
|---|---|---|---|---|---|---|
| Convex Pattern | Light-transmitting portion | Line pitch (μm) | 300 | 300 | 300 | 300 |
| | | Line width (μm) | 15 to 17 | 15 to 17 | 15 to 17 | 15 to 17 |
| | | Bias angle (°) | 45° | 45° | 45° | 45° |
| | Line portion | Pattern shape | Mesh Four sides | Mesh One side | Hatched Four sides | Hatched One side |
| | | Line pitch (μm) | 150 | 75 | 150 | 75 |
| | | Line width (μm) | 15 to 17 | 15 to 17 | 15 to 17 | 15 to 17 |
| | | Bias angle (°) | 45° | 45° | 45° | 45° |
| | | Region width (mm) | 0.5 mm | 1 mm | 2 mm | 2 mm |
| Substrate with pattern | Light-transmitting portion | Line pitch (μm) | 300 | 300 | 300 | 300 |
| | | Line width (μm) | 23 to 25 | 23 to 25 | 23 to 25 | 23 to 25 |
| | | Bias angle (°) | 45° | 45° | 45° | 45° |
| | | Conductor thickness (μm) | 4 to 5 | 4 to 5 | 4 to 5 | 4 to 5 |
| | | Numerical aperture T1 | 84.0% | 84.0% | 84.0% | 84.0% |
| | Line portion | Line pitch (μm) | 150 | 75 | 150 | 75 |
| | | Line width (μm) | 22 to 24 | 21 to 23 | 22 to 24 | 22 to 24 |
| | | Bias angle (°) | 45° | 45° | 45° | 45° |
| | | Conductor thickness (μm) | 3.5 to 4.5 | 3 to 4 | 3 to 4 | 3 to 4 |
| | | Numerical aperture T2 | 70.6% | 48.1% | 77.3% | 62.6% |
| | | T2/T1 | 84.1% | 57.3% | 92.0% | 74.5% |
| Characteristics | | Line portion visibility | Preferable | Preferable | Possible | Preferable |
| | | Bending of plating layer | No | No | No | No |

Furthermore, the present invention will be concretely described below with reference to Examples 1H to 3H.

Example 1H

Formation of Conductive Inorganic Material

A conductive DLC film was formed by using a plasma CVD apparatus (HTC1500 manufactured by Hauzer Techno Coating BV). A 100 mm square stainless steel substrate (SUS304, mirror finish, thickness of 0.5 mm, manufactured by NISSHIN STEEL CO., LTD.) was put into a vacuum chamber, and, first, a plasma by an Ar gas was excited to clean the substrate. Thereafter, a Cr was formed as an intermediate layer by sputtering on one surface of the stainless steel substrate to have a thickness of 0.2 μm. A DLC layer containing 10% of tungsten (W) was formed on the intermediate layer by introducing an acetylene gas and a tungsten hexafluoride gas to have a film thickness of 1.5 to 2.5 μm.

(Formation of Convex Pattern)

Resist films (PhoTec RY 3315, thickness: 10 μm (manufactured by Hitachi Chemical Co., Ltd.) were laminated to both surfaces of the substrate on which the conductive DLC obtained as described above was formed. As laminating conditions, a roll temperature was set to 105° C., a pressure was set to 0.5 MPa, and a line speed was set to 1 m/min. A negative film on which a lattice-shaped pattern of light-transmitting portion was formed at a line width of 40 μm and a line pitch of 300 μm in a 80 mm square area and at a bias angle of 45° (in the square area, lines are arranged at 45° to the sides of the square area) was placed on one surface of the stainless steel plate at rest. By using an ultraviolet irradiation apparatus, under a degree of vacuum of 600 mmHg or less, ultraviolet rays were irradiated at 120 mJ/cm² on the negative film for the upper and lower surfaces of the stainless steel plate on which the negative film was placed. Furthermore, the resist film was developed with a 1% sodium carbonate aqueous solution, so that a lattice-shaped pattern constituted by a projection portion resist film (the projection portion: height of 10 μm having a line width of 39 to 41 μm, a line pitch of 300 μm, and a bias angle of 45° was formed on the SUS plate. Since a surface opposing the surface on which the pattern is formed is entirely exposed by UV-rays, the surface is not developed, and the resist film is formed on the entire surface.

(Formation of Insulating Layer)

A DLC film was formed by PBII/D apparatus (Type III, manufactured by Kurita Seisakusyo Co., Ltd.) as hereinafter. A stainless steel substrate with a resist film was put into a chamber, and a vacuum state was set in the chamber. Thereafter, a substrate surface was cleaned with an argon gas. Hexamethyldisiloxane was introduced into the chamber, and an intermediate layer was formed to have a film thickness of 0.1 μm. Toluene, methane, and an acetylene gas were introduced, and a DLC layer was formed on the intermediate layer to have a film thickness of 5 to 6 μm. The thickness of the DLC film was 4 to 6 μm of both the sides of the convex portion formed by the resist film. An angle of a boundary surface was 45 to 51°. The thickness of the insulating layer and the angle of the boundary surface were actually measured such that a part of the conductive substrate was cut out and casted with a resin and SEM observation of a section was performed at a magnification of 3000. Measuring portions were 5 portions, and both the sides of the resist film were measured. For this reason, the maximum values and the minimum values of the values at a total of 10 points were employed.

(Formation of Concave Portion; Removal of Convex Pattern to which Insulating Layer Adheres)

A stainless steel substrate to which an insulating layer adheres was dipped in a sodium hydroxide aqueous solution (10%, 50° C.) and left in the solution for 8 hours while being oscillated occasionally. A resist film which formed a convex pattern and a DLC film which adheres to the resist film were stripped. Since some portion could not be easily stripped, these films were entirely stripped by lightly rubbing the films with a cloth to obtain an engraved plate.

A shape of the concave portion increased in width toward an opening, and an inclination angle of a side surface of the concave portion was equal to an angle of the boundary surface. The depth of the concave portion was 5 to 6 μm. The width of the concave portion at a bottom portion was 39 to 41 μm, and a width (maximum width) at the opening was 49 to 53 μm. A pitch of the concave portions was 300 μm.

(Copper Plating)

The engraved plate obtained as described above was used as a cathode, phosphorous-containing copper was used as an anode, and they were dipped in an electrolytic bath (250 g/L of copper sulfate (pentahydrate), 70 g/L of sulfuric acid, and 4 ml/L of an aqueous solution of CU-BRITE AR (manufactured by EBARA-UDYLITE CO., LTD., additive), 30° C.) for electrolytic copper plating, a voltage was applied across both the electrodes to obtain a current density of 10 A/dm². Plating was performed until the thickness of a metal deposited on the concave portion of the engraved plate was almost 7 μm. A plating layer was formed in the concave portion of the engraved plate such that the plating layer overflowed from the concave portion.

(Manufacturing of Adhesive Film for Transfer)

On a surface of a 100-μm-thickness polyethylene terephthalate (PET) film (A-4100, manufactured by TOYOBO CO., LTD.), a primer (HP-1, manufactured by Hitachi Chemical Co., Ltd.) was firstly coated at a thickness of 1 μm and an acrylic polymer (HTR-280, manufactured by Nagase ChemteX Corporation) was next coated at a thickness of 10 μm and serving as an adhesive layer and consequently an adhesive film for transfer was manufactured.

(Transfer)

A surface of the adhesive layer of the adhesive film for transfer and the copper-plated surface of the engraved plate were bonded to each other by using a roll laminator. As laminate conditions, a roll temperature was set to 25° C., a pressure was set to 0.1 MPa, and a line speed was set to 1 m/min. When the adhesive film bonded to the plate for transfer of the plated metal was peeled, copper deposited on the engraved plate was transferred onto the adhesive film. In this manner, a substrate with conductor layer pattern was obtained, the pattern constituted by a lattice-shaped conductor layer pattern having a line width of 63 to 69 μm, a line pitch of 300±2 μm, and a conductor layer thickness (maximum) of 7 to 8 μm. The shape of the conductor layer, reflecting the shape of the concave portion, increased in width from the lower portion to the upper portion (adhesive layer), and a portion overflowed from the concave portion spread like an umbrella.

When the surface of the engraved plate was observed after the transfer operation, the insulating layer was not stripped at any portion. The line width and the thickness of the conductor layer were actually measured such that the obtained substrate with conductor layer pattern was partially cut and casted with a resin, and a section was SEM-observed at a magnification of 3000. Measuring portions were 5 portions, and both the sides of the concave portion were measured. For this reason, the maximum values and the minimum values of the values at a total of 10 points were employed (the same way will be applied to the following description). The line pitch was measured at a magnification of 200 by using a microscope (digital microscope VHX-500, manufactured by KEYENCE CORPORATION). The measurement was performed at 5 arbitrary points.

(Formation of Protecting Film)

The surface of the obtained substrate with conductor layer pattern on which the conductor layer pattern was present was coated with UV-curable resin Hitaloid 7983AA3 (manufactured by Hitachi Chemical Co., Ltd.) and laminated by a polycarbonate film (macrohole DE, manufactured by Bayer Corporation, 75 μm). Consequently the conductor layer pattern was buried in a UV-curable resin. Thereafter, an ultraviolet ray having 1 J/cm² was irradiated on the UV-curable resin by using an ultraviolet lamp to cure the UV-curable resin, so that a substrate with conductor layer pattern having a protecting film was obtained.

(Repetitive Use)

By using the engraved plate, the copper plating step to the transfer step were repeated 500 times by the same manner as described above. As a result, a deposition property and transference performance of the copper plating were not changed, and stripped portions of the insulating layer were also not observed.

Example 2H

Formation of Conductive Inorganic Material

Formation of a conductive inorganic material was performed as in Example 1, and a DLC layer was formed on a 100 mm square stainless steel substrate.

(Formation of Convex Pattern)

Resist films (PhoTec RY 3315, thickness: 10 μm (manufactured by Hitachi Chemical Co., Ltd.) were laminated to both surfaces of the substrate on which the conductive DLC obtained as described above was formed. As laminating conditions, a roll temperature was set to 105° C., a pressure was set to 0.5 MPa, and a line speed was set to 1 m/min. A negative film on which circular patterns serving which did not transmit light and each of which had a diameter of +100 μm were formed at a circular pattern pitch of 250 μm was placed on one surface of the stainless steel plate at rest. By using an ultraviolet irradiation apparatus, under a degree of vacuum of 600 mmHg or less, ultraviolet rays were irradiated at 120 mJ/cm$^2$ on the negative film for the upper and lower surfaces of the stainless steel plate on which the negative film was placed. Furthermore, the resist film was developed with a 1% sodium carbonate aqueous solution, so that a pattern constituted by a projection portion resist film (projection portion; height of 10 μm) having a circular pattern diameter of 98 to 101 μm and a circular pattern pitch of 250 μm was formed on the SUS plate. Since a surface opposing the surface on which the pattern is formed is entirely exposed by UV-ray, the surface is not developed, and the resist film is formed on the entire surface.

(Formation of Insulating Layer)

An insulating layer was formed as in Example 1H.

(Formation of Concave Portion; Removal of Convex Pattern to which Insulating Layer Adheres)

A stainless steel substrate to which an insulating layer adheres was dipped in a sodium hydroxide aqueous solution (10%, 50° C.) to strip a resist film which formed a convex pattern and a DLC film which adhered to the resist film, so that an engraved plate was obtained.

A shape of the concave portion increased in width toward an opening, and an inclination angle of a side surface of the concave portion was equal to an angle of the boundary surface. The depth of the concave portion was 5 to 6 μm. A pitch of the circular patterns was a pitch of 250 μm.

(Copper Plating)

By using the engraved plate obtained as described above as a cathode, electrolytic copper plating was performed as in Example 1, and the plating was performed until a thickness of a metal deposited on the concave portion of the engraved plate was almost 20 μm. A plating layer was formed in the concave portion of the engraved plate such that the plating layer overflowed from the concave portion.

(Peeling)

A copper plated portion was peeled from the copper-plated surface of the engraved plate as a copper foil. A line speed was set to 1 m/min. In this state, a perforated copper foil constituted by a pattern having a hole shape of φ57 to 63 μm and a hole pitch of 250 μm was obtained.

(Repetitive Use)

By using the engraved plate, the copper plating step to the peeling step were repeated 100 times by the same manner as described above. As a result, a deposition property and a peeling property of the copper plating were not changed, and stripped portions of the insulating layer were also not observed.

Example 3H

Formation of Conductive Inorganic Material

Formation of a conductive inorganic material was performed as in Example 1, and a DLC layer was formed on a 100 mm square stainless steel substrate. Thereafter, formation of a convex pattern and formation of an insulating layer were not performed.

(Copper Plating)

By using the engraved plate obtained as described above as a cathode, electrolytic copper plating was performed as in Example 1H, and the plating was performed until a thickness of a metal deposited on the concave portion of the engraved plate was almost 20 μm.

(Peeling)

A copper plating portion was peeled as a copper foil from the copper-plated surface of the engraved plate. A line speed was set to 1 m/min. In this state, a smooth copper foil was obtained.

(Repetitive Use)

By using the engraved plate, the copper plating step to the peeling step were repeated 100 times by the same manner as described above. As a result, a deposition property and a peeling property of the copper plating were not changed, and stripped portions of the insulating layer were also not observed.

Furthermore, the present invention will be concretely described below with reference to Examples 1I to 3I.

Example 1I

Formation of Convex Pattern

Resist films (PhoTec RY 3315, thickness: 15 μm (manufactured by Hitachi Chemical Co., Ltd.) were laminated to both surfaces of a stainless steel plate (SUS316L, mirror finish, thickness: 300 μm, manufactured by NISSHIN STEEL CO., LTD.) (corresponding to FIG. 3A). As laminating conditions, a roll temperature was set to 105° C., a pressure was set to 0.5 MPa, and a line speed was set to 1 m/min. A negative film on which a lattice-shaped pattern of light-transmitting portion was formed at a line width of 15 μm and a line pitch of 300 μm in a 120 mm square area and at a bias angle of 45° (in the square area, lines are arranged at 450 to the sides of the square area) was placed on one surface of the stainless steel plate at rest. By using an ultraviolet irradiation apparatus, under a degree of vacuum of 600 mmHg or less, ultraviolet rays were irradiated at 120 mJ/cm$^2$ on the negative film for the upper and lower surfaces of the stainless steel plate on which the negative film was placed. Furthermore, the resist film was developed with a 1% sodium carbonate aqueous solution, so that a lattice-shaped pattern constituted by a resist film having a line width of 16 to 19 μm, a line pitch of 300 μm, and a bias angle of 45° was formed on the SUS plate. A width ($d_0$) of a contact portion between the projection portion and the conductive substrate was smaller than the maximum width by 0 to about 1 μm. The minimum width of the projection portion was smaller than the maximum width ($d_1$) by 0 to about 2 μm and a width of a portion slightly higher than the contact portion between the projection portion and the conductive substrate. These were actually measured by observing a section with a scanning electron microscope (SEM) at a magnification of 3000. As measuring points, 5 or more points were set.

Since a surface opposing the surface on which the convex pattern is formed is entirely exposed by UV-ray, the surface is not developed, and the resist film is formed on the entire surface (corresponding to FIG. 3B).

(Formation of Insulating Layer)

A DLC film was formed by PBII/D apparatus (Type III, manufactured by Kurita Seisakusyo Co., Ltd.) as hereinafter. A stainless steel substrate with a resist film was put into a chamber, and a vacuum state was set in the chamber. Thereafter, a substrate surface was cleaned with an argon gas, hexamethyldisiloxane was introduced into the chamber, and an intermediate layer was formed to have a film thickness of 0.1 µm. Toluene, methane, and an acetylene gas were introduced, and a DLC layer was formed on the intermediate layer to have a film thickness of 2 µm (corresponding to FIG. 3C). The thicknesses of the DLC films formed on both the sides of the convex portion formed by the resist film were 2 µm. An angle of a boundary surface was 45 to 51°. The thickness of the insulating layer and the angle of the boundary surface were actually measured such that a part of the conductive substrate was cut out and casted with a resin and SEM observation of a section was performed at a magnification of 3000. Measuring portions were 5 portions, and both the sides of the resist film were measured. For this reason, the maximum values and the minimum values at a total of 10 points were employed.

(Formation of Concave Portion; Removal of Convex Pattern to which Insulating Layer Adheres)

A stainless steel substrate to which an insulating layer adheres was dipped in a sodium hydroxide aqueous solution (10%, 50° C.) and left in the solution for 8 hours while being oscillated occasionally. A resist film which formed a convex pattern and a DLC film which adheres to the resist film could be stripped. Since some portion could not be easily stripped, these films were entirely stripped by lightly rubbing the films with a cloth to obtain an engraved plate (corresponding to FIG. 3D).

A shape of the concave portion increased in width toward an opening, and an inclination angle of both the sides surface of the concave portion was equal to an angle of the boundary surface. The depth of the concave portion was 2 µm. The width of the concave portion at a bottom portion was 16 to 19 µm, and a width (maximum width) at the opening was 21 to 27 µm. A pitch of the concave portions was 300 µm.

(Copper Plating)

Furthermore, an adhesive film (HITALEX K-3940B, manufactured by Hitachi Chemical Co., Ltd.) was bonded to a surface of the obtained engraved plate on which the pattern was not formed. By using the engraved plate to which the adhesive film adheres as a cathode, electrolytic copper plating was performed. A bath composition of an electrolytic copper plating bath and electrolytic conditions are as follows:

Concentration of copper sulfate (pentahydrate), 200 g/L
Concentration of sulfuric acid: 100 g/L
Amount of used hydrochloric acid (35%): 2 mL/L
Additive: MICROFILL VF-AN (manufactured by Meltx Inc., organic sulfur compound (bis(3-sulfopropyl) disulphide salt)): 0.3 mL/L
MICROFILL VF-BN (manufactured by Meltx Inc., surface active agent, polyethylene glycols containing primary to quaternary ammonium group): 15 mL/L
Bath temperature: 25° C.
Anode: Copper plate The plating bath was sufficiently stirred by using aeration. Plating was performed at a current density of 10 A/dm$^2$ until a thickness of a metal deposited on a metal surface of the concave portion of the conductive substrate was 4 µm. The metal deposited at this stage was red, and an electric conductivity was 0.05 Ω/square. Thereafter, the aeration was stopped to eliminate liquid stirring, the current density was changed into 50 A/dm$^2$, and plating was continuously performed for 5 seconds to make the surface black. The conductive substrate to which the conductor pattern having a surface treated by a blacking process adheres was extracted from the plating bath, washed with water, and dried.

(Manufacturing of Adhesive Film for Transfer)

On a surface of a 100-µm-thickness polyethylene terephthalate (PET) film (A-4100, manufactured by TOYOBO CO., LTD.), a primer (HP-1, manufactured by Hitachi Chemical Co., Ltd.) was firstly coated at a thickness of 1 µm and an acrylic polymer (HTR-280, manufactured by Nagase ChemteX Corporation) was next coated at a thickness of 10 µm. Consequently, an adhesive film for transfer was manufactured.

(Transfer)

A surface of the adhesive layer of the adhesive film for transfer and the copper-plated surface of the engraved plate were bonded to each other by using a roll laminator. As laminate conditions, a roll temperature was set to 25° C., a pressure was set to 0.1 MPa, and a line speed was set to 1 m/min. When the adhesive film bonded to the plate for transfer of the plated metal was peeled, copper deposited on the engraved plate was transferred onto the adhesive film. In this manner, a substrate with conductor layer pattern was obtained, the pattern constituted by a lattice-shaped conductor layer pattern having a line width of 20 to 25 µm, a line pitch of 300±2 µm, and a conductor layer thickness of 5 µm on an average. The shape of the conductor layer, reflecting the shape of the concave portion, increased in width from the lower portion to the upper portion (adhesive layer) as shown in FIG. 6H, and a portion overflowed from the concave portion spread like an umbrella.

When the surface of the engraved plate was observed after the transfer operation, the insulating layer was not stripped at any portion. The line width and the thickness of the conductor layer were actually measured such that the obtained substrate with conductor layer pattern was partially cut and casted with a resin, and a section was SEM-observed at a magnification of 3000. Measuring portions were 5 portions, and both the sides of the concave portion were measured. For this reason, the maximum values and the minimum values of the values at a total of 10 points were employed (the same way will be applied to the following description). The line pitch was measured at a magnification of 200 by using a microscope (digital microscope VHX-500, manufactured by KEYENCE CORPORATION). The measurement was performed at 5 arbitrary points (the same way will be applied to the following description).

(Formation of Protecting Film)

The surface of the obtained substrate with conductor layer pattern on which the conductor layer pattern was present was coated with UV-curable resin Hitaloid 7983AA3 (manufactured by Hitachi Chemical Co., Ltd.) and laminated by a polycarbonate film (macrohole DE, manufactured by Bayer Corporation, 75 µm). Consequently the conductor layer pattern was buried in a UV-curable resin. Thereafter, an ultraviolet ray having 1 J/cm$^2$ was irradiated on the UV-curable resin by using an ultraviolet lamp to cure the UV-curable resin, so that a substrate with conductor layer pattern having a protecting film was obtained.

(Repetitive Use)

By using the engraved plate, the copper plating transfer step was repeated 500 times by the same manner as described above. As a result, transference performance of the copper plating was not changed, and stripped portions of the insulating layer were also not observed.

(Measurement of Luminance and Chromaticity)

A luminance and a chromaticity of the obtained substrate with conductor layer pattern were measured by using a spectrophotometer CM-508d (Konica Minolta Holdings, Inc.).

Measurement was performed in a reflecting mode such that black paper having a luminance L* of 25 was laid under the substrate.

As an object to be measured, a conductor layer pattern having a surface treated by a blacking process was used, and an opening area was about 77%. When the luminance was measured, a luminance L* was 43 which fell within a preferable value range. The chromaticities a* and b* were 2.8 and 2.2, respectively. Each value signifies low hue.

Example 2I

A substrate with conductor layer pattern was manufactured as in the same manner as in Example 1I except that Photec RY 3415 (thickness of 15 μm, and manufactured by Hitachi Chemical Co., Ltd.) was used as a resist film used in formation of the convex pattern in Example 1I and a titanium plate (#400 polishing finish, thickness of 0.5 mm, and manufactured by MICRON INDUSTRY CO., LTD.) was used as a conductive substrate. Red electrolytic plating was performed to the obtained substrate with conductor layer pattern as in Example 1I, and black electrolytic plating was subsequently performed to the substrate. After the resultant film was transferred to an adhesive film for transfer as in Example 1I, a protecting film was formed.

A luminance and a chromaticity of the obtained conductor layer pattern were measured as in Example 1I. As an object to be measured, a conductor layer pattern having a surface treated by a blacking process was used, and an opening area was about 80%. When the luminance was measured, a luminance L* was 47 which fell within a preferable value range. The chromaticities a* and b* were 1.4 and 1.7, respectively. Each value signifies low hue.

Example 3I

A substrate with conductor layer pattern was manufactured as in Example 2I such that a bath composition of an electrolytic copper plating bath is given as follows:
Concentration of copper sulfate (pentahydrate), 60 g/L
Concentration of sulfuric acid: 170 g/L
Amount of used hydrochloric acid (35%): 0.2 mL/L
Additive: Copperacid GS (manufactured by Atotech Japan, organic sulfur compound): 0.1 mL/L
Copperacid HL (manufactured by Atotech Japan, surface active agent): 20 mL/L
Bath temperature: 25° C.
Anode: Titanium substrate coated with platinum A luminance and a chromaticity of the obtained conductor layer pattern were measured as in Example 1I. As an object to be measured, a conductor layer pattern having a surface treated by a blacking process was used, and an opening area was about 80%. When the luminance was measured, a luminance L* was 48 which fell within a preferable value range. The chromaticities a* and b* were 1.9 and −1.0, respectively. Each value signifies low hue.

Furthermore, the present invention will be described below with reference to Examples 1J to 4J.

Example 1J

Manufacturing of Convex Pattern and Conductive Substrate having Concave Portion having Geometric Figure Drawn by the Convex Pattern A resist film (PhoTec H-Y920, manufactured by Hitachi Chemical Co., Ltd.) was laminated to a 750×1100-mm stainless steel (SUS316L, finish 3/4H, a thickness of 0.3 mm, manufactured by NISSHIN STEEL CO., LTD.). As laminating conditions, a roll temperature was set to 105° C., a pressure was set to 0.5 MPa, and a line speed was set to 1 m/min. A negative film formed in the form of a lattice having a line width of 30 μm and a line pitch of 300 μm in a light-transmitting portion and a bias angle of 45° was placed on the stainless steel plate to which the resist film adheres at rest. By using an ultraviolet irradiation apparatus, under a degree of vacuum of 600 mmHg or less, an ultraviolet ray was irradiated at 120 mJ/cm² on the negative film for the upper surface of the negative film. Furthermore, the resist film was developed with a 1% sodium carbonate aqueous solution, so that a resist mask having a line width of 30 μm, a line pitch of 300 μm, and a bias angle of 45° was formed on the SUS plate. In addition, the SUS plate was etched by using a ferric chloride aqueous solution heated to 40° C. (45°B, manufactured by Tsurumi Soda Co., Ltd.). The etching was performed until the line width of the SUS plate was 20 μm. By using a 5% sodium hydroxide solution, the resist film formed on the SUS plate was stripped, a lattice-shaped pattern (line width, i.e., a width on the upper surface of the convex portion was 20 μm, a pitch was 300 μm, a height of the convex portion was 15 μm, and a sectional shape of the convex portion was a curved surface (similar to FIG. 2-c), and an engraved plate having the convex pattern having an upper surface and the concave portion of the geometric figure drawn by the convex portion was manufactured.

A ground corresponding portion (region B) of a mesh pattern of a convex portion having a convex portion upper surface width of 80 μm, a pitch of 300 μm, and a convex portion height of 15 μm was formed on a region of 40-mm width containing outer circumferential portion of the engraved plate.

(Formation of Insulating Layer)

A DLC film was formed by PBII/D apparatus (Type III, manufactured by Kurita Seisakusyo Co., Ltd.) as hereinafter. A stainless steel substrate with a resist film was put into a chamber, and a vacuum state was set in the chamber. Thereafter, a substrate surface was cleaned with an argon gas, hexamethyldisiloxane was introduced into the chamber, and an intermediate layer was formed to have a film thickness of 0.1 μm. Toluene, methane, and an acetylene gas were introduced, and a DLC layer was formed on the intermediate layer to have a film thickness of 2 μm. The thicknesses of the DLC films formed on both the sides of the convex portion formed by the resist film were 2 μm. An angle of a boundary surface was 45 to 51°. The thickness of the insulating layer and the angle of the boundary surface were actually measured such that a part of the conductive substrate was cut out and casted with a resin and SEM observation of a section was performed at a magnification of 3000. Measuring portions were 5 portions, and both the sides of the resist film were measured. For this reason, the maximum values and the minimum values of the values at a total of 10 points were employed.

(Formation of Concave Portion; Removal of Convex Pattern to which Insulating Layer Adheres)

A stainless steel substrate to which an insulating layer adheres was dipped in a sodium hydroxide aqueous solution (10%, 50° C.) and left in the solution for 8 hours while being oscillated occasionally. A resist film which formed a convex pattern and a DLC film which adheres to the resist film were stripped. Since some portion could not be easily stripped, these films were entirely stripped by lightly rubbing the films with a cloth to obtain an engraved plate.

In a shape of the convex portion, a thickness of the DLC film on an end of an upper surface of the convex portion was 1.8 μm, and a thickness of the DLC film on the concave portion was 2 μm. The conductive material was covered with an insulating film except for the upper surface of the convex portion. A pitch of the convex portions was a pitch of 300 μm.

(Copper Plating)

A conductive substrate having an insulating film was fixed to a rotating drum electrode serving as a cathode by a Teflon (registered trademark) tape, and electrolytic copper plating was performed.

Main specifications of the rotating drum electrode were as follows:

Drum diameter: 425 mm
Drum width: 900 mm
Plating tank: diameter of 600 mm, liquid content: 80 L
Anode: insoluble electrode plate
Drum rotating speed: 0.4 rpm A bath composition of an electrolytic copper plating bath and electrolytic conditions are as follows:

Concentration of copper pyrophosphate: 100 g/L
Concentration of potassium pyrophosphate: 250 g/L
Amount of used ammonia water (30%): 2 mL/L pH: 8 to 9
Bath temperature: 30° C.
Anode: titanium substrate coated with iridium oxide The plating bath was sufficiently stirred by using only moderate liquid circulation. Plating was performed at a current density of 10 A/dm$^2$ until a thickness of a metal deposited on a metal surface of the convex portion of the conductive substrate was 5 μm. The metal deposited at this stage was red, and an electric conductivity was 0.1 Ω/square. Thereafter, as pulse energization processes of a constant current, a high-energization condition was set to 150 A/dm$^2$, a low-energization condition was set to 10 A/dm$^2$, and processing times were set to 5 ms and 10 ms, respectively, so that a cycle ratio (E) was set to 33%. Subsequently, plating was performed for 5 seconds to blacken the surface. The conductive substrate to which the conductor pattern having a surface treated by a blacking process adheres was extracted from the plating bath, washed with water, and dried.

(Manufacturing of Adhesive Film)

On a surface of a 125-μm-thickness polyethylene terephthalate (PET) film (A-4100, manufactured by TOYOBO CO., LTD.), a primer (HP-1, manufactured by Hitachi Chemical Co., Ltd.) was firstly coated at a thickness of 1 μm and an acrylic polymer (HTR-280, manufactured by Nagase ChemteX Corporation) was next coated at a thickness of 10 μm, and consequently an adhesive film was manufactured.

(Transfer)

An adhesive agent surface of the adhesive film and the copper-plated surface of the conductive substrate having a surface treated by a blacking process were bonded to each other by using a roll laminator. As laminate conditions, a roll temperature was set to 25° C. and a pressure was set to 0.1 MPa. When the adhesive film bonded to the conductive substrate was peeled, copper deposited on the upper surface of the convex portion of the conductive substrate was transferred onto the adhesive film.

In this manner, a substrate with conductor layer pattern was obtained, the pattern constituted by a conductor layer pattern having a line width of 28 μm, a line pitch of 300 μm, and a conductor layer thickness of 5 μm.

When the conductive substrate was observed after the transfer operation, the insulating film was not stripped at any portion. The line width and the thickness of the conductor layer were actually measured such that the obtained substrate with conductor layer pattern was partially cut and casted with a resin, and a section was SEM-observed at a magnification of 3000. Measuring portions were 5 portions, and both the sides of the concave portion were measured. For this reason, the maximum values and the minimum values of the values at a total of 10 points were employed (the same way will be applied to the following description). The line pitch was measured at a magnification of 200 by using a microscope (digital microscope VHX-500, manufactured by KEYENCE CORPORATION). The measurement was performed at 5 arbitrary points (the same way will be applied to the following description).

(Formation of Protecting Film)

The surface of the obtained substrate with conductor layer pattern which had the surface treated by a blacking process and on which the conductor layer pattern was present was coated with UV-curable resin Hitaloid 7983AA3 (manufactured by Hitachi Chemical Co., Ltd.) and laminated by a polycarbonate film (macrohole DE, manufactured by Bayer Corporation, 75 μm). Consequently the conductor layer pattern was buried in a UV-curable resin. Thereafter, an ultraviolet ray having 1 J/cm$^2$ was irradiated on the UV-curable resin by using an ultraviolet lamp to cure the UV-curable resin, so that a substrate with conductor layer pattern having a protecting film was obtained.

(Measurement of Luminance and Chromaticity)

A luminance and a chromaticity of the obtained substrate with conductor layer pattern were measured by using a spectrophotometer CM-508d (Konica Minolta Holdings, Inc.). Measurement was performed in a reflecting mode such that black paper having a luminance L* of 25 was laid under the substrate in an SCI (including regularly reflected light) scheme of C illuminant of 10° (the same way will be applied to the following description).

As an object to be measured, a grounding portion formed outside the conductor layer pattern having a surface treated by a blacking process was used, and an opening area was about 50%. When the luminance was measured, a luminance L* was 34 which fell within a preferable value range. The chromaticities a* and b* were 0.4 and 0.9, respectively. Each value signifies low hue. A line shape of the conductor layer pattern was free from abnormal black deposition and was a preferable shape.

Example 2J

Formation of Convex Pattern

Resist films (PhoTec RY 3525 (thickness: 25 μm (manufactured by Hitachi Chemical Co., Ltd.) were laminated to both surfaces of a 150 mm square titanium plate (mirror finish, thickness of 0.5 mm, and manufactured by MICRON INDUSTRY CO., LTD.). As laminating conditions, a roll temperature was set to 105° C., a pressure was set to 0.5 MPa, and a line speed was set to 1 m/min. A negative film on which a lattice-shaped pattern of light-transmitting portion was formed at a line width of 15 μm and a line pitch of 300 μm in a 120 mm square area and at a bias angle of 45° (in the square area, lines are arranged at 45° to the sides of the square area) was placed on one surface of the titanium plate at rest. By using an ultraviolet irradiation apparatus, under a degree of vacuum of 600 mmHg or less, ultraviolet rays were irradiated at 120 mJ/cm$^2$ on the negative film for the upper and lower surfaces of the titanium plate on which the negative film was placed. Furthermore, the resist film was developed with a 1% sodium carbonate aqueous solution, so that a lattice-shaped pattern constituted by a resist film having a line width of 16 to 19 μm, a line pitch of 300 μm, and a bias angle of 45° was formed on the titanium plate. Since a surface opposing the surface on which the pattern is formed is entirely exposed by UV-ray, the surface is not developed, and the resist film is formed on the entire surface.

(Formation of Insulating Layer)

An insulating film constituted by a DLC film was formed as in Example 1J.

(Formation of Concave Portion; Removal of Convex Pattern to which Insulating Layer Adheres)

A titanium substrate to which an insulating layer adheres was dipped in a sodium hydroxide aqueous solution (10%, 50° C.) and left in the solution for 8 hours while being oscillated occasionally. A resist film which formed a convex pattern and a DLC film which adheres to the resist film were stripped. Since some portion could not be easily stripped, these films were entirely stripped by lightly rubbing the films with a cloth to obtain an engraved plate (corresponding to FIG. 3(d)).

A shape of the concave portion increased in width toward an opening, and an inclination angle of a side surface of the concave portion was equal to an angle of the boundary surface. The depth of the concave portion was 2 μm. The width of the concave portion at a bottom portion was 16 to 19 μm, and a width (maximum width) at the opening was 21 to 27 μm. A pitch of the concave portions was 300 μm.

(Copper Plating)

Furthermore, an adhesive film (HITALEX K-3940B, manufactured by Hitachi Chemical Co., Ltd.) was bonded to a surface of the obtained engraved plate on which the pattern was not formed. By using the engraved plate to which the adhesive film adheres, electrolytic copper plating was performed. A bath composition of an electrolytic copper plating bath was the same as that in Example 1J.

Moderate aeration was performed to stir the plating bath. Plating was performed at a current density of 10 A/dm$^2$ until a thickness of a metal deposited on a metal surface of the concave portion of the conductive substrate was 5 μm. The metal deposited at this stage was red, and an electric conductivity was 0.1 Ω/square. Thereafter, as pulse energization processes of a constant current, a high-energization condition was set to 250 A/dm$^2$, a low-energization condition was set to 10 A/dm$^2$, and processing times were set to 10 ms and 60 ms, respectively, so that a cycle ratio (E) was set to 14%. Subsequently, plating was performed for 10 seconds to blacken the surface. The conductive substrate to which the conductor pattern having a surface treated by a blacking process adheres was extracted from the plating bath, washed with water, and dried.

(Manufacturing of Adhesive Film for Transfer)

On a surface of a 100-μm-thickness polyethylene terephthalate (PET) film (A-4100, manufactured by TOYOBO CO., LTD.), a primer (HP-1, manufactured by Hitachi Chemical Co., Ltd.) was firstly coated at a thickness of 1 μm and an acrylic polymer (HTR-280, manufactured by Nagase ChemteX Corporation) was next coated at a thickness of 10 μm, and consequently an adhesive film was manufactured.

(Transfer)

A surface the adhesive layer of the adhesive film for transfer and the copper-plated surface of the engraved plate were bonded to each other by using a roll laminator. As laminate conditions, a roll temperature was set to 25° C., a pressure was set to 0.1 MPa, and a line speed was set to 1 m/min. When the adhesive film bonded to the plate for plating transfer was peeled, copper deposited on the surface of the concave portion of the conductive substrate was transferred onto the adhesive film. In this manner, a substrate with conductor layer pattern was obtained, the pattern constituted by a lattice-shaped conductor layer pattern having a line width of 20 to 25 μm, a line pitch of 300±2 μm, and a conductor layer thickness of 5 μm on an average.

The shape of the conductor layer, reflecting the shape of the concave portion, increased in width from the lower portion to the upper portion (adhesive layer) as shown in FIG. 5(h), and a portion overflowed from the concave portion spread like an umbrella.

When the surface of the engraved plate was observed after the transfer operation, the insulating layer was not stripped at any portion.

(Formation of Protecting Film)

The surface of the obtained substrate with conductor layer pattern on which the conductor layer pattern was present was coated with UV-curable resin Hitaloid 7983AA3 (manufactured by Hitachi Chemical Co., Ltd.) and laminated by a polycarbonate film (macrohole DE, manufactured by Bayer Corporation, 75 μm). Consequently the conductor layer pattern was buried in a UV-curable resin. Thereafter, an ultraviolet ray having 1 J/cm$^2$ was irradiated on the UV-curable resin by using an ultraviolet lamp to cure the UV-curable resin, so that a substrate with conductor layer pattern having a protecting film was obtained.

(Measurement of Luminance and Chromaticity)

A luminance and a chromaticity of the obtained substrate with conductor layer pattern were measured as in Example 1J.

As an object to be measured, the conductor layer pattern having a surface treated by a blacking process was used, and an opening area was about 80%. When the luminance was measured, a luminance L* was 40 which fell within a preferable value range. The chromaticities a* and b* were 2.2 and 1.7, respectively. Both the values were values having low hues.

A line shape of the conductor layer pattern was free from abnormal black deposition and was a preferable shape.

Example 3J

Formation of Convex Pattern

Resist films PhoTec RY 3415 (thickness: 15 μm manufactured by Hitachi Chemical Co., Ltd.) were laminated to both surfaces of a 150 mm square titanium plate (#400 polishing finish, thickness of 0.5 mm, and manufactured by MICRON INDUSTRY CO., LTD.) (corresponding to FIG. 3(a)). As laminating conditions, a roll temperature was set to 105° C., a pressure was set to 0.5 MPa, and a line speed was set to 1 m/min. A negative film on which a lattice-shaped pattern of light-transmitting portion was formed at a line width of 15 μm and a line pitch of 300 μm in a 120 mm square area and at a bias angle of 45° (in the square area, lines are arranged at 45° to the sides of the square area) was placed on one surface of the titanium plate at rest. By using an ultraviolet irradiation apparatus, under a degree of vacuum of 600 mmHg or less, ultraviolet rays were irradiated at 120 mJ/cm$^2$ for the upper and lower surfaces of the titanium plate on which the negative film was placed. Furthermore, the resist film was developed with a 1% sodium carbonate aqueous solution, so that a lattice-shaped pattern constituted by a resist film having a line width of 16 to 19 μm, a line pitch of 300 μm, and a bias angle of 45° was formed on the titanium plate. A width ($d_0$) of a contact portion between the projection portion and the conductive substrate was smaller than the maximum width by 0 to about 1 μm. The minimum width of the projection portion was smaller than the maximum width ($d_1$) by 0 to about 2 μm and a width of a portion slightly higher than the contact portion between the projection portion and the conductive substrate.

These were actually measured by observing a section with a scanning electron microscope (SEM) at a magnification of 3000. As measuring points, 5 or more points were set.

Since a surface opposing the surface on which the convex pattern is formed is entirely exposed by UV-ray, the surface is not developed, and the resist film is formed on the entire surface.

(Formation of Insulating Layer, Formation of Concave Portion; Removal of Convex Pattern to which Insulating Layer Adheres)

An insulating layer constituted by a DLC film was formed as in Example 2J. Thereafter, the convex pattern was removed.

(Copper Plating)

Furthermore, an adhesive film (HITALEX K-3940B, manufactured by Hitachi Chemical Co., Ltd.) was bonded to a surface of the obtained engraved plate on which the pattern was not formed. By using the engraved plate to which the adhesive film adheres as a cathode, electrolytic copper plating was performed. A bath composition of an electrolytic copper plating bath and electrolytic conditions are as follows:

Concentration of copper sulfate (pentahydrate): 200 g/L
Concentration of sulfuric acid: 100 g/L
Amount of used hydrochloric acid (35%): 0.2 mL/L
Additive: MICROFILL VF-AN (manufactured by Meltx Inc., organic sulfur compound (bis(3-sulfopropyl) disulphide salt): 0.3 mL/L
MICROFILL VF-BN (manufactured by Meltx Inc., surface active agent, polyethylene glycols containing primary to quaternary ammonium group): 15 mL/L
Bath temperature: 25° C.
Anode: Titanium substrate coated with platinum The plating bath was sufficiently stirred by using aeration. Plating was performed at a current density of 10 A/dm$^2$ until a thickness of a metal deposited on a metal surface of the concave portion of the conductive substrate was 4 μm. The metal deposited at this stage was red, and an electric conductivity was 0.05 Ω/square. Thereafter, the aeration was stopped to eliminate liquid stirring. Thereafter, as pulse energization processes of a constant voltage, a high-energization condition was set to 85 A/dm$^2$, a low-energization condition was set to 0 A/dm$^2$, and processing times were set to 10 ms and 5 ms, respectively, so that a cycle ratio (E) was set to 67%. Subsequently, plating was performed for 5 seconds to blacken the surface. The conductive substrate to which the conductor pattern having a surface treated by a blacking process adheres was extracted from the plating bath, washed with water, and dried.

(Manufacturing of Adhesive Film for Transfer)

On a surface of a 100-μm-thickness polyethylene terephothalate (PET) film (A-4100, manufactured by TOYOBO CO., LTD.), a primer (HP-1, manufactured by Hitachi Chemical Co., Ltd.) was firstly coated at a thickness of 1 μm and an acrylic polymer (HTR-280, manufactured by Nagase ChemteX Corporation) was next coated at a thickness of 10 μm, and consequently an adhesive film for transfer was manufactured.

(Transfer)

A surface of the adhesive layer of the adhesive film for transfer and the copper-plated surface of the engraved plate were bonded to each other by using a roll laminator. As laminate conditions, a roll temperature was set to 25° C., a pressure was set to 0.1 MPa, and a line speed was set to 1 m/min. When the adhesive film bonded to the plate for transfer of the plated metal was peeled, copper deposited on the engraved plate was transferred onto the adhesive film. In this manner, a substrate with conductor layer pattern was obtained, the pattern constituted by a lattice-shaped conductor layer pattern having a line width of 20 to 25 μm, a line pitch of 300±2 μm, and a conductor layer thickness of 5 μm on an average. The shape of the conductor layer, reflecting the shape of the concave portion, increased in width from the lower portion to the upper portion (adhesive layer) as shown in FIG. 5(h), and a portion overflowed from the concave portion spread like an umbrella.

When the surface of the engraved plate was observed after the transfer operation, the insulating layer was not stripped at any portion.

(Formation of Protecting Film)

The surface of the obtained substrate with conductor layer pattern on which the conductor layer pattern was present was coated with UV-curable resin Hitaloid 7983AA3 (manufactured by Hitachi Chemical Co., Ltd.) and laminated by a polycarbonate film (macrohole DE, manufactured by Bayer Corporation, 75 μm). Consequently the conductor layer pattern was buried in a UV-curable resin. Thereafter, an ultraviolet ray having 1 J/cm$^2$ was irradiated on the UV-curable resin by using an ultraviolet lamp to cure the UV-curable resin, so that a substrate with conductor layer pattern having a protecting film was obtained.

(Measurement of Luminance and Chromaticity)

A luminance and a chromaticity of the obtained substrate with conductor layer pattern were measured as in Example 1J. As an object to be measured, the conductor layer pattern having a surface treated by a blacking process was used, and an opening area was about 85%. When the luminance was measured, a luminance L* was 43 which fell within a preferable value range. The chromaticities a* and b* were 1.1 and 1.3, respectively. Both the values were values having low hues.

A line shape of the conductor layer pattern was free from abnormal black deposition and was a preferable shape.

Example 4J

Manufacturing of Convex Pattern and Conductive Substrate having Concave Portion having Geometric Figure Drawn by the Convex Pattern Photec RY 3415 (thickness of 15 μm, and manufactured by Hitachi Chemical Co., Ltd.) was used as a resist film, and a conductive substrate was laminated to a 750×1200-mm titanium plate (#400 polishing finish, thickness of 0.5 mm, and manufactured by MICRON INDUSTRY CO., LTD.). As laminating conditions, a roll temperature was set to 105° C., a pressure was set to 0.5 MPa, and a line speed was set to 1 m/min. A negative film on which a lattice-shaped pattern was formed at a line width of 15 μm and a line pitch of 300 μm in a light-transmitting portion and at a bias angle of 45° was placed on one surface of the titanium plate at rest. By using an ultraviolet irradiation apparatus, under a degree of vacuum of 600 mmHg or less, ultraviolet rays were irradiated at 120 mJ/cm$^2$ on the negative film for the upper and lower surfaces of the titanium plate on which the negative film was placed. Furthermore, the resist film was developed with a 1% sodium carbonate aqueous solution, so that a lattice-shaped pattern constituted by a resist film having a line width of 16 to 19 μm, a line pitch of 300 μm, and a bias angle of 45° was formed on the titanium plate. A width ($d_0$) of a contact portion between the projection portion and the conductive substrate was smaller than the maximum width by 0 to about 1 μm. The minimum width of the projection portion was smaller than the maximum width ($d_1$) by to about 2 μm and a width of a portion slightly higher than the contact portion between the projection portion and the conductive substrate. These were actually measured by observing a section with a scanning electron microscope (SEM) at a magnification of 3000. As measuring points, 5 or more points were set.

Since a surface opposing the surface on which the convex pattern is formed is entirely exposed by UV-ray, the surface is not developed, and the resist film is formed on the entire surface.

(Formation of Insulating Layer)

A DLC film was formed as in Example 1J except that a substrate was changed into a titanium plate. The thicknesses of the DLC films formed on both the sides of the convex portion formed by the resist film were 2 μm. An angle of a boundary surface was 45 to 51°. The thickness of the insulating layer and the angle of the boundary surface were actually measured such that a part of the conductive substrate was cut out and casted with a resin and SEM observation of a section was performed at a magnification of 3000. Measuring portions were 5 portions, and both the sides of the resist film were measured. For this reason, the maximum values and the minimum values of the values at a total of 10 points were employed.

(Formation of Concave Portion; Removal of Convex Pattern to which Insulating Layer Adheres)

A titanium substrate to which an insulating layer adheres was dipped in a sodium hydroxide aqueous solution (10%, 50° C.) and left in the solution for 8 hours while being oscillated occasionally. A resist film which formed a convex pattern and a DLC film which adheres to the resist film were stripped. Since some portion could not be easily stripped, these films were entirely stripped by lightly rubbing the films with a cloth to obtain an engraved plate (corresponding to FIG. 3(d)).

In the shape of the convex portion, a thickness of the DLC film on an end of an upper surface of the convex portion was 1.8 μm, and a thickness of the DLC film on the concave portion was 2 μm. The conductive material was covered with an insulating film except for the upper surface of the convex portion. A pitch of the convex portions was a pitch of 300 μm.

(Copper Plating)

A conductive substrate having an insulating film was fixed to a rotating drum electrode serving as a cathode by a Teflon (trademark) tape, and electrolytic copper plating was performed by the same equipment and the same bath as those in Example 1J.

A plating energization process was performed by the following conditions:

Plating was performed at a current density of 8 A/dm² until a thickness of a metal deposited on a metal surface of the concave portion of the conductive substrate was 4 μm. Thereafter, as pulse energization processes of a constant current, a high-energization condition was set to 7.5 V, a low-energization condition was set to 0 V, and processing times were set to 3 ms and 100 ms, respectively, so that a cycle ratio (E) was set to 3%. Subsequently, plating was performed for 5 seconds to blacken the surface. The conductive substrate to which the conductor pattern having a surface treated by a blacking process adheres was extracted from the plating bath, washed with water, and dried.

Manufacturing and transferring of the adhesive film for transfer and the protecting film were processed as in Example 2J.

(Measurement of Luminance and Chromaticity)

A luminance and a chromaticity of the obtained substrate with conductor layer pattern were measured as in Example 1J. As an object to be measured, the conductor layer pattern having a surface treated by a blacking process was used, and an opening area was about 85%. When the luminance was measured, a luminance L* was 43 which fell within a preferable value range. The chromaticities a* and b* were 2.8 and 2.2, respectively. Both the values were values having low hues.

A line shape of the conductor layer pattern was free from abnormal black deposition and was a preferable shape.

Furthermore, the invention of this application will be described below with reference to Examples 1K to 2K Example 1K Formation of Convex Pattern A resist film (PhoTec RY 3315, thickness: 15 μm, and manufactured by Hitachi Chemical Co., Ltd.) was laminated to one surface of a 150 mm square stainless steel plate (SUS316L, mirror finish, thickness: 300 μm, manufactured by NISSHIN STEEL CO., LTD.). As laminating conditions, a roll temperature was set to 105° C., a pressure was set to 0.5 MPa, and a line speed was set to 1 m/min. A negative film on which a lattice-shaped pattern of light-transmitting portion was formed at a line width of 15 μm and a line pitch of 300 μm in a 120 mm square area and at a bias angle of 45° (in the square area, lines are arranged at 45° to the sides of the square area) was placed on one surface of the stainless steel plate at rest. By using an ultraviolet irradiation apparatus, under a degree of vacuum of 600 mmHg or less, the negative film was placed on a surface to which the resist film of the stainless steel plate was bonded, and an ultraviolet ray was irradiated at 120 mJ/cm². Furthermore, the resist film was developed with 1% sodium carbonate aqueous solution, so that a lattice-shaped pattern constituted by a projection portion resist film (projection portion; height: 15 μm) having a line width of 16 to 19 μm, a line pitch of 300 μm, and a bias angle of 45° was formed on the SUS plate. The line width is a maximum width ($d_1$) of the projection portion and a width of an upper portion of the projection portion. A width ($d_0$) of a contact portion between the projection portion and the conductive substrate was smaller than the maximum width by 0 to about 0.8 μm. A minimum width of the projection portion is smaller than the maximum width ($d_1$) by 0 to about 1.5 μm and a width of a portion of the projection portion slightly higher than the contact portion between the projection portion and the conductive substrate. These were actually measured by observing a section with a scanning electron microscope (SEM) at a magnification of 3000. As measuring points, 5 or more points were set.

(Formation of First Insulating Layer)

A DLC film was formed by PBII/D apparatus (Type III, manufactured by Kurita Seisakusyo Co., Ltd.) as hereinafter. A stainless steel substrate with a resist film was put into a chamber, and a vacuum state was set in the chamber. Thereafter, a substrate surface was cleaned with an argon gas, hexamethyldisiloxane was introduced into the chamber, and an intermediate layer was formed to have a film thickness of 0.1 μm. Toluene, methane, and an acetylene gas were introduced, and a DLC layer was formed on the intermediate layer to have a film thickness of 2 to 3 μm. The thicknesses of the DLC films on both sides of the convex portion formed by the resist film were 2 to 3 μm. An angle of a boundary surface was 45 to 51°. The thickness of the insulating layer and the angle of the boundary surface were actually measured such that a part of a simultaneous test piece which was applied simultaneously with the conductive substrate and on which the same pattern was formed was cut out and casted with a resin and SEM observation of a section was performed at a magnification of 3000. Measuring portions were 5 portions, and both the sides of the resist film were measured. For this reason, the maximum values and the minimum values of the values at a total of 10 points were employed.

(Formation of Second Insulating Layer)

A substrate obtained by bonding an adhesive film for protection (HITALEX K-3940B, manufactured by Hitachi Chemical Co., Ltd.) to an opposite surface, on which a convex pattern was formed, of the conductive substrate on which the first insulating layer was formed (the conductive substrate was kept exposed at one end to electrify the conductive substrate) was used as a cathode, and a stainless steel (SUS304) plate was used as an anode, electrocoating was performed in a cationic electrocoating (Insuleed1004, novolac epoxy system, manufactured by Nippon Paint Co., Ltd.) under the conditions of 6 V and 5 minutes. After the substrate was preliminarily dried at 105° C. for 5 minutes, baking was performed at 200° C. for 20 minutes. It was observed in microscope observation that holes were selectively buried with the electrocoating. When a thickness of a convex portion formed by the electrocoating was checked with a laser microscope (manufactured by KEYENCE CORPORATION, VK8500), the thickness was 1 to 2 µm. In this manner, a second insulating film consisting of an electrically insulating resin was formed by the electrocoating on the convex pattern side of the engraved plate.

(Formation of Third Insulating Layer)

A DLC film was formed by PBII/D apparatus (Type III, manufactured by Kurita Seisakusyo Co., Ltd.) as in the formation of the first insulating layer. A stainless steel substrate with a resist film was put into a chamber, and a vacuum state was set in the chamber. Thereafter, a substrate surface was cleaned with an argon gas, hexamethyldisiloxane was introduced into the chamber, and an intermediate layer was formed to have a film thickness of 0.1 µm. Toluene, methane, and an acetylene gas were introduced, and a DLC layer was formed on the intermediate layer to have a film thickness of 2 to 3 µm. The total thickness of the formed DLC films was 4 to 6 µm. When a portion of the second insulating layer (electrocoating) was independently observed with a laser microscope, the second insulating layer rose up by an electrodeposited portion (1 to 2 µm) after the formation of the third insulating layer. For this reason, the thickness of that portion was 5 to 8 µm in calculation. At this time, the total thickness of the DLC films on both the sides of the convex portion formed by the resist film was 4 to 6 µm on the first and third insulating layers. An angle of a boundary surface was 45 to 51°. The thickness of the insulating layer and the angle of the boundary surface were actually measured such that a part of the conductive substrate was cut out and casted with a resin and SEM observation of a section was performed at a magnification of 3000. Measuring portions were 5 portions, and both the sides of the resist film were measured. For this reason, the maximum values and the minimum values of the values at a total of 10 points were employed.

(Formation of Concave Portion; Removal of Concave Pattern to which Insulating Layer Adheres)

A stainless steel substrate to which an insulating layer adheres was dipped in a sodium hydroxide aqueous solution (10%, 50° C.) and left in the solution for 8 hours while being oscillated occasionally. A resist film which formed a convex pattern and a DLC film which adheres to the resist film were stripped. Since some portion could not be easily stripped, these films were entirely stripped by lightly rubbing the films with a cloth to obtain an engraved plate.

A shape of the concave portion increased in width toward an opening, and an inclination angle of a side surface of the concave portion was equal to an angle of the boundary surface. The depth of the concave portion was 4 to 6 µm. The width of the concave portion at a bottom portion was 16 to 19 µm, and a width (maximum width) at the opening was 26 to 31 µm. A pitch of the concave portions was 300 µm.

(Copper Plating)

Furthermore, an adhesive film (HITALEX K-3940B, manufactured by Hitachi Chemical Co., Ltd.) was bonded to a surface (rear surface) of the obtained engraved plate on which the pattern was not formed. The engraved plate to which the adhesive film was bonded as a cathode, and phosphorous-containing copper were used as an anode, respectively, and they were dipped in an electrolytic bath (250 g/L of copper sulfate (pentahydrate), 70 g/L of sulfuric acid, and 4 ml/L of an aqueous solution of CU-BRITE AR (manufactured by EBARA-UDYLITE CO., LTD., additive), 30° C.) for electrolytic copper plating, a voltage was applied across both the electrodes to obtain a current density of 10 $A/dm^2$, and plating was performed until the thickness of a metal deposited on the concave portion of the engraved plate was 7 µm. A plating layer was formed in the concave portion of the engraved plate such that the plating layer overflowed from the concave portion.

(Initial Pin Hole)

When the first metal was plated, a copper-deposited portion except for a line in a 10 mm square area was observed at a magnification of 200 by using a microscope (digital microscope VHX-500, manufactured by KEYENCE CORPORATION). In this case, the deposited copper was observed as copper particles. The number of observed copper particles was 13.

(Manufacturing of Adhesive Film for Transfer)

On a surface of a 100-µm-thickness polyethylene terephothalate (PET) film (A-4100, manufactured by TOYOBO CO., LTD.), a primer (HP-1, manufactured by Hitachi Chemical Co., Ltd.) was firstly coated at a thickness of 1 µm and an acrylic polymer (HTR-280, manufactured by Nagase ChemteX Corporation) was next coated at a thickness of 10 µm, and consequently an adhesive film for transfer was manufactured.

(Transfer)

A surface of the adhesive layer of the adhesive film for transfer and the copper-plated surface of the engraved plate were bonded to each other by using a roll laminator. As laminate conditions, a roll temperature was set to 25° C., a pressure was set to 0.1 MPa, and a line speed was set to 1 m/min. When the adhesive film bonded to the plate for transfer of the plated metal was peeled, copper deposited on the engraved plate was transferred onto the adhesive film. In this manner, a substrate with conductor layer pattern was obtained, the pattern constituted by a lattice-shaped conductor layer pattern having a line width of 30 to 35 µm, a line pitch of 300±2 µm, and a conductor layer thickness (maximum) of 7 to 8 µm. The shape of the conductor layer, reflecting the shape of the concave portion, increased in width from the lower portion to the upper portion (adhesive layer), and a portion overflowed from the concave portion spread like an umbrella.

When the surface of the engraved plate was observed after the transfer operation, the insulating layer was not stripped at any portion. The line width and the conductor layer thickness were actually measured such that a part of the obtained substrate with conductor layer pattern was cut out and casted with a resin and SEM observation of a section was performed at a magnification of 3000. Measuring portions were 5 portions, and both the sides of the concave portion were measured. For this reason, the maximum values and the minimum values of the values at a total of 10 points were employed (the same way will be applied to the following description). The line pitch was measured at a magnification of 200 by using a microscope (digital microscope VHX-500, manufactured by KEYENCE CORPORATION). The measurement was performed at 5 arbitrary points (the same way will be applied to the following description).

(Formation of Protecting Film)

The surface of the obtained substrate with conductor layer pattern on which the conductor layer pattern was present was coated with UV-curable resin Hitaloid 7983AA3 (manufactured by Hitachi Chemical Co., Ltd.) and laminated by a polycarbonate film (macrohole DE, manufactured by Bayer Corporation, 75 μm). Consequently the conductor layer pattern was buried in a UV-curable resin. Thereafter, an ultraviolet ray having 1 J/cm$^2$ was irradiated on the UV-curable resin by using an ultraviolet lamp to cure the UV-curable resin, so that a substrate with conductor layer pattern having a protecting film was obtained.

(Repetitive Use)

By using the engraved plate, the copper plating step to the transfer step was repeated 200 times by the same manner as described above. As a result, transference performance of the copper plating was not changed, and stripped portions of the insulating layer (especially, a portion practiced electrocoating) were also not observed.

Example 2K

Formation of Convex Pattern

A liquid resist (SU-8, manufactured by NIPPON KAYAKU CO., LTD.) was coated to one surface of a stainless steel substrate (SUS304, 314×150 mm, manufactured by NISSHIN STEEL CO., LTD.) to have a thickness of 7 μm. After the resultant resist film was prebaked at 90° C. for 10 minutes, two negative chromium masks on each of which a lattice-shaped pattern of light-transmitting portion was formed at a line width of 5 μm and a line pitch of 300 μm in a 110 mm square area and at a bias angle of 45° (in the square area, lines are arranged at 45° to the sides of the square area) were placed on one surface of the stainless steel plate in parallel to each other at rest. By using an ultraviolet irradiation apparatus, under a degree of vacuum of 600 mmHg or less, an ultraviolet ray was irradiated at 200 mJ/cm$^2$ for the upper surface of the stainless steel plate (adsorbed as a substrate) on which the chromium mask was placed. After the resultant structure was heated at 95° C. for 7 minutes, the resist film were developed with propylene glycol monomethyl ether (PGMEA) to form a pattern constituted by a resist film having a line width of 5 to 7 μm, a line pitch of 300 μm, and a bias angle of 45° on the stainless steel plate. The line width is a maximum width ($d_1$) of the projection portion and a width of an upper portion of the projection portion. A width ($d_0$) of a contact portion between the projection portion and the conductive substrate was smaller than the maximum width by 0 to about 1 μm. A minimum width of the projection portion is smaller than the maximum width ($d_1$) by 0 to about 2 μm and a width of a portion of the projection portion slightly higher than the contact portion between the projection portion and the conductive substrate. These were actually measured by observing a section with a scanning electron microscope (SEM) at a magnification of 3000. As measuring points, 5 or more points were set.

(Formation of First Insulating Layer)

A DLC film was coated as in Example 1K to have a film thickness of 3 to 4 μm. At this time, thicknesses of the DLC films on both sides of a convex portion formed by a resist film were 3 to 4 μm. An angle of a boundary surface was 45 to 47°.

(Formation of Second Insulating Layer)

Electrocoating was performed as a Example 1K in a cationic electrocoating (Insuleed1004) under the conditions of 6 V and 5 minutes. After the substrate was preliminarily dried at 105° C. for 5 minutes, baking was performed at 200° C. for 20 minutes. It was observed in microscope observation that holes were selectively buried with the electrocoating. When a thickness of a convex portion formed by the electrocoating was checked with a laser microscope (manufactured by KEYENCE CORPORATION, VK8500), the thickness was 2 to 3 μm (thickest portion).

(Formation of Third Insulating Layer)

A DLC film was coated as in Example 1K to have a film thickness of 1 to 2 μm. The total thickness of the formed DLC films was 4 to 6 μm. When a portion of the second insulating layer (electrocoating) was independently observed with a laser microscope, the second insulating layer rose up by an electrodeposited portion (2 to 3 μm) after the formation of the third insulating layer. For this reason, the thickness of that portion was 6 to 9 μm in calculation. At this time, the total thickness of the DLC films on both the sides of the convex portion formed by the resist film was 4 to 6 μm on the first and third insulating layers. An angle of a boundary surface was 45 to (Formation of Concave Portion; Removal of Convex Pattern to which Insulating Layer Adheres)

A stainless steel substrate to which an insulating layer adheres was dipped in water and left in the water for 3 hours while being applied with supersonic waves (28 kHz). A resist film which formed a convex pattern and a DLC film which adheres to the resist film were stripped. Since some portion could not be easily stripped, these films were entirely stripped by lightly rubbing the films with a cloth to obtain an engraved plate.

A shape of the concave portion increased in width toward an opening, and an inclination angle of a side surface of the concave portion was equal to an angle of the boundary surface. The depth of the concave portion was 4 to 6 μm. The width of the concave portion at a bottom portion was 5 to 7 μm, and a width (maximum width) at the opening was 13 to 17 μm. A pitch of the concave portions was 300 μm.

(Copper Plating)

The engraved plate was winded on a stainless steel roll having a diameter of φ100 mm and a width of 200 mm such that a rear surface of the engraved plate manufactured as described above was in contact with the roll, and joint lines were bonded to each other with an insulating tape. Furthermore, in order to prevent a plating solution from penetrating through the side portions, the insulating tapes were adhered to the roll and the conductive substrate along the circumferences of both sides so as to cover the region of 5 mm width containing the ends of the conductive substrate. Consequently one rotator was formed.

With the apparatus configuration as shown in FIG. 16, electrolytic copper plating was performed to a rotator 104. As an anode 103, a titanium insoluble electrode coated with platinum was used. For a cathode, the stainless steel roll was used as a drum electrode. In an electrolytic bath 100 for electrolytic copper plating, an aqueous solution containing copper pyrophosphate: 100 g/L, potassium pyrophosphate: 250 g/L, and ammonia water (30%): 2 mL/L and set at pH: 8 to 9 was accommodated as an electrolytic solution 102 at 40° C. The electrolytic solution 102 was supplied to a portion between the first anode 103 and the rotator 104 by a pump 106 through a pipe 105 to fulfill the portion. An approximately half part of the rotator 104 was dipped in the electrolytic solution. A voltage was applied across both the electrodes to obtain a current density of 15 A/dm$^2$, and plating was performed until the thickness of a metal deposited on the conductive substrate was about 5 μm. At this time, the stainless steel roll was rotated at a speed of 0.1 m/minute. As a result, a plating layer was formed in the concave portion of the engraved plate such that the plating layer overflowed from the concave portion.

(Initial Pin Hole)

When the first metal was plated, the engraved plate was temporarily removed from the roll, a copper-deposited portion except for a line in a 10 mm square area was observed at a magnification of 200 by using a microscope (digital microscope VHX-500, manufactured by KEYENCE CORPORATION). In this case, the deposited copper was observed as copper particles. The number of observed copper particles was 15.

(Transfer)

The adhesive film manufactured in Example 1K was temporarily winded in the form of a roll to obtain a rolled adhesive film. The adhesive film 108 was winded off from the rolled adhesive film, and an adhesive compound layer surface of the adhesive film was continuously bonded to a metal (copper) 108 deposited on the rotator (stainless steel roll), on which the engraved plate was loaded again, by a bonding roll 110 under the same laminate conditions as in Example 1K and peeled to transfer the metal 108 to the adhesive compound layer of the adhesive film, so that a substrate with conductor layer pattern 111 was continuously manufactured. The substrate with conductor layer pattern 111 was winded in the form of a roll (not shown). At this time, the substrate with conductor layer pattern was winded while laminating a release liner PET (S-32, manufactured by Teijin DuPont Films Japan Limited) on a surface of the adhesive film on which the conductor layer pattern was transferred to prevent blocking in a winding state. The conductor layer pattern had a line width of 14 to 18 μm, a line pitch of 300±2 μm, and a conductor layer thickness of 4.5 to 6.5 μm. After a 50-m of adhesive film to which the copper plating layer was transferred was winded, the plating of copper on the stainless steel roll and transference performance of the copper plating were not changed, and stripped portions of the insulating layer were also not observed. The shape of the conductor layer, reflecting the shape of the concave portion, increased in width from the lower portion to the upper portion (adhesive layer), and a portion overflowed from the concave portion spread like an umbrella.

(Formation of Protecting Film)

A part of the obtained substrate with conductor layer pattern was cut off, and, on a surface on which the conductor layer pattern was formed, a UV-curable resin (ARONIX UV-3701, manufactured by TOAGOSEI CO., LTD) was coated by using an applicator (Yoshimitsu Seiki Corporation, YBA type) to have a thickness of 15 μm, and a PET film (Miller D, manufactured by Teijin DuPont Films Japan Limited, 75 μm) by using a hand roll while preventing air bubbles from being made. Thereafter, an ultraviolet ray of 1 J/cm$^2$ was irradiated by using an ultraviolet lamp to form a protecting film.

(Repetitive Use)

By using the obtained conductive substrate for plating transfer, the copper plating step to the transfer step were repeated 5000 times (rotator was rotated 5000 times) by the same manner as described above. As a result, transference performance of the copper plating was not changed, and stripped portions of the insulating layer were also not observed.

The above results are shown in Table 6.

TABLE 6

|  |  | Example 1K | Example 2K |
|---|---|---|---|
| Conductive | Material | SUS316L | SUS304 |
| Substrate | Shape | Single-fed processing | Roll |
| Convex | Forming method | Photolithography | Photolithography |
| pattern | Resist thickness (μm) | 15 | 7 |
|  | Mask line width | 15 | 5 |
|  | Line pitch | 300 | 300 |
|  | Line width (μm) | 16 to 19 | 5 to 7 |
| Insulating | Material | DLC | DLC |
| layer | Intermediate layer coating | 0.1 | 0.1 |
| coating | thickness (μm) |  |  |
| (first) | Coating thickness (μm) | 2 to 3 | 3 to 4 |
|  | Coating thickness on both sides of convex portion (μm) | 2 to 3 | 3 to 4 |
|  | Angle of boundary surface (°) | 45 to 51 | 45 to 47 |
| Insulating | Material | electrocoating | electrocoating |
| layer | Application condition | 6 V 5 minutes | 6 V 7 minutes |
| coating | Application thickness (μm) | 1 to 2 | 2 to 3 |
| (second) |  |  |  |
| Insulating | Material | DLC | DLC |
| layer | Intermediate layer, coating | 0.1 | 0.1 |
| coating | thickness (μm) |  |  |
| (third) | Coating thickness (μm) | 2 to 3 | 1 to 2 |
|  | Coating thickness (total) (μm) | 4 to 6 | 4 to 6 |
|  | Coating thickness on both sides of convex portion (total) (μm) | 4 to 6 | 4 to 6 |
|  | Angle of boundary surface (°) | 45 to 51 | 45 to 49 |
| stripping of | Method | Alkali dipping | Supersonic wave |
| convex | Groove width (bottom portion) (μm) | 16 to 19 | 5 to 7 |
| pattern |  |  |  |
|  | Groove width (opening) (μm) | 26 to 31 | 13 to 17 |
|  | Groove depth (μm) | 4 to 6 | 4 to 6 |
|  | Groove pitch (μm) | 300 | 300 |

TABLE 6-continued

|  |  | Example 1K | Example 2K |
|---|---|---|---|
| Plating condition | Composition | Copper sulfate 250 g/L<br>Sulfuric acid 70 g/L | Copper pyrophosphate 100 g/L<br>Potassium pyrophosphate 250 g/L<br>Ammonia water 2 ml/L |
|  | Cathode current density (A/dm$^2$) | 10 | 15 |
| Pin hole | Initial pin hole (holes/cm$^2$) | 13 | 15 |
| Conductor layer pattern | Line width (μm) | 30 to 35 | 14 to 18 |
|  | Line thickness (μm) | 7 to 8 | 4.5 to 6.5 |
|  | Line linearity | OK | OK |
|  | Pattern abnormality | None | None |
| Repetitive endurance of conductive substrate |  | 200 times OK | 5000 times OK |

The invention claimed is:

1. An engraved plate comprising a substrate and an insulating layer formed with an inorganic compound on a surface of the substrate, wherein a concave portion which increases in width toward an opening is formed at the insulating layer, an angle of a side surface of the concave portion is 30° or more to less than 90°, the concave portion is configured to hold an object to be transferred, and the concave portion has a minimum width of 1 to 40 μm, a maximum width of 2 to 60 μm, and an interval of 50 to 1000 μm.

2. The engraved plate according to claim 1, wherein the substrate is insulative or conductive.

3. The engraved plate according to claim 1, wherein the concave portion is a portion to form a plating layer.

4. The engraved plate according to claim 3, wherein a bottom surface of the concave portion is conductive.

5. The engraved plate according to claim 1, wherein the concave portion is formed to draw a geometric figure on an insulating layer or to draw a geometric figure by itself.

6. The engraved plate according to claim 1, wherein a thickness of the insulating layer is 0.1 to 100 μm.

7. The engraved plate according to claim 1, wherein the engraved plate is a roll or wound on a roll.

8. The engraved plate according to claim 1, wherein the engraved plate is roughly a flat plate.

9. The engraved plate according to claim 1, wherein a surface of the substrate consists of steel, Ti, conductive diamond-like carbon, or a conductive inorganic material.

10. An engraved plate comprising a substrate and an insulating layer on a surface of the substrate, wherein a concave portion which increases in width toward an opening is formed at the insulating layer, the insulating layer is constituted by a convex shape having a bottom area of 1 to 1×10$^6$ square micrometers, and the convex shapes are distributed at intervals of 1 to 1000 μm.

11. The engraved plate according to claim 10, wherein the substrate is insulative or conductive.

12. The engraved plate according to claim 10 wherein the concave portion is to hold an object to be transferred.

13. The engraved plate according to claim 10, wherein the concave portion is a portion to form a plating layer.

14. The engraved plate according to claim 13, wherein a bottom surface of the concave portion is conductive.

15. The engraved plate according to claim 10, wherein the concave portion is formed to draw a geometric figure on an insulating layer or to draw a geometric figure by itself.

16. The engraved plate according to claim 10, wherein a thickness of the insulating layer is 0.1 to 100 μm.

17. The engraved plate according to claim 10, wherein the engraved plate is a roll or wound on a roll.

18. The engraved plate according to claim 10, wherein the engraved plate is roughly a flat plate.

19. The engraved plate according to claim 10, wherein a surface of the substrate consists of steel, Ti, conductive diamond-like carbon, or a conductive inorganic material.

20. An engraved plate comprising a substrate and an insulating layer formed with an inorganic compound on a surface of the substrate, wherein a concave portion which increases in width toward an opening is formed at the insulating layer such that the substrate is exposed at a bottom portion of the concave portion, at least a surface of the substrate exposed at the bottom portion of the concave portion comprising diamond-like carbon, an angle of a side surface of the concave portion is 30° or more to less than 90°, and the concave portion is configured to hold an object to be transferred.

21. The engraved plate according to claim 20, wherein the angle of the side surface of the concave portion is 30° or more to 80° or less.

22. The engraved plate according to claim 20, wherein the substrate is insulative or conductive.

23. The engraved plate according to claim 20, wherein the object is a plating layer.

24. The engraved plate according to claim 23, wherein a bottom surface of the concave portion is conductive.

25. The engraved plate according to claim 20, wherein the concave portion is formed to draw a geometric figure on an insulating layer or to draw a geometric figure by itself.

26. The engraved plate according to claim 20, wherein a thickness of the insulating layer is 0.1 to 100 μm.

27. The engraved plate according to claim 20, wherein the engraved plate is a roll or wound on a roll.

28. The engraved plate according to claim 20, wherein the engraved plate is roughly a flat plate.

29. The engraved plate according to claim 20, wherein the insulating layer is made of diamond-like carbon, Al$_2$O$_3$ or SiO$_2$.

* * * * *